US009524027B2

(12) United States Patent
Sirpal et al.

(10) Patent No.: US 9,524,027 B2
(45) Date of Patent: Dec. 20, 2016

(54) MESSAGING APPLICATION VIEWS

(71) Applicant: Z124, Georgetown (KY)

(72) Inventors: Sanjiv Sirpal, Oakville (CA); Mohammed Selim, Oakville (CA)

(73) Assignee: Z124, George Town (KY)

(*) Notice: Subject to any disclaimer, the term of this patent is extended or adjusted under 35 U.S.C. 154(b) by 526 days.

(21) Appl. No.: 13/627,680

(22) Filed: Sep. 26, 2012

(65) Prior Publication Data

US 2013/0091439 A1  Apr. 11, 2013

Related U.S. Application Data

(60) Provisional application No. 61/539,884, filed on Sep. 27, 2011.

(51) Int. Cl.
*G06F 3/00* (2006.01)
*G06F 3/048* (2013.01)
(Continued)

(52) U.S. Cl.
CPC .......... *G06F 3/017* (2013.01); *B29D 11/00673* (2013.01); *E05D 3/12* (2013.01); *G02B 6/0001* (2013.01); *G06F 1/1601* (2013.01); *G06F 1/1605* (2013.01); *G06F 1/1616* (2013.01); *G06F 1/1618* (2013.01); *G06F 1/1637* (2013.01); *G06F 1/1641* (2013.01); *G06F 1/1643* (2013.01); *G06F 1/1647* (2013.01); *G06F 1/1649* (2013.01); *G06F 1/1677* (2013.01); *G06F 1/1681* (2013.01); *G06F 1/1692* (2013.01); *G06F 3/00* (2013.01); *G06F 3/01* (2013.01); *G06F 3/0346* (2013.01); *G06F 3/041* (2013.01); *G06F 3/044* (2013.01); *G06F 3/048* (2013.01); *G06F 3/0412* (2013.01); *G06F 3/0416* (2013.01); *G06F 3/0481* (2013.01);
(Continued)

(58) Field of Classification Search
CPC .... G06Q 10/107; G06Q 10/10; G06Q 10/109; H04L 12/581; H04L 12/582; H04L 12/586; H04L 12/587; H04L 12/589; H04L 12/5895; G06F 3/0482; G06F 3/04842; G06F 3/0488; G06F 3/0481–3/0489
USPC .................................................. 715/752, 810
See application file for complete search history.

(56) References Cited

U.S. PATENT DOCUMENTS 5,835,090 A    11/1998 Clark et al.
6,014,135 A *   1/2000 Fernandes ................ 715/744
(Continued)

FOREIGN PATENT DOCUMENTS

CN    1627765    6/2005
CN    1902563    1/2007
(Continued)

OTHER PUBLICATIONS

International Preliminary Report on Patentability for International (PCT) Patent Application No. PCT/US2011/053884, mailed Mar. 13, 2014 8 pages.

(Continued)

*Primary Examiner* — Steven B Theriault
(74) *Attorney, Agent, or Firm* — Sheridan Ross P.C.

(57) ABSTRACT

A communication device comprising a microprocessor readable computer readable medium is provided that includes microprocessor executable instructions to provide single- and multi-thread views of messages sent and received by a communication device.

26 Claims, 93 Drawing Sheets

(51) Int. Cl.

| | | |
|---|---|---|
| G06F 3/01 | (2006.01) | |
| G06F 1/16 | (2006.01) | |
| G06F 3/0488 | (2013.01) | |
| G06F 9/44 | (2006.01) | |
| G06F 3/0481 | (2013.01) | |
| G06F 3/0483 | (2013.01) | |
| G06F 3/14 | (2006.01) | |
| G09G 5/14 | (2006.01) | |
| B29D 11/00 | (2006.01) | |
| E05D 3/12 | (2006.01) | |
| F21V 8/00 | (2006.01) | |
| G06F 3/041 | (2006.01) | |
| G06F 3/0489 | (2013.01) | |
| G06T 3/00 | (2006.01) | |
| G09G 1/00 | (2006.01) | |
| G09G 5/00 | (2006.01) | |
| G09G 5/34 | (2006.01) | |
| H04M 1/02 | (2006.01) | |
| H04N 5/445 | (2011.01) | |
| H04W 48/18 | (2009.01) | |
| H04W 72/06 | (2009.01) | |
| H04W 88/06 | (2009.01) | |
| H05K 5/00 | (2006.01) | |
| H05K 5/02 | (2006.01) | |
| H05K 5/04 | (2006.01) | |
| H05K 7/02 | (2006.01) | |
| H05K 7/14 | (2006.01) | |
| H05K 13/00 | (2006.01) | |
| H05K 13/04 | (2006.01) | |
| G06F 3/0484 | (2013.01) | |
| H04W 88/02 | (2009.01) | |
| G06F 3/0482 | (2013.01) | |
| G09G 5/12 | (2006.01) | |
| G06G 1/00 | (2006.01) | |
| G06F 3/0346 | (2013.01) | |
| H04N 5/232 | (2006.01) | |
| H04N 5/262 | (2006.01) | |
| G06F 3/0486 | (2013.01) | |
| G06F 3/0485 | (2013.01) | |
| G06F 17/30 | (2006.01) | |
| G06F 9/00 | (2006.01) | |
| G06F 3/16 | (2006.01) | |
| G06F 3/044 | (2006.01) | |
| H04W 4/02 | (2009.01) | |
| H04W 24/02 | (2009.01) | |

(52) U.S. Cl.
CPC .......... *G06F 3/0482* (2013.01); *G06F 3/0483* (2013.01); *G06F 3/0484* (2013.01); *G06F 3/0485* (2013.01); *G06F 3/0486* (2013.01); *G06F 3/0488* (2013.01); *G06F 3/04817* (2013.01); *G06F 3/04842* (2013.01); *G06F 3/04845* (2013.01); *G06F 3/04883* (2013.01); *G06F 3/04886* (2013.01); *G06F 3/04897* (2013.01); *G06F 3/1423* (2013.01); *G06F 3/1438* (2013.01); *G06F 3/1446* (2013.01); *G06F 3/167* (2013.01); *G06F 9/00* (2013.01); *G06F 9/44* (2013.01); *G06F 9/4443* (2013.01); *G06F 17/3028* (2013.01); *G06F 17/30274* (2013.01); *G06G 1/00* (2013.01); *G06T 3/00* (2013.01); *G09G 1/00* (2013.01); *G09G 5/00* (2013.01); *G09G 5/12* (2013.01); *G09G 5/14* (2013.01); *G09G 5/34* (2013.01); *H04M 1/0216* (2013.01); *H04M 1/0266* (2013.01); *H04N 5/23293* (2013.01); *H04N 5/2628* (2013.01); *H04N 5/44591* (2013.01); *H04W 4/02* (2013.01); *H04W 24/02* (2013.01); *H04W 48/18* (2013.01); *H04W 72/06* (2013.01); *H04W 88/02* (2013.01); *H04W 88/06* (2013.01); *H05K 5/0017* (2013.01); *H05K 5/0226* (2013.01); *H05K 5/04* (2013.01); *H05K 7/02* (2013.01); *H05K 7/1452* (2013.01); *H05K 13/00* (2013.01); *H05K 13/046* (2013.01); *E05Y 2900/606* (2013.01); *G06F 1/16* (2013.01); *G06F 2203/04803* (2013.01); *G09G 2300/023* (2013.01); *G09G 2330/021* (2013.01); *G09G 2354/00* (2013.01); *Y10T 16/547* (2015.01); *Y10T 29/4984* (2015.01); *Y10T 29/49826* (2015.01)

(56) References Cited

U.S. PATENT DOCUMENTS

| | | | |
|---|---|---|---|
| 6,301,245 B1* | 10/2001 | Luzeski et al. | 370/352 |
| 6,331,840 B1 | 12/2001 | Nielson et al. | |
| 6,430,174 B1* | 8/2002 | Jennings et al. | 370/352 |
| 6,545,669 B1 | 4/2003 | Kinawi et al. | |
| 6,577,496 B1 | 6/2003 | Gioscia et al. | |
| 6,661,877 B1* | 12/2003 | Lee et al. | 379/67.1 |
| 6,919,864 B1 | 7/2005 | Macor | |
| 6,987,988 B2 | 1/2006 | Uchiyama | |
| 7,289,083 B1 | 10/2007 | Canova, Jr. | |
| 7,432,876 B2 | 10/2008 | Okuley | |
| 7,839,419 B2 | 11/2010 | Hanggie et al. | |
| 7,844,301 B2* | 11/2010 | Lee et al. | 455/566 |
| 7,895,537 B2* | 2/2011 | Gruen et al. | 715/863 |
| 7,978,182 B2 | 7/2011 | Ording et al. | |
| 7,996,045 B1 | 8/2011 | Bauer et al. | |
| 7,996,450 B1 | 8/2011 | Lee et al. | |
| 8,046,030 B2* | 10/2011 | Dunko | 455/567 |
| 8,068,121 B2 | 11/2011 | Williamson | |
| 8,139,026 B2* | 3/2012 | Griffin | 345/156 |
| 8,150,930 B2* | 4/2012 | Satterfield et al. | 709/206 |
| 8,191,011 B2* | 5/2012 | Abanami et al. | 715/835 |
| 8,228,292 B1 | 7/2012 | Ruiz et al. | |
| 8,233,885 B2* | 7/2012 | Kansal et al. | 455/412.1 |
| 8,261,213 B2 | 9/2012 | Hinckley et al. | |
| 8,289,292 B2 | 10/2012 | Sip | |
| 8,300,022 B2* | 10/2012 | Brenneman et al. | 345/173 |
| 8,350,919 B2 | 1/2013 | Schindler | |
| 8,356,258 B2 | 1/2013 | Matthews et al. | |
| 8,472,926 B2* | 6/2013 | Doudkine et al. | 455/414.1 |
| 8,539,361 B2* | 9/2013 | Hardy et al. | 715/752 |
| 8,564,543 B2* | 10/2013 | Chaudhri | 345/173 |
| 8,670,002 B2* | 3/2014 | Kim et al. | 345/658 |
| 8,689,116 B2* | 4/2014 | Guzman et al. | 715/752 |
| 8,739,071 B2 | 5/2014 | Klassen et al. | |
| 2002/0097194 A1 | 7/2002 | Uchida et al. | |
| 2002/0143489 A1* | 10/2002 | Orchard | 702/141 |
| 2003/0059003 A1 | 3/2003 | Lewis | |
| 2003/0142469 A1 | 7/2003 | Ponx | |
| 2004/0075691 A1* | 4/2004 | Moon | 345/805 |
| 2004/0122853 A1* | 6/2004 | Moore | 707/103 R |
| 2005/0004990 A1* | 1/2005 | Durazo et al. | 709/206 |
| 2005/0114781 A1* | 5/2005 | Brownholtz et al. | 715/733 |
| 2005/0289478 A1 | 12/2005 | Landman et al. | |
| 2006/0012951 A1 | 1/2006 | Kim | |
| 2006/0069734 A1* | 3/2006 | Gersh et al. | 709/207 |
| 2006/0082518 A1 | 4/2006 | Ram | |
| 2006/0101354 A1* | 5/2006 | Hashimoto et al. | 715/863 |
| 2006/0183505 A1* | 8/2006 | Willrich | 455/566 |
| 2006/0195252 A1* | 8/2006 | Orr et al. | 701/200 |
| 2006/0197755 A1 | 9/2006 | Bawany | |
| 2006/0206825 A1 | 9/2006 | Dorn et al. | |
| 2006/0211454 A1 | 9/2006 | Park et al. | |
| 2006/0227106 A1 | 10/2006 | Hashimoto et al. | |
| 2006/0238517 A1* | 10/2006 | King et al. | 345/173 |
| 2006/0281453 A1* | 12/2006 | Jaiswal et al. | 455/423 |
| 2007/0004451 A1* | 1/2007 | C. Anderson | 455/556.1 |

(56) References Cited

U.S. PATENT DOCUMENTS

| | | | |
|---|---|---|---|
| 2007/0005715 A1* | 1/2007 | LeVasseur et al. | 709/206 |
| 2007/0146321 A1* | 6/2007 | Sohn et al. | 345/158 |
| 2007/0176898 A1* | 8/2007 | Suh | 345/158 |
| 2007/0188450 A1* | 8/2007 | Hernandez et al. | 345/158 |
| 2007/0198948 A1 | 8/2007 | Toriyama | |
| 2007/0271527 A1* | 11/2007 | Paas et al. | 715/810 |
| 2007/0282956 A1* | 12/2007 | Staats | 709/206 |
| 2008/0036743 A1 | 2/2008 | Westerman et al. | |
| 2008/0037726 A1* | 2/2008 | Yao et al. | 379/88.13 |
| 2008/0059915 A1 | 3/2008 | Boillot | |
| 2008/0062625 A1 | 3/2008 | Batio | |
| 2008/0086703 A1* | 4/2008 | Flynt et al. | 715/853 |
| 2008/0122796 A1 | 5/2008 | Jobs et al. | |
| 2008/0165144 A1 | 7/2008 | Forstall et al. | |
| 2008/0165152 A1* | 7/2008 | Forstall et al. | 345/173 |
| 2008/0174570 A1 | 7/2008 | Jobs et al. | |
| 2009/0029674 A1* | 1/2009 | Brezina et al. | 455/405 |
| 2009/0106676 A1* | 4/2009 | Brezina et al. | 715/763 |
| 2009/0119678 A1 | 5/2009 | Shih et al. | |
| 2009/0137278 A1 | 5/2009 | Haru et al. | |
| 2009/0228807 A1* | 9/2009 | Lemay | 715/752 |
| 2009/0235203 A1 | 9/2009 | Iizuka | |
| 2009/0254861 A1 | 10/2009 | Seetharamakrishnan et al. | |
| 2009/0262074 A1 | 10/2009 | Nasiri et al. | |
| 2009/0278806 A1 | 11/2009 | Duarte et al. | |
| 2009/0291760 A1 | 11/2009 | Hepburn et al. | |
| 2009/0298548 A1 | 12/2009 | Kim et al. | |
| 2010/0007603 A1 | 1/2010 | Kirkup | |
| 2010/0013778 A1 | 1/2010 | Liu et al. | |
| 2010/0037184 A1* | 2/2010 | Sie | 715/863 |
| 2010/0053089 A1 | 3/2010 | Kwok et al. | |
| 2010/0058231 A1 | 3/2010 | Duarte et al. | |
| 2010/0064244 A1 | 3/2010 | Kilpatrick, II et al. | |
| 2010/0064251 A1 | 3/2010 | Hufnagel et al. | |
| 2010/0064536 A1 | 3/2010 | Caskey et al. | |
| 2010/0079355 A1 | 4/2010 | Kilpatrick, II et al. | |
| 2010/0081475 A1* | 4/2010 | Chiang et al. | 455/564 |
| 2010/0085274 A1 | 4/2010 | Kilpatrick, II et al. | |
| 2010/0085382 A1 | 4/2010 | Lundqvist et al. | |
| 2010/0088532 A1 | 4/2010 | Pollock et al. | |
| 2010/0088634 A1 | 4/2010 | Tsuruta et al. | |
| 2010/0088639 A1* | 4/2010 | Yach et al. | 715/825 |
| 2010/0100842 A1 | 4/2010 | Kim | |
| 2010/0125815 A1 | 5/2010 | Wang et al. | |
| 2010/0137027 A1 | 6/2010 | Kim | |
| 2010/0162128 A1 | 6/2010 | Richardson et al. | |
| 2010/0164836 A1 | 7/2010 | Liberatore | |
| 2010/0182247 A1 | 7/2010 | Petschnigg et al. | |
| 2010/0182251 A1 | 7/2010 | Hong et al. | |
| 2010/0182265 A1 | 7/2010 | Kim et al. | |
| 2010/0211872 A1 | 8/2010 | Rolston et al. | |
| 2010/0223553 A1 | 9/2010 | Madden | |
| 2010/0227651 A1 | 9/2010 | Kim | |
| 2010/0245106 A1 | 9/2010 | Miller et al. | |
| 2010/0245209 A1 | 9/2010 | Miller et al. | |
| 2010/0245240 A1 | 9/2010 | Heringslack et al. | |
| 2010/0245256 A1 | 9/2010 | Estrada et al. | |
| 2010/0248788 A1 | 9/2010 | Yook et al. | |
| 2010/0262554 A1 | 10/2010 | Elliott | |
| 2010/0262922 A1* | 10/2010 | Fan et al. | 715/752 |
| 2010/0280676 A1 | 11/2010 | Pabon et al. | |
| 2010/0297304 A1 | 11/2010 | Maxwell | |
| 2010/0298032 A1 | 11/2010 | Lee et al. | |
| 2010/0304791 A1 | 12/2010 | Lee et al. | |
| 2010/0305843 A1 | 12/2010 | Yan et al. | |
| 2010/0313156 A1 | 12/2010 | Louch et al. | |
| 2010/0321275 A1 | 12/2010 | Hinckley et al. | |
| 2011/0006971 A1 | 1/2011 | Ebey et al. | |
| 2011/0012931 A1 | 1/2011 | Abe | |
| 2011/0018821 A1 | 1/2011 | Kii | |
| 2011/0025625 A1 | 2/2011 | Hirako | |
| 2011/0047459 A1* | 2/2011 | Van Der Westhuizen | 715/702 |
| 2011/0072363 A1* | 3/2011 | Mandel et al. | 715/752 |
| 2011/0074717 A1 | 3/2011 | Yamashita | |
| 2011/0107272 A1 | 5/2011 | Aguilar | |
| 2011/0128241 A1 | 6/2011 | Kang et al. | |
| 2011/0143769 A1 | 6/2011 | Jones et al. | |
| 2011/0153044 A1* | 6/2011 | Lindahl et al. | 700/94 |
| 2011/0157057 A1 | 6/2011 | Hata | |
| 2011/0175805 A1 | 7/2011 | Rottler et al. | |
| 2011/0187662 A1 | 8/2011 | Lee et al. | |
| 2011/0199361 A1* | 8/2011 | Shin | 345/211 |
| 2011/0209058 A1 | 8/2011 | Hinckley et al. | |
| 2011/0210922 A1 | 9/2011 | Griffin | |
| 2011/0230178 A1 | 9/2011 | Jones et al. | |
| 2011/0231499 A1* | 9/2011 | Stovicek et al. | 709/206 |
| 2011/0239142 A1 | 9/2011 | Steeves et al. | |
| 2011/0239157 A1 | 9/2011 | Lin et al. | |
| 2011/0252317 A1 | 10/2011 | Keranen et al. | |
| 2011/0267256 A1 | 11/2011 | Stevens et al. | |
| 2011/0291964 A1 | 12/2011 | Chambers et al. | |
| 2011/0296333 A1 | 12/2011 | Bateman et al. | |
| 2012/0005602 A1 | 1/2012 | Anttila et al. | |
| 2012/0052845 A1* | 3/2012 | Olivier et al. | 455/413 |
| 2012/0054401 A1 | 3/2012 | Cheng | |
| 2012/0079099 A1* | 3/2012 | Dhara et al. | 709/224 |
| 2012/0081270 A1 | 4/2012 | Gimpl et al. | |
| 2012/0081277 A1 | 4/2012 | de Paz | |
| 2012/0081278 A1 | 4/2012 | Freedman | |
| 2012/0081302 A1 | 4/2012 | Gimpl et al. | |
| 2012/0081400 A1 | 4/2012 | Schrock et al. | |
| 2012/0083260 A1* | 4/2012 | Arriola et al. | 455/418 |
| 2012/0084674 A1 | 4/2012 | Visosky | |
| 2012/0084676 A1 | 4/2012 | de Paz | |
| 2012/0084693 A1 | 4/2012 | Sirpal et al. | |
| 2012/0084714 A1* | 4/2012 | Sirpal et al. | 715/790 |
| 2012/0084720 A1 | 4/2012 | Sirpal et al. | |
| 2012/0084722 A1 | 4/2012 | Cassar et al. | |
| 2012/0124148 A1* | 5/2012 | Hamlin et al. | 709/206 |
| 2012/0174028 A1 | 7/2012 | Sirpal et al. | |
| 2012/0240054 A1* | 9/2012 | Webber | 715/752 |
| 2012/0246374 A1 | 9/2012 | Fino | |
| 2012/0268399 A1 | 10/2012 | Cheng et al. | |
| 2012/0280924 A1 | 11/2012 | Kummer et al. | |
| 2012/0290965 A1* | 11/2012 | Ignor et al. | 715/777 |
| 2012/0297304 A1 | 11/2012 | Maxwell | |
| 2012/0299554 A1 | 11/2012 | Kruglick | |
| 2013/0021262 A1 | 1/2013 | Chen | |
| 2013/0021266 A1* | 1/2013 | Selim | 345/173 |
| 2013/0024780 A1* | 1/2013 | Sutedja et al. | 715/752 |
| 2013/0038541 A1* | 2/2013 | Bakker | 345/173 |
| 2013/0095801 A1* | 4/2013 | Kermoian et al. | 455/414.1 |
| 2013/0100167 A1* | 4/2013 | Bose et al. | 345/651 |
| 2013/0120251 A1 | 5/2013 | Lee et al. | |
| 2013/0238728 A1* | 9/2013 | Fleck et al. | 709/206 |
| 2014/0022285 A1* | 1/2014 | Stovicek et al. | 345/650 |
| 2015/0046858 A1 | 2/2015 | Gimpl et al. | |
| 2015/0254805 A1 | 9/2015 | Sirpal et al. | |
| 2016/0085384 A1 | 3/2016 | Selim | |
| 2016/0110049 A1 | 4/2016 | Cassar et al. | |

FOREIGN PATENT DOCUMENTS

| | | |
|---|---|---|
| CN | 101441085 | 5/2009 |
| CN | 101477442 | 7/2009 |
| EP | 1775925 | 4/2007 |
| JP | H09-305259 | 11/1997 |
| JP | 2003-511786 | 3/2003 |
| JP | 2003-302957 | 10/2003 |
| JP | 2010-26883 | 2/2010 |
| WO | WO 2010/028394 | 3/2010 |
| WO | WO 2010/028399 | 3/2010 |

OTHER PUBLICATIONS

Official Action for U.S. Appl. No. 13/247,787, mailed May 14, 2014 23 pages.

Official Action for U.S. Appl. No. 13/341,666, mailed Jun. 4, 2014 19 pages.

Official Action for U.S. Appl. No. 13/341,634, mailed Jun. 4, 2014 20 pages.

Official Action for U.S. Appl. No. 13/365,157, mailed May 30, 2014 22 pages.

(56) References Cited

OTHER PUBLICATIONS

Official Action for U.S. Appl. No. 13/365,153, mailed May 15, 2014 17 pages.
Official Action for U.S. Appl. No. 13/365,148, mailed May 29, 2014 13 pages.
Notice of Allowance for U.S. Appl. No. 13/222,888, mailed Jun. 9, 2014 5 pages.
International Preliminary Report on Patentability for International (PCT) Patent Application No. PCT/US2011/053849, mailed Apr. 11, 2013 6 pages.
International Preliminary Report on Patentability for International (PCT) Patent Application No. PCT/US2011/053914, mailed Apr. 11, 2013 6 pages.
International Preliminary Report on Patentability for International (PCT) Patent Application No. PCT/US2011/054032, mailed Apr. 11, 2013 8 pages.
Extended Search Report for European Patent Application No. 12180497.5, dated Nov. 21, 2012 8 pages.
International Preliminary Report on Patentability for International (PCT) Patent Application No. PCT/US2011/052811, mailed Apr. 11, 2013 6 pages.
Official Action for U.S. Appl. No. 13/247,787, mailed Feb. 28, 2013 16 pages.
Official Action for U.S. Appl. No. 13/247,787, mailed Jun. 17, 2013 20 pages.
Official Action for U.S. Appl. No. 13/247,823, mailed May 23, 2013 20 pages.
Official Action for U.S. Appl. No. 13/247,514, mailed Jun. 17, 2013 30 pages.
Official Action for U.S. Appl. No. 13/365,148, mailed Mar. 28, 2013 15 pages.
Official Action for U.S. Appl. No. 13/248,199, mailed Jun. 14, 2013 15 pages.
"How to disable orientation change in Android?" stackoverflow.com, Oct. 18, 2009, 4 pages.
Official Action for U.S. Appl. No. 13/247,359, mailed Aug. 6, 2014 15 pages.
Official Action for U.S. Appl. No. 13/247,728, mailed Aug. 27, 2014 20 pages.
Notice of Allowance for U.S. Appl. No. 13/247,817, mailed Sep. 11, 2013 12 pages.
Official Action for U.S. Appl. No. 13/222,888, mailed Sep. 6, 2013 19 pages.
Official Action for U.S. Appl. No. 13/365,157, mailed Aug. 15, 2013 19 pages.
Official Action for U.S. Appl. No. 13/365,153, mailed Aug. 16, 2013 18 pages.
Official Action for U.S. Appl. No. 12/948,682, mailed Aug. 2, 2013 14 pages.
U.S. Appl. No. 13/341,634, filed Dec. 30, 2011, Selim.
U.S. Appl. No. 13/341,666, filed Dec. 30, 2011, Selim.
U.S. Appl. No. 13/365,148, filed Feb. 2, 2012, Reeves et al.
U.S. Appl. No. 13/365,153, filed Feb. 2, 2012, Reeves et al.
U.S. Appl. No. 13/365,157, filed Feb. 2, 2012, Reeves et al.
Google images, accessed Apr. 18, 2011, 6 pages.
"Lapdock™ for Motorola ATRIX," at www.motorola.com/Consumers/US-EN/Consumer-Product-and-Services/Mobile . . . , accessed Apr. 18, 2011, 1 page.
"Motorola ATRIX 4G Laptop Dock Review," at www.phonearena.com/reviews/Motorola-ATRIX-4G-Laptop-Dock-Review_id2667, Mar. 2, 2011, 6 pages.
Website entitled, "Kyocera Echo," at www.echobykyocera.com/, 2011, 6 pages.
Website entitled, "Sony Tablet," at store.sony.com/webapp/wcs/stores/servlet/CategoryDisplay?catalogId=10551&storeId=10151&langId=-1&categoryId=8198552921644795521, 2011, 3 pages.
Burns, "Motorola ATRIX 4G Laptop Dock Review," at www.androidcommunity.com/motorola-atrix-4g-laptop-dock-review-20110220/, Feb. 20, 2011, 5 pages.
Catacchio, "This smartphone has two huge screens . . . that rotate," The Next Web at www.thenextweb.com/asia/2010/10/07/this-smartphone-has-two-huge-screens-that-rotate/, Jul. 21, 2011, 2 pages.
Harman03, "Kyocera Echo Dual-screen Android Phone," posted 4 weeks from Apr. 18, 2011, 3 pages.
Hinckley et al. "Codex: A Dual Screen Tablet Computer," CHI 2009 ~ New Mobile Interactions, Apr. 4-9, 2009, pp. 1933-1942 (www.dgp.utoronto.ca/~ravin/papers/chi2009_codex.pdf).
Lee "Developing Orientatin-Aware Android Application," Jun. 11, 2010, 9 pages (www.devx.com/wireless/Article/40792/1954).
Martelin "Orientation Awareness in Declarative User Interface Languages for Mobile Devices: A Case Study and Evaluation," Jun. 1, 2010, 79 pages (lib.tkk.fi/Dipl/2010/um100291.pdf).
Stein, S., "How does the Motorola Atrix 4G Lapdock compare with a laptop?" Crave—CNET, at www.news.cnet.com/8301-17938_105-20031251-1.html, Feb. 9, 2011, 7 pages.
International Search Report and Written Opinion for International (PCT) Patent Application No. PCT/US11/53849, mailed Feb. 27, 2012 7 pages.
International Search Report and Written Opinion for International (PCT) Patent Application No. PCT/US11/53884, mailed Feb. 28, 2012 19 pages.
International Search Report and Written Opinion for International (PCT) Patent Application No. PCT/US11/53914, mailed Feb. 21, 2012 7 pages.
International Search Report and Written Opinion for Internatioanl (PCT) Patent Application No. PCT/US11/54032, mailed Feb. 22, 2012 9 pages.
International Search Report and Written Opinion for International (PCT) Patent Application No. PCT/US2011/052811, mailed Apr. 27, 2012 14 pages.
Official Action for U.S. Appl. No. 13/365,148, mailed Oct. 23, 2012 10 pages.
"Basics Guide Kyocera Echo," Sprint Corporation, Jun. 22, 2011, accessed Nov. 27, 2013 [web.archive.org/web/20110622191751/http://support.sprint.com/support/device/Kyocera/Kyocera_Echotrade-dvc4820001prd] 161 pages.
Official Action for U.S. Appl. No. 13/247,359, mailed Nov. 21, 2013 11 pages.
Official Action for U.S. Appl. No. 13/247,787, mailed Nov. 15, 2013 18 pages.
Official Action for U.S. Appl. No. 13/247,823, mailed Oct. 11, 2013 19 pages.
Official Action for U.S. Appl. No. 13/247,514, mailed Oct. 11, 2013 16 pages.
Official Action for U.S. Appl. No. 13/248,199, mailed Oct. 1, 2013 16 pages.
Official Action for U.S. Appl. No. 13/248,199, mailed Dec. 23, 2013 16 pages.
Official Action for U.S. Appl. No. 13/341,634, mailed Nov. 19, 2013 23 pages.
Official Action for U.S. Appl. No. 13/341,666, mailed Dec. 17, 2013 25 pages.
Official Action for U.S. Appl. No. 13/222,888, mailed Jan. 6, 2014 13 pages.
"Make Windows Position Your Dual Monitors Correctly," How-To Geek.com, Apr. 17, 2010, [retrieved on Mar. 4, 2014], 4 pages. Retrieved from: www.howtogeek.com/howto/14875/make-windows-position-your-dual-monitors-correctly/.
Official Action for U.S. Appl. No. 13/247,359 mailed Mar. 21, 2014 12 pages.
Official Action for U.S. Appl. No. 13/247,823 mailed Mar. 12, 2014 19 pages.
Official Action for U.S. Appl. No. 13/247,728 mailed Jan. 31, 2014, 17 pages.
Official Action for U.S. Appl. No. 13/365,157, mailed Jan. 21, 2014, 21 pages.
Official Action for U.S. Appl. No. 13/365,153, mailed Jan. 16, 2014, 17 pages.
Notice of Allowance for U.S. Appl. No. 12/948,682, mailed Jan. 27, 2014, 8 pages.

(56) References Cited

OTHER PUBLICATIONS

Jordan, "Choose what opens when you plug in an iPhone," Mac Tips, Jan. 12, 2010, retrieved from http://web.archive.org/web/20100122014412/http://mactips.info/2010/01/choose-what-opens-when-you-plug-in-an-iphone, 3 pages.
Kear, "Applescript to test is power adaptor is plugged in," LinkedIn AppleScript Developers, Dec. 22, 2010, retrieved from https://www.linkedin.com/grp/post/154178-38296878, 2 pages.
Official Action (with English translation) for Chinese Patent Application No. 201180057653.8, dated Oct. 8, 2015, 16 pages.
Official Action (with English Summary) for Japanese Patent Application No. 2013-531830, dated Oct. 20, 2015, 5 pages.
Official Action (with English translation) for Chinese Patent Application No. 201180051481.3, dated Sep. 21, 2015, 5 pages.
Official Action for European Patent Application No. 12180497.5, dated May 11, 2015 7 pages.
Official Action with English Translation for China Patent Application No. 201180057860.3, dated Nov. 19, 2015 27 pages.
Notice of Allowance for U.S. Appl. No. 13/247,359, mailed Dec. 11, 2014 6 pages.
Official Action for U.S. Appl. No. 13/247,787, mailed Dec. 22, 2014 18 pages.
Notice of Allowance for U.S. Appl. No. 13/247,787, mailed Apr. 21, 2015 12 pages.
Official Action for U.S. Appl. No. 13/247,311, mailed Mar. 5, 2015 7 pages.
Official Action for U.S. Appl. No. 13/247,311, mailed Sep. 23, 2015 14 pages.
Official Action for U.S. Appl. No. 13/247,311, mailed Feb. 24, 2016 36 pages.
Official Action for U.S. Appl. No. 13/247,823, mailed Sep. 9, 2014, 18 pages.
Official Action for U.S. Appl. No. 13/247,823, mailed Dec. 22, 2014, 18 pages.
Official Action for U.S. Appl. No. 13/247,823, mailed Jul. 21, 2015 12 pages.
Notice of Allowance for U.S. Appl. No. 13/247,514, mailed Sep. 12, 2014 19 pages.
Notice of Allowance for U.S. Appl. No. 13/247,728, mailed Mar. 23, 2015 11 pages.
Notice of Allowance for U.S. Appl. No. 13/247,728, mailed May 4, 2015 9 pages.
Official Action for U.S. Appl. No. 13/248,199, mailed Nov. 14, 2014 15 pages.
Official Action for U.S. Appl. No. 13/248,199, mailed Mar. 16, 2015 16 pages.
Notice of Allowance for U.S. Appl. No. 13/248,199, mailed Jul. 31, 2015 9 pages.
Official Action for U.S. Appl. No. 13/341,666, mailed Oct. 23, 2014 19 pages.
Official Action for U.S. Appl. No. 13/341,666, mailed Apr. 24, 2015 19 pages.
Notice of Allowance for U.S. Appl. No. 13/341,666, mailed Dec. 18, 2015 8 pages.
Official Action for U.S. Appl. No. 13/341,634, mailed Oct. 2, 2014 18 pages.
Official Action for U.S. Appl. No. 13/341,634, mailed Apr. 24, 2015 18 pages.
Notice of Allowance for U.S. Appl. No. 13/365,157, mailed Nov. 7, 2014 8 pages.
Official Action for U.S. Appl. No. 13/365,1553, mailed Oct. 24, 2014 19 pages.
Notice of Allowance for U.S. Appl. No. 13/365,1553, mailed Feb. 18, 2015 8 pages.
Official Action for U.S. Appl. No. 13/365,148, mailed Oct. 15, 2014 13 pages.
Official Action for U.S. Appl. No. 13/365,148, mailed Mar. 25, 2015 11 pages.
Notice of Allowance for U.S. Appl. No. 13/365,148, mailed Aug. 11, 2015 13 pages.

\* cited by examiner

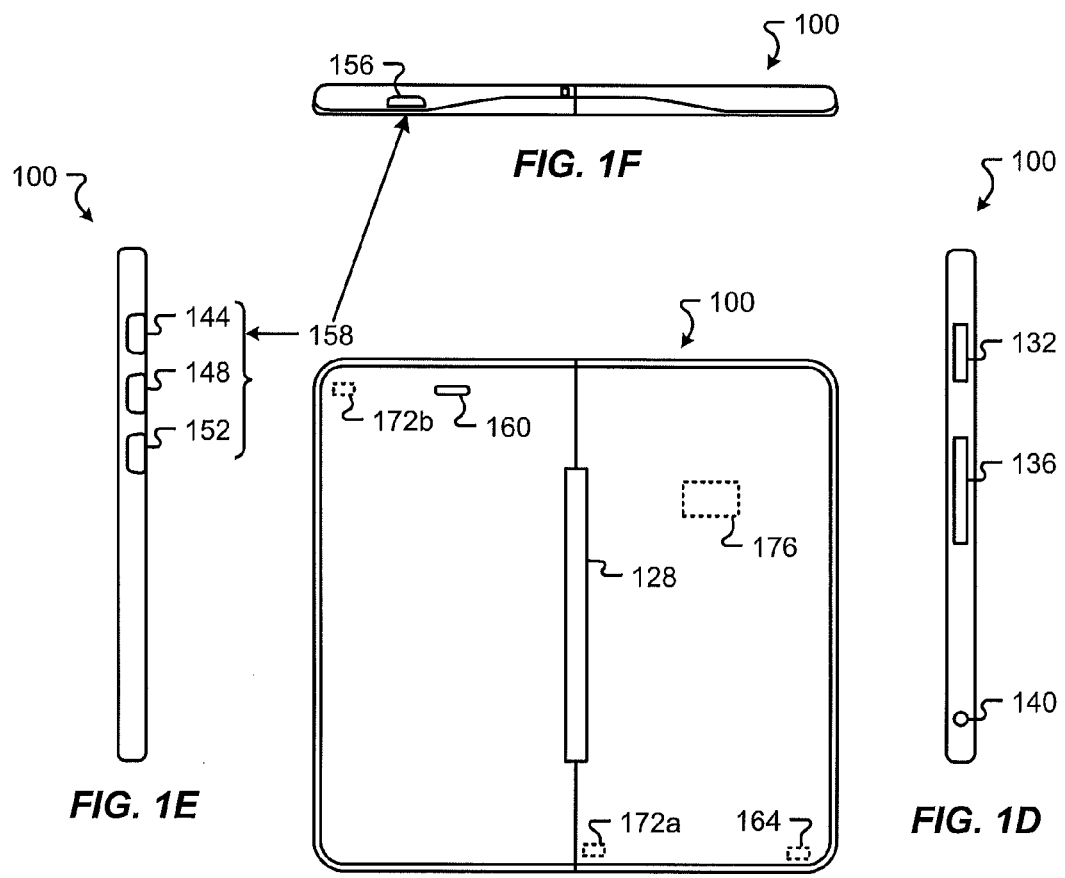

FIG. 3B

Key:
H - Hall Effect Sensor(s)
a - accelerometer(s)
T - Timer
P – communications Trigger
I – Image / Video capture Request

|  |  | PORTRAIT | | | | | | LANDSCAPE | | | | | |
|---|---|---|---|---|---|---|---|---|---|---|---|---|---|
|  |  | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
| PORTRAIT | OPEN | X | HT | HT | HT | P | I | AT | HAT | HAT | HAT | P | I |
|  | CLOSED | HT | X | HAT | HAT | P | I | HAT | AT | HAT | HAT | P | I |
|  | EASEL | HT | HAT | X | X | P | I | HAT | HAT | HAT | HAT | P | I |
|  | PHONE | HT | X | HT | HT | X | I | HAT | HAT | HAT | HAT | X | X |
|  | IMAGE/VIDEO | HT | HT | HT | X | P | X | HAT | HAT | HAT | HAT | X | HAT |
| LANDSCAPE | OPEN | AT | HAT | HAT | HAT | P | I | X | HT | HT | HT | P | I |
|  | CLOSED | HAT | AT | HAT | HAT | P | I | HT | X | HT | HT | P | I |
|  | EASEL | HAT | HAT | HAT | HAT | P | I | HT | HT | X | HT | P | I |
|  | MODIFIED EASEL | HAT | HAT | HAT | HAT | HAT | AT | HT | HT | HT | X | P | X |
|  | IMAGE/VIDEO |  |  |  |  |  |  |  |  |  |  |  |  |
|  | DOCKED | DOCKING SIGNAL | | | | | | | | | | | |

Tap

Long Press

Drag

Flick

Pinch

Spread

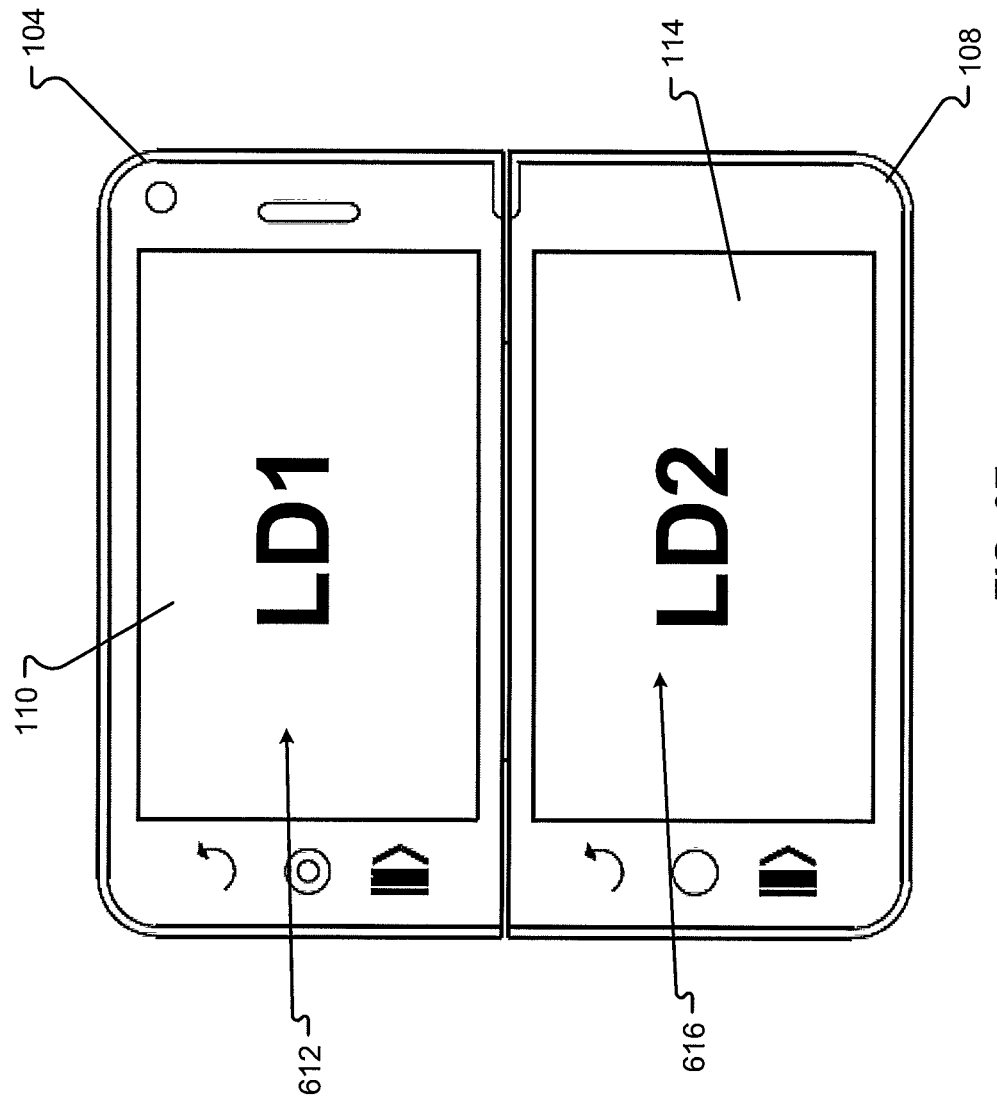

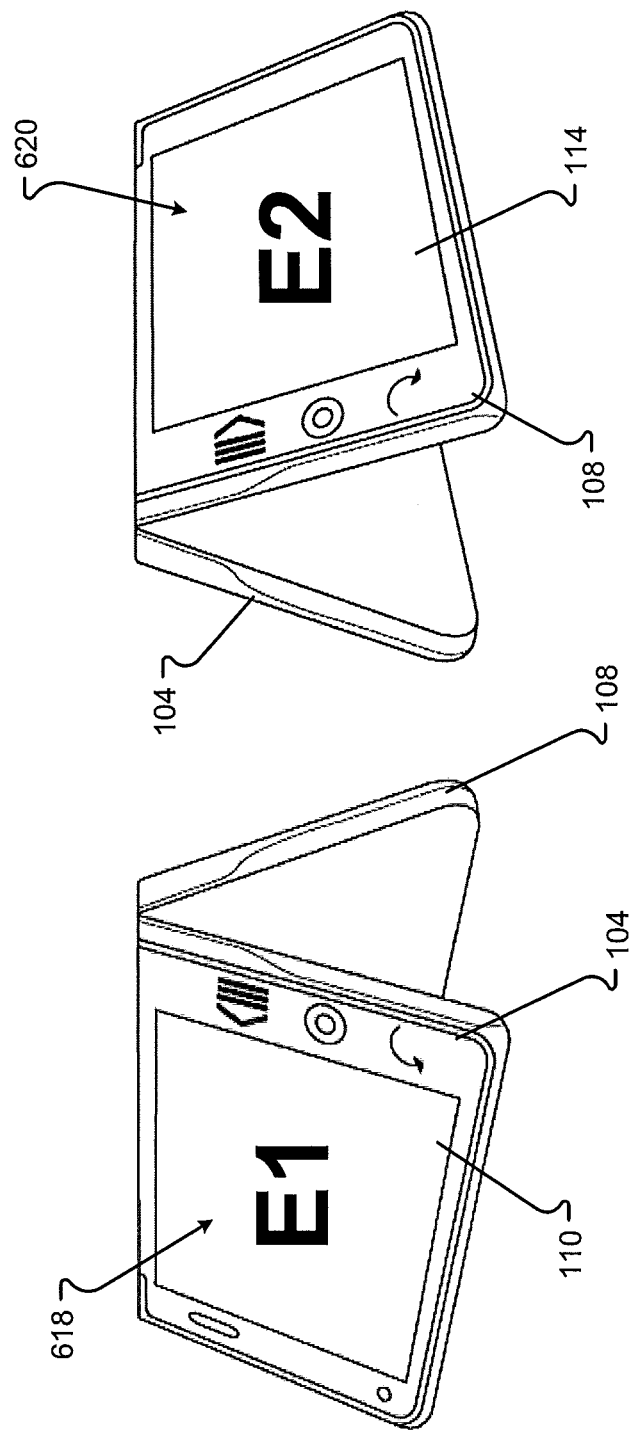

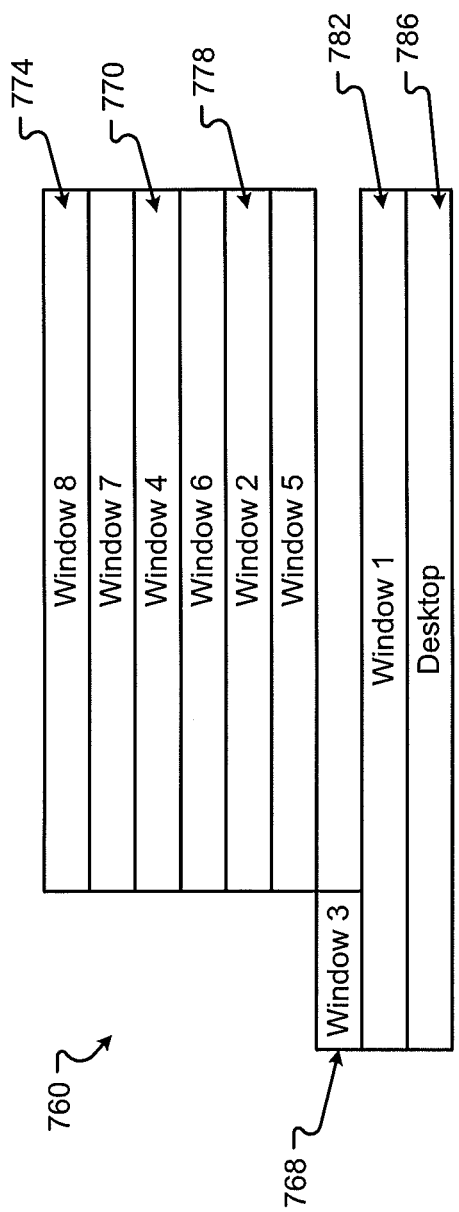
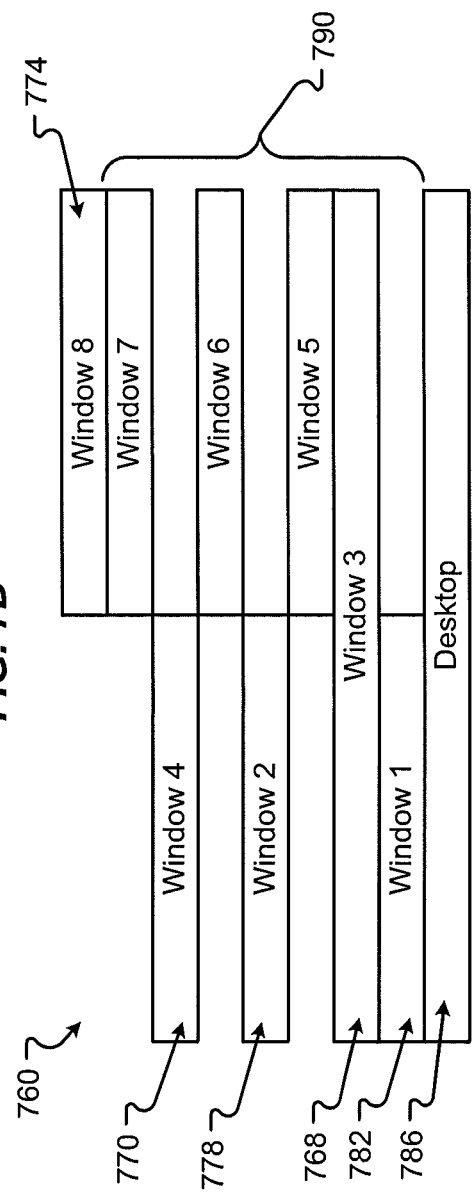

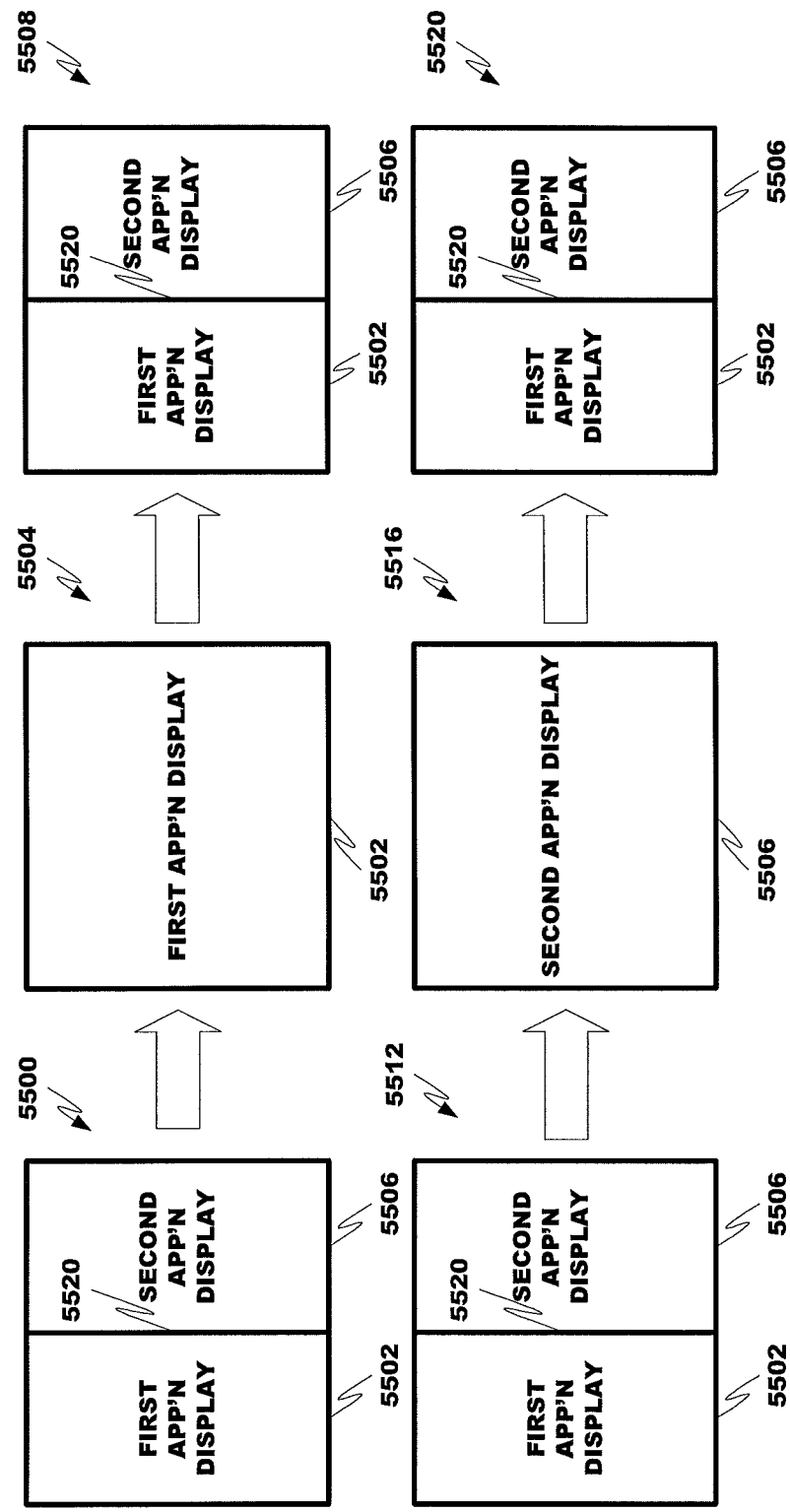
Figs. 55A-F

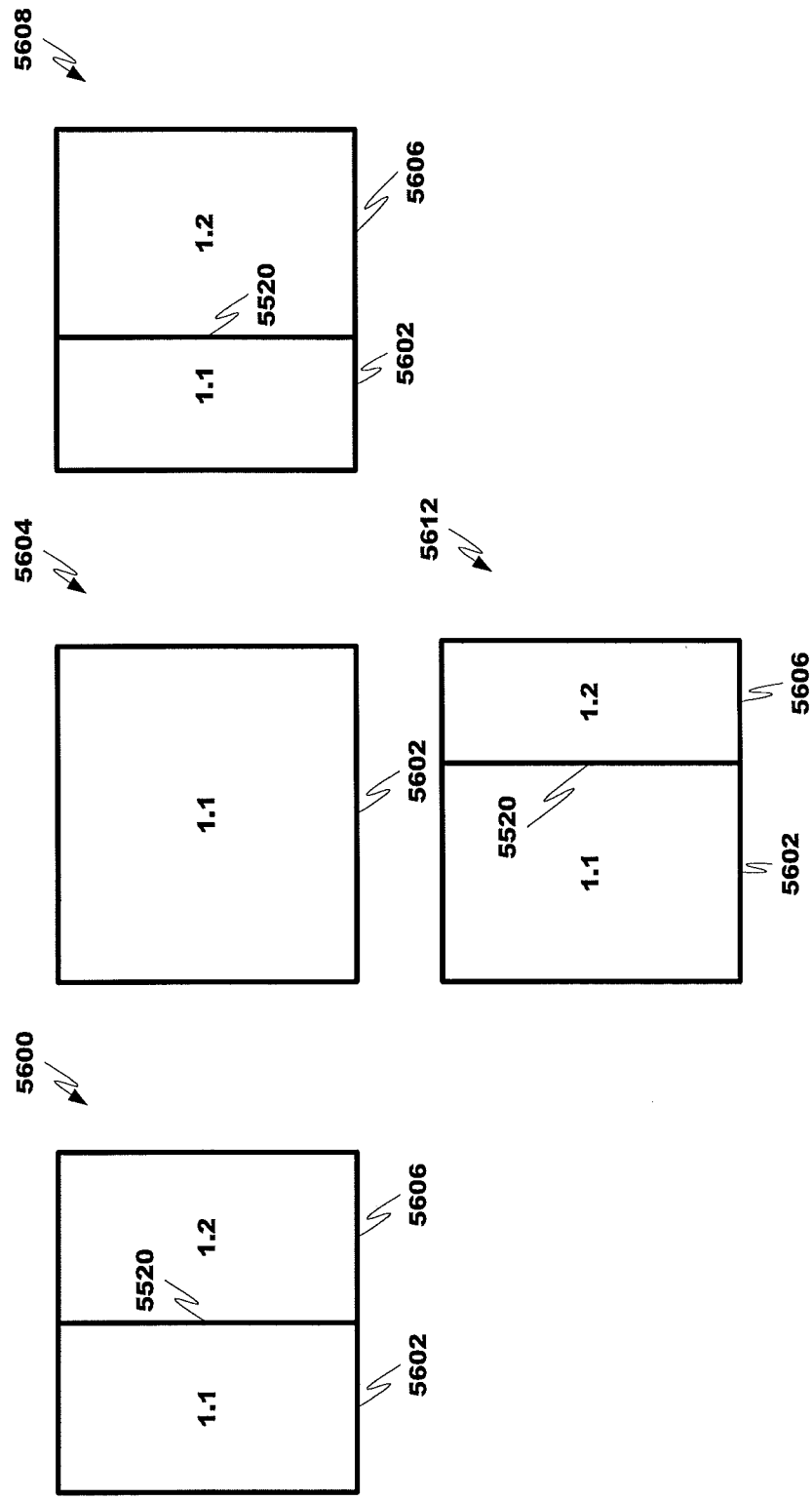
Figs. 56A-D

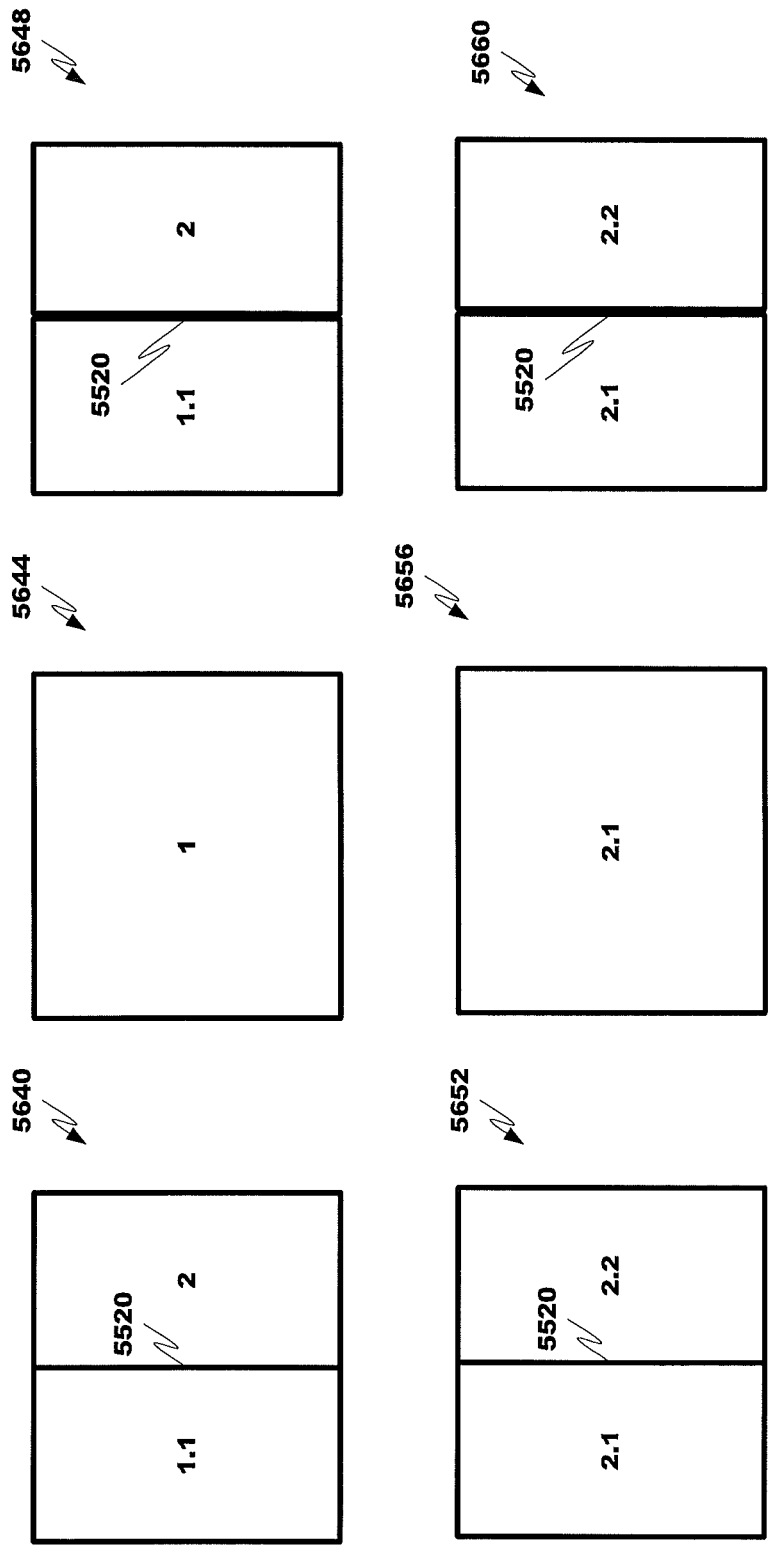
Figs. 56E-J

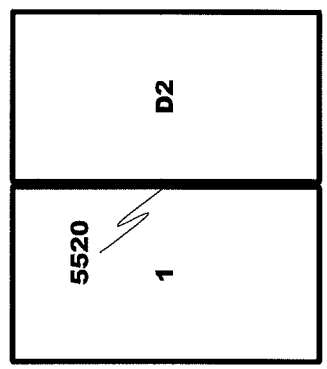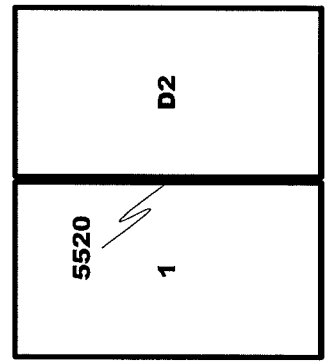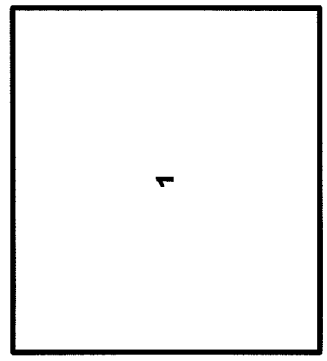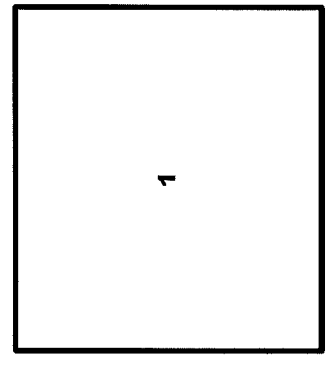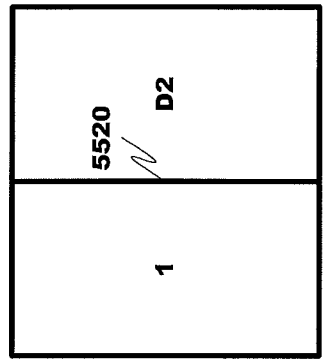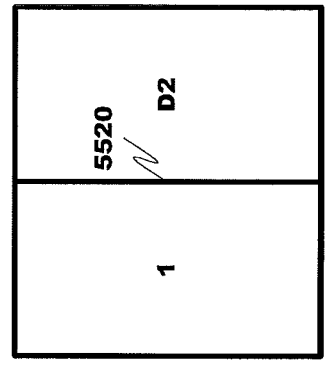
Figs. 56K-P

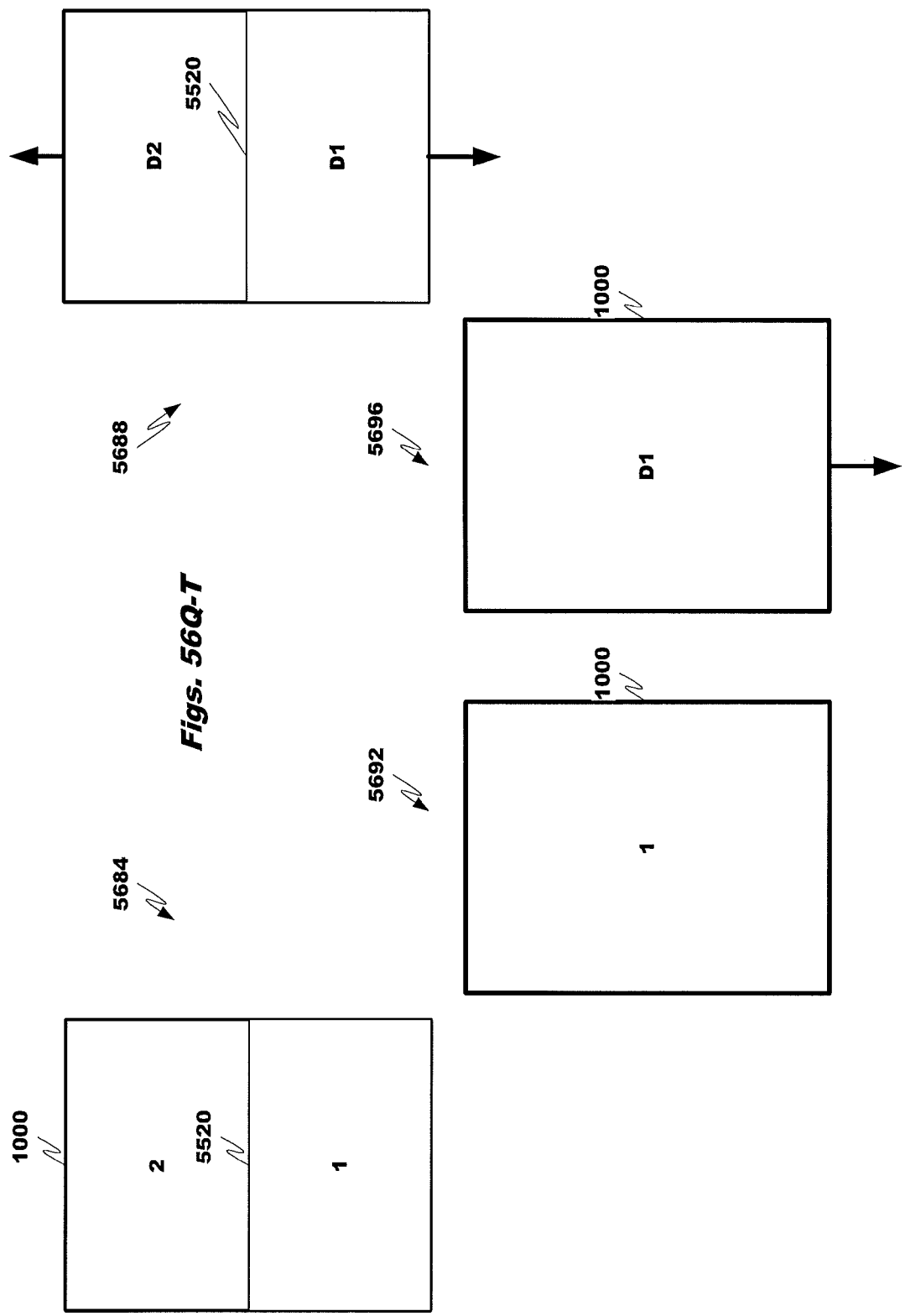

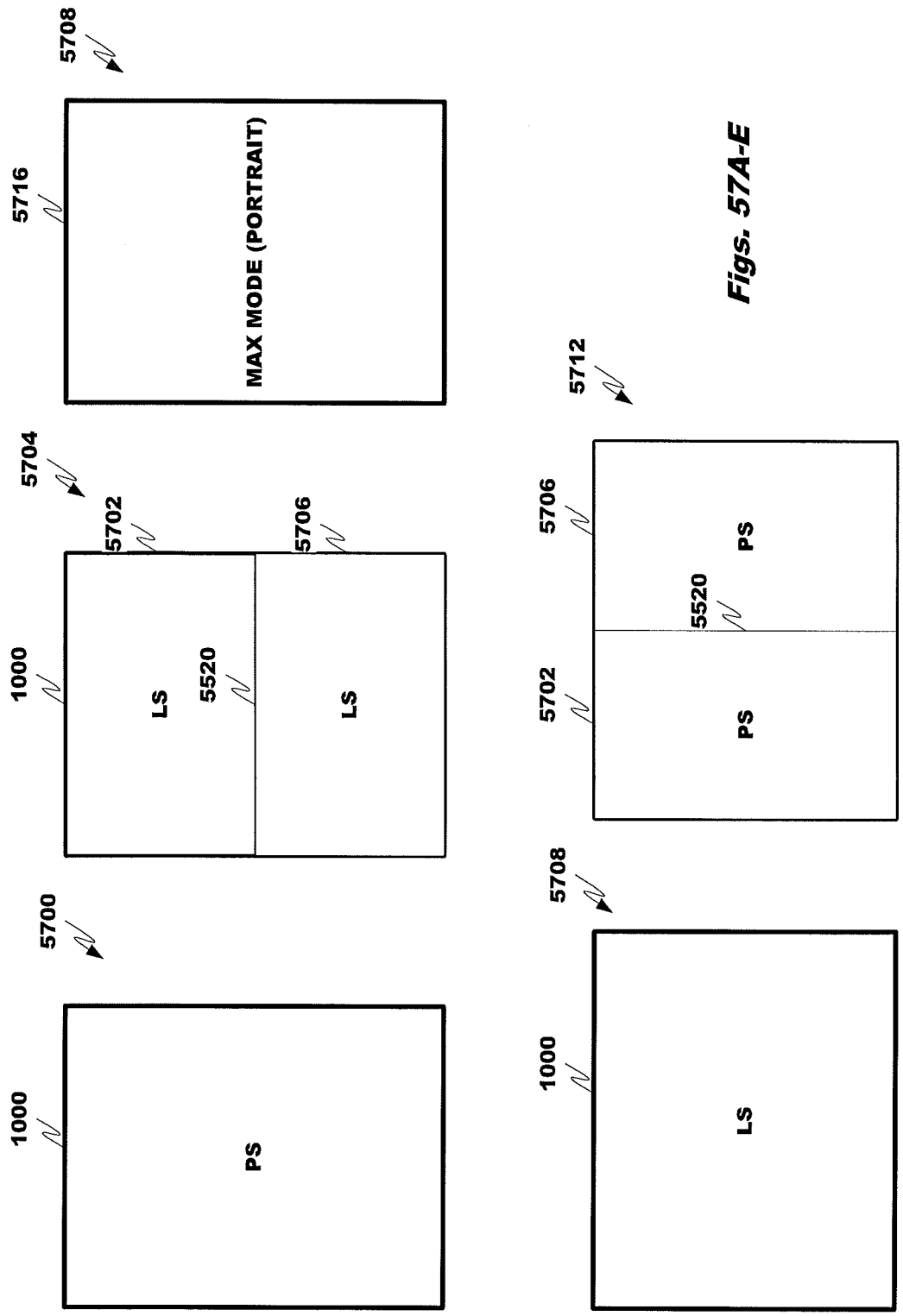
Figs. 57A-E

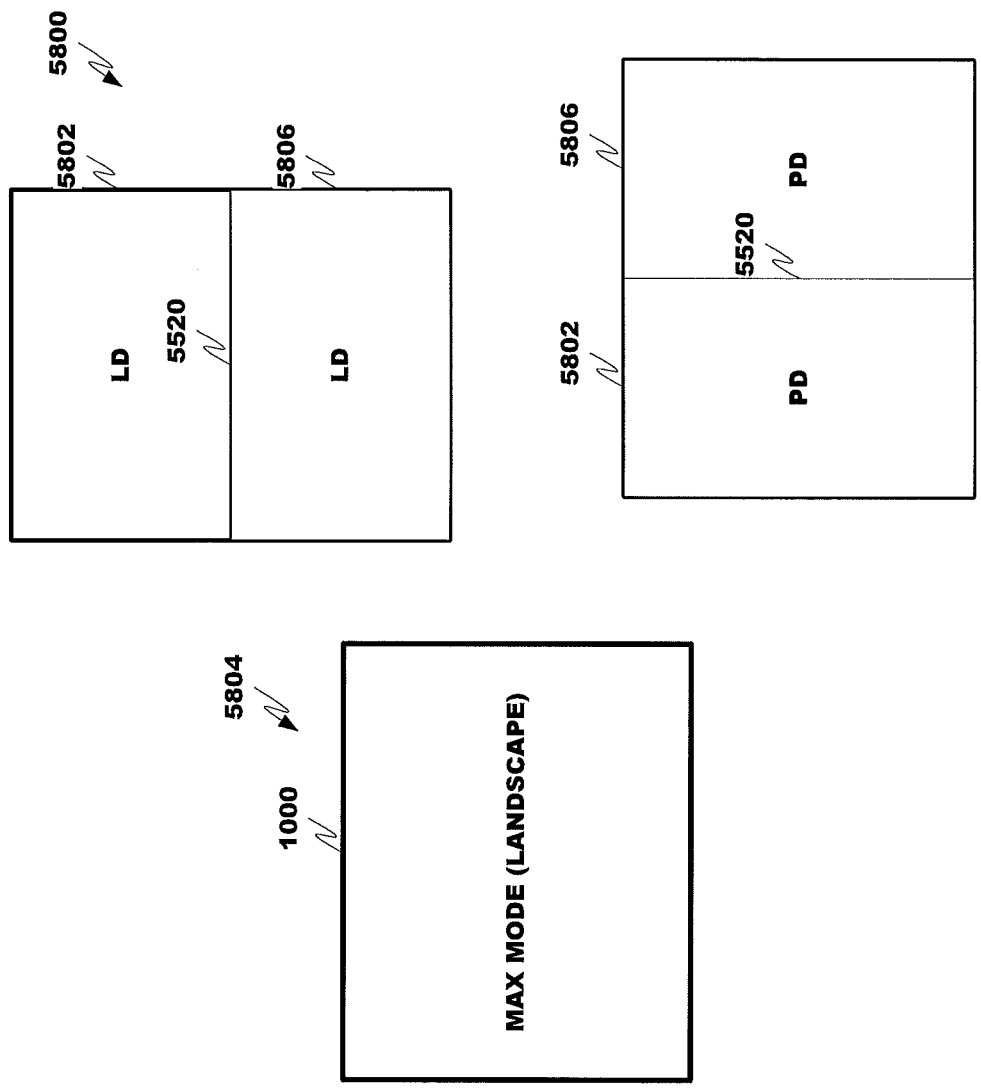

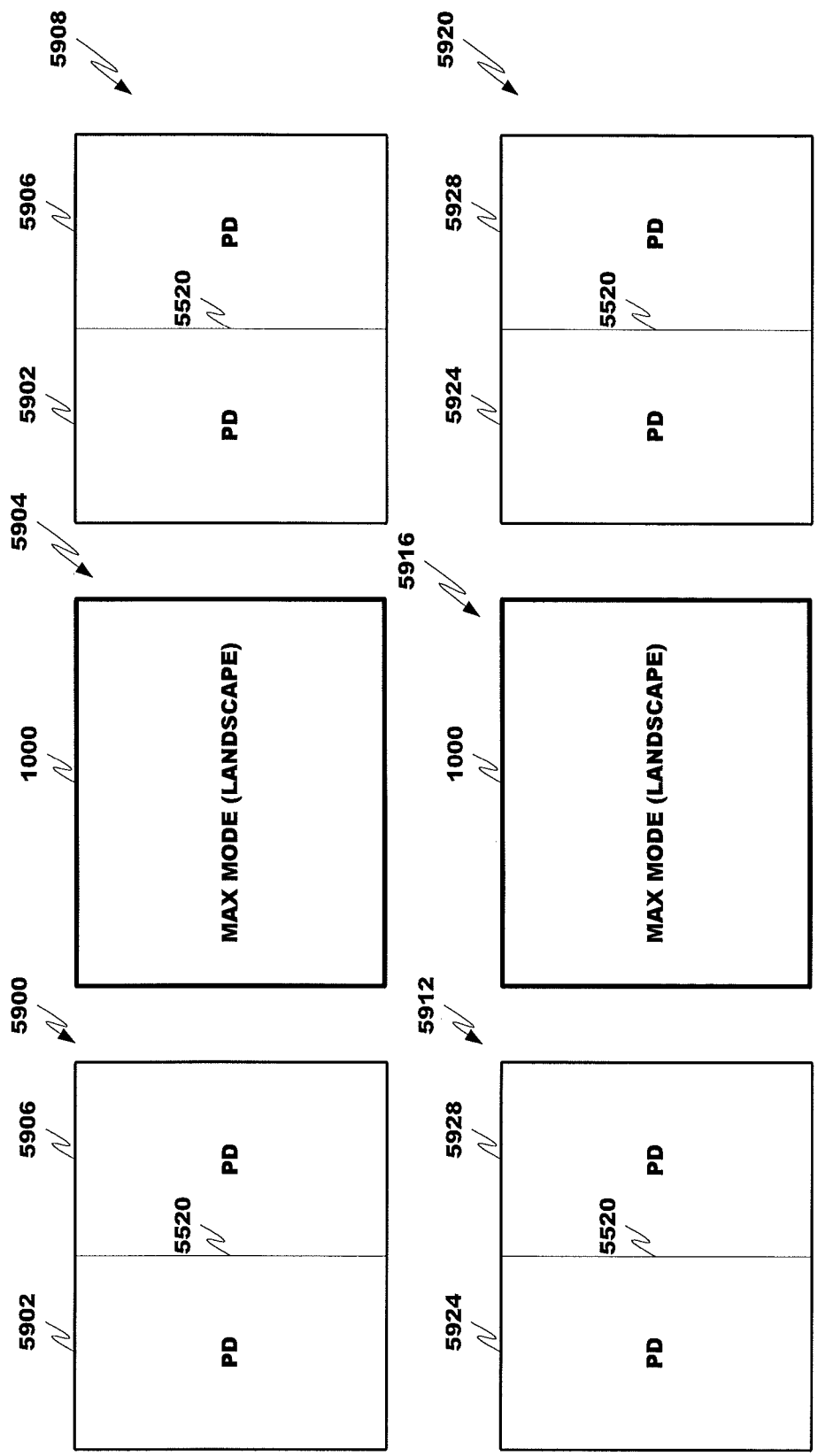
FIGS. 59A-F

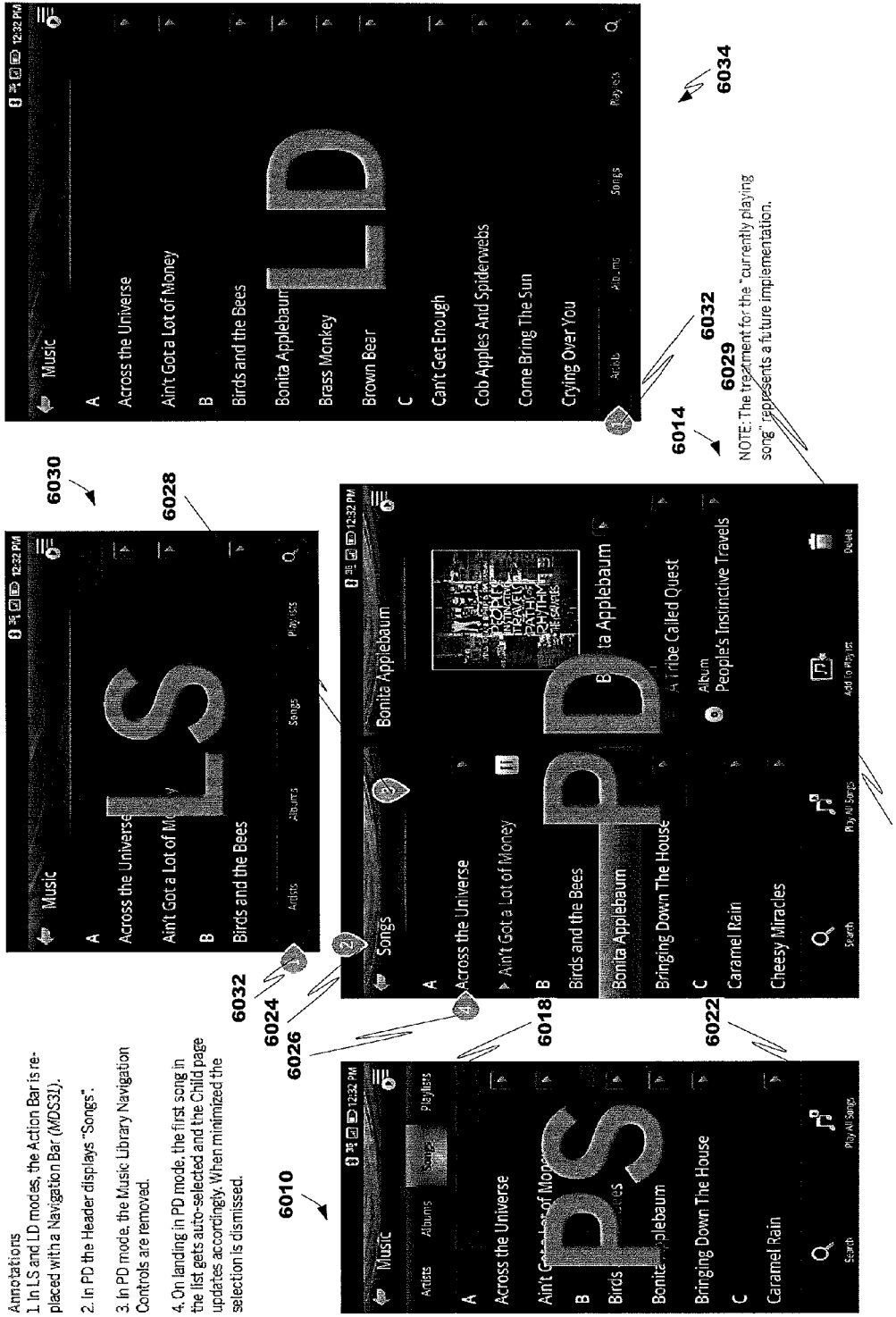
FIG. 60A-D

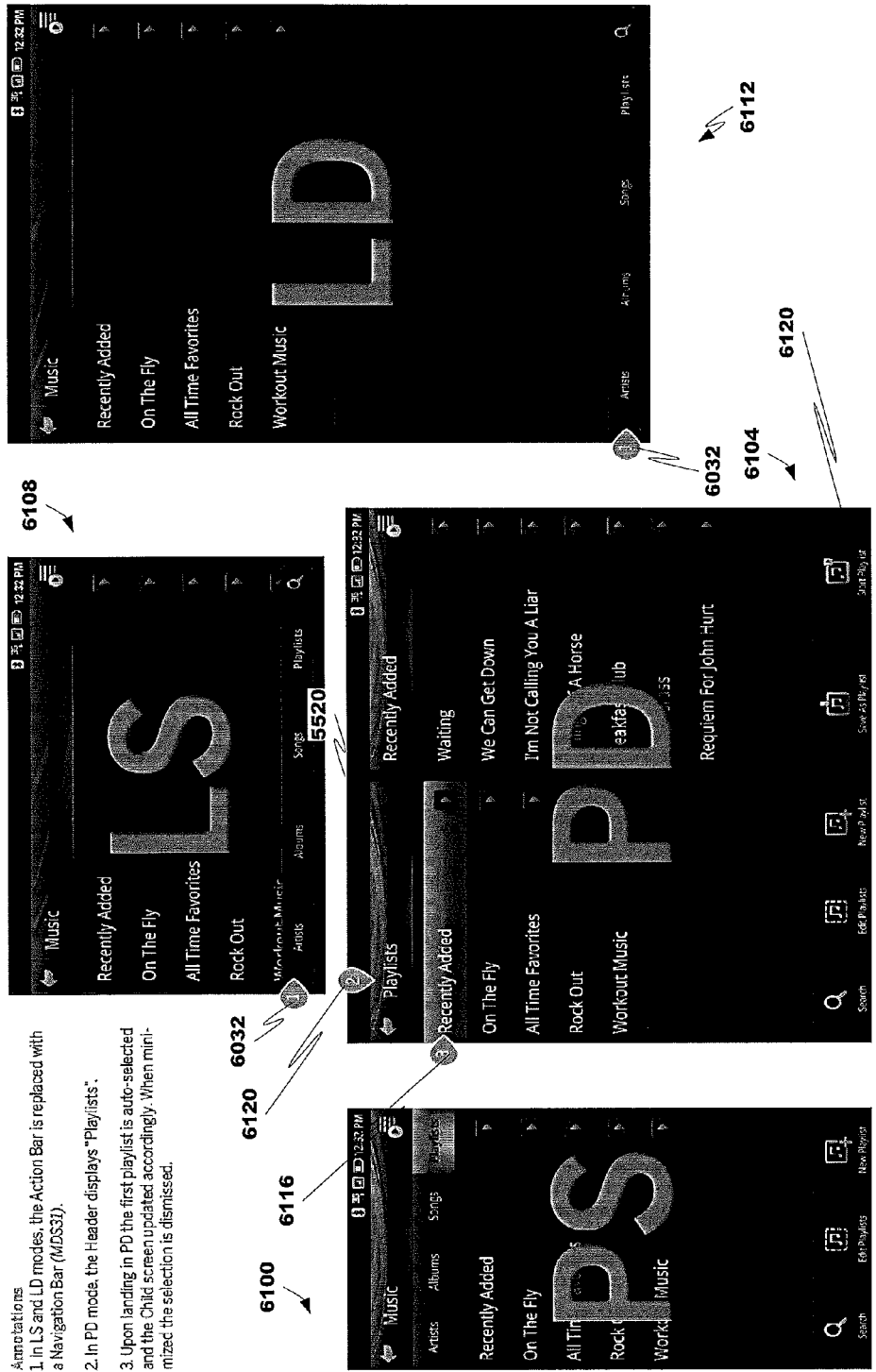
FIG. 61A-D

MESSAGING APPLICATION VIEWS

CROSS REFERENCE TO RELATED APPLICATION

The present application claims the benefits of and priority, under 35 U.S.C. §119(e), to U.S. Provisional Application Ser. No. 61/539,884, filed Sep. 27, 2011, entitled "MOBILE DEVICE," which is incorporated herein by this reference in its entirety for all that it teaches and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other hand, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

In one embodiment, a method is provided that includes: displaying, by a microprocessor on a screen of a wireless communication device, a multi-thread view comprising a plurality of messages of different types and from different sources received by the communication device over a selected time period;

receiving, by the microprocessor and from a user, a selection of a displayed message; and in response, displaying, by the screen in a single thread view, a plurality of messages sent by the user to the source and from the source to the user.

In one configuration, the messages sent by the user are displayed in differently than messages received by the user to distinguish sent messages from received messages.

In one configuration, the displayed sent and received messages differ in one or more of the following respects: color, type of information displayed, font, and displayed message horizontal screen position.

The user selection can be done by many techniques, including contact with a touchscreen, an off-display gesture, and/or rotation of the device to a different orientation relative to a selected point of reference. In one configuration, rotation of the screen from portrait to landscape mode causes selection of the displayed message The messages can be of different types of messages, such as e-mail, voice mail, instant messaging, multimedia messaging service, text chat, and any other electronic communication modalities.

The device can be any type of wireless communication device, such as, for example, a cellular phone, tablet computer such as a smart pad, and laptop.

In one configuration, in the single thread view, the view, in the header area, displays an identification of the source, contact information for the source, and an image of the source and, in the application area, displays, for each message sent by the user and received by the user, at least part of the content of the respective message and a timestamp associated with each message.

In one configuration, in the multi-thread view, each of the displayed messages include an identification of the source, contact information for the source, an image of the source, at least part of the content of the respective message, and a timestamp associated with each message. The present disclosure can provide a number of advantages depending on the particular aspect, embodiment, and/or configuration.

For example, the communication device and smartpad, though having differing numbers of screens, can provide a substantially uniform and intuitive series of views to the user. This can be done by configuring the output of a software application to be that of a multi-screen application or multi-display application to match the capabilities of the graphical user interface of the device.

Additionally, the communication device and smartpad can alter the type and/or content of information displayed depending on screen orientation, thereby enabling a user conveniently to alter displayed content simply by rotating the screen as opposed to using a second hand to select and activate a control button.

Additionally, the communication device and smartpad, by using multi- and single-thread views provide the user with a convenient and useful display of relatively complex and voluminous communication threads.

Additionally, the smartpad could provide additional display area to assist a user with viewing content on the device.

Additionally, power sharing and management functions are available due to, for example, the larger size of the smartpad that could be used for power storage.

Furthermore, the smartpad allows functions of a communications device to be extended to a tablet-like platform and/or form factor.

Even further, the disclosure provides techniques directed toward translating or otherwise converting content for a multi-display device into content for a single screen device.

Moreover, the smartpad provides additional input areas adapted to receive input beyond that of the touchscreen.

Additional advantages are directed toward managing the display of one or more windows associated with one or more applications on a multi-display device on a single display device.

Further advantages are directed toward emulation of multi-display content on a single screen device.

These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "composite display" refers to a logical structure that defines a display that can encompass one or more screens. A "multi-screen composite display" is a display that encompasses multiple screens. A "single-screen composite display" has different displays on a common screen. The composite display can have different display characteristics based on the various orientations of the device.

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The terms "determine", "calculate" and "compute," and variations thereof, as used herein, are used interchangeably and include any type of methodology, process, mathematical operation or technique.

The term "display" refers to one or more portions of one or more screens used to display the output of a computer to a user. A display may refer to all or part of a screen. In one configuration, the display is a single-display screen or a multi-display screen. A single physical screen can include multiple displays that are managed as separate logical displays. Thus, different content can be displayed on the separate displays although part of the same physical screen. In another configuration, the display occupies a single screen or spans multiple screens, referred to as a composite display. A composite display can encompass the touch sensitive displays of one or more screens.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

The term "means" shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

The term "module" as used herein refers to any known or later developed hardware, software, firmware, artificial intelligence, fuzzy logic, or combination of hardware and software that is capable of performing the functionality associated with that element.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "multi-display application" refers to an application that is capable of multiple modes. The multi-display application mode can include, but is not limited to, a single display mode (where the application is displayed on a single display) or a composite display mode (where the application is displayed on two or more displays). A multi-display application can have different layouts optimized for the mode. Thus, the multi-display application can have different layouts for a single display or for a composite display that can encompass two or more displays. The different layouts may have different screen/display dimensions and/or configurations on which the user interfaces of the multi-display applications can be rendered. The different layouts allow the application to optimize the application's user interface for the type of display, e.g., single screen or multiple screens. In single display mode, the multi-display application may present one window pane of information. In a composite display mode, the multi-display application may present multiple window panes of information or may provide a larger and a richer presentation because there is more space for the display contents. The multi-display applications may be designed to adapt dynamically to changes in the device and the mode depending on which display (single or composite) the system assigns to the multi-display application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application may not be capable of the several modes discussed with the multi-screen application.

A "single-display application" refers to an application that is capable of single display mode. Thus, the single-display application can produce only one window and may not be capable of different modes or different display dimensions. A single-display application may not be capable of the several modes discussed with the multi-display application.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "window" refers to a, typically rectangular, displayed image on at least part of a display that contains or provides content different from the rest of the screen. The window may obscure the desktop.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6F is a sixth representation of an embodiment of a device configuration generated in response to the device state;

FIG. 6G is a seventh representation of an embodiment of a device configuration generated in response to the device state;

FIG. 6H is a eighth representation of an embodiment of a device configuration generated in response to the device state;

FIG. 7D is another representation of an embodiment of a logical window stack;

FIG. 7E is another representation of an embodiment of a logical window stack;

FIGS. 55A-F depict various displays according to an embodiment.

FIGS. 56A-T depict various displays according to an embodiment.

FIGS. 57A-E depict various displays according to an embodiment.

FIGS. 58A-C depict various displays according to an embodiment.

FIGS. 59A-F depict various displays according to an embodiment.

FIGS. 60A-D depict various displays according to an embodiment.

FIGS. 61A-D depict various displays according to an embodiment.

Figure 1A:
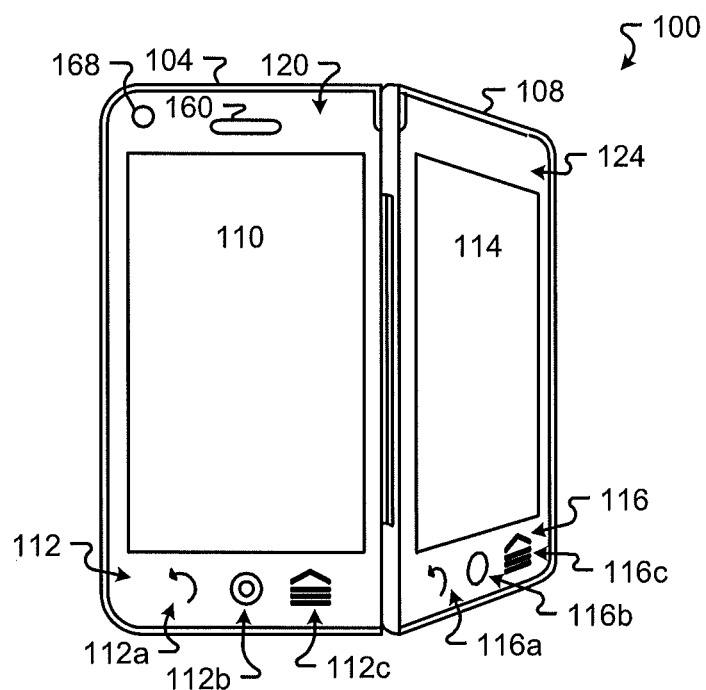
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-c and 116a-c may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
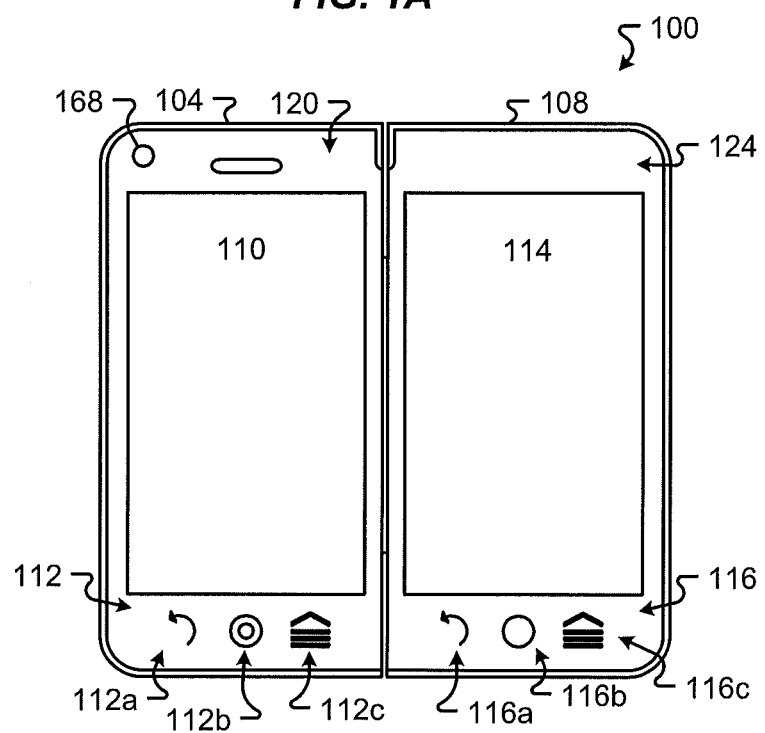
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108 relative to a selected point of reference. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
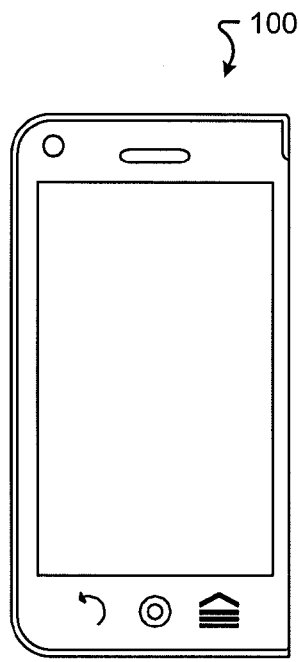
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
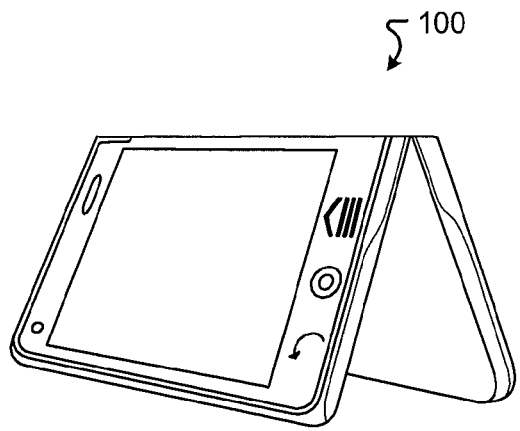
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
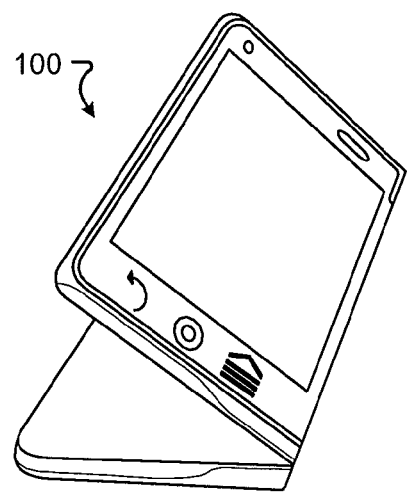
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are non-limiting.

Figure 2:
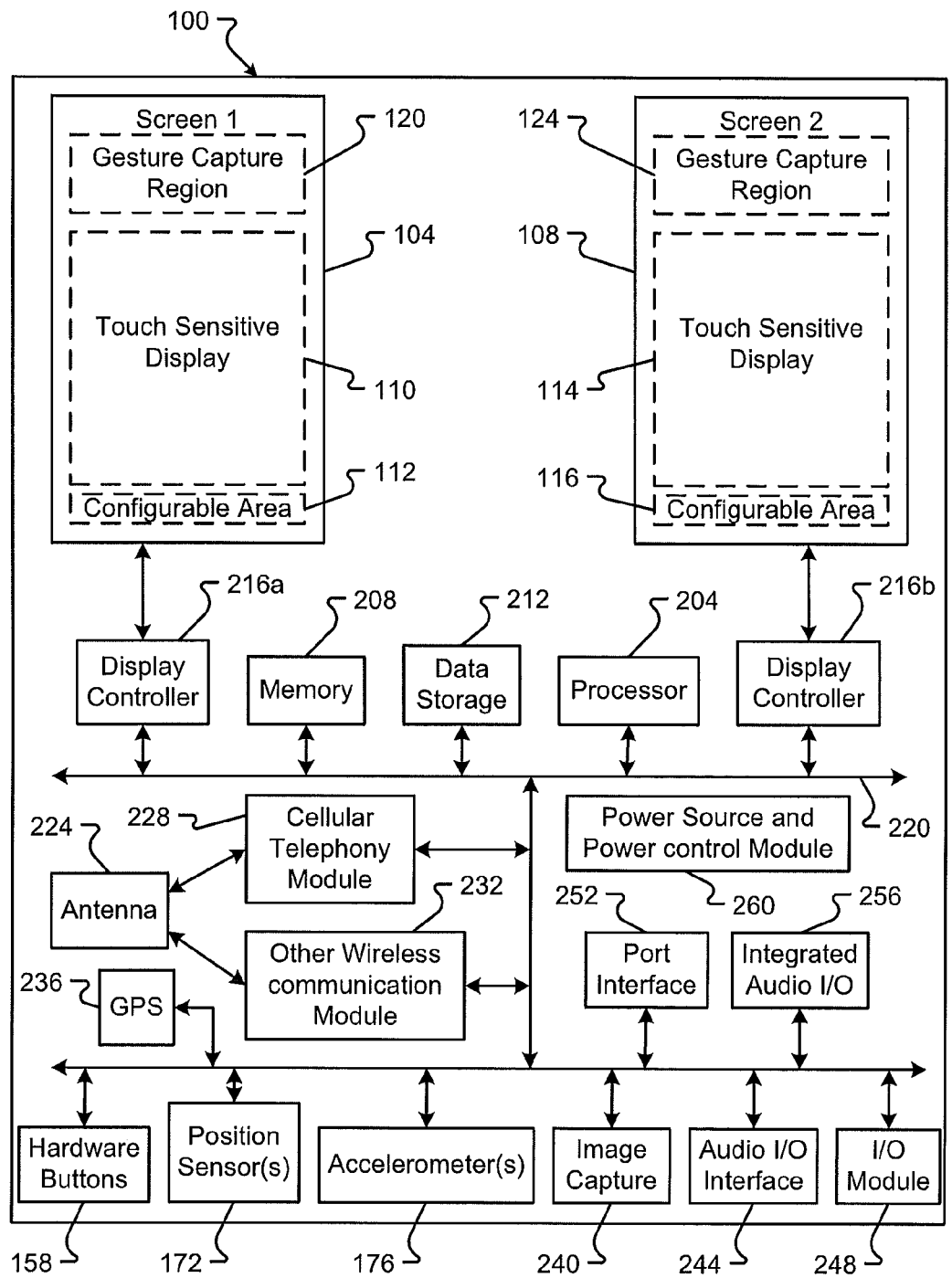
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller may be used to control each of the included touch sensitive screens 104 and 108. In accordance with still other embodiments, the functions of a touch screen controller may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present disclosure, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present disclosure can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
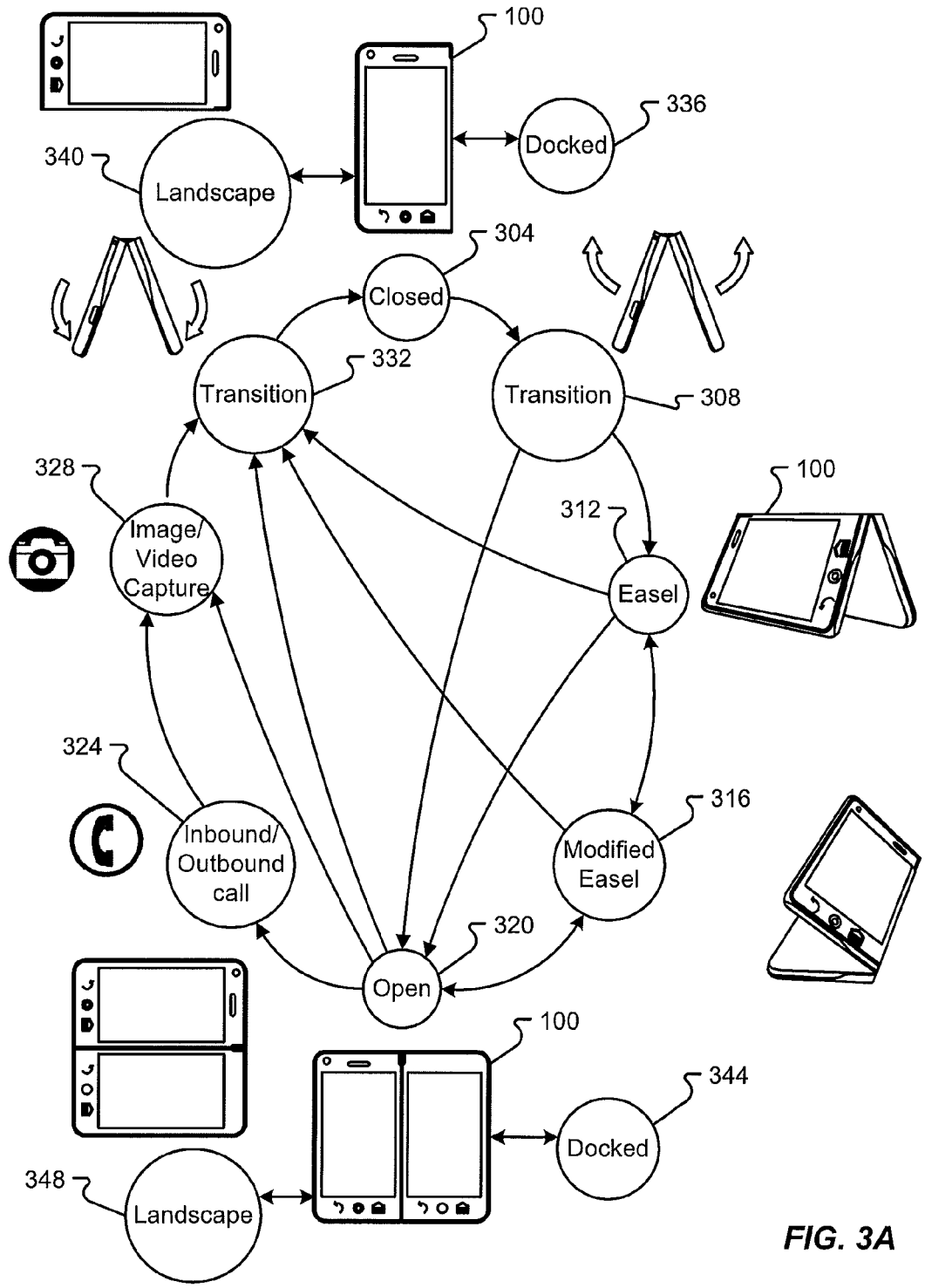
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed but the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 332 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110,114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
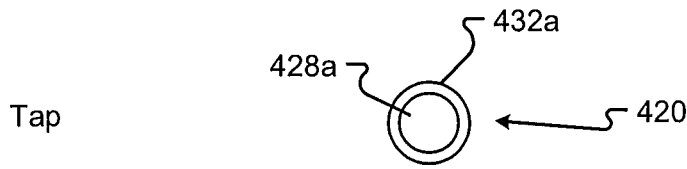
FIG. 4A is a first representation of an embodiment of user gesture received at a device.
Figure 4B:
FIG. 4B is a second representation of an embodiment of user gesture received at a device.
Figure 4C:
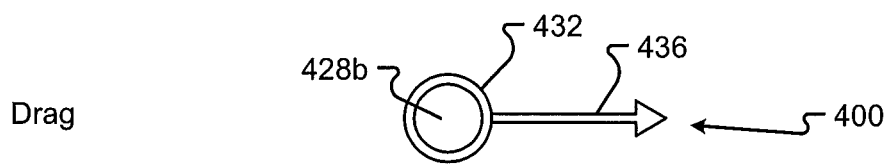
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
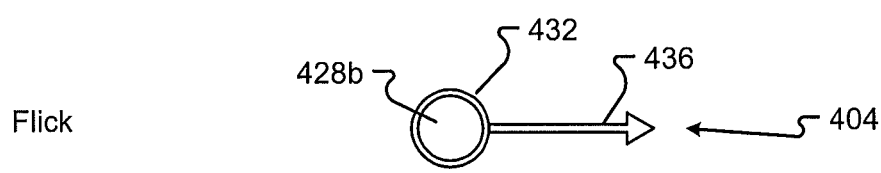
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
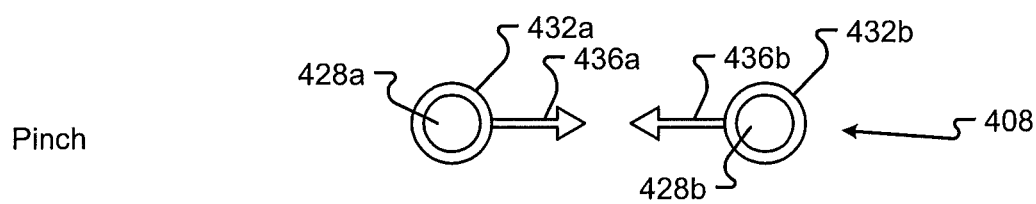
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
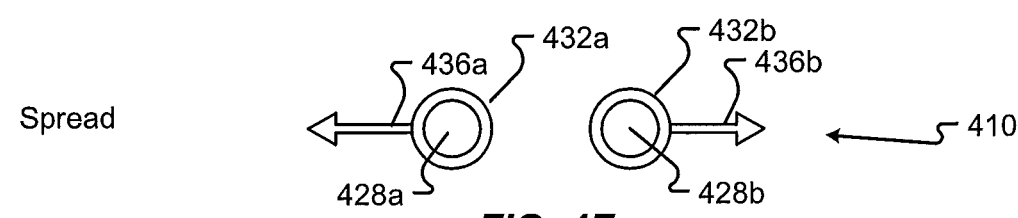
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
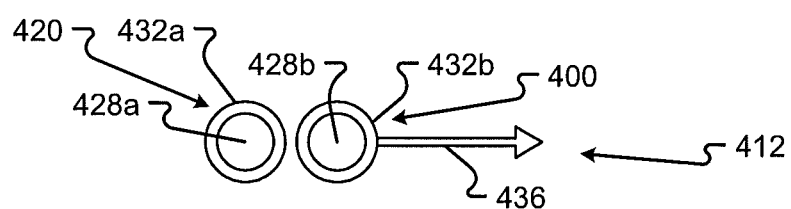
FIG. 4G is a seventh representation of an embodiment of user gesture received at a device.
Figure 4H:
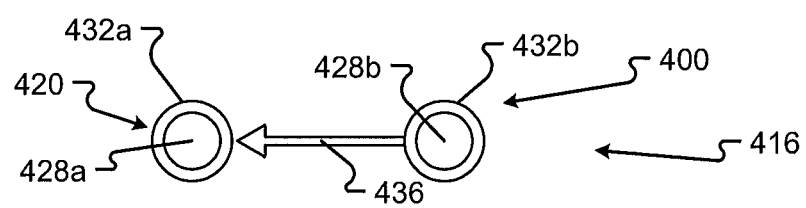
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application (s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event," which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can up-scale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110,114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564, based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
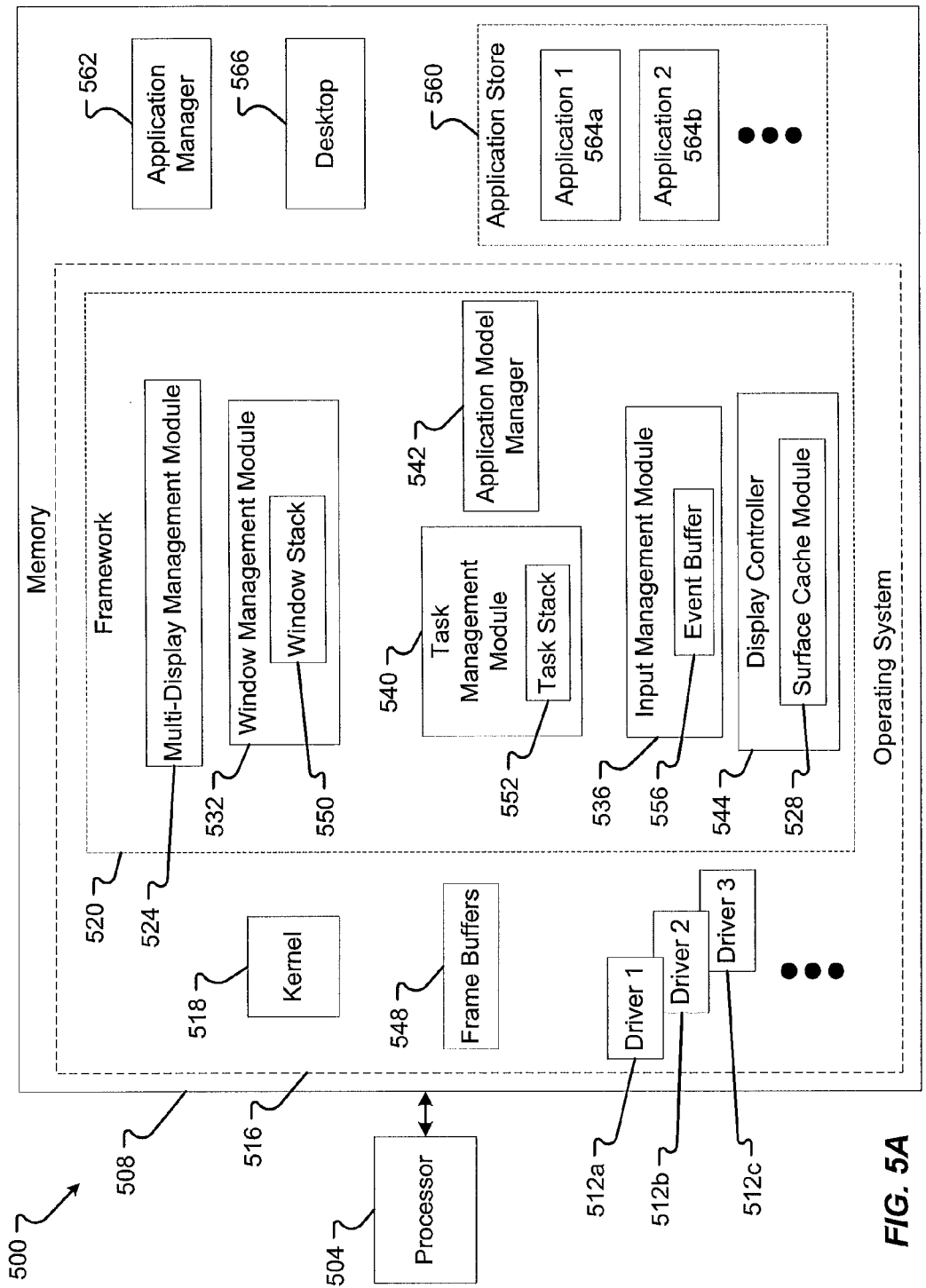
FIG. 5A is a block diagram of an embodiment of the device software and/or firmware.
Figure 5B:
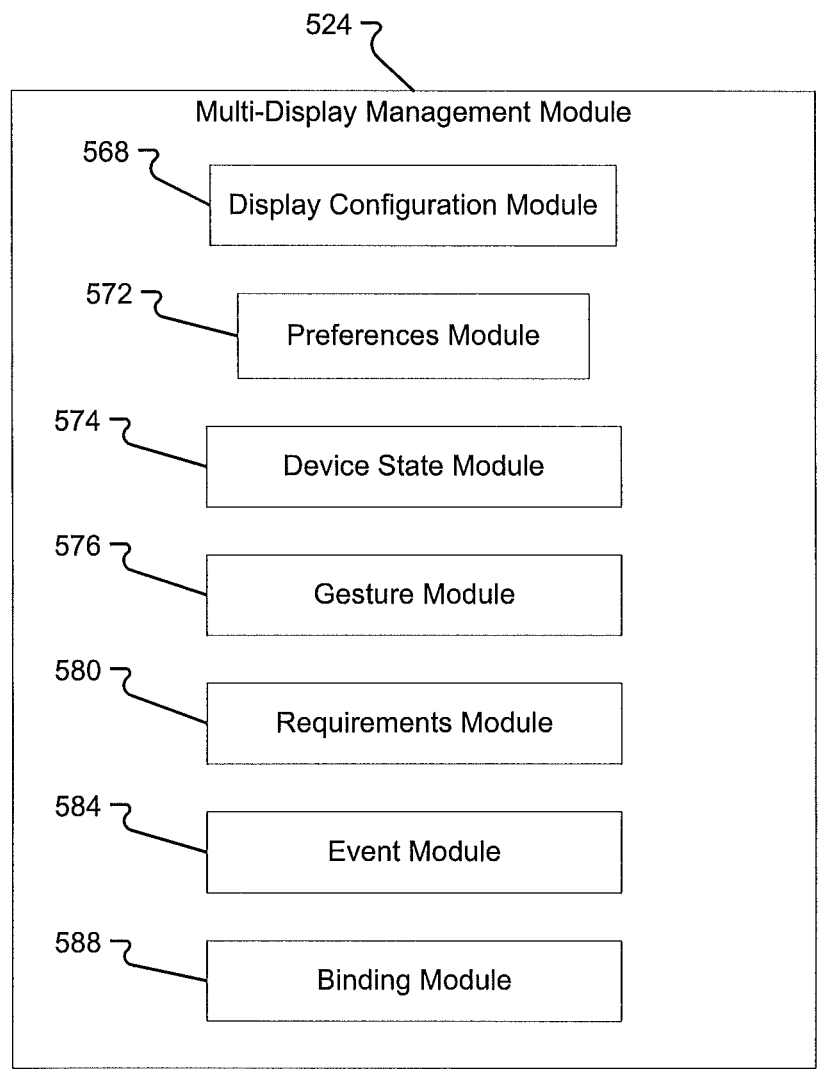
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window (s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
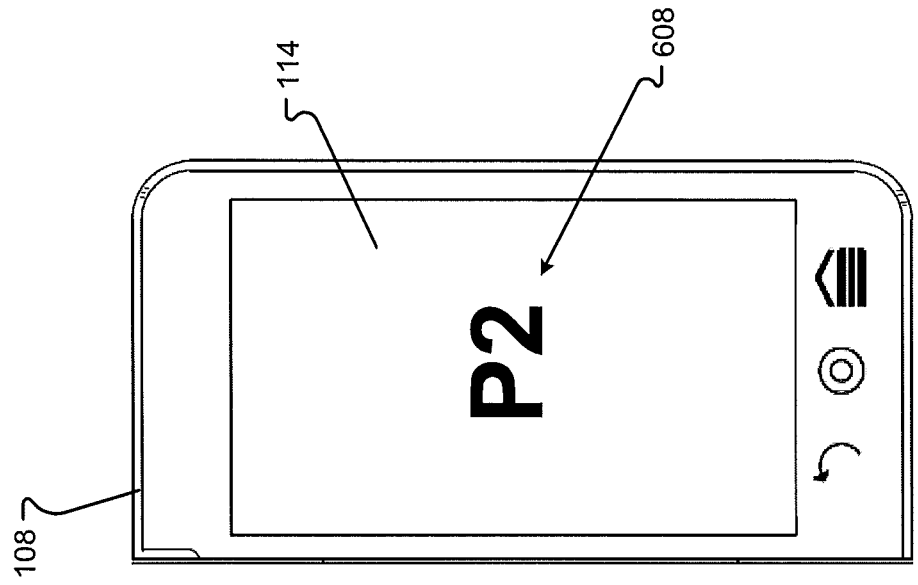
FIG. 6B is a second representation of an embodiment of a device configuration generated in response to the device state.
Figure 6A:
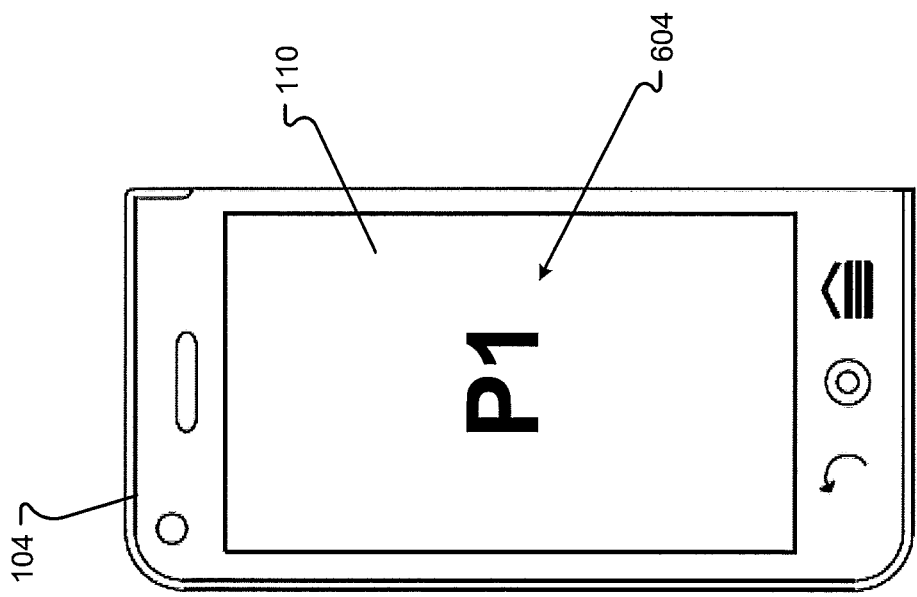
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
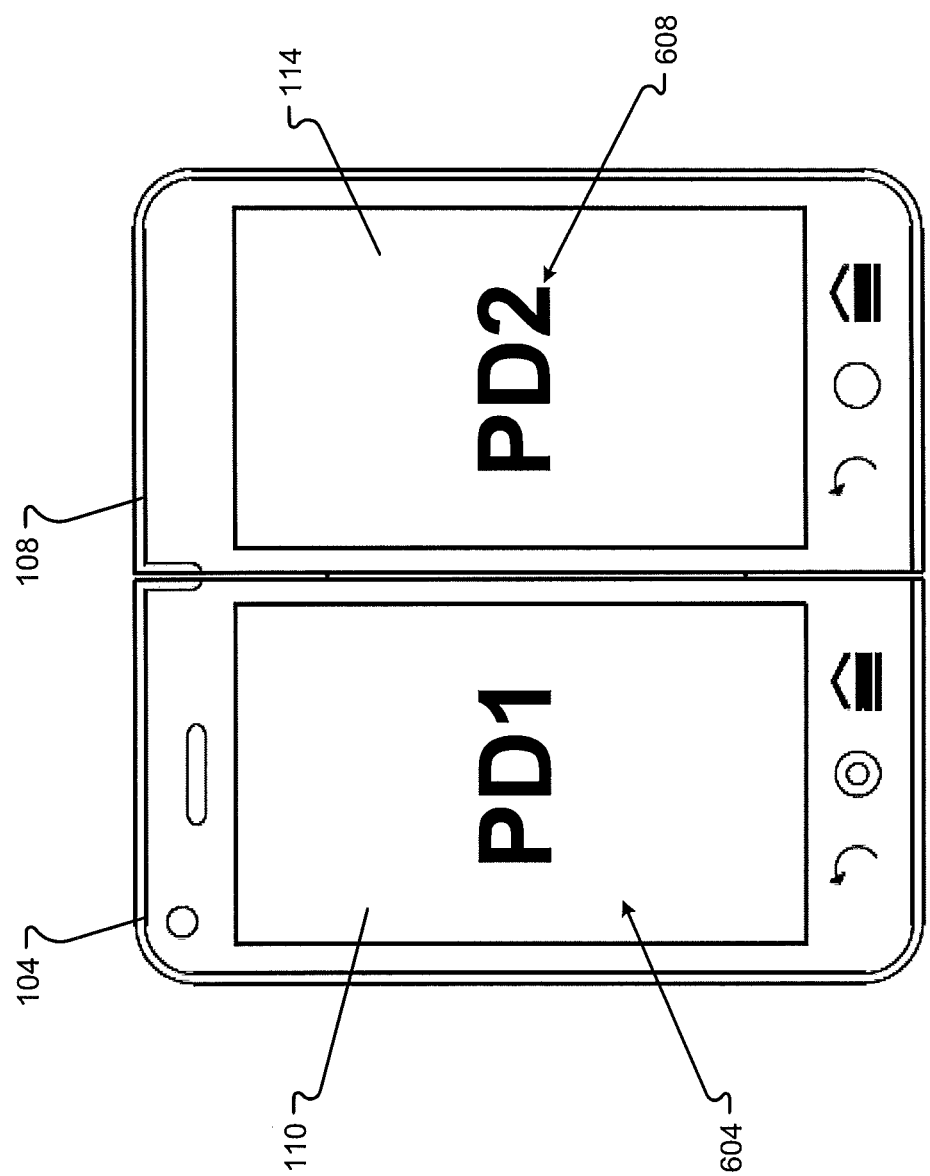
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6E:
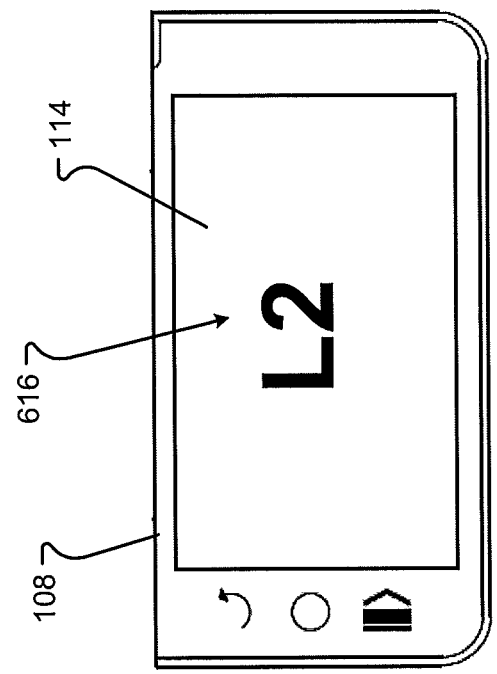
FIG. 6E is a fifth representation of an embodiment of a device configuration generated in response to the device state.
Figure 6D:
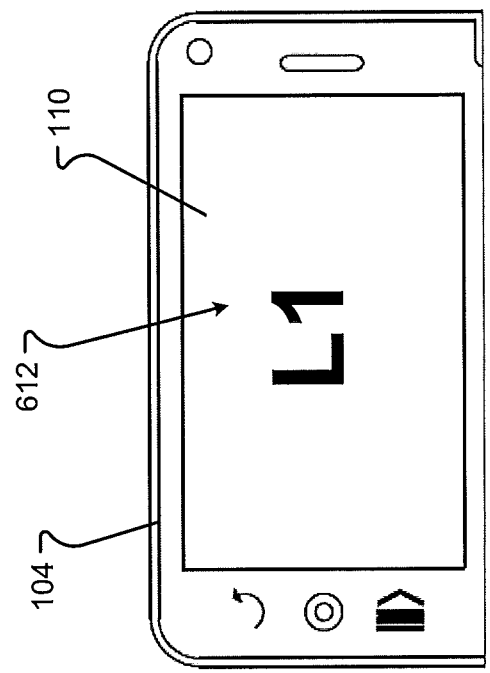
FIG. 6D is a fourth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
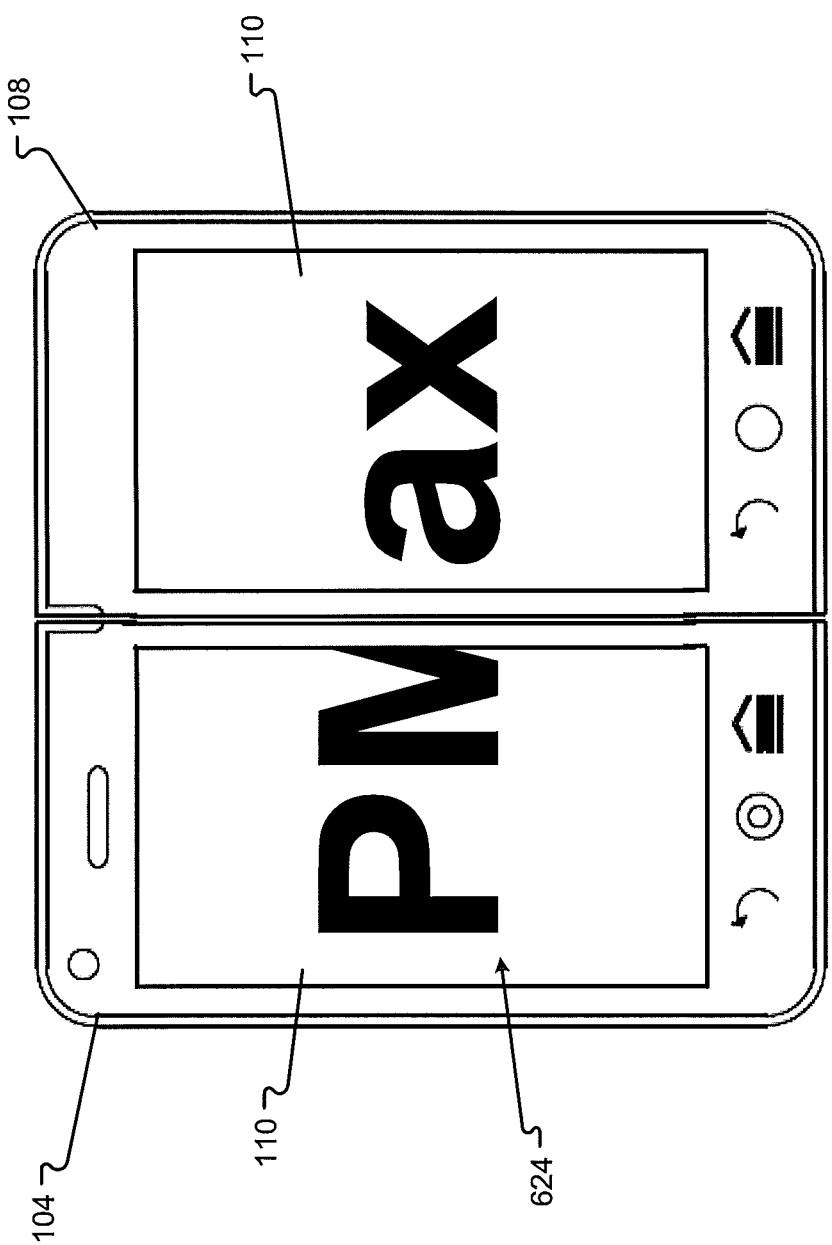
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
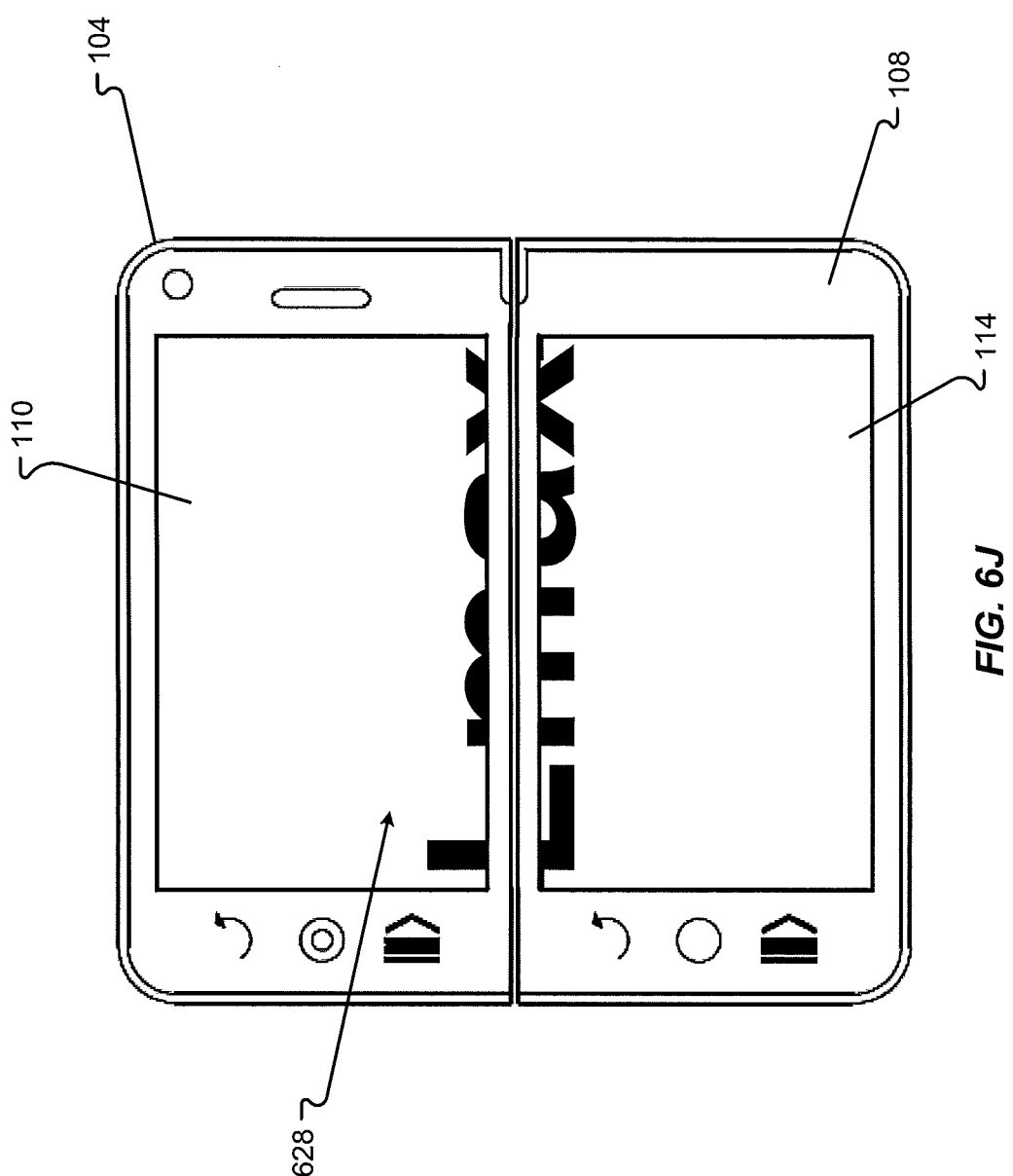
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

Figure 7A:
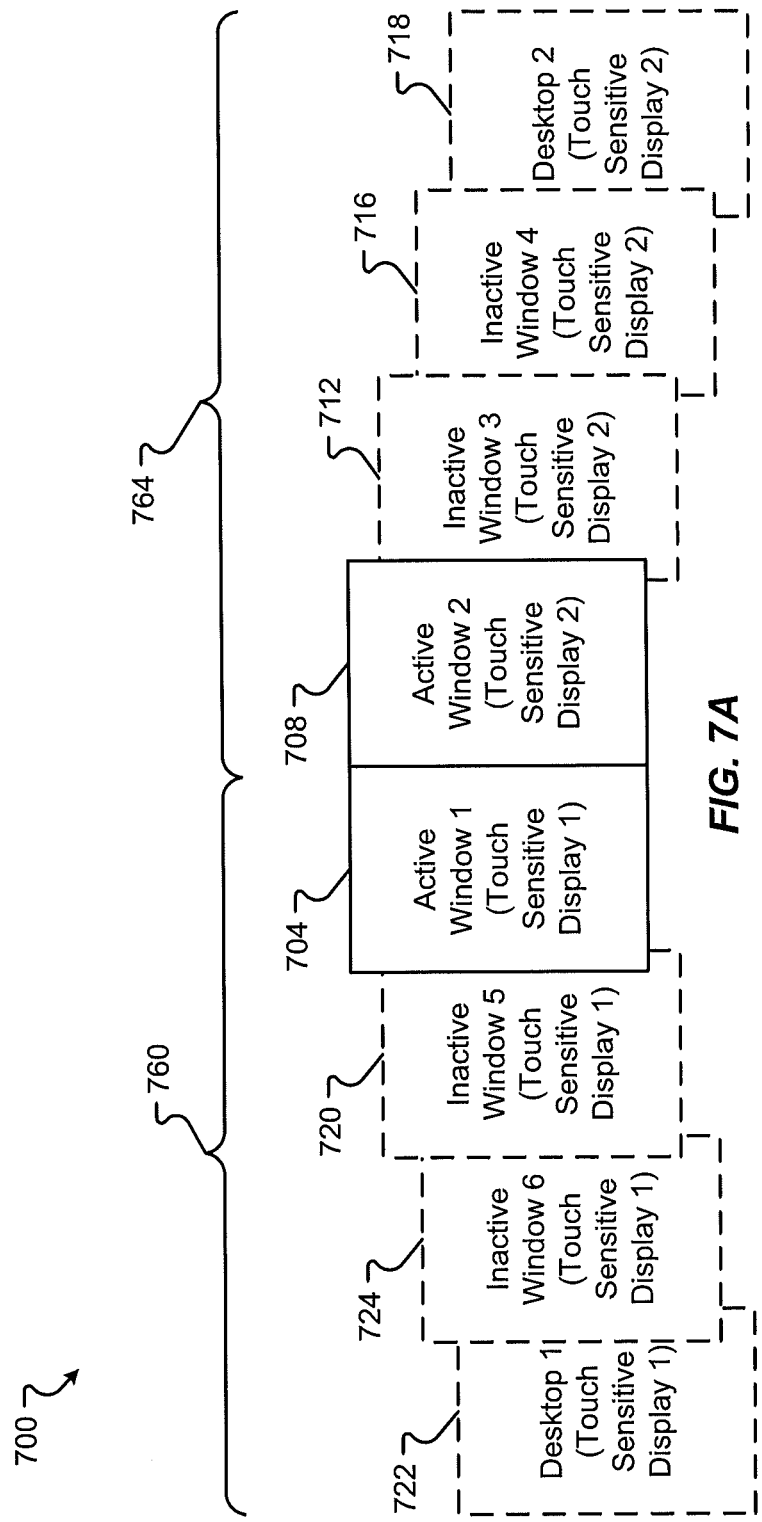
FIG. 7A is representation of a logical window stack.
Figure 7B:
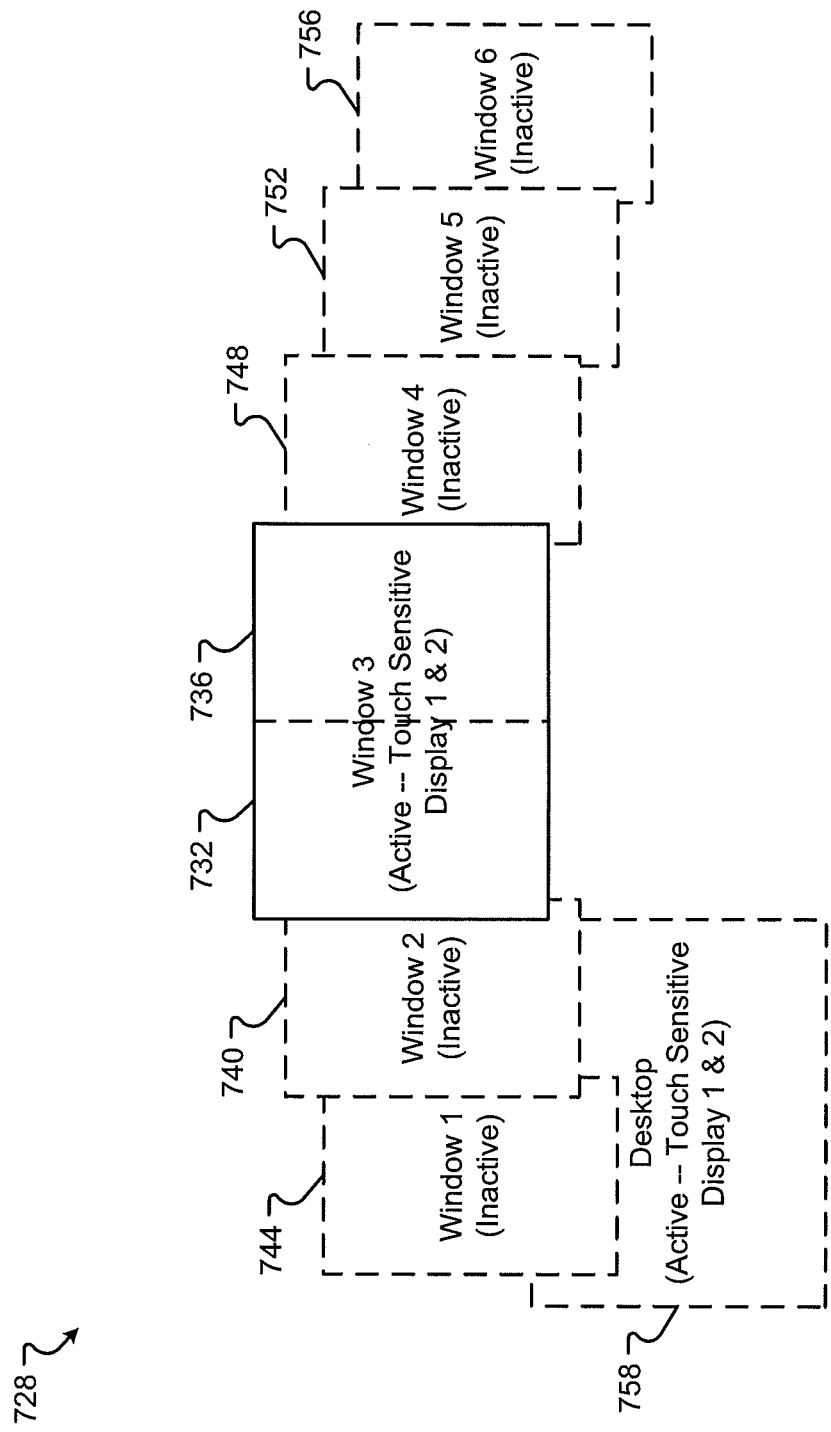
FIG. 7B is another representation of an embodiment of a logical window stack.

The device 100 manages desktops and/or windows with at least one window stack 700, 728, as shown in FIGS. 7A and 7B. A window stack 700, 728 is a logical arrangement of active and/or inactive windows for a multi-screen device. For example, the window stack 700, 728 may be logically similar to a deck of cards, where one or more windows or desktops are arranged in order, as shown in FIGS. 7A and 7B. An active window is a window that is currently being displayed on at least one of the touch sensitive displays 110, 114. For example, windows 104 and 108 are active windows and are displayed on touch sensitive displays 110 and 114. An inactive window is a window that was opened and displayed but is now "behind" an active window and not being displayed. In embodiments, an inactive window may be for an application that is suspended, and thus, the window is not displaying active content. For example, windows 712, 716, 720, and 724 are inactive windows.

A window stack 700, 728 may have various arrangements or organizational structures. In the embodiment shown in FIG. 7A, the device 100 includes a first stack 760 associated with a first touch sensitive display 110 and a second stack associated with a second touch sensitive display 114. Thus, each touch sensitive display 110, 114 can have an associated window stack 760, 764. These two window stacks 760, 764 may have different numbers of windows arranged in the respective stacks 760, 764. Further, the two window stacks 760, 764 can also be identified differently and managed separately. Thus, the first window stack 760 can be arranged in order from a first window 704 to a next window 720 to a last window 724 and finally to a desktop 722, which, in embodiments, is at the "bottom" of the window stack 760. In embodiments, the desktop 722 is not always at the "bottom" as application windows can be arranged in the window stack below the desktop 722, and the desktop 722 can be brought to the "top" of a stack over other windows during a desktop reveal. Likewise, the second stack 764 can be arranged from a first window 708 to a next window 712 to a last window 716, and finally to a desktop 718, which, in embodiments, is a single desktop area, with desktop 722, under all the windows in both window stack 760 and window stack 764. A logical data structure for managing the two window stacks 760, 764 may be as described in conjunction with FIG. 8.

Another arrangement for a window stack 728 is shown in FIG. 7B. In this embodiment, there is a single window stack 728 for both touch sensitive displays 110, 114. Thus, the window stack 728 is arranged from a desktop 758 to a first window 744 to a last window 756. A window can be arranged in a position among all windows without an association to a specific touch sensitive display 110, 114. In this embodiment, a window is in the order of windows. Further, at least one window is identified as being active. For example, a single window may be rendered in two portions 732 and 736 that are displayed on the first touch sensitive screen 110 and the second touch sensitive screen 114. The single window may only occupy a single position in the window stack 728 although it is displayed on both displays 110, 114.

Figure 7C:
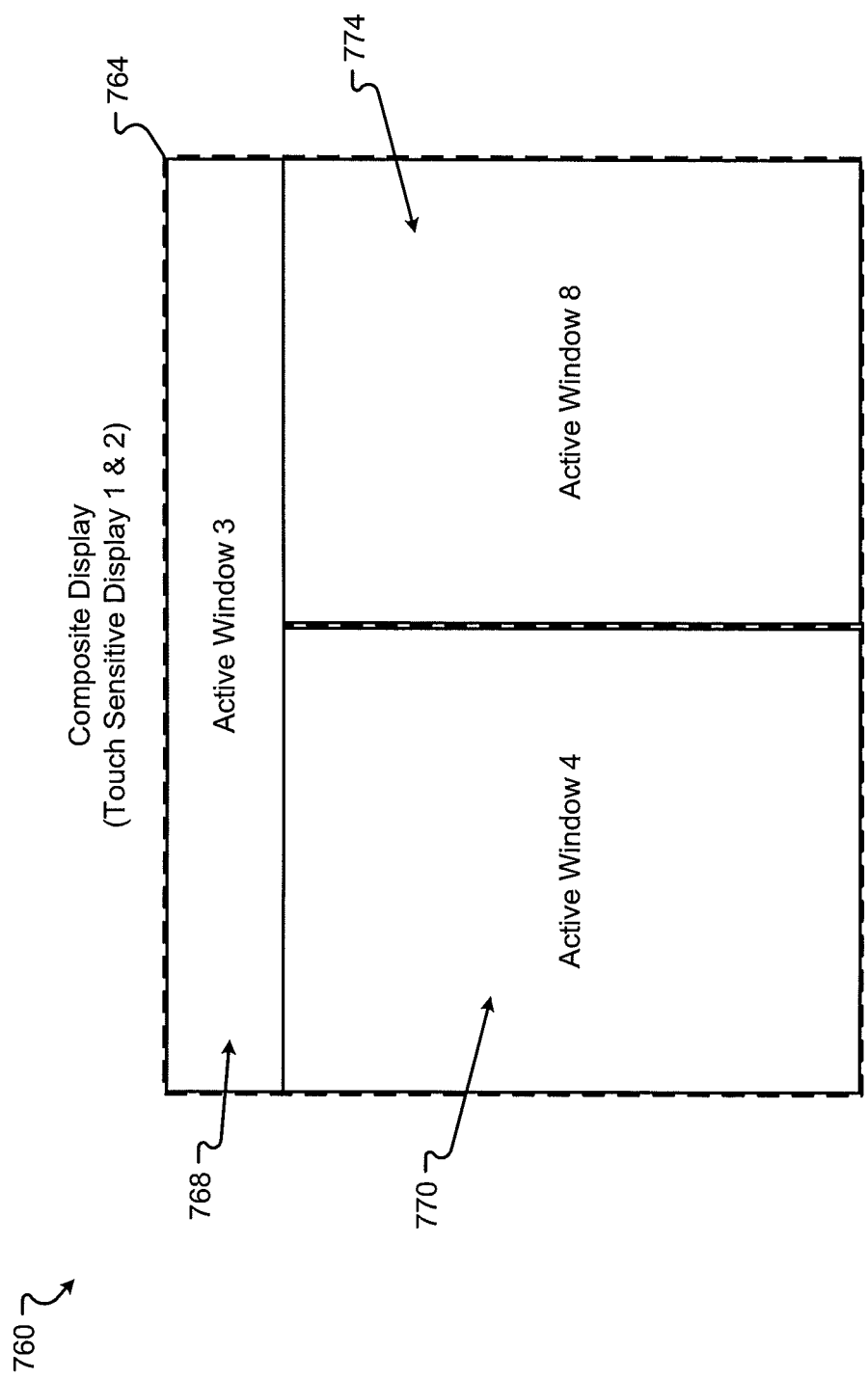
FIG. 7C is another representation of an embodiment of a logical window stack.

Yet another arrangement of a window stack 760 is shown in FIGS. 7C through 7E. The window stack 760 is shown in three "elevation" views. In FIG. 7C, the top of the window stack 760 is shown. Two sides of the window stack 760 are shown in FIGS. 7D and 7E. In this embodiment, the window stack 760 resembles a stack of bricks. The windows are stacked on each other. Looking from the top of the window stack 760 in FIG. 7C, only the top most windows in the window stack 760 are seen in different portions of the composite display 764. The composite display 764 represents a logical model for the entire display area of the device 100, which can include touch sensitive display 110 and touch sensitive display 114. A desktop 786 or a window can occupy part or all of the composite display 764.

In the embodiment shown, the desktop 786 is the lowest display or "brick" in the window stack 760. Thereupon, window 1 782, window 2 782, window 3 768, and window 4 770 are layered. Window 1 782, window 3 768, window 2 782, and window 4 770 only occupy a portion of the composite display 764. Thus, another part of the stack 760 includes window 8 774 and windows 5 through 7 shown in section 790. Only the top window in any portion of the composite display 764 is actually rendered and displayed. Thus, as shown in the top view in FIG. 7C, window 4 770, window 8 774, and window 3 768 are displayed as being at the top of the display in different portions of the window stack 760. A window can be dimensioned to occupy only a portion of the composite display 760 to "reveal" windows lower in the window stack 760. For example, window 3 768 is lower in the stack than both window 4 770 and window 8 774 but is still displayed. A logical data structure to manage the window stack can be as described in conjunction with FIG. 8.

When a new window is opened, the newly activated window is generally positioned at the top of the stack. However, where and how the window is positioned within the stack can be a function of the orientation of the device 100, the context of what programs, functions, software, etc. are being executed on the device 100, how the stack is positioned when the new window is opened, etc. To insert the window in the stack, the position in the stack for the window is determined and the touch sensitive display 110, 114 to which the window is associated may also be determined. With this information, a logical data structure for the window can be created and stored. When user interface or other events or tasks change the arrangement of windows, the window stack(s) can be changed to reflect the change in arrangement. It should be noted that these same concepts described above can be used to manage the one or more desktops for the device 100.

Figure 8:
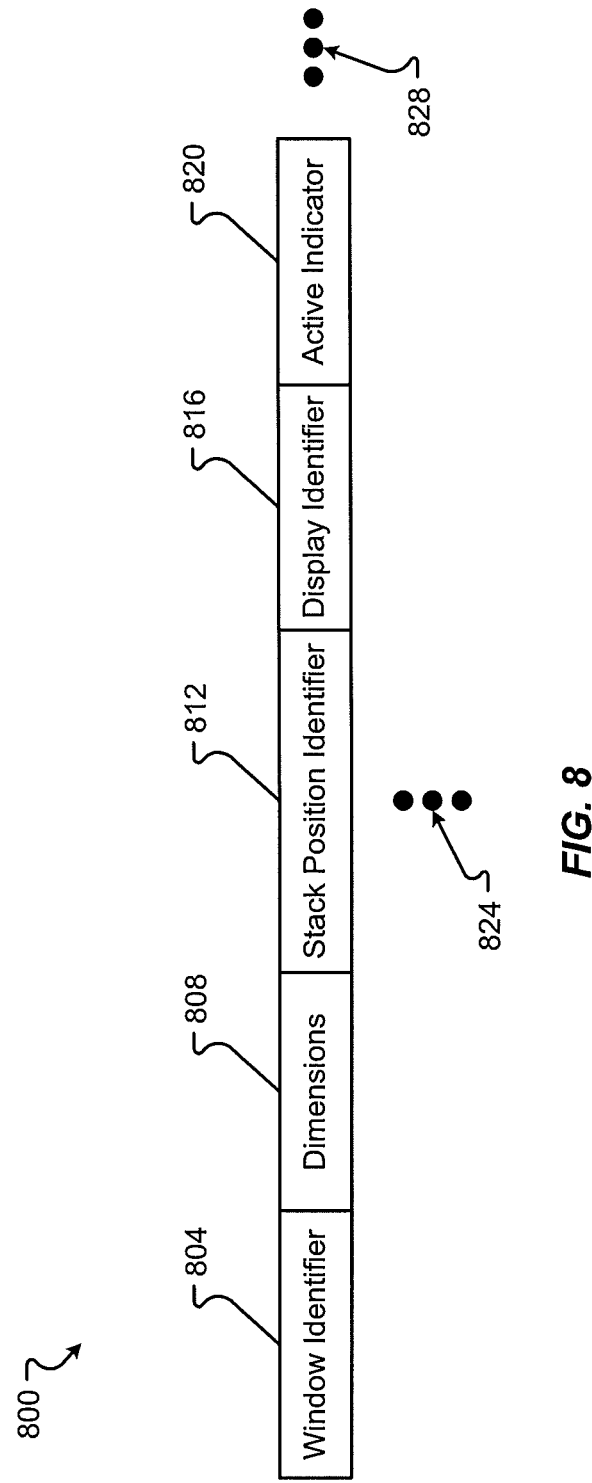
FIG. 8 is block diagram of an embodiment of a logical data structure for a window stack.

A logical data structure 800 for managing the arrangement of windows or desktops in a window stack is shown in FIG. 8. The logical data structure 800 can be any data structure used to store data whether an object, record, file, etc. The logical data structure 800 can be stored in any type of database or data storage system, regardless of protocol or standard. In embodiments, the logical data structure 800 includes one or more portions, fields, attributes, etc. that store data in a logical arrangement that allows for easy storage and retrieval of the information. Hereinafter, these one or more portions, fields, attributes, etc. shall be described simply as fields. The fields can store data for a window identifier 804, dimensions 808, a stack position identifier 812, a display identifier 816, and/or an active indicator 820. Each window in a window stack can have an associated logical data structure 800. While only a single logical data structure 800 is shown in FIG. 8, there may be more or fewer logical data structures 800 used with a window stack (based on the number of windows or desktops in the stack), as represented by ellipses 824. Further, there may be more or fewer fields than those shown in FIG. 8, as represented by ellipses 828.

A window identifier 804 can include any identifier (ID) that uniquely identifies the associated window in relation to other windows in the window stack. The window identifier 804 can be a globally unique identifier (GUID), a numeric ID, an alphanumeric ID, or other type of identifier. In embodiments, the window identifier 804 can be one, two, or any number of digits based on the number of windows that can be opened. In alternative embodiments, the size of the window identifier 804 may change based on the number of windows opened. While the window is open, the window identifier 804 may be static and remain unchanged.

Dimensions 808 can include dimensions for a window in the composite display 760. For example, the dimensions 808 can include coordinates for two or more corners of the window or may include one coordinate and dimensions for the width and height of the window. These dimensions 808 can delineate what portion of the composite display 760 the window may occupy, which may be the entire composite display 760 or only part of composite display 760. For example, window 4 770 may have dimensions 880 that indicate that the window 770 will occupy only part of the display area for composite display 760, as shown in FIGS. 7c through 7E. As windows are moved or inserted in the window stack, the dimensions 808 may change.

A stack position identifier 812 can be any identifier that can identify the position in the stack for the window or may be inferred from the window's control record within a data structure, such as a list or a stack. The stack position identifier 812 can be a GUID, a numeric ID, an alphanumeric ID, or other type of identifier. Each window or desktop can include a stack position identifier 812. For example, as shown in FIG. 7A, window 1 704 in stack 1 760 can have a stack position identifier 812 of 1 identifying that window 704 is the first window in the stack 760 and the active window. Similarly, window 6 724 can have a stack position identifier 812 of 3 representing that window 724 is the third window in the stack 760. Window 2 708 can also have a stack position identifier 812 of 1 representing that window 708 is the first window in the second stack 764. As shown in FIG. 7B, window 1 744 can have a stack position identifier 812 of 1, window 3, rendered in portions 732 and 736, can have a stack position identifier 812 of 3, and window 6 756 can have a stack position identifier 812 of 6. Thus, depending on the type of stack, the stack position identifier 812 can represent a window's location in the stack.

A display identifier 816 can identify that the window or desktop is associated with a particular display, such as the first display 110 or the second display 114, or the composite display 760 composed of both displays. While this display identifier 816 may not be needed for a multi-stack system, as shown in FIG. 7A, the display identifier 816 can indicate whether a window in the serial stack of FIG. 7B is displayed on a particular display. Thus, window 3 may have two portions 732 and 736 in FIG. 7B. The first portion 732 may have a display identifier 816 for the first display while the second portion 736 may have a display identifier 816 for the second display 114. However, in alternative embodiments, the window may have two display identifier 816 that represent that the window is displayed on both of the displays 110, 114, or a display identifier 816 identifying the composite display. In another alternate embodiment, the window may have a single display identifier 816 to represent that the window is displayed on both of the displays 110, 114.

Similar to the display identifier 816, an active indicator 820 may not be needed with the dual stack system of FIG. 7A, as the window in stack position 1 is active and displayed. In the system of FIG. 7B, the active indicator 820 can indicate which window(s) in the stack is being displayed. Thus, window 3 may have two portions 732 and 736 in FIG. 7. The first portion 732 may have an active indicator 820 while the second portion 736 may also have an active indicator 820. However, in alternative embodiments, window 3 may have a single active indicator 820. The active indicator 820 can be a simple flag or bit that represents that the window is active or displayed.

Figure 9:
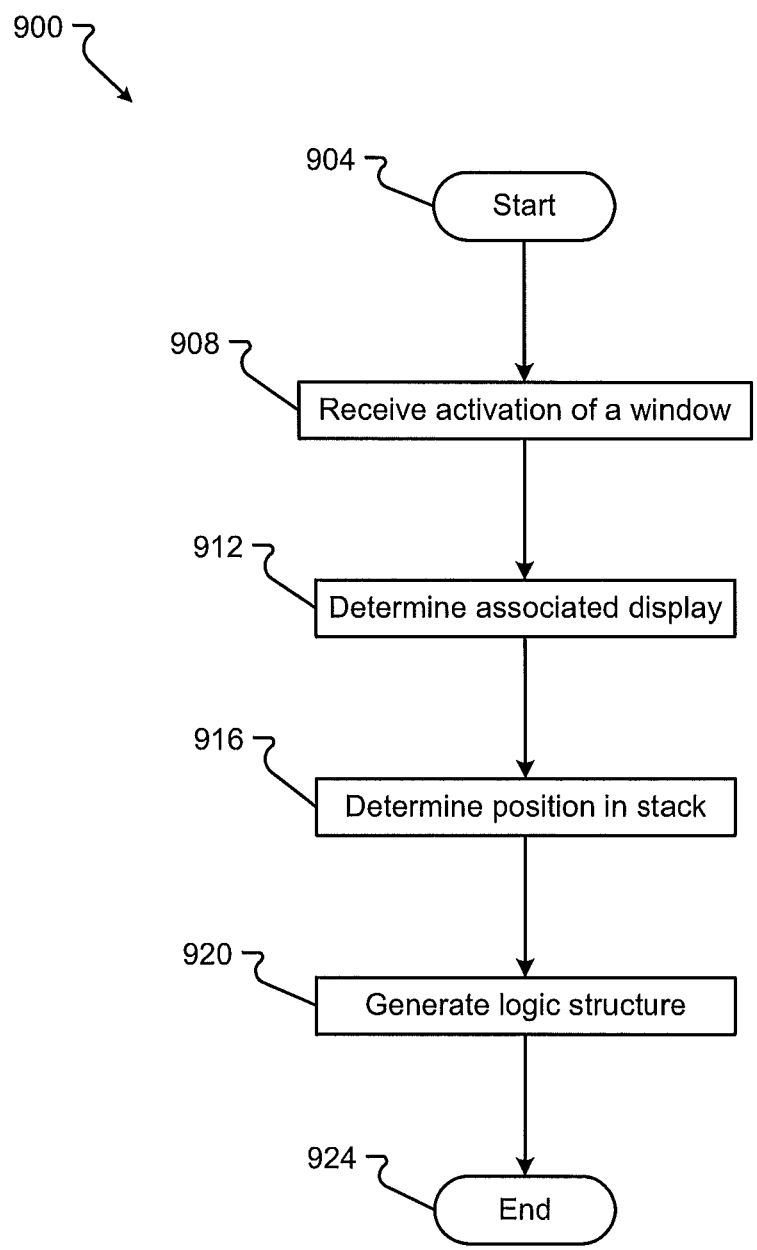
FIG. 9 is a flow chart of an embodiment of a method for creating a window stack.

An embodiment of a method 900 for creating a window stack is shown in FIG. 9. While a general order for the steps of the method 900 is shown in FIG. 9. Generally, the method 900 starts with a start operation 904 and ends with an end operation 928. The method 900 can include more or fewer steps or can arrange the order of the steps differently than those shown in FIG. 9. The method 900 can be executed as a set of computer-executable instructions executed by a computer system and encoded or stored on a computer readable medium. Hereinafter, the method 900 shall be explained with reference to the systems, components, modules, software, data structures, user interfaces, etc. described in conjunction with FIGS. 1-8.

A multi-screen device 100 can receive activation of a window, in step 908. In embodiments, the multi-screen device 100 can receive activation of a window by receiving an input from the touch sensitive display 110 or 114, the configurable area 112 or 116, a gesture capture region 120 or 124, or some other hardware sensor operable to receive user interface inputs. The processor may execute the Task Management Module 540 may receive the input. The Task Management Module 540 can interpret the input as requesting an application task to be executed that will open a window in the window stack.

In embodiments, the Task Management Module 540 places the user interface interaction in the task stack 552 to be acted upon by the Display Configuration Module 568 of the Multi-Display Management Module 524. Further, the Task Management Module 540 waits for information from the Multi-Display Management Module 524 to send instructions to the Window Management Module 532 to create the window in the window stack.

The Multi-Display Management Module 524, upon receiving instruction from the Task Management Module 540, determines to which touch portion of the composite display 760, the newly activated window should be associated, in step 912. For example, window 4 770 is associated with the a portion of the composite display 764 In embodiments, the device state module 574 of the Multi-Display Management Module 524 may determine how the device is oriented or in what state the device is in, e.g., open, closed, portrait, etc. Further, the preferences module 572 and/or requirements module 580 may determine how the window is to be displayed. The gesture module 576 may determine the user's intentions about how the window is to be opened based on the type of gesture and the location of where the gesture is made.

The Display Configuration Module 568 may use the input from these modules and evaluate the current window stack 760 to determine the best place and the best dimensions, based on a visibility algorithm, to open the window. Thus, the Display Configuration Module 568 determines the best place to put the window at the top of the window stack 760, in step 916. The visibility algorithm, in embodiments, determines for all portions of the composite display, which windows are at the top of the stack. For example, the visibility algorithm determines that window 3 768, window 4 770, and window 8 774 are at the top of the stack 760 as viewed in FIGS. 7C through 7E. Upon determining where to open the window, the Display Configuration Module 568 can assign a display identifier 816 and possibly dimensions 808 to the window. The display identifier 816 and dimensions 808 can then be sent back to the Task Management Module 540. The Task Management Module 540 may then assign the window a stack position identifier 812 indicating the windows position at the top of the window stack.

In embodiments, the Task Management Module 540 sends the window stack information and instructions to render the window to the Window Management Module 532. The Window Management Module 532 and the Task Management Module 540 can create the logical data structure 800, in step 924. Both the Task Management Module 540 and the Window Management Module 532 may create and manage copies of the window stack. These copies of the window stack can be synchronized or kept similar through communications between the Window Management Module 532 and the Task Management Module 540. Thus, the Window Management Module 532 and the Task Management Module 540, based on the information determined by the Multi-Display Management Module 524, can assign dimensions 808, a stack position identifier 812 (e.g., window 1 782, window 4 770, etc.), a display identifier 816 (e.g., touch sensitive display 1 110, touch sensitive display 2 114, composite display identifier, etc.), and an active indicator 820, which is generally always set when the window is at the "top" of the stack. The logical data structure 800 may then be stored by both the Window Management Module 532 and the Task Management Module 540. Further, the Window Management Module 532 and the Task Management Module 540 may thereinafter manage the window stack and the logical data structure(s) 800.

Demand for portable electronic devices with high levels of functionality continues to rise and personal electronic devices continue to become increasingly more portable. While computer power, battery life, screen size and overall functionality of portable phones and smart phones continue to increase, user reliance on these devices increases. Many users of such devices rely heavily on such devices for general communication, accessing the internet, cloud computing, and accessing various locally stored information such as contact information, files, music, pictures and the like. It is often desirable therefore to connect such heavily relied on devices to an additional computing device or display, such as a monitor or tablet device, such as a SmartPad (SP) 1000 (see FIG. 10).

Accordingly, it is desirable for the device 100 to be able to interface with an additional device, such as the SmartPad 1000, that enables functionality similar to, for example, both a tablet computer system and smart phone. Furthermore, a need exists for the above-described device to allow for various pre-existing features of both devices, such as sending and receiving phone calls and further allowing for the accessibility of applications running on the device 100. A need also exists for the above device 100 to provide the benefits of both a tablet computer system and cellular phone in one integrative device by allowing for common operations and functionality without compromising the form factor of the device.

One exemplary embodiment is directed toward a selectively removable device and smartpad system. The smartpad system is discussed in greater detail hereinafter, and can have various features for complementing the communications device, such as a smart phone or device 100. For example, the smartpad may supplement the device 100 by providing increased screen size, increased processor size, increased battery or power supply, or the like. Similarly, the device 100 may compliment the SP 1000 by providing connectivity through one or more wireless networks, access to various stored information, and the like. It will expressly recognized therefore that two or more devices of the present disclosure may be provided in a connected or docked and generally symbiotic relationship. It will further be recognized that the devices provide various features, benefits and functionality in their independent state(s).

In accordance with one exemplary embodiment, the device 100 is capable of being received by the SP 1000 through a recessed feature of the SP 1000 having corresponding dimensions to the device 100. In one exemplary embodiment, the SP 1000 is provided and preferably sized for receiving a predetermined device 100. In alternative embodiments, however, it is contemplated that the SP 1000 is provided, the smartpad capable of receiving a plurality of communications devices of different sizes. In such embodiments, the SP 1000 may receive communications devices of various sizes by, for example, the inclusion of additional elements, such as spacers and various adjustable features.

In accordance with one exemplary embodiment, the device 100 and SP 1000 have a docking relationship that is established when the device 100 is connected to the SP 1000 during various modes of operation. For example, in one embodiment, a system is provided comprising the SP 1000 and the device 100, the SP 1000 capable of physically receiving the device 100, wherein the device 100 is operable as the primary computing device. In such an embodiment, the SP 1000 may, for example, simply provide enhanced audio and visual features for the device 100 that comprises its own CPU, memory, and the like. It is further contemplated that the system can be placed in a mode of operation wherein the device 100 docked to the SP 1000 provide it in a more passive mode where, for example, the device 100 draws power from the SP 1000 such as to recharge a battery of the device 100.

In accordance with another exemplary embodiment, the device 100 and SP 1000 are provided wherein the device 100 is received or docked with the SP 1000 and wherein a substantial area of the device 100 is positioned within one or more compartments of the SP 1000. For example, where as various known devices comprise docking features which require or result in the docked item to be generally exposed, thereby substantially altering the external dimensions of the host device and/or creating a potential for damaging one or both devices upon impact, an exemplary embodiment contemplates the SP 1000 which receives the device 100 in a manner such that the external dimensions of the SP 1000 are not substantially altered when the devices are connected. In such an arrangement, the device 100 and associated connection means are generally protected and the SP 1000 is allowed to substantially maintain its original shape. In accordance with one exemplary embodiment, the SP 1000 is capable of receiving and/or docking the device 100 wherein the device 100 is received in lockable association with the SP 1000. As used herein, the term "lockable" is not intended to designate or limit it to any particular arrangement. Rather, lockable is intended to refer to various embodiments as described herein and will be recognized by one of ordinary skill in the art. In one embodiment, the device 100 is connectable to the SP 1000 wherein the SP 1000 comprises extension springs for first electively securing the device 100 in a docked manner and an ejection feature for releasing the device 100 from the SP 1000. Moreover, as will be described in greater detail below, it should be appreciated that the device 100 and SP 1000 can communicate using wired and/or wireless technology(ies) with equal success. Moreover, and in accordance with another exemplary embodiment, the hinged device 100 is selectively connectable to the SP 1000 wherein the device 100 is received by the SP 1000 in an open position and where in one or more preexisting ports of the SP 1000 correspond with internal receiving features of the SP 1000, such that the device 100 and the SP 1000 may be operated simultaneously in various modes of use.

In accordance with some exemplary embodiments, the SP 1000 is provided with an eject or release button to facilitate the removal of a stored or docked device 100.

Figure 10:
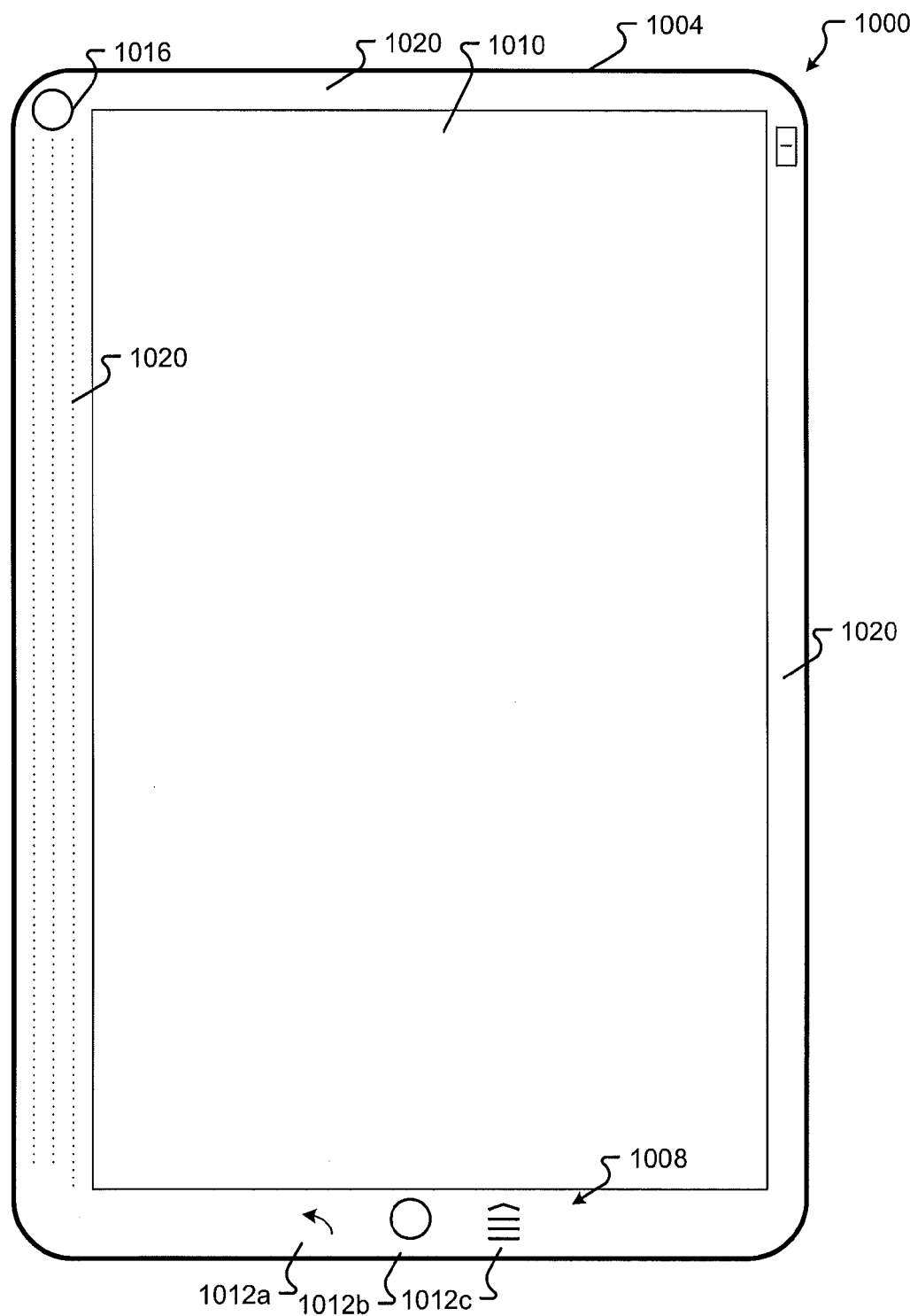
FIG. 10 illustrates an exemplary smartpad (SP).

FIG. 10 illustrates an exemplary SmartPad (SP) 1000 according to an exemplary embodiment. The exemplary SmartPad at least provides a larger touch sensitive display operatively coupleable to device 100.

While the following description uses the term "smart" in conjunction with the display device 1000, it is to be appreciated that this term does not necessarily connotate that there is intelligence in the SmartPad. Rather, it is to be appreciated that there can be "intelligence," including one or more of a processor(s), memory, storage, display drivers, etc., in the SmartPad, and/or one or more of these elements shared with the device 100 via, for example, one or more of a port, bus, connection, or the like. In general, any one or more of the functions of the device 100 is extendable to the SmartPad 1000 and vice versa.

The exemplary SmartPad 1000 includes a screen 1004, a SP touch sensitive display 1010, a SP configurable area 1008, a SP gesture capture region(s) 1020 and a SP camera 1016. The SP 1000 also includes a port (not visible in this orientation) adapted to receive the device 100 as illustrated at least in FIG. 11.

The device 100 docks with the SmartPad 1000 via the port on the SP 1000 and the corresponding port 136 on device 100. As discussed, port 136 in some embodiments is an input/output port (I/O port) that allows the device 100 to be connected to other peripheral devices, such as a display, keyboard, printing device and/or SP 1000. In accordance with one exemplary embodiment, the docking is accomplished by the device 100 sliding into the left-hand side of the SP 1000, with the device 100 being in an open state and the device 100 engaging a port in the SP 1000 corresponding to port 136. In accordance with one exemplary embodiment, the device 100 engages a doored cassette-like slot in the SP 1000 into which the device 100 slides. (See for example FIGS. 13A-B) It should be appreciated however that there may be other configurations for physically and electrically engaging the two devices—in general, the manner of engagement is not important provided the device 100 and SP 1000 are in electrical communication with one another.

The SP 1000 includes a screen 1004. In some embodiments, the entire front surface of the SP 1000 may be touch sensitive and capable of receiving input by a user touching the front surface of the screen 1004. The screen 1004 includes touch sensitive display 1010, which, in addition to being touch sensitive, is also capable of displaying information to a user.

The screen 1004 also includes a configurable area 1008 that has been configured for specific inputs when the user touches portions of the configurable area 1008. Area 1012a is configured to receive a "back" input indicating that a user would like to view information previously displayed. Area 1012b is configured to receive a "menu" input indicating that the user would like to view options from a menu. Area 1012c is configured to receive a "home" input indicating that the user would like to view information associated with a "home" view.

In other embodiments, areas 1012a-c may be configured, in addition to the configurations described above, for other types of specific inputs including controlling features of device 100 and/or device 1000, some non-limiting examples including adjusting overall system power, adjusting the volume, adjusting the brightness, adjusting the vibration, selecting of displayed items on screen 1004, operating the SP camera 1016, operating a microphone, and initiating/terminating of telephone calls. Also, in some embodiments, areas 1012a-c may be configured for specific inputs depending upon the application running on device 100/SP 1000 and/or information displayed on the touch sensitive displays 1010.

In addition to touch sensing, screen 1004 may also include areas that receive input from a user without requiring the user to touch the display area of the screen. For example, screen 1004 can include gesture capture area 1020. These areas are able to receive input by recognizing gestures made by a user without the need for the user to actually touch the surface of the display area. In comparison to touch sensitive display 1010 and 1014, the gesture capture area 1012 may not be capable of rendering a displayed image.

While not illustrated, there may also be a number of hardware components within SP 1000. As illustrated in FIG. 10, SP 1000 can include a speaker, a microphone and one or more cameras 1016. Upon docking the device 100 in the SP 1000, the corresponding device(s) (e.g., the speaker) in the device 100 could be disabled in favor of the speaker in the SP 1000. Similarly, other components, such as the screen 1004, microphone, speaker, etc, could be disabled on the device 100 in favor of the SP 1000.

In general, the touch sensitive display 1010 may comprise a full color, touch sensitive display. A second area within each touch sensitive screen 1004 may comprise the SP gesture capture region 1020. The SP gesture capture region 1020 may comprise an area or region that is outside of the SP touch sensitive display 1010 area that is capable of receiving input, for example in the form of gestures provided by a user. However, the SP gesture capture region 1020 does not necessarily include pixels that can perform a display function or capability.

A third region of the SP touch sensitive screen 1004 may comprise the configurable area 1008. The configurable area 1008 is capable of receiving input and has display or limited display capabilities. In embodiments, the configurable area 1008 may present different input options to the user. For example, the configurable area 1008 may display buttons or other relatable items. Moreover, the identity of displayed buttons, or whether any buttons are displayed at all within the configurable area 1008 of the SP touch sensitive screen 1004 may be determined from the context in which the device 1000 is used and/or operated. In an exemplary embodiment, the touch sensitive screen 1004 comprise liquid crystal display devices extending across at least those regions of the touch sensitive screen 1004 that is capable of providing visual output to a user, and a capacitive input matrix over those regions of the touch sensitive screen 1004 that is capable of receiving input from the user.

As discussed above with reference to FIGS. 4A through 4H, the various graphical representations of gesture inputs that may be recognized by the screens 104, 108 are also recognizable by screen 1004. As discussed, the gestures may be performed not only by a user's body part, such as a digit, but also by other devices, such as a stylus, that may be sensed by the contact sensing portion(s) of a screen 1004. In general, gestures are interpreted differently, based on where the gestures are performed (either directly on the display 1004 or in the gesture capture region 1020). For example, gestures in the display 1010 may be directed to a desktop or application, and gestures in the gesture capture region 1020 may be interpreted as for the system.

In addition to the above, the SP touch sensitive screen 1004 may also have an area that assists a user with identifying which portion of the screen is in focus. This could be a bar of light or in general an indicator that identifies which one or more portions of the SP touch sensitive screen 1004 are in focus. (See for example, FIG. 29)

One or more display controllers (such as display controllers 216a, 216b and/or dedicated display controller(s) on the SP 1000) may be provided for controlling the operation of the touch sensitive screen 1004 including input (touch sensing) and output (display) functions.

In accordance with one exemplary embodiment, a separate touch screen controller is provided for the SP 1000 in addition to each of the controllers for the touch screens 104 and 108. In accordance with alternate embodiments, a common or shared touch screen controller may be used to control any one or more of the touch sensitive screens 104 and 108, and/or 1004. In accordance with still other embodiments, the functions of the touch screen controllers may be incorporated into other components, such as a processor and memory or dedicated graphics chip(s).

In a similar manner, the SP 1000 may include a processor complementary to the processor 204, either of which may comprise a general purpose programmable processor or controller for executing application programming or instructions. In accordance with at least some embodiments, the processors may include multiple processor cores, and/or implement multiple virtual processors. In accordance with still other embodiments, the processors may include multiple physical processors. As a particular example, the processors may comprise a specially configured application specific integrated circuit (ASIC) or other integrated circuit, a digital signal processor, a controller, a hardwired electronic or logic circuit, a programmable logic device or gate array, a special purpose computer, or the like. The processors generally function to run programming code or instructions implementing various functions of the device 100 and/or SP 1000.

The SP 1000 can also optionally be equipped with an audio input/output interface/device(s) (not shown) to provide analog audio to an interconnected speaker or other device, and to receive analog audio input from a connected microphone or other device. As an example, the audio input/output interface/device(s) 256 may comprise an associated amplifier and analog to digital converter usable with SP 1000. Alternatively or in addition, the device 100 can include an integrated audio input/output device 256 and/or an audio jack for interconnecting an external speaker or microphone via SP 1000. For example, an integrated speaker and an integrated microphone can be provided, to support near talk or speaker phone operations.

Hardware buttons (not shown) but similar to hardware buttons 158 can be included for example for use in connection with certain control operations. Examples include a master power switch, volume control, etc., as described in conjunction with FIGS. 1A through 1J. One or more image capture interfaces/devices 1016, such as a camera, can be included for capturing still and/or video images. Alternatively or in addition, an image capture interface/device 1016 can include a scanner or code reader. An image capture interface/device 1016 can include or be associated with additional elements, such as a flash or other light source.

Communications between various components of the device 100 and SP 1000 can be carried by one or more buses and/or communications channels. In addition, power can be supplied to one or more of the components of the device 100 and Sp 1000 from a power source and/or power control module 260. The power control module 260 and/or device 100 and/or SP 1000 can, for example, include a battery, an AC to DC converter, power control logic, and/or ports for interconnecting the device 100/1000 to an external source of power.

The middleware 520 may also be any software or data that allows the multiple processes running on the devices to interact. In embodiments, at least portions of the middleware 520 and the discrete components described herein may be considered part of the OS 516 or an application 564. However, these portions will be described as part of the middleware 520, but those components are not so limited. The middleware 520 can include, but is not limited to, a Multi-Display Management (MDM) class 524, a Surface Cache class 528, a Window Management class 532, an Activity Management class 536, an Application Management class 540, a display control block, one or more frame buffers 548, an activity stack 552, and/or an event buffer 556—all of the functionality thereof extendable to the SP 1000. A class can be any group of two or more modules that have related functionality or are associated in a software hierarchy.

The MDM class 524 also includes one or more modules that are operable to manage the display of applications or other data on the screen of the SP 1000. An embodiment of the MDM class 524 is described in conjunction with FIG. 5B. In embodiments, the MDM class 524 receives inputs from the OS 516, the drivers 512 and the applications 564. The inputs assist the MDM class 524 in determining how to display the information required by the user. Once a determination for display configurations is determined, the MDM class 524 can bind the applications 564 to a display configuration. The configuration may then be provided to one or more other components to generate the display on the SP 1000.

Figure 11:
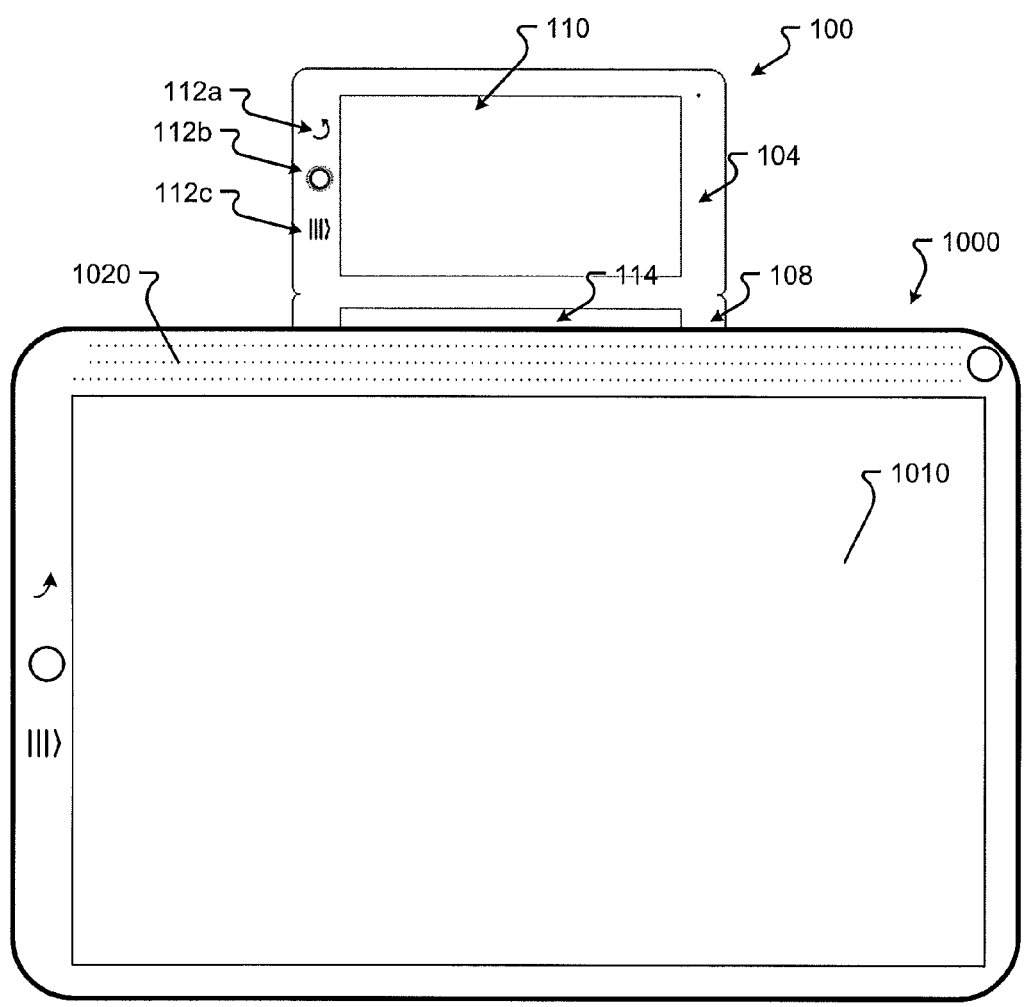
FIG. 11 illustrates an exemplary method of associating the smartpad with the device.
Figure 12:
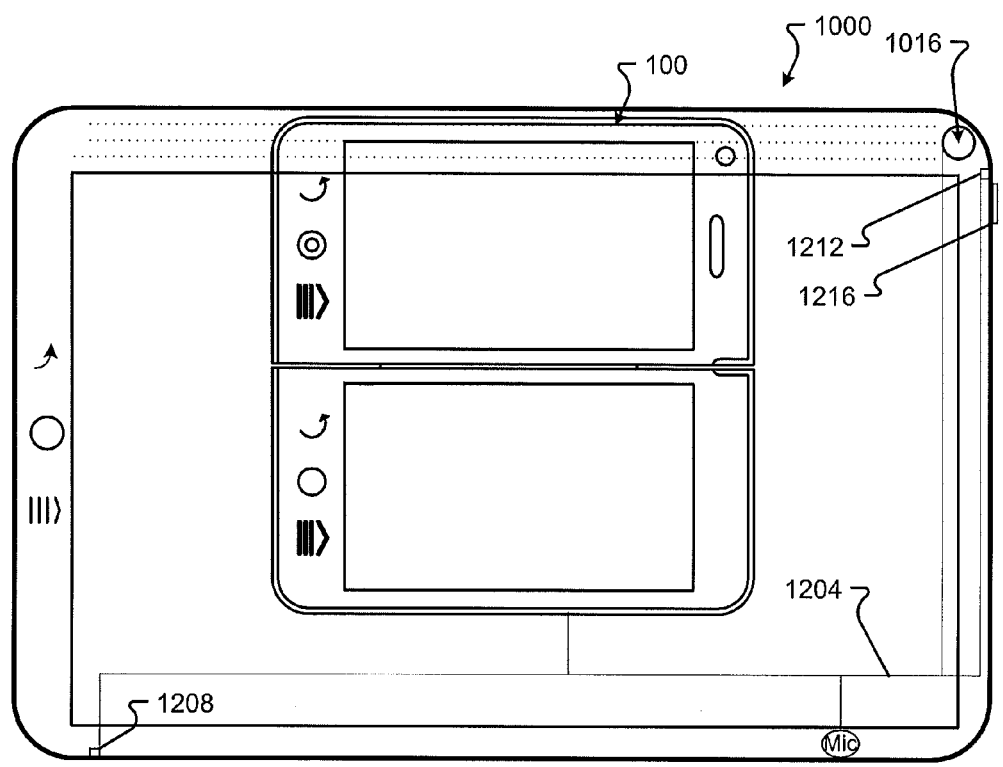
FIG. 12 illustrates a docked device with the smartpad.

FIG. 11 illustrates an exemplary embodiment showing the device 100 docking with the SP 1000. More specifically, the device 100 is being inserted into a slot (not shown) on the SP 1000. On completion of the inserting of device 100 into SP 1000 (See FIG. 12), device 100 communicates with the SP 1000 via bus or other wired or wireless electrical means 1204. The device 100 is also connected with, for example, the camera/video camera 1016, microphone (Mic), and power port 1208.

In conjunction with the docking of device 100 with SP 1000, one or more of the devices can begin power management. For example, one or more of the device 100 and SP 1000 can include power supplies, such as batteries, solar, or in general any electrical supply, any one or more of which being usable to supply one or more of the device 100 and SP 1000. Furthermore, through the use of, for example, an AC power adaptor connected to port 1208, the SP 1000 can supply power to device 100, such as to charge device 100. It will be appreciated that the power management functionality described herein can be distributed between one or more of the device 100 and SP 1000, with power being sharable between the two devices.

In addition to power management functions, upon the device 100 being docked with the SP 1000, the displays on device 100 can be turned off to, for example, save power. Furthermore, electrical connections are established between the device 100 and SP 1000 such that the speaker, microphone, display, input capture region(s), inputs, and the like, received by SP 1000 are transferable to device 100. Moreover, the display on device 1000 is enabled such that information that would have been displayed on one or more of the touch sensitive displays 110 and 114 is displayed on touch sensitive display 1010. As will be discussed in greater detail herein, the SP 1000 can emulate the dual display configuration of the device 100 on the single display 1010.

The SP 1000 can optionally be equipped with the headphone jack 1212 and power button 1216. Moreover, any hardware buttons or user input buttons on the device 100 could be extended to and replicated on the SP 1000.

This dock event between the device 100 and SP 1000 can be seen as states 336 or 344 in FIG. 3A. As will be appreciated, and in accordance with one of the illustrative embodiments herein, the device 100 is docked with SP 1000 with the device being in the open state 210. However, it is to be appreciated that the device 100 can be docked with the SP 1000 in the closed state 304, or docked via, for example, a cable without the device 100 necessarily being inserted into the SP 1000.

Figure 13A:
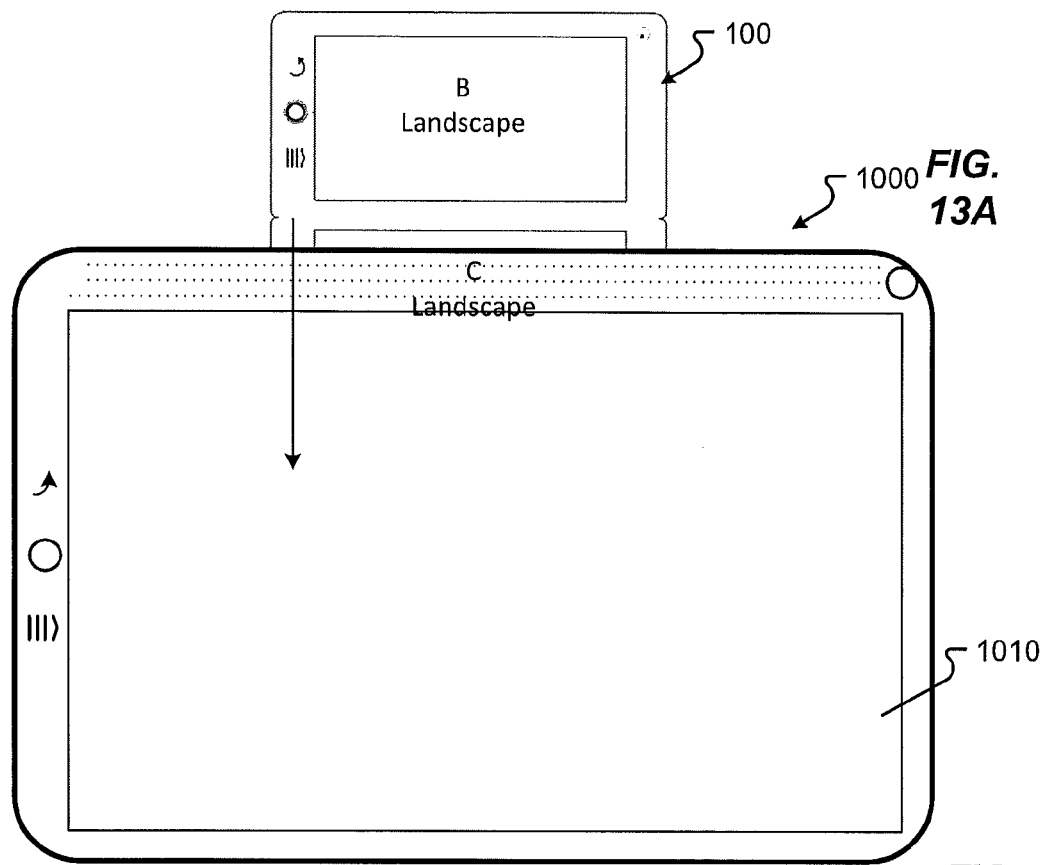
FIGS. 13A-13B illustrate an exemplary method for screen orientation.
Figure 13B:
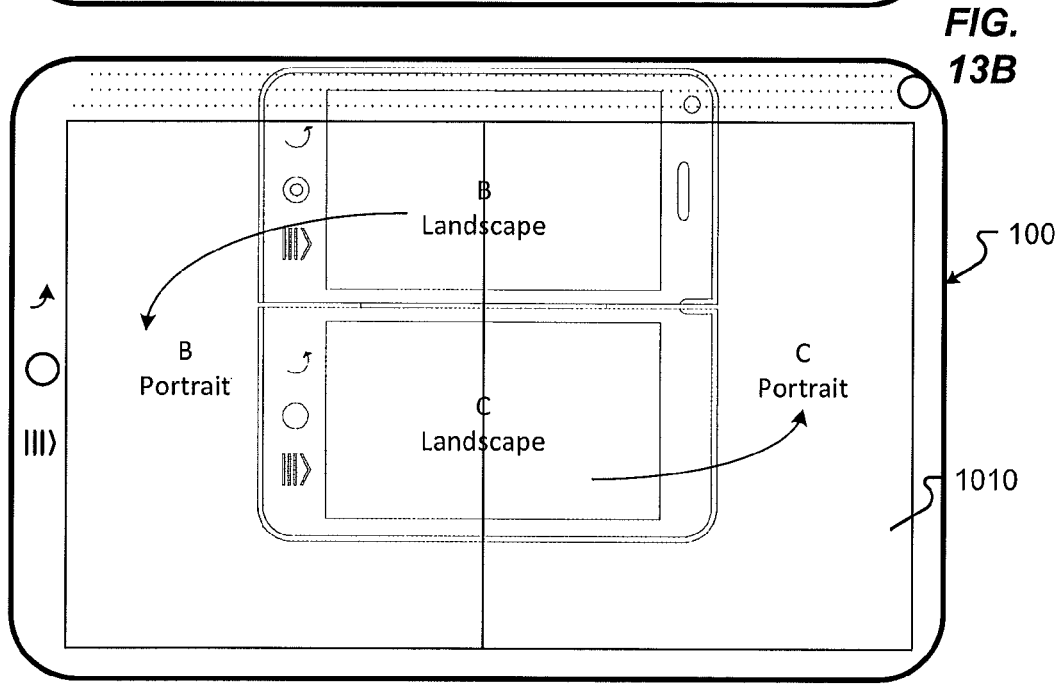

FIGS. 13A-B illustrate application reorientation according to an exemplary embodiment of the disclosure. In particular, FIG. 13A illustrates the device 100 being inserted into the SP 1000. Before being associated with the SP 1000, the device 100 has two applications, both in the landscape mode, represented by application "B" in landscape on a first screen and application "C" in landscape on a second screen (partially obscured by SP 1000).

FIG. 13B illustrates the re-orientation of the windows for the two applications based on the device 100 being associated with the SP 1000, the SP 1000 being in the landscape orientation. In accordance with this exemplary embodiment, application "B" on the device 100 is re-oriented to be in the portrait orientation on the SP 1000, and in a similar manner, application "C" on the device 100 is reoriented to the portrait orientation on the right-hand side the touch sensitive display 1010. As will be appreciated, the reorientation of the application(s) from the device 100 to the SP 1000 can occur in a similar manner for a single application running on the device 100. For example, if there is only one application running on device 100, and the application is running in landscape mode, when the device 100 is docked with the SP 1000, the orientation of the application is reoriented to be appropriate for the current orientation of the SP 1000. For example, if the application on the device 100 is in portrait mode, and the SP 1000 is in landscape mode, the application is reoriented from portrait mode on the device 100 to landscape mode on the SP 1000. In a similar manner, if the application on the device is in landscape mode, and upon being docked to the SP 1000 in portrait mode, the application is reoriented into portrait mode for appropriate viewing on the SP 1000.

In accordance with one exemplary embodiment, the accelerometer 176 on device 100 is used to determine the orientation of both the device 100 and SP 1000, and consequently the orientation of the touch screen display 1010. Therefore, the accelerometer(s) 176 outputs a signal that is used in connection with the display of information to control the orientation and/or format in which information is to be displayed to the user on display 1010. As is to be appreciated, reorientation can include one or more of a portrait to landscape conversion, a landscape to portrait conversion, a resizing, a re-proportioning and/or a redrawing of the window(s) associated with the application(s).

On reorienting of the running application(s), the application(s) is displayed on display 1010 on SP 1000.

In accordance with an optional exemplary embodiment, priority can be given to the application that is in focus. For example, and using again applications "B" and "C" as illustrated in FIG. 13B, if instead application C was in focus before docking, application C could be reoriented and displayed on the left-hand portion of display 1010, and application B, which was not in focus before docking, displayed on the right-hand portion of display 1010 upon docking In accordance with another optional embodiment, the application in focus could be displayed in full-screen mode on display 1010 with the application(s) not in focus placed into a window stack that is, for example, in a carousel-type arrangement as discussed hereinafter.

Figure 14:
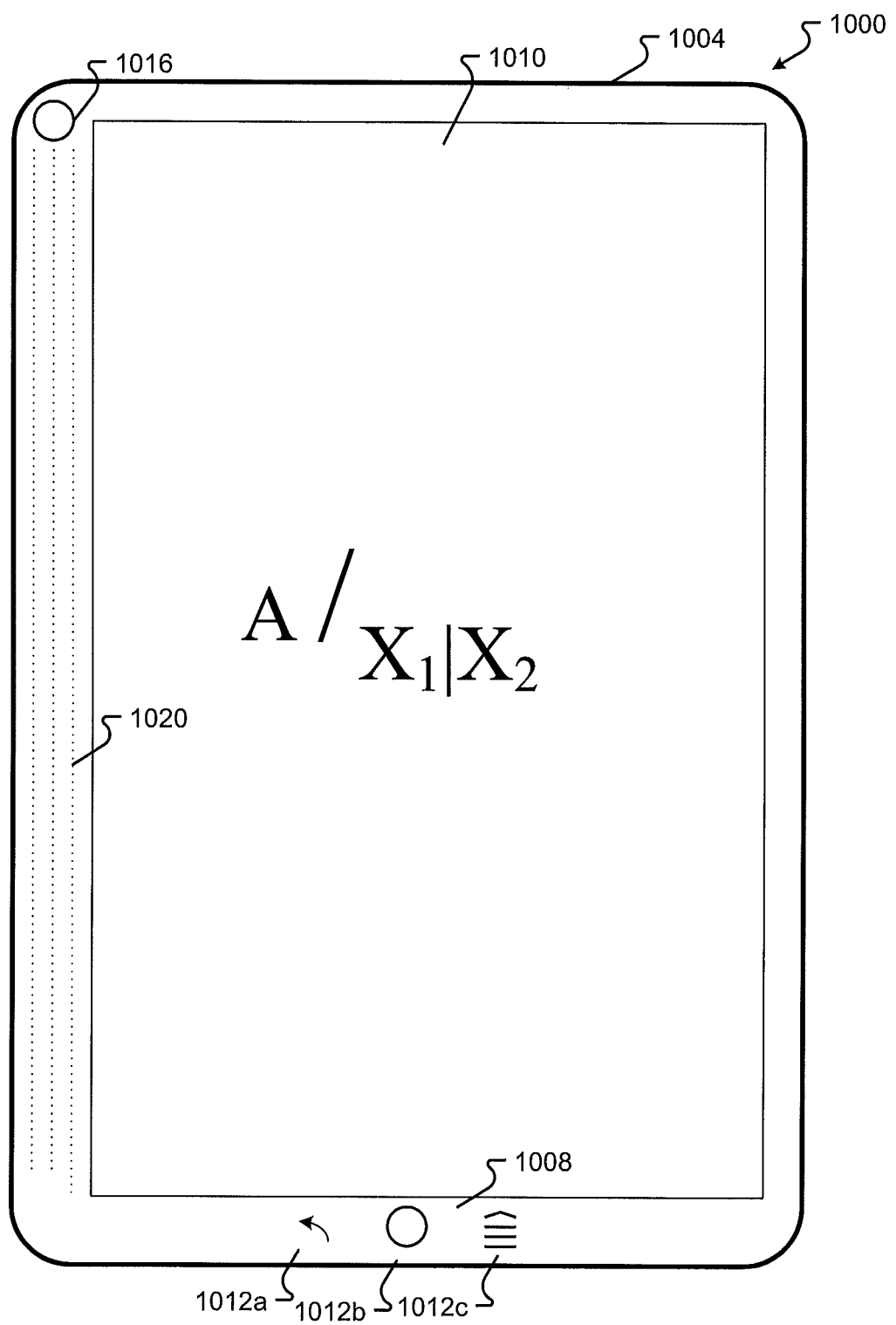
FIG. 14 illustrates a method for displaying an application when the SP is in a portrait mode.

FIG. 14 illustrates an exemplary embodiment of a single application mode for the SP 1000. In the single application mode, all applications are launched and displayed in full screen. The single application mode can be indicated by a multi-tasking icon in the enunciator bar, or at some other location on screen 1004.

Figure 15:
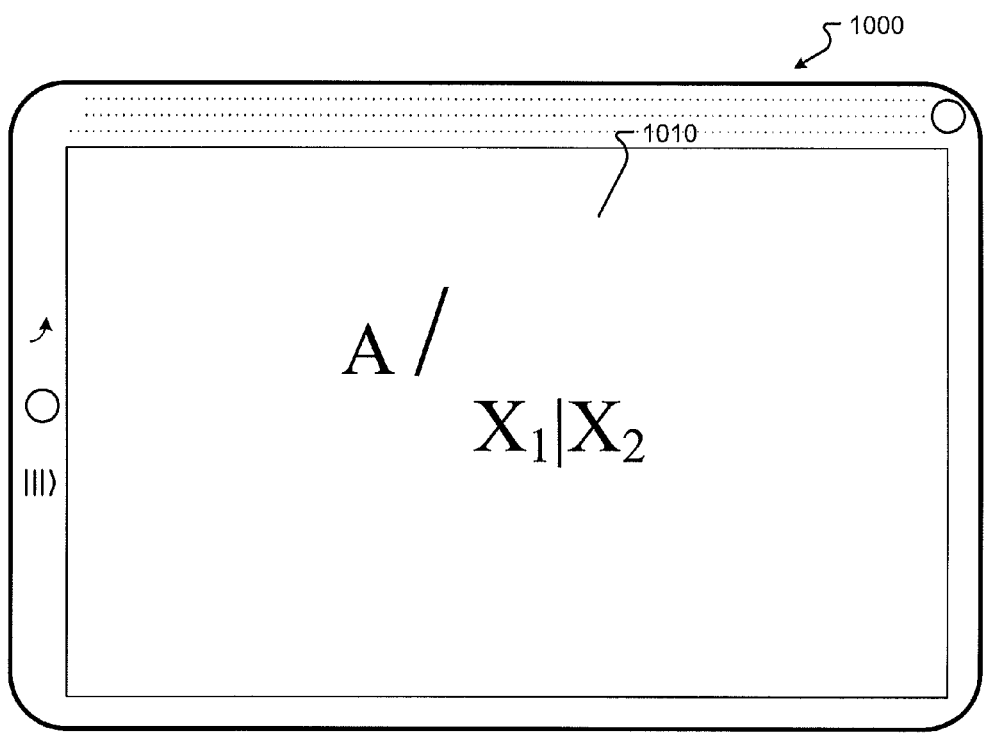
FIG. 15 illustrates a method for displaying an application when the SP is in a landscape mode.

Displaying of the application(s) are managed by one or more of the display controller 544, framework 520, window management module 532, display configuration module 568, as well as middleware 520 and associated classes. In single application mode, all dual screen capable applications can be launched in either a dual screen or max mode, where the application is displayed substantially filling the display 1010. This is applicable to when the SP 1000 is either in the portrait mode, as illustrated in FIG. 14, or in the landscape mode, as illustrated in FIG. 15. In these figures, the "A" represents the single application with the X1, X2 being variables representing the coordinates and/or location of the window in which the application "A" is to be displaced. A similar notation is used hereinafter for the multi-application mode, with it being appreciated that, for example, X1 may contain the coordinate information for the displaying of the window for a first application, and X2 may contain the coordinate information for the displaying of a window corresponding to a second application, and so on.

In one configuration, max mode is a mode that maximizes the entire application workspace or area for viewing canvas-based content. Canvas-based content includes items such as Web Pages, E-mail, images, videos, photographs, documents, and other content that is not predefined by the application, such as commands, controls, settings, and the like. When an application supports max mode, it generally has a max mode button on or icon the action bar (discussed below). One location of the button is the last item of the first row in the action bar. When the max mode Screen button is selected, the content canvas is expanded to fill all available screens. If the application is currently minimized, max mode trigger an auto-maximization. Any non-canvas screen elements are hidden. This includes menus, tabs, action bar, notification bar, and other normally persistent controls. While in max mode, an overlay partially transparent icon can be fixed in the bottom right hand corner.

When SP 1000 is in single application mode, all applications are launched and displayed in max mode. Single application mode is indicated by a multi-tasking icon in an enunciator bar. Typical applications supported by this mode are single and multi-display applications. All multi-display applications are launched in max mode.

When an application that supports max mode is set to max mode, it will automatically take over both screens or displays regardless of prior state (maximized or minimized) of the application. Upon exiting max mode, the application will remain in a maximized (or full screen) state. In a full-screen state, the application view occupies the application area but non-canvas screen elements, particularly persistent controls, are not hidden but displayed in an appropriate display location, such as in a header or footer area (discussed below) and/or only one logical display (portion) of the screen or composite display is occupied by the view of the application. Thus, in full screen or maximized mode, the view includes menus, tabs, action bar, notification bar, and other normally persistent controls and the view occupies only a logical display portion of the screen or composite display.

Max mode is typically dismissed by one or more of selecting the max mode toggle button, selecting the menu button, closing the application, navigating to an application page that does not support max mode (including when using a hardware back button), performing a minimization action to perform the minimization and exit max mode, receiving an incoming phone call, and launching a second application from the max mode application.

Therefore, in one exemplar embodiment, when a single application is executed, a single application can launch in the full screen mode and can be correlated to the max mode as discussed in relation to FIG. 6I where a single application spans both screens of the device 100. This max mode is applicable to both the portrait and landscape orientations as illustrated in FIG. 14 and FIG. 15 with the display configuration module 568 appropriately (re)sizing the window for the application to fit on substantially all or all of the display 1010.

This resizing can occur regardless of whether a native application on the device 100 actually supports the orientation of the SP 1000. Therefore, even if the application does not support a particular orientation on device 100, the display configuration module 568 can appropriately re-render and/or re-size the window for the application for appropriate display on the SP 1000.

Figure 16:
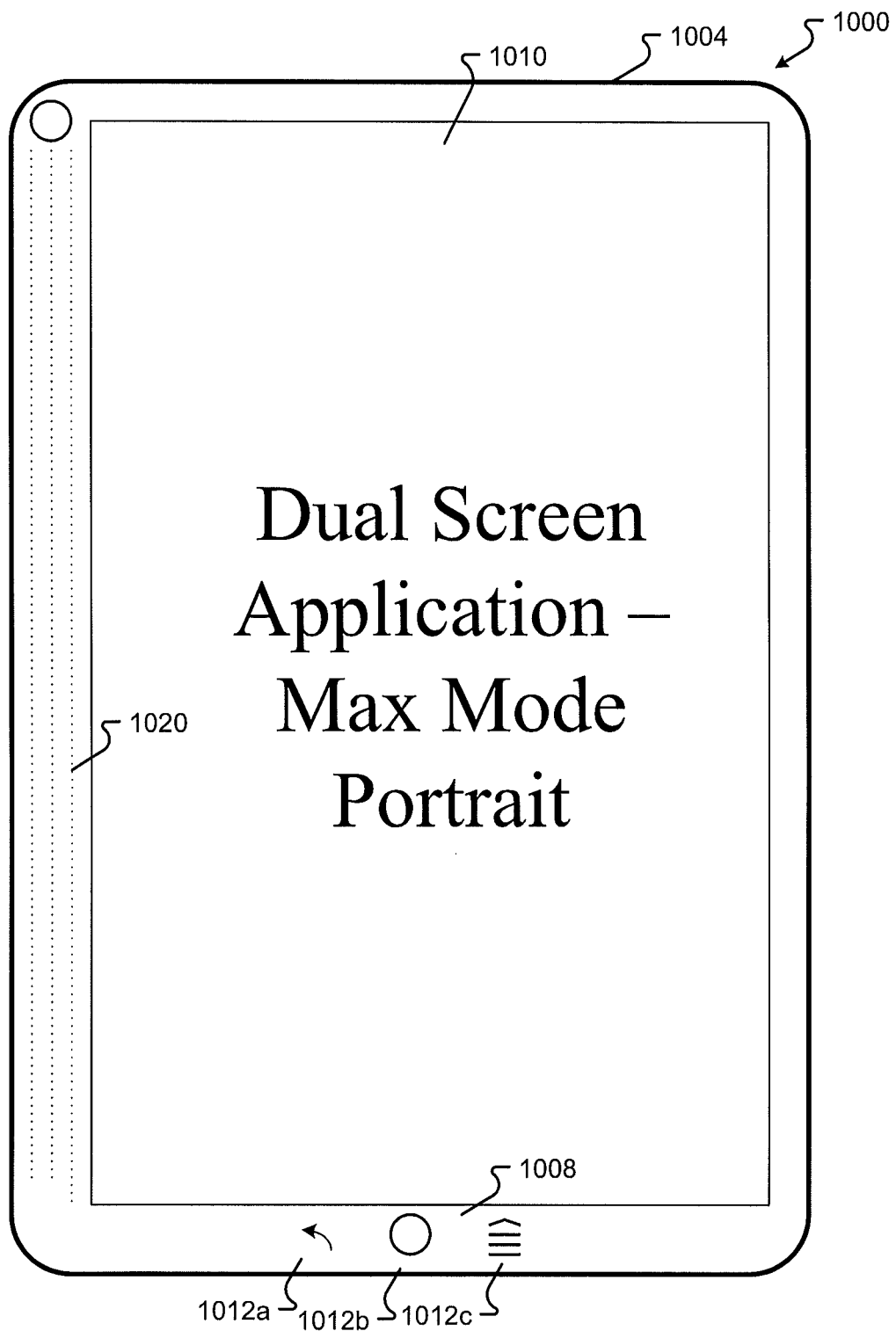
FIG. 16 illustrates an example of a dual screen application in portrait max mode.
Figure 17:
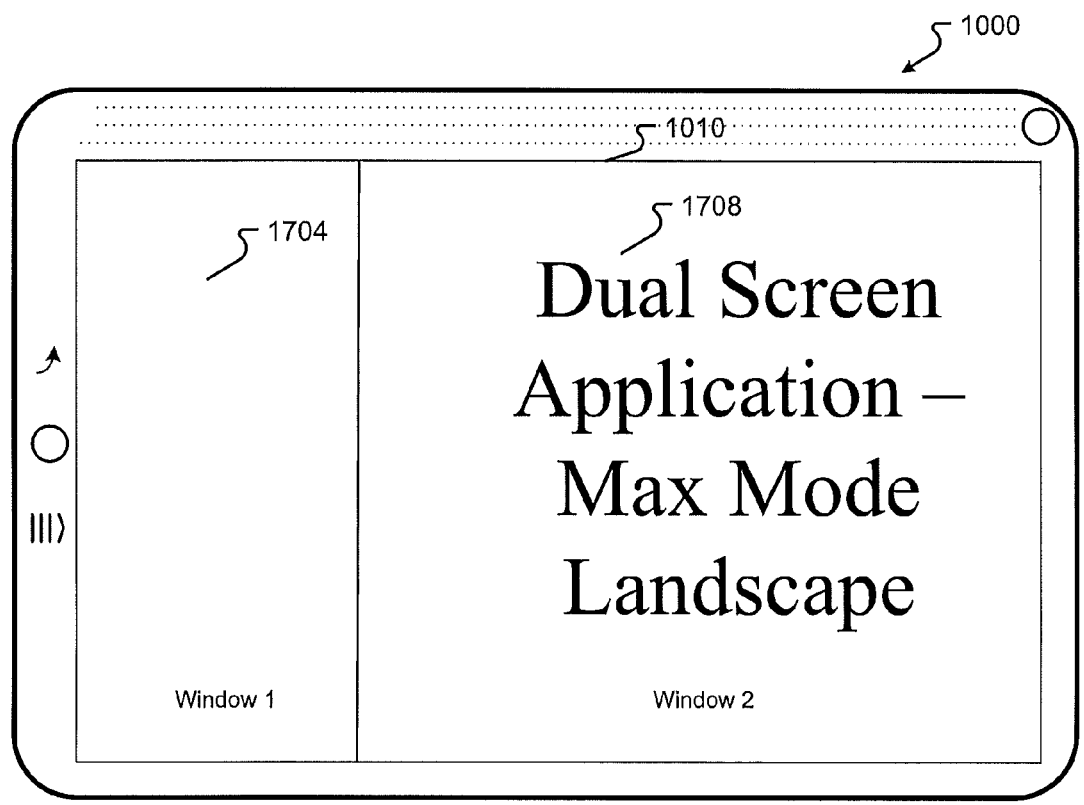
FIG. 17 illustrates an example of a dual screen application in max mode landscape.

FIG. 16 and FIG. 17 illustrate an exemplary method of rendering a single application, that is a dual screen application, in the portrait max mode and landscape max mode, respectively. More specifically, in FIG. 16, the rendering of a dual screen application in portrait mode will display on display 1010 one of the two screens substantially or completely filling display 1010. A user then, for example using a gesture, could scroll between the two screens of the single application. In the landscape mode, as illustrated in FIG. 17, the screen 1010 is divided into a first portion 1704 and a second portion 1708. In this exemplary embodiment, the first screen of the dual screen application is rendered in first portion 1704, and the second screen of the dual screen application is rendered in the second portion 1708. While a certain portion of the screen 1010 is illustratively logically divided for the first portion 1704 and the second portion 1708, it should be appreciated that the screen real estate assigned to each portion can vary, for example, based on one or more of optimum display for the window(s), type of information being displayed in each portion, user preferences, rules associated with the application, and/or the like.

In accordance with a first example, the first portion is allocated one third of the screen 1010's resolution, while the second portion 1708 is allocated two thirds of the screen real estate. In accordance with another example, the screen 1010 is split 50/50. In accordance with yet another example, the first portion could be allocated 70% of the screen 1010's real estate, while the second portion 1708 could be allocated 30%. The managing and resizing of these windows can again be done in cooperation with the display configuration module 568, as well as the windows management module 532 and display controllers for successful rendering of the location of the window(s) on the SP 1000.

As will be appreciated, and in a manner similar to the operation of device 1000, should the SP 1000 change orientation (e.g., from landscape to portrait or vice versa) the window(s) for the application(s) can be redrawn in the appropriate orientation taking into account window prioritization based on whether a particular application and current focus is for a dual screen application or a single screen application.

Focus can also be taken into consideration when determining which window of the application should be displayed when the SP 1000 is in the portrait position. For example, if the application is an e-mail client, and the application natively is displayed on dual screens on device 1000 (a first screen being directed toward showing inbox content, and the second screen being a preview window for a specific item in the inbox) the system can evaluate which window is currently in focus, and ensure that window is displayed in the portrait max mode when the SP 1000 is in the portrait orientation.

In FIG. 17 the SP 1000 is configured to merge windows from the dual screen application on to a single display 1010. In this landscape orientation, data (e.g., a single image, application, window, icon, video, etc.) from a first window is displayed in a first portion of the display 1010 while data (e.g., a single image, application, window, icon, video, etc.) is shown in a second portion of the display 1010. Similar to other output configurations, it may be possible to transition the SP 1000 from the shown output configuration to any other output configuration described herein, depending on, for example, into which state the SP 1000 is moved.

Some other exemplary embodiments of windows management within the SP 1000 upon the device 100 docking with the SP 1000 are as follows: For example, a device 100 is docked to the SP 1000, with the SP 1000 in a portrait orientation and there are two single-display applications running on the device 1000, the application in focus is placed in a lower portion of the display 1010, and the application not in focus is placed on an upper portion of the display 1010. Another exemplary scenario, where the device 100 is docked to a portrait-oriented SP 1000 where one dual-screen application is running on the device 100 and the SP 1000 is in a dual application mode, applies gravity drop as discussed herein.

In another exemplary scenario, where the device 100 is running two single-screen applications, and the SP 1000 is in a landscape dual application mode, the first application is assigned to a first portion of the display 1010 and the second application is assigned to a second portion of the display 1010.

In yet another exemplary scenario where the device 100 is running one dual-screen application and the SP 1000 is in dual application landscape mode, both screens of the dual screen application can be shown on the SP 1000.

Stickiness can also apply to the SP 1000 such that, for example, when a first application is in focus, upon docking to a single application mode SP 1000, the application remains visible after docking As another example of stickiness, if a second application is in focus upon docking to a single application mode SP 1000, application two remains visible after docking In accordance with another example, the device 100 is running one dual-screen application and is docked to a landscape-oriented SP 1000 in max mode, the windows are re-oriented to be side-by-side, opposed to one above the other.

Figure 18:
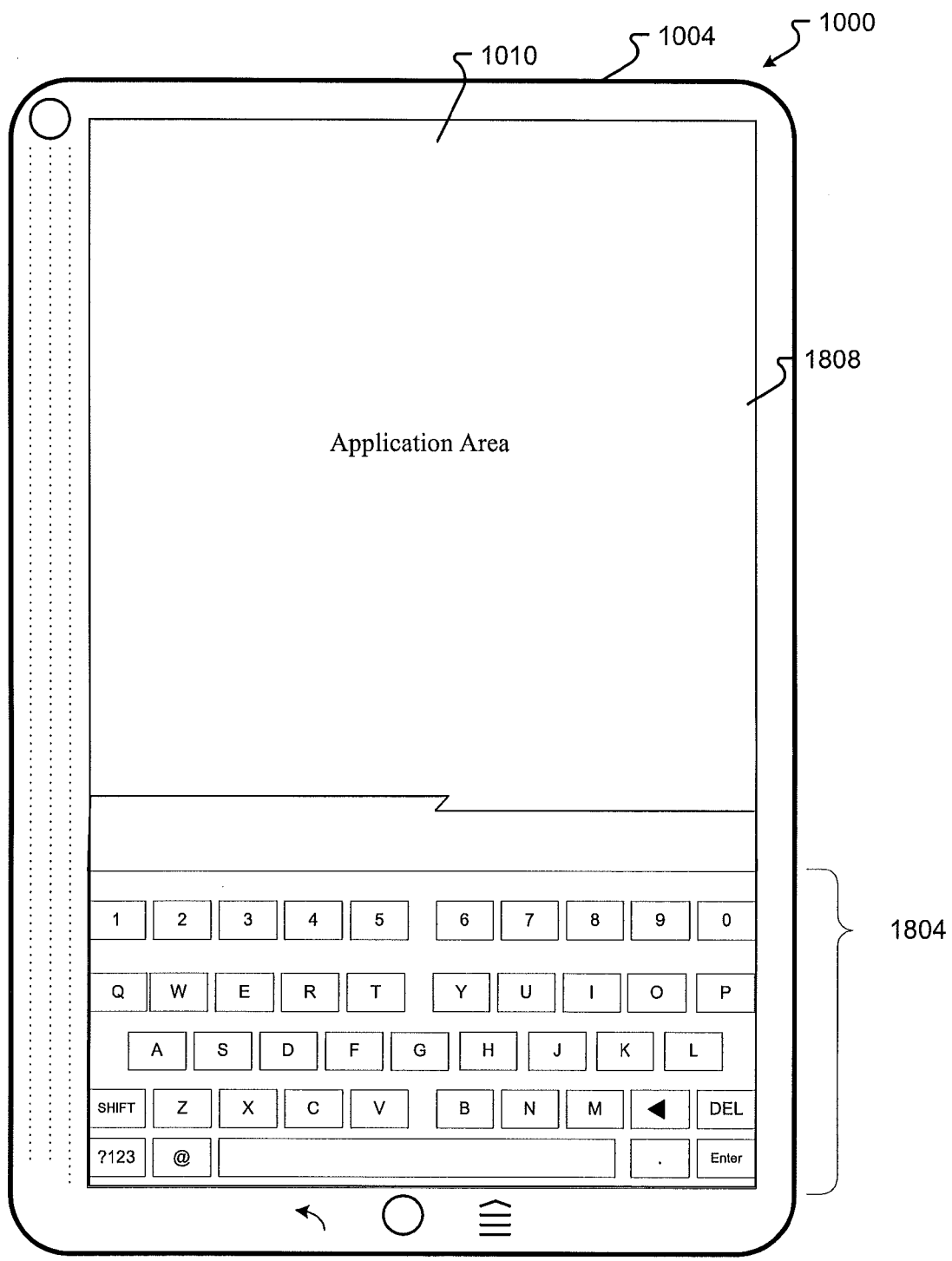
FIG. 18 illustrates an example of keyboard management on the SP.
Figure 19:
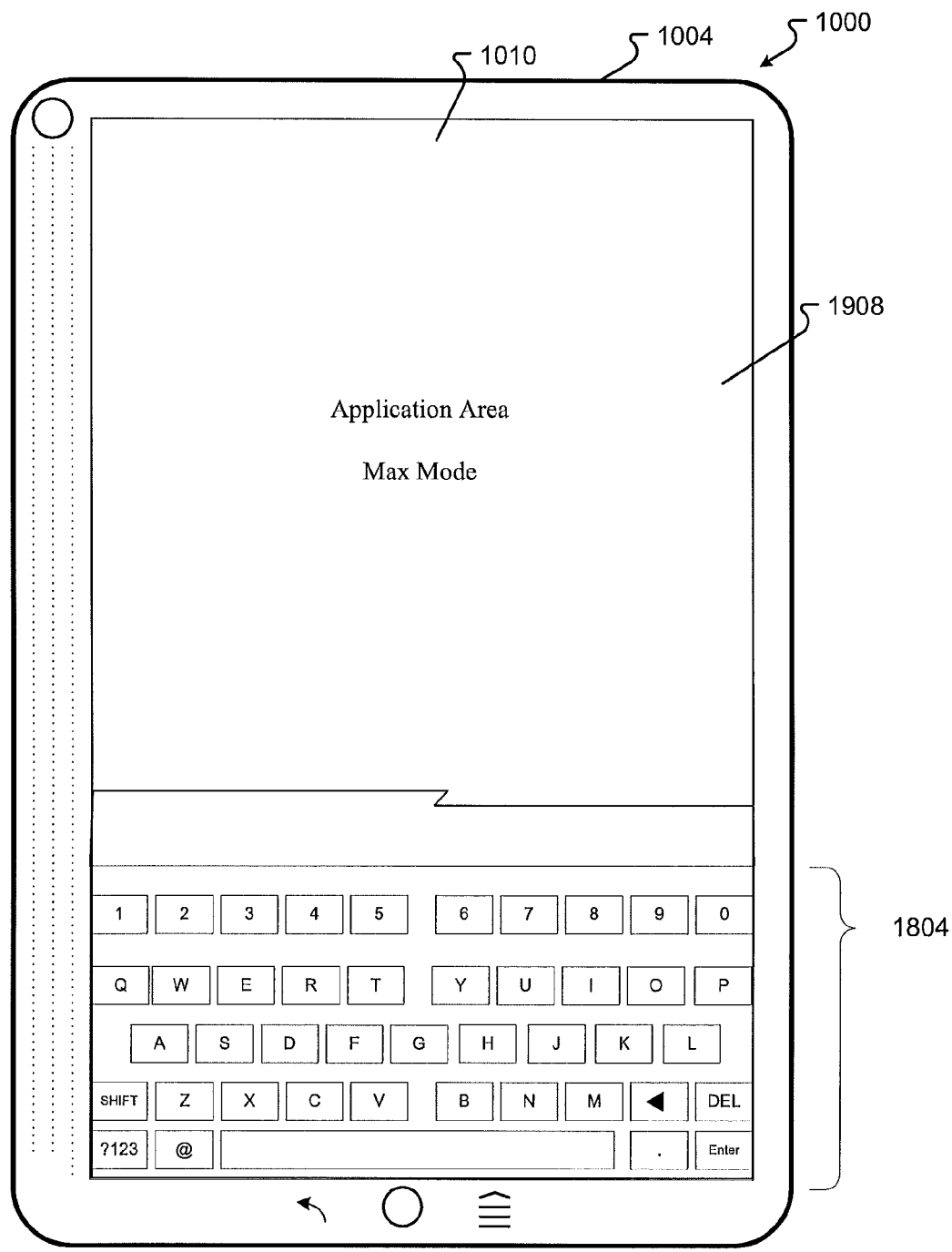
FIG. 19 illustrates an example of keyboard management on the SP with an application area in max mode.

FIGS. 18 through FIG. 21 generally illustrate the management and display of a virtual keyboard 1804 on display 1010. More specifically, in FIG. 18, in portrait mode, the virtual keyboard 1804 is positioned below application area 1808, where an application is displayed in, for example, max mode. In general, it is preferred that the keyboard can be glued to the lower-portion of the display 1010, regardless of whether the SP is in the landscape or portrait mode. However, it is to be appreciated that, for example, based on user preferences, the screen can be glued to another portion of the screen, or can be moved to another location via, for example, a gesture. In FIG. 18, the application area 1808 displays, for example, a standard application with the virtual keyboard 1804 being displayed in the lower portion of display 1010. In FIG. 19, for example, the application area 1908 is showing a dual-screen enabled application in max mode. The keyboard 1804 is again similarly displayed in the lower portion of the display 1010.

Figure 20:
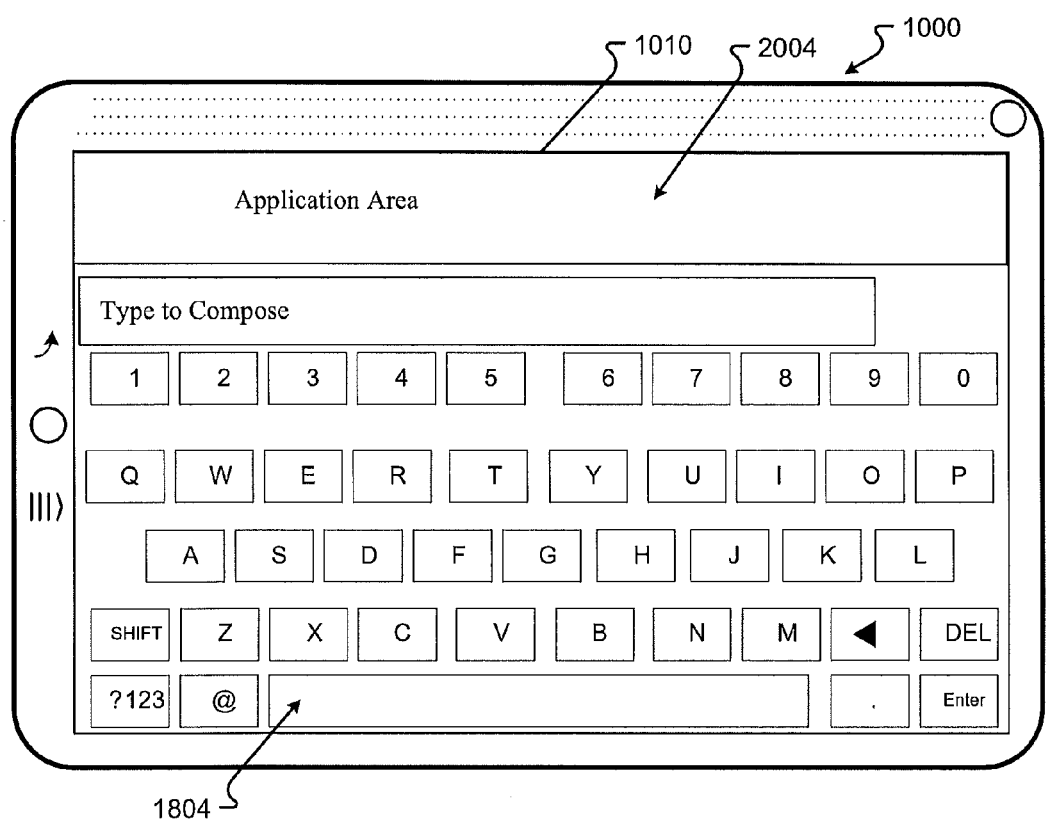
FIG. 20 illustrates another example of keyboard management for the SP in landscape mode.
Figure 21:
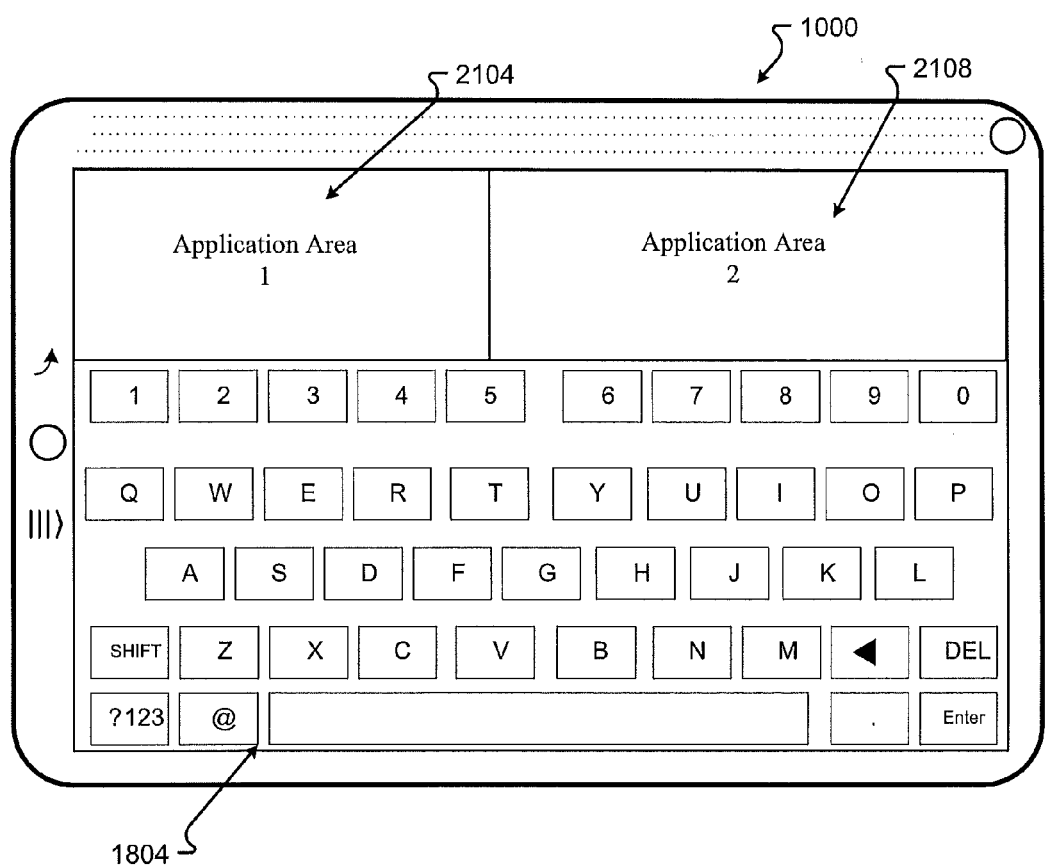
FIG. 21 illustrates an example of a dual screen application running in a dual screen emulation mode on the SP with a virtual keyboard.

In FIG. 20, in SP landscape mode, the keyboard 1804 is displayed in the lower portion of display 1010 with the application area 2004 substantially or completely filling the displayable area above the keyboard 1804. In FIG. 21, the SP is again in landscape mode and displaying a dual-screen enabled application in max mode, the application area 1 2104 and application area 2 2108, the keyboard 1804 is displayed below the two application areas.

In general, in the embodiments illustrated in FIG. 18 through FIG. 21, a first determination is made as to whether a keyboard should be displayed. If the keyboard is to be displayed, the next determination is made as to the orientation of the SP. If the SP is in a portrait mode, the virtual keyboard is presented also in a portrait mode, preferable on the lower portion of the screen. If the SP is in a landscape mode, the keyboard is optionally re-sized to be substantially displayed on a lower portion of the display with, for example, one or more application windows being located above the virtual keyboard. With the orientation of the SP change, the keyboard is also reoriented to be coincident with the orientation of the SP. Similarly, when the keyboard is no longer required, the keyboard is hidden with the application area(s) being expanded to again substantially fill the display 1010.

Figure 22:
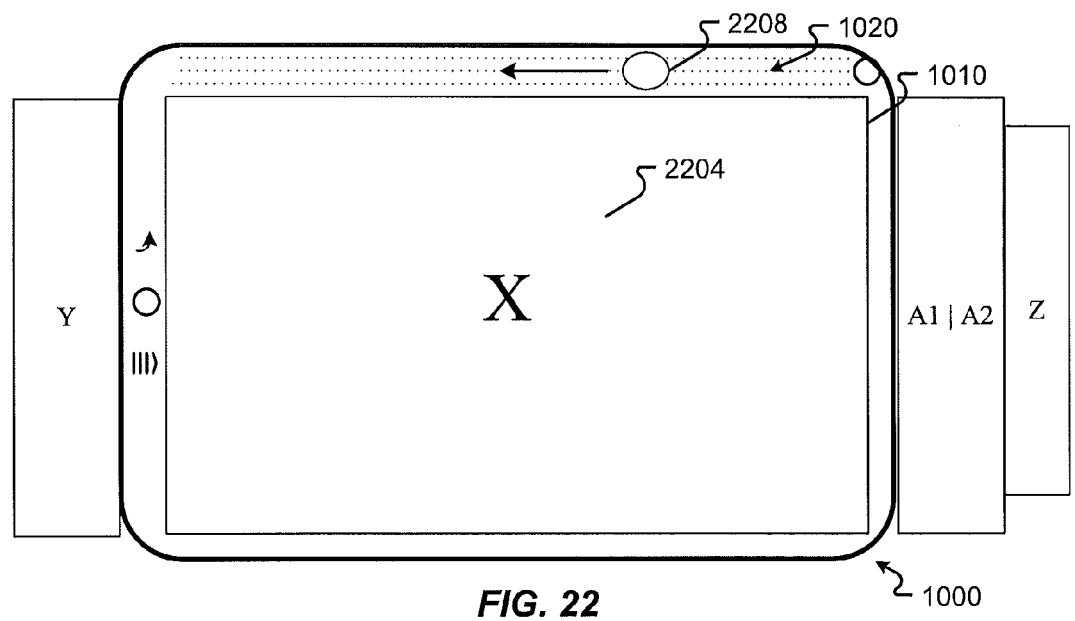
FIG. 22 illustrates an example of application window stack management on the SP.
Figure 23:
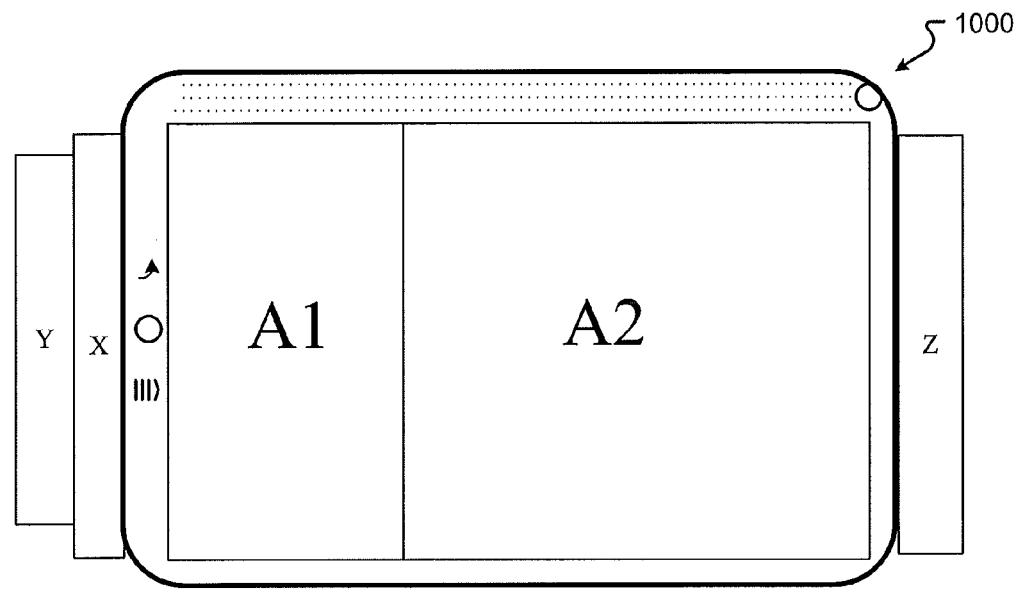
FIG. 23 illustrates another example of application window stack management on the SP.

FIG. 22 and FIG. 23 illustrate exemplary methods of managing window positions on the SP 1000. In particular, in FIG. 22, application X 2204 is in view on display 1010. On receiving user input, such as the swipe motion represented by 2208 in the gesture capture region 1020, application X is "scrolled" to the left to be replaced with the dual-screen application A1|A2, as shown in FIG. 23. If the same gesture 2208 were to be repeated again, application Z would come into view. Similarly, if in FIG. 22 gesture 2208 was in the opposite direction, to the right, application Y would come into view on display 1010. Scrolling through available windows is of course applicable to both the landscape and portrait mode of the SP in a similar manner. For example, in portrait mode, instead of the gesture traversing from left to right or right to left, the gesture could traverse in a downward motion, or in an upward motion, with the virtual stacks of the windows being located "above" or "below" the device, similar to a rolodex. Thus, when the user initiates a downward type gesture, the next application "above" is displayed on display 1010.

Figure 24:
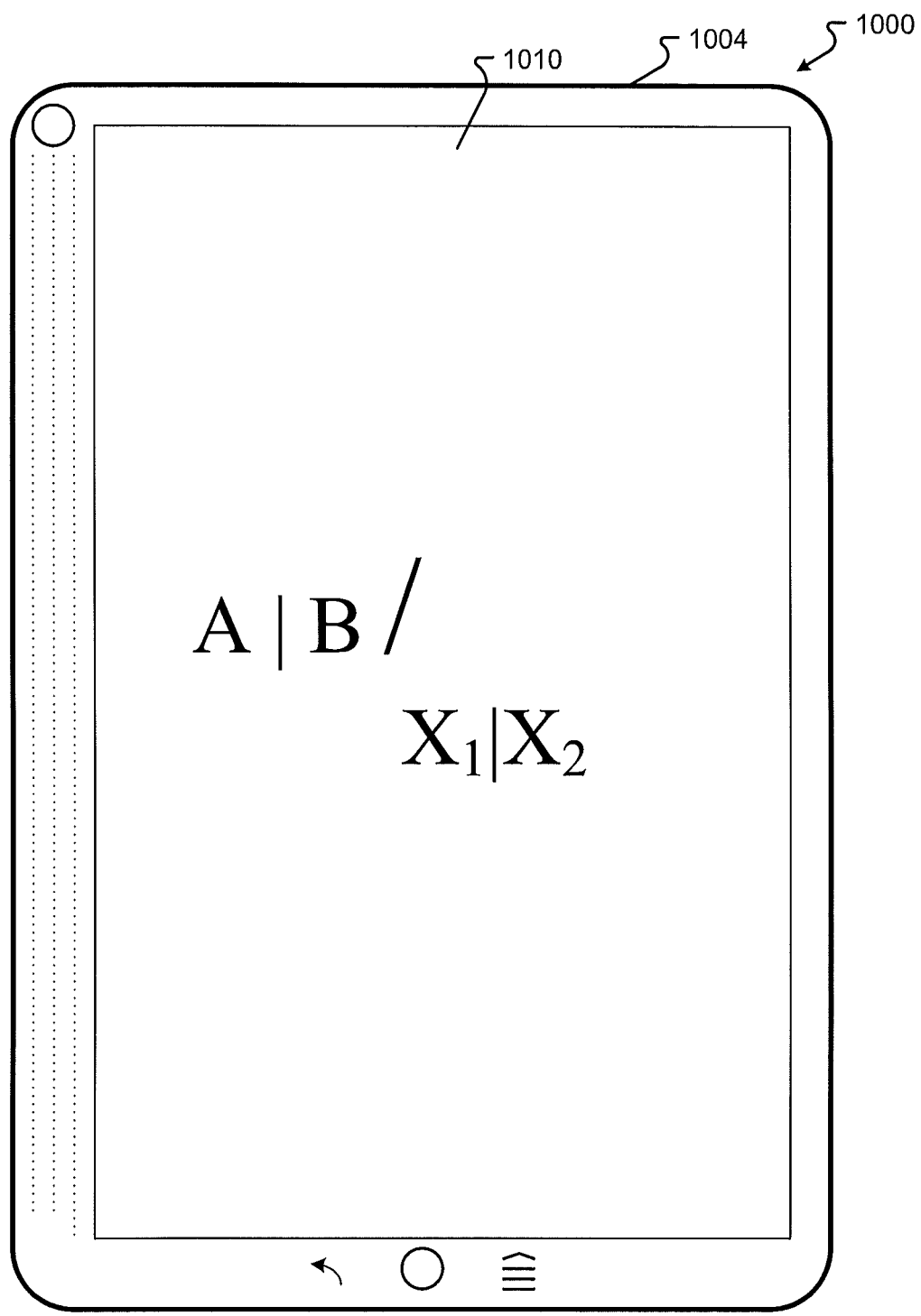
FIG. 24 illustrates an example of multi application mode of the SP, wherein in the multi application mode the SP emulates the device in its mini-tablet form.
Figure 25:
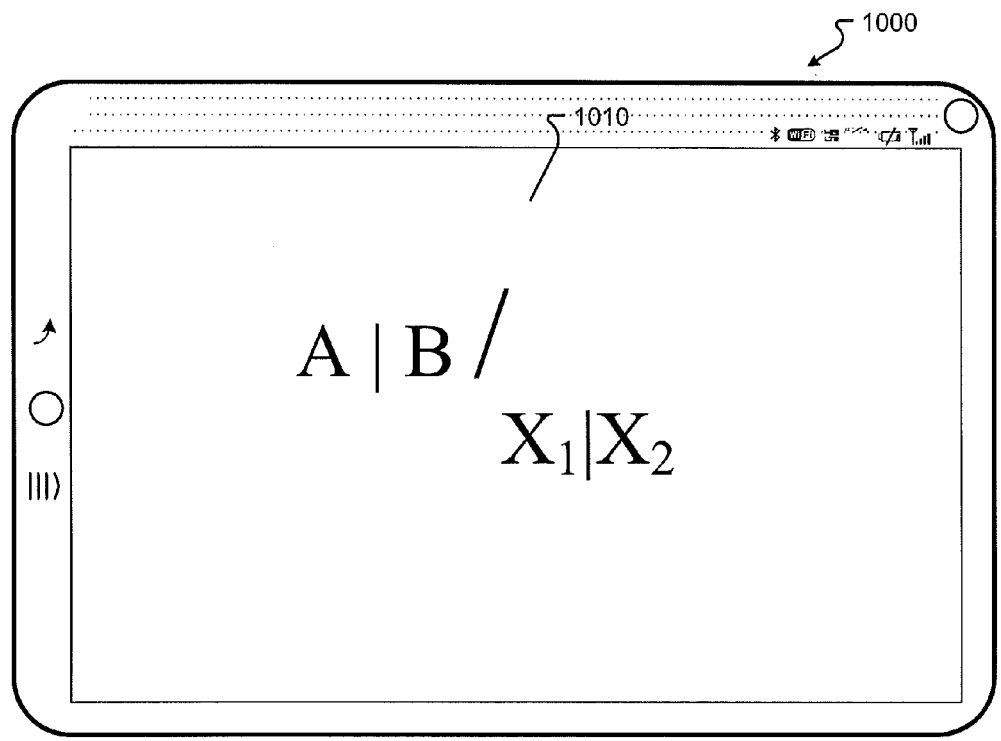
FIG. 25 illustrates another example of multi application mode of the SP.

FIG. 24 illustrates the multi application mode of the SP 1000, wherein in the multi application mode the SP 1000 emulates the device 100 in its mini-tablet form—with this mode optionally being invoked by selection of a multi application button (shown and described hereinafter). A simplified way of understanding this mode is to appreciate that the mode emulates the device 100 being opened. In this multi application mode, the SP 1000 can inherit the rules regarding the display of information on the device 100—For example, that all applications are launched in single screen mode. One exception could be applications that support a max mode can be by default automatically expanded to this mode if provided the opportunity.

In this mode, each application has the ability to determine how the application appears in each orientation (e.g., portrait and landscape).

Figure 26:
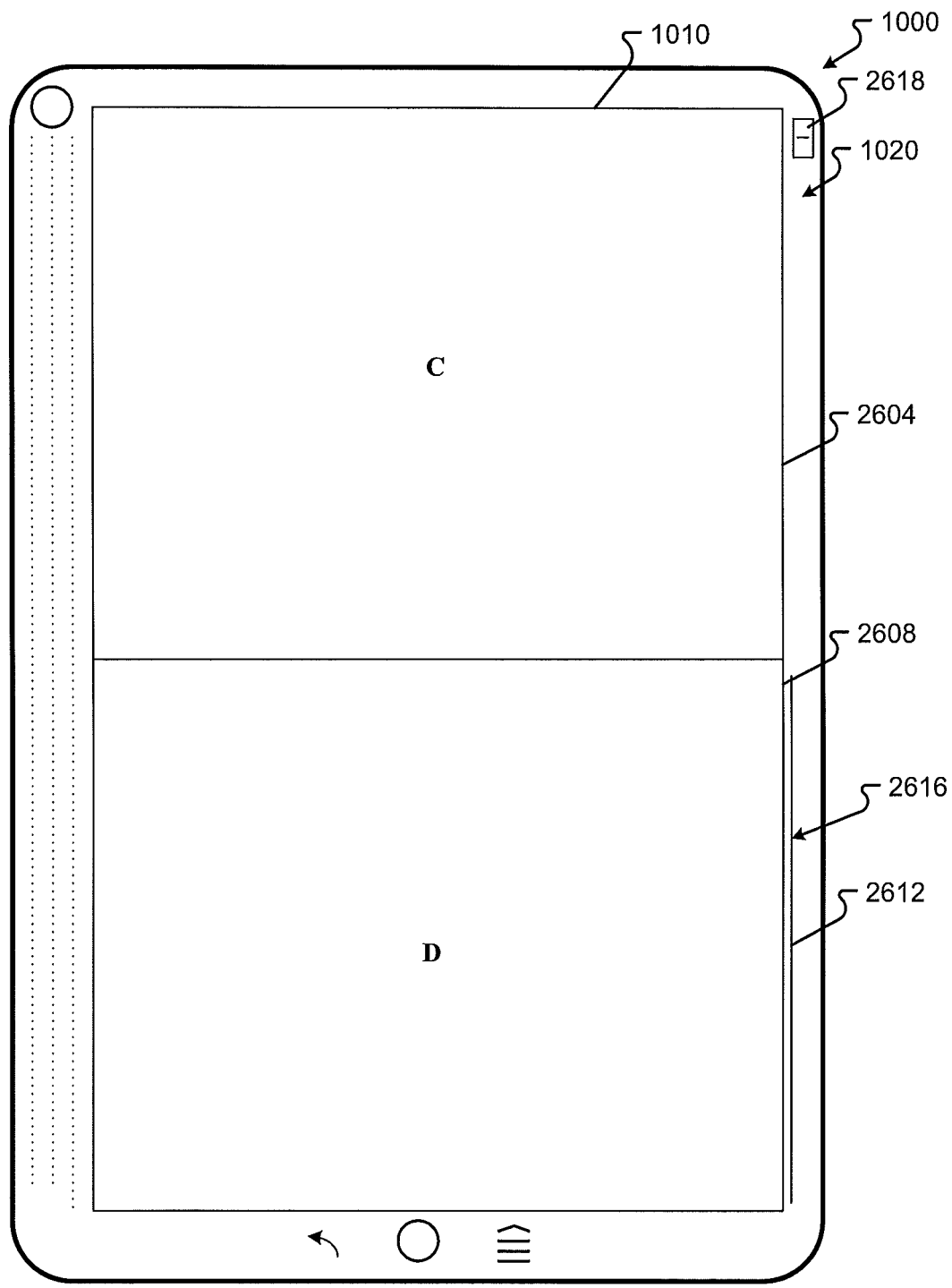
FIG. 26 illustrates another example of multi application mode of the SP.

FIG. 26 illustrates an exemplary method of managing the multiple application mode of the SP 1000. In the multiple application mode, multiple applications can be managed and displayed within the display 1010. In multi application mode, the SP1000 having the single screen emulates the dual screens of the device 100. To initiate the multiple application mode, a button/toggle 2618 is selected, which allows the user to select multiple applications for display in the display 1010. In this exemplary embodiment, a first application 2604 C, is shown in the upper-portion of the portrait mode SP 1000 and a second application 2608 D, is shown in a lower-portion of screen 1010. In conjunction with the displaying of multiple applications in the multiple application mode, focus indicator 2616 can be provided to assist the user with identifying which application is in focus. As discussed, this focus indicator 2616 can be a light bar, or other indicator (such as an indicator in the screen 1010 or beside 2608) drawing the user's attention to which application is in focus. In the exemplary embodiment in FIG. 26, application D 2608 is in focus as represented by the focus indicator 2616. In accordance with this exemplary embodiment, and while the focus indicator 2616 is shown in the gesture capture region 1020, it should be appreciated that the focus indicator could be located in some other portion of the SP 1000. For example, the window for the application in focus could be slightly re-sized to allow for the display of a bar of pixels adjacent to the window, which would similarly alert the user to the fact that that application is in focus. Similarly, the application in focus could appear at normal brightness while the application not in focus could be slightly dimmed. In general, any technique could be used to assist the user in readily determining which application is in focus.

To change focus, a user could use any of the gestures discussed herein or could, for example, simply touch the area where application C is displayed, thereby changing focus to application C, at which point a corresponding relocation of the focus indicator 2616 to adjacent to application C would occur.

Figure 27:
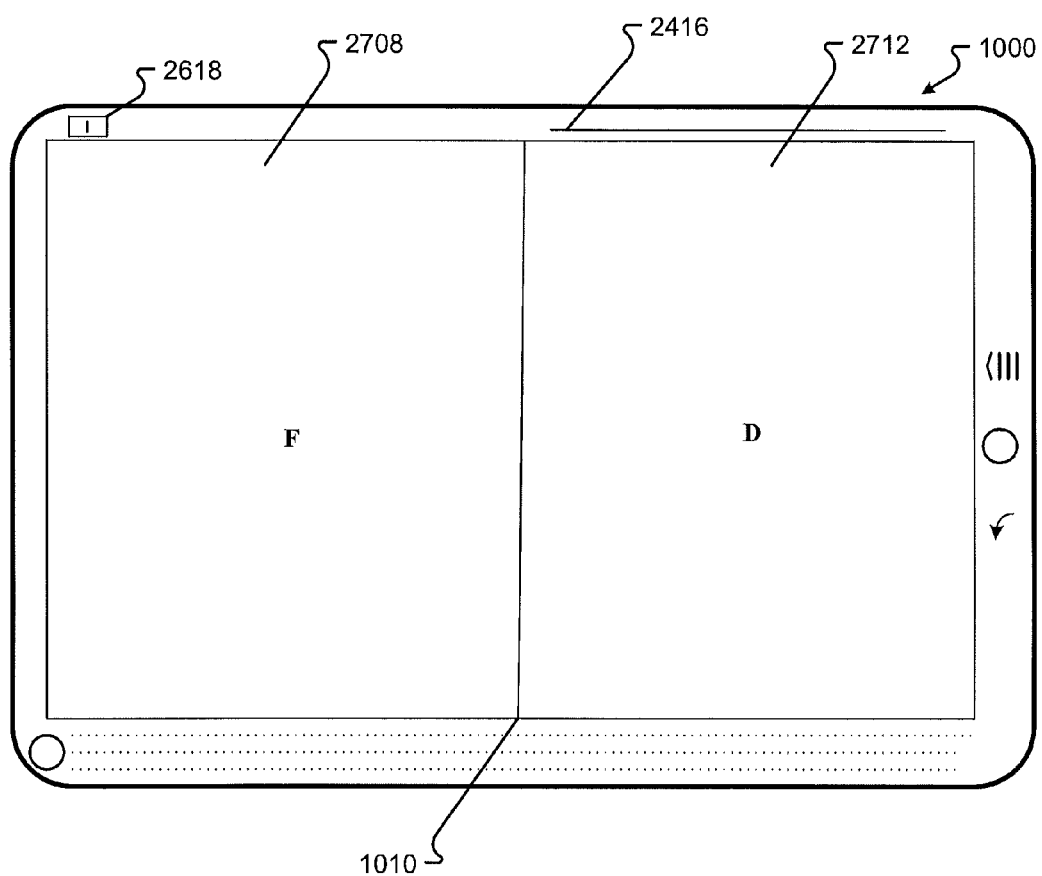
FIG. 27 illustrates another example of multi application mode of the SP.

FIG. 27 illustrates a similar scenario for a landscape mode SP 1000. In particular, and upon selection of the multi application mode, the display 1010 is divided between, in this example, a first application D 2712, and a second application F 2708. Here, application D is displayed on the right-hand portion of display 1010 and application F displayed on the left-hand portion of display 1010. While in this exemplary embodiment, the display real estate is split 50/50 between the two applications, it should be appreciated that one application could be displayed on a larger portion of the display 1010 than the other. In this particular exemplary embodiment, application D is in focus, as represented by focus indicator 2416.

In the multiple application mode, in both portrait and landscape orientations, each application could have its own associated window stack as show in FIG. 22 and FIG. 23, or there could be one stack shared between all of the displayed applications. More specifically, if each application has its own stack, with a stack structure similar to that illustrated in FIG. 22, a stack would be available for the first application, such as application X, and a similar stack would be available for application Y. Each of these stacks could be independently scrolled through using, for example, a gesture as discussed above.

Figure 28:
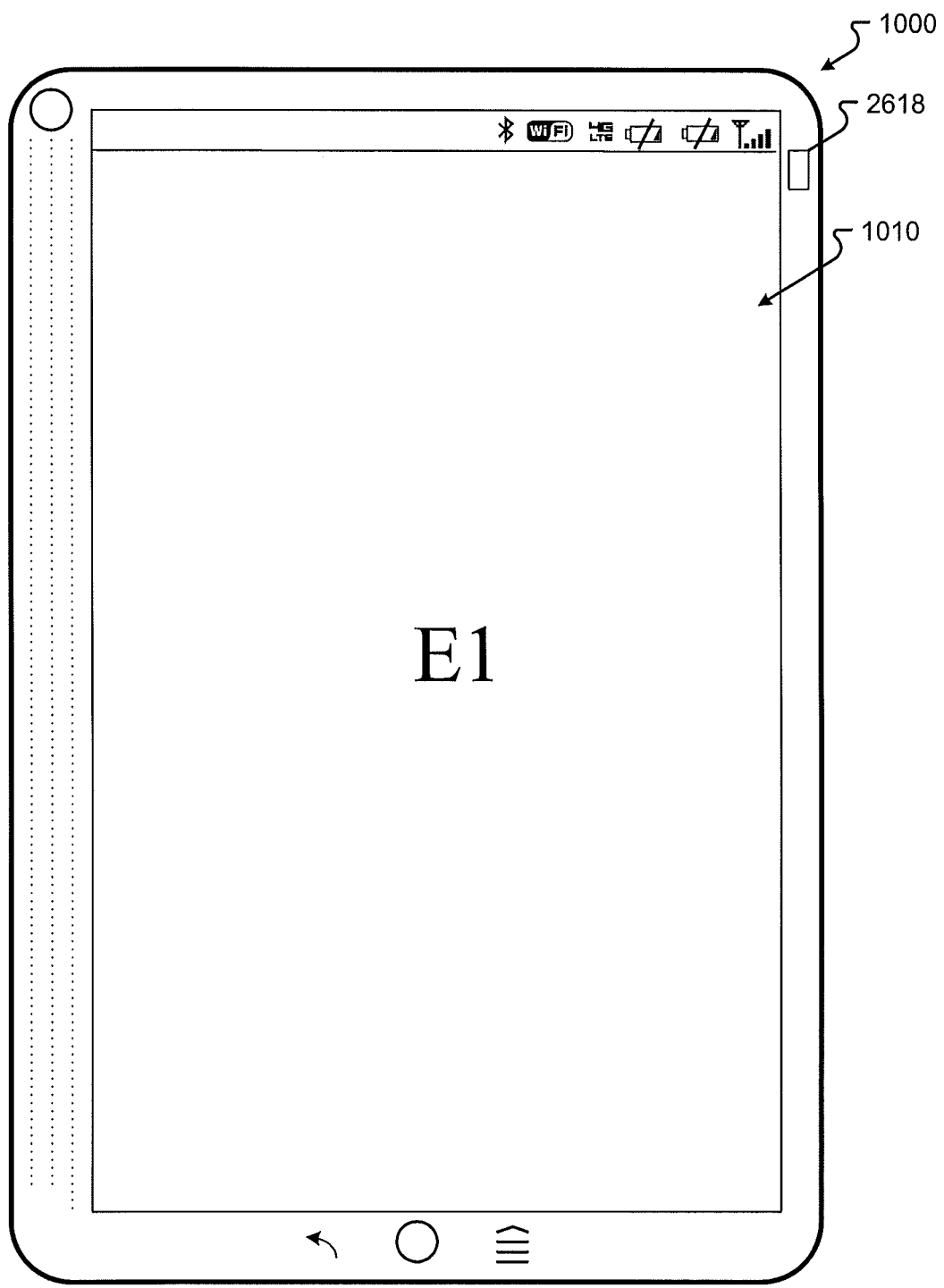
FIG. 28 illustrates a method for managing screen display.

FIG. 28 illustrates an exemplary method for managing screen display characteristics according to another embodiment of this disclosure. In accordance with this embodiment, a determination is made whether an application can be maximized, and if it can be maximized, it is expanded to the dual screen mode or max mode, as appropriate, to substantially fill the display 1010 as illustrated in the figure. Here, application E1, which is an application that can be maximized, has been expanded using the max mode to substantially or completely fill display 1010.

In FIG. 28, button 2618 allows a user to toggle between a single screen mode (as illustrated in FIG. 28) and an emulated dual screen mode, for example, as illustrated in FIG. 26 and FIG. 27. Here, button 2618 does not include the "1" therefore indicating to the user the SP 1000 is in single screen mode.

Figure 29:
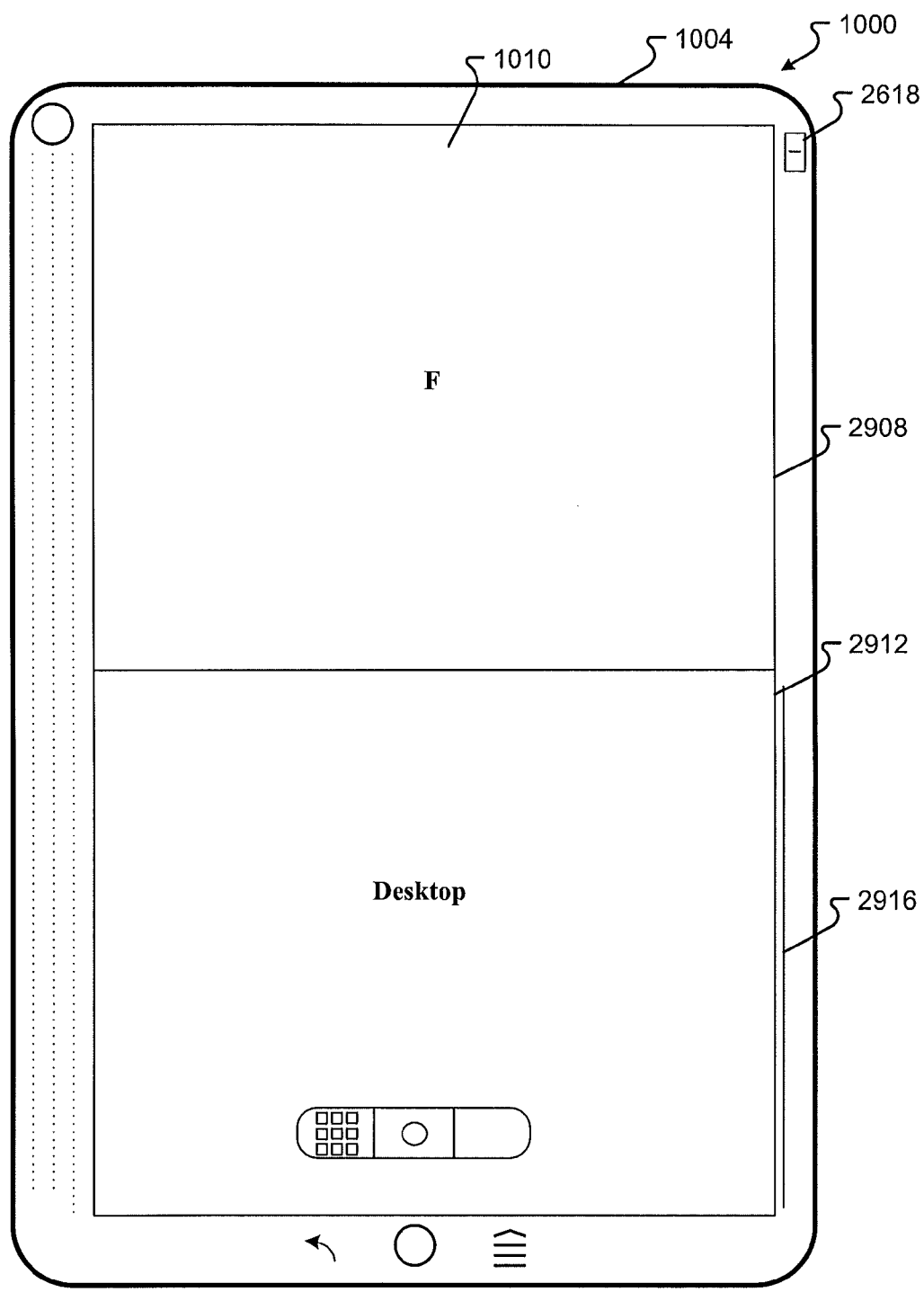
FIG. 29 illustrates an exemplary method for managing screen display with the desktop.

FIG. 29 illustrates an exemplary method of managing windows. In this exemplary embodiment, and similar to the operation of the device 100, when the last application in the stack is moved to the side, the desktop is displayed. Even more specifically, as shown in FIG. 29, application F 2908 is displayed in an upper portion of display 1010 and the desktop 2912 is displayed in the lower portion of display 1010. Here the desktop is in focus, as illustrated by the focus indicator 2916. This configuration is available since the user has selected the dual-screen emulation mode button 2618.

Figure 30:
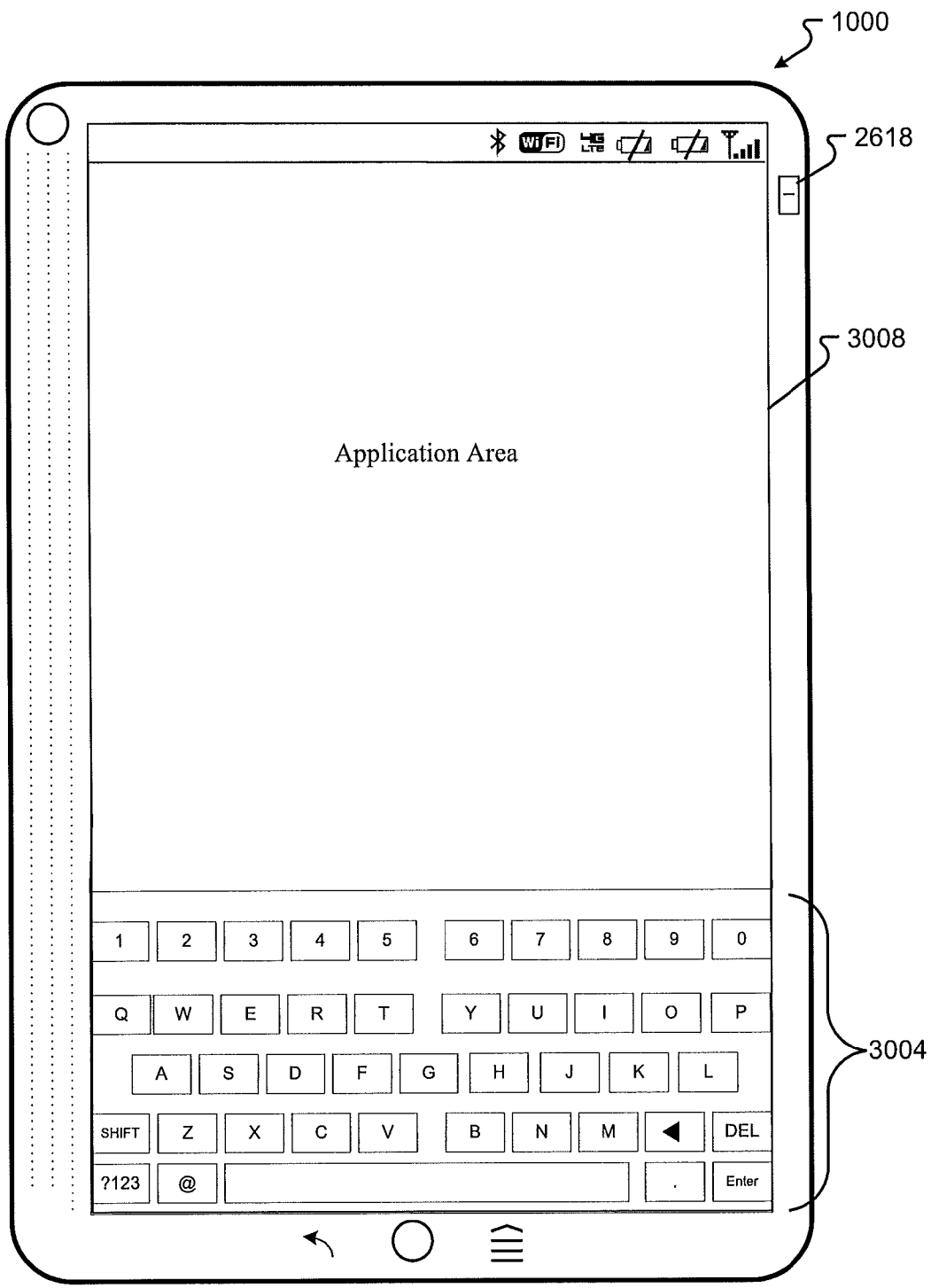
FIG. 30 illustrates an exemplary method of managing screen display with a keyboard.

FIG. 30 illustrates an exemplary method of displaying a keyboard according to one embodiment. In particular, when the SP is in portrait mode, the SP will have a keyboard area 3004 and an application area 3008. Upon display of the keyboard 3004, the application in application area 3008 is resized to substantially or completely fill the area of the screen not occupied by the keyboard 3004.

Figure 31A:
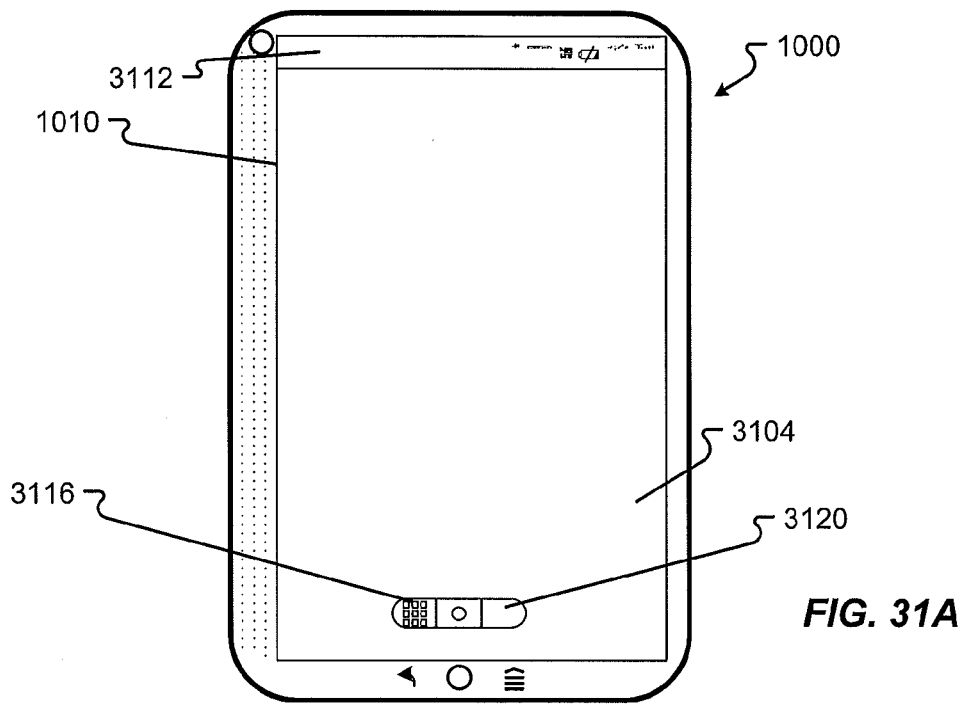
FIGS. 31A and 31B illustrate desktop management on the SP.
Figure 31B:
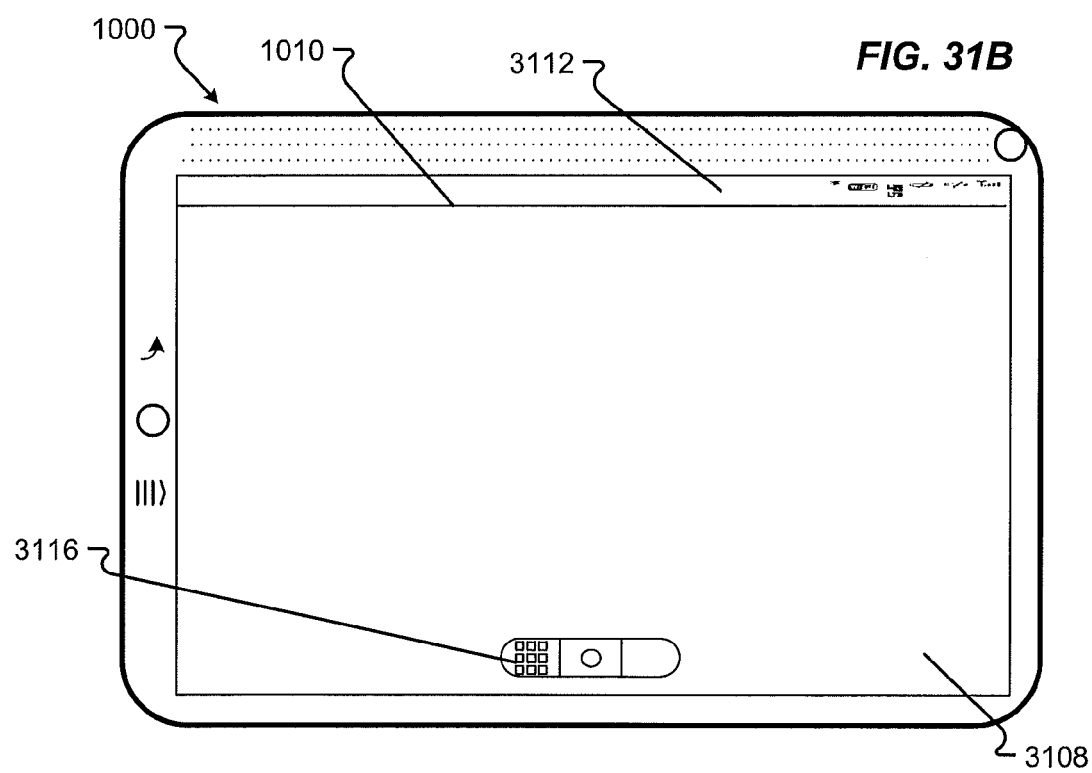

FIG. 31A and FIG. 31B illustrate desktop availability in both the single application mode and dual application mode in both the SP landscape mode and SP portrait mode. In particular, and in accordance with an exemplary embodiment, the desktop 3104 will occupy the entirety of the screen 1010. Additionally, and in accordance with this exemplary embodiment where the desktop is shown in a full-screen mode, the enunciator bar 1312 can be expanded across the entirety of the screen 1010. This can occur in both the portrait mode as shown in FIG. 31A as well as the landscape mode as illustrated in FIG. 31B. From here, upon selection of the application launcher 3116, the application launcher can optionally expand across the entirety of the screen 1010 in either the portrait or landscape mode. Similarly, the file explorer, which is launched by pressing the file explorer button 3120, can be similarly expanded into substantially all or all of the screen 1010 space.

Figure 32A:
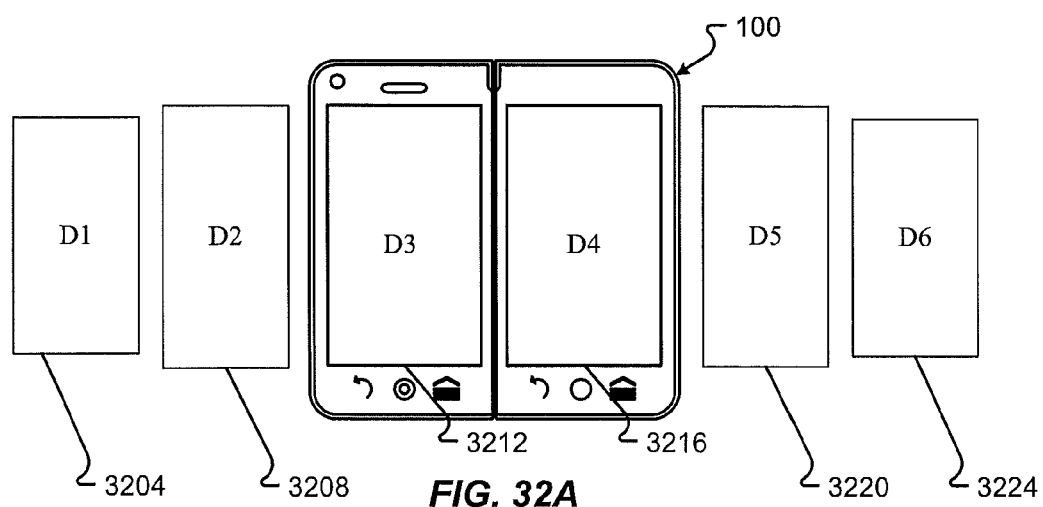
FIGS. 32A and 32 B illustrate exemplary methods for desktop panel management.
Figure 32B:
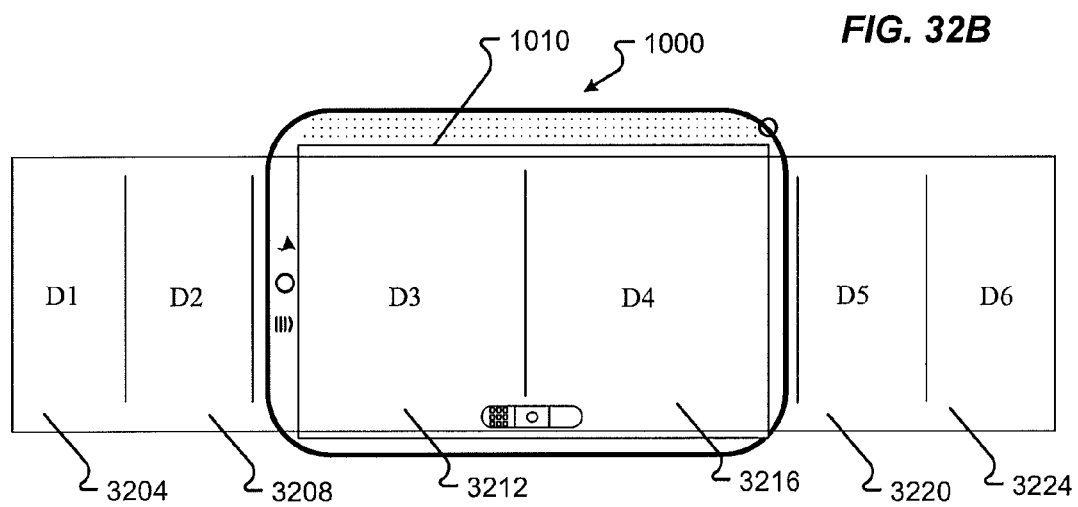

FIG. 32A and FIG. 32B illustrate screen redrawing that may be required to transition the desktop from the device 100 to the SP 1000. In particular, in FIG. 32A, six exemplary desktop panels are shown 3204-3224. These desktop panels are moveable in a carousel-like fashion based on gesture input from a user. However, it may not be possible to directly translate these panels to display correctly on the SP 1000 without the panels being distorted or not occupying the entirety of the screen 1010. Accordingly, in accordance with one exemplary embodiment, one or more of the panels 3204-3224 can be resized when displayed on the SP 1000 to accommodate all or substantially all of the screen 1010. In accordance with another exemplary embodiment, more than two of the panels can be shown on the screen 1010, such as a portion of panel D2 3208, a portion of panel D3 3212 and a portion of panel D4 3216. In this manner, the desktop illustrated on the SP 1000 will have a similar look-and-feel to the desktop panels shown on device 100. The same carousel-like motion is available via a gesture input to the SP 1000 such that a user can scroll to the one or more panels of the desktop.

Figure 33:
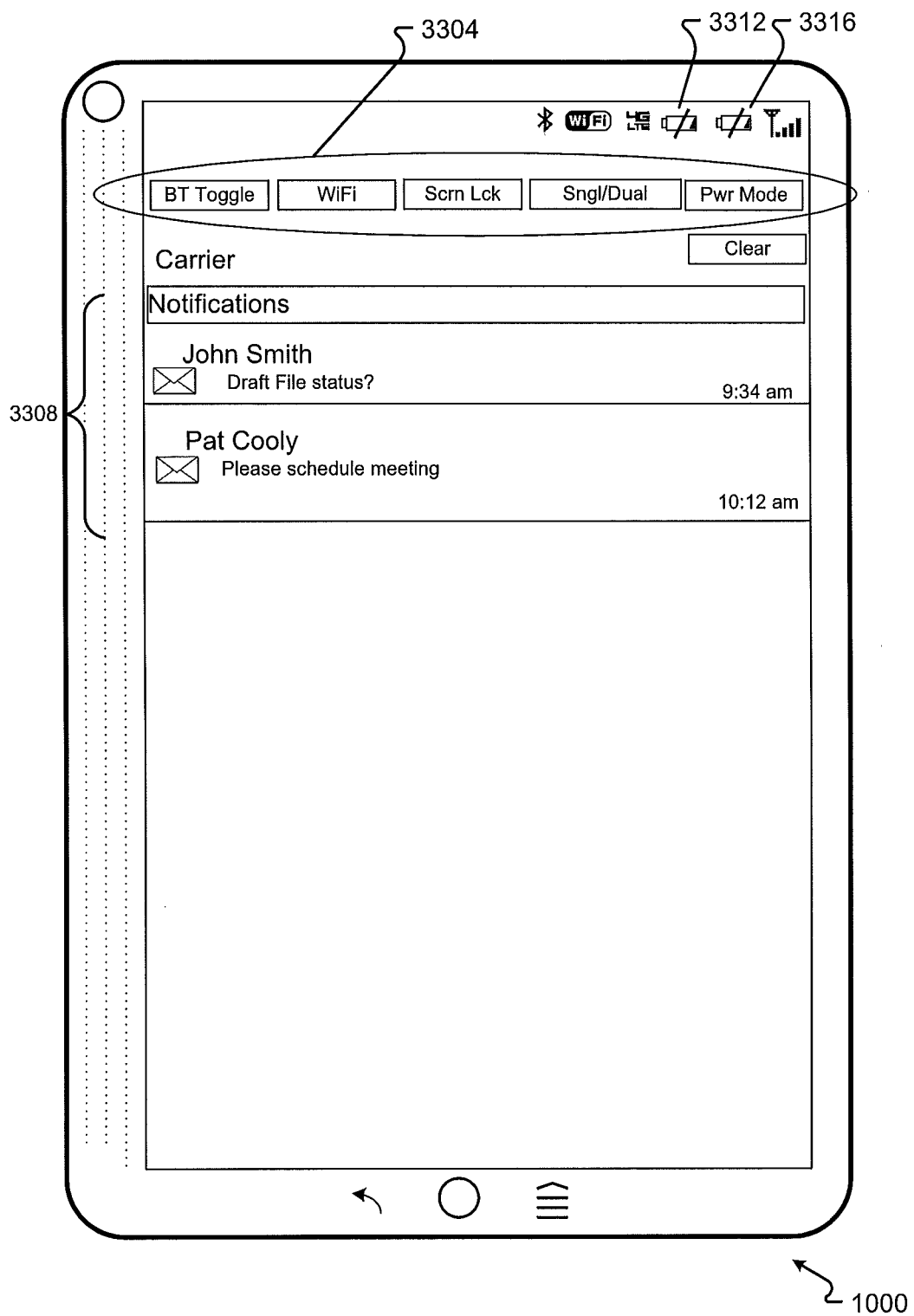
FIG. 33 illustrates exemplary notification management on the SP.

FIG. 33 illustrates an exemplary notifications display that behaves on the SP 1000 in a very similar manner to that of the device 100. In particular, and whether in the portrait or landscape mode, notifications and status/toggle buttons are provided that allow the user to, for example, toggle on or off Bluetooth®, WiFi, screen lock, dual or single screen mode, power options, and the like. These, as well as other options are generally shown in area 3304. Additional notifications can also be shown in area 3308 including one or more of carrier information, notification information, communication information, and the like as discussed above.

In more detail, area 3304 provides some buttons for standard widgets such as WiFi toggle on and off, Bluetooth® toggle on and off, and the like. The screen lock toggle can allow, for example, user to lock the screen thereby prohibiting it from rotating despite the orientation of the SP 1000. The toggle can change color or display characteristics to indicate whether screen lock has been enabled. The single/dual application mode button toggles, for example, three different states including a dual application mode state, a single application mode state, and a single application lock state. The power mode toggle toggles between a handset optimized, SP optimized, hybrid power consumption, or of the like. These power modes can be associated with power levels, as indicated by the two battery status indicators 3312 and 3316 which correspond to the power levels in the device 100 and SP 1000, respectively.

Figure 34A:
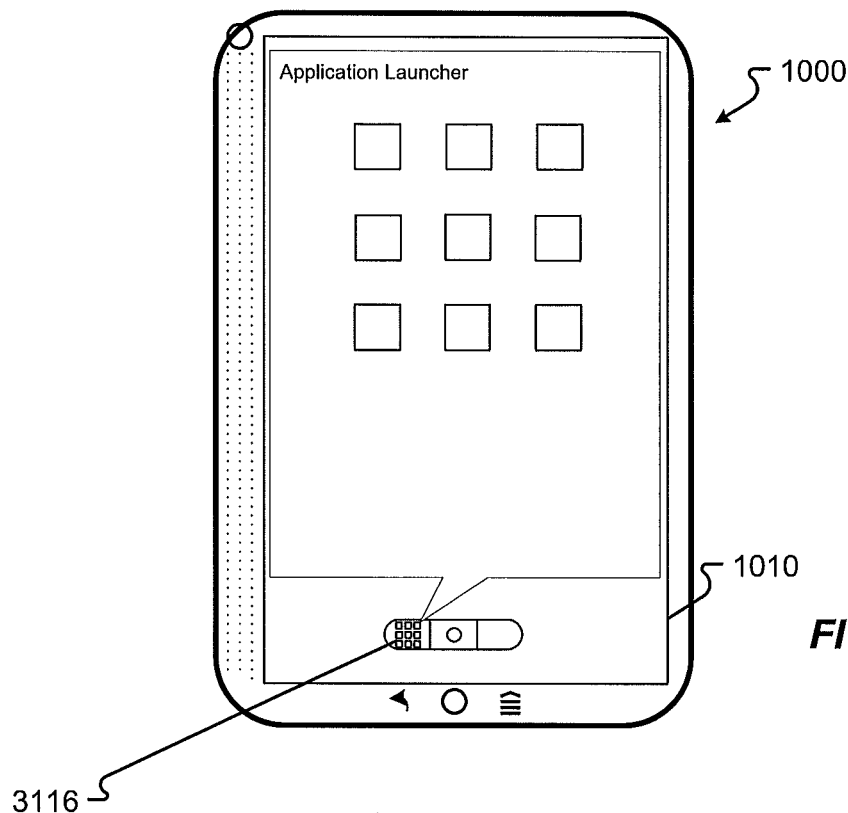
FIGS. 34A and 34B illustrate exemplary techniques for application management.
Figure 34B:
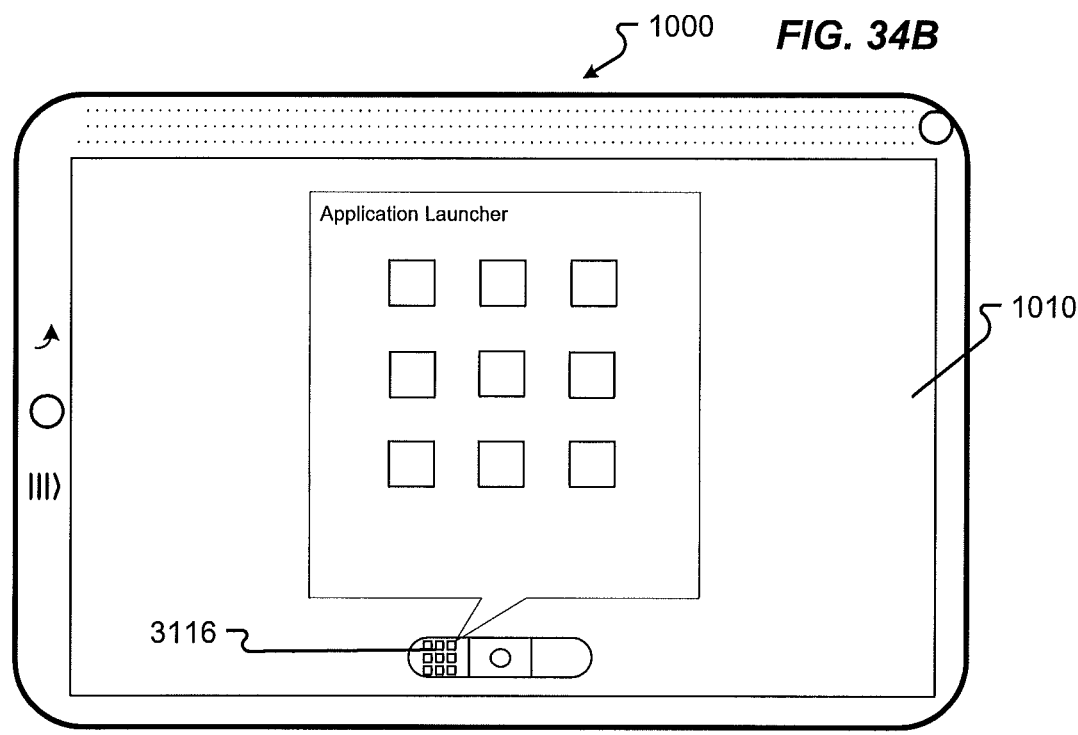

FIG. 34A and FIG. 34B show exemplary methods of launching and displaying the application launcher upon selection of the application launcher button 3116. In both the portrait mode illustrated in FIG. 34A and landscape mode illustrated in 34B, and when the SP is in single application mode, the application launcher can appear in a bubble so as to not necessarily take up the entirety of the screen 1010. However, for example, upon receiving an appropriate gesture or input by the user, the application launcher can be expanded to take up the entirety of the screen 1010. This could further be classified in a preference such that the default is to always open the application launcher in a bubble so as to not take up the entirety of the screen 1010, or to always open in full screen mode, taking up substantially all, or all of the screen 1010.

Figure 35A:
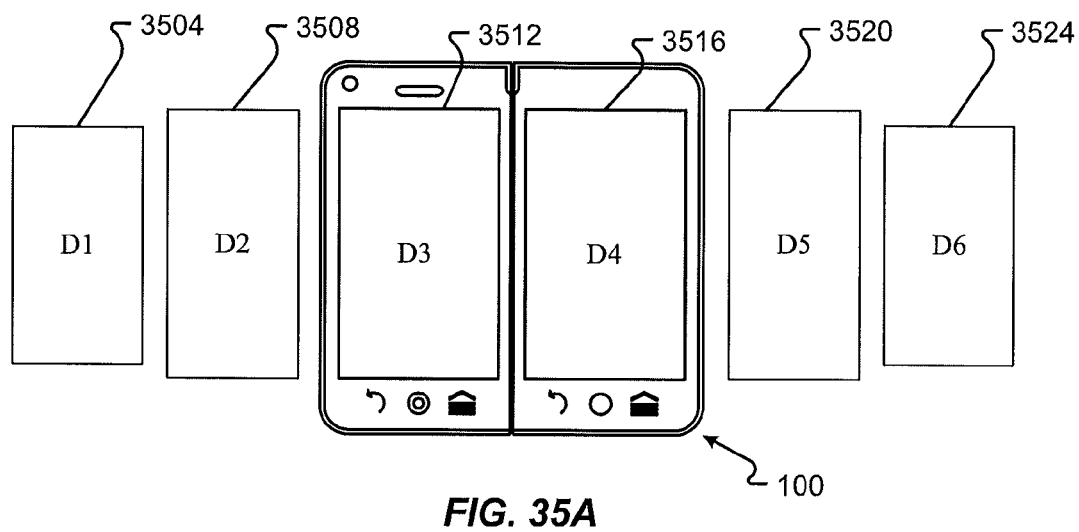
FIGS. 35A and 35B illustrate an exemplary method for providing desktop previews or hints.
Figure 35B:
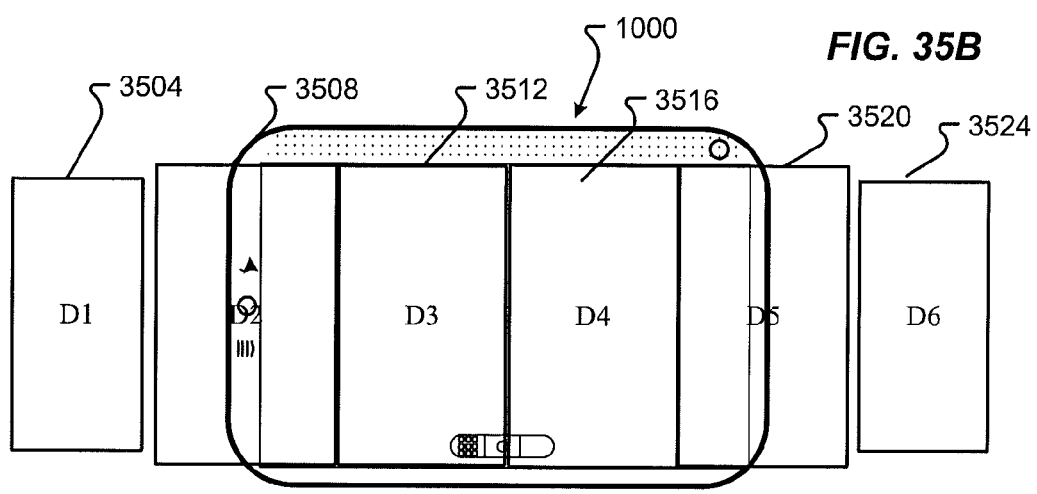

FIG. 35A and FIG. 35B illustrate an optional embodiment whereby the system could provide "hints" as to the content of desktop panels that are not fully in view. More specifically, FIG. 35A shows the first embodiment of the desktop panels D1-D6, 3504-3524 respectively. As discussed, a user is able to scroll through these panels in a carousel-type fashion, revealing any of the content in D1-D6. In accordance with the optional embodiment illustrated in FIG. 35B, where the same panels D1-D6 are available for viewing by user, the user is given a preview of one or more adjacent panels, here D2 3508 and D5 3520. In this configuration, this user is able to "peek" at the content of the adjacent panel(s) without necessarily scrolling in a carousel like fashion to view the entirety of the panel. More specifically, the entirety of panel D3 3512 and D4 3516 is shown on the display 1010. In addition, approximately one third of panel D2 3508 and one third of panel D5 3520 are also shown on the display 1010. As will be appreciated, more or less of panels D2 and D5 could be shown, with the greater of the panel being shown, the more visibility into that portion of the desktop the user would have.

Figure 36:
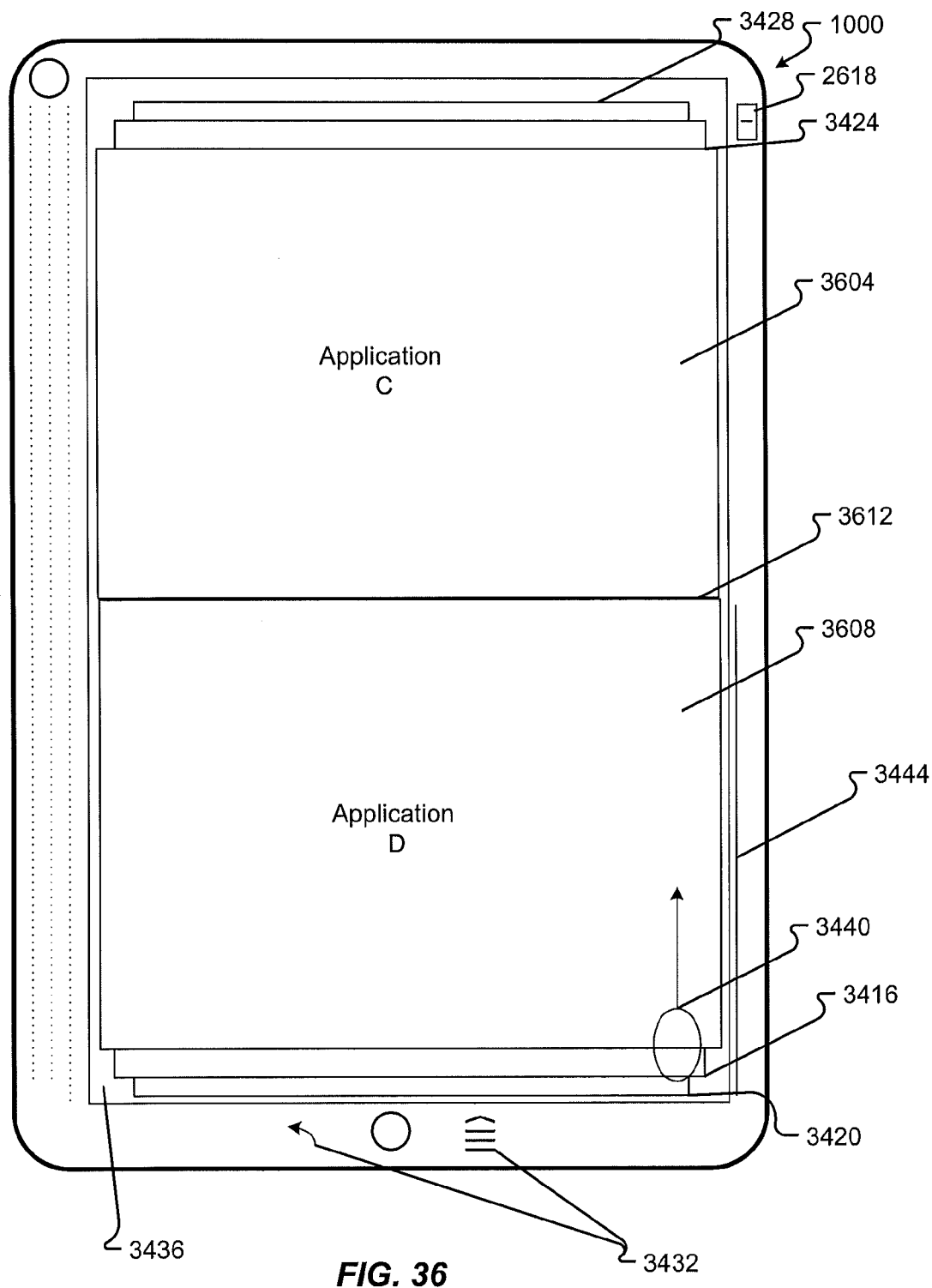
FIG. 36 illustrates an exemplary carousel application window stack.

FIG. 36 illustrates an optional embodiment for managing in a multiple application mode the stack of windows. This elegant method reinforces the conceptual model and assists the user with visualizing spatially the "carousel" type arrangement of the stack in the multi application mode. As is to be appreciated, while the exemplary embodiment shown in FIG. 36 is directed toward portrait mode of SP1000, it can work equally well in the landscape mode with the difference being instead of the carousel rotating from a top to bottom or bottom to top type arrangement, the "carousel" could be manipulated in a left to right or right to left type operation. However, the carousel could also work in a top to bottom or bottom to top mode in landscape mode as well.

In this exemplary embodiment, when multi-application mode is enabled via button 2618, application C 3604 and application D 3608 can be displayed, separated by separator 3612. In accordance with this optional exemplary embodiment, there are also one or more overflow applications behind application C 3604, here the overflow applications being 3424 and 3428. In a similar manner, there can be one or more overflow applications behind application D 3608, here application 3416 and application 3420. In this particular exemplary embodiment, the back and menu buttons 3432 can be enabled with a portion of the desktop 3436 being viewable behind the application stack. Upon receipt of one or more input gestures, such as gesture 3440, a user can scroll through the "carousel" of applications, in this instance, relocating application D 3608 to application C 3604's position, and thereby revealing application 3416. In addition, the focus indicator can be displayed near the application that is in focus. In this particular example, focus indicator 3444 is displayed beside application D. In accordance with an optional exemplary embodiment, instead of the stack "stopping" when the user reaches the last application, such as application 3420 or application 3428, the applications can be stacked in a circular manner, and continuously rotate in response to one or more input gestures by a user.

Figure 37:
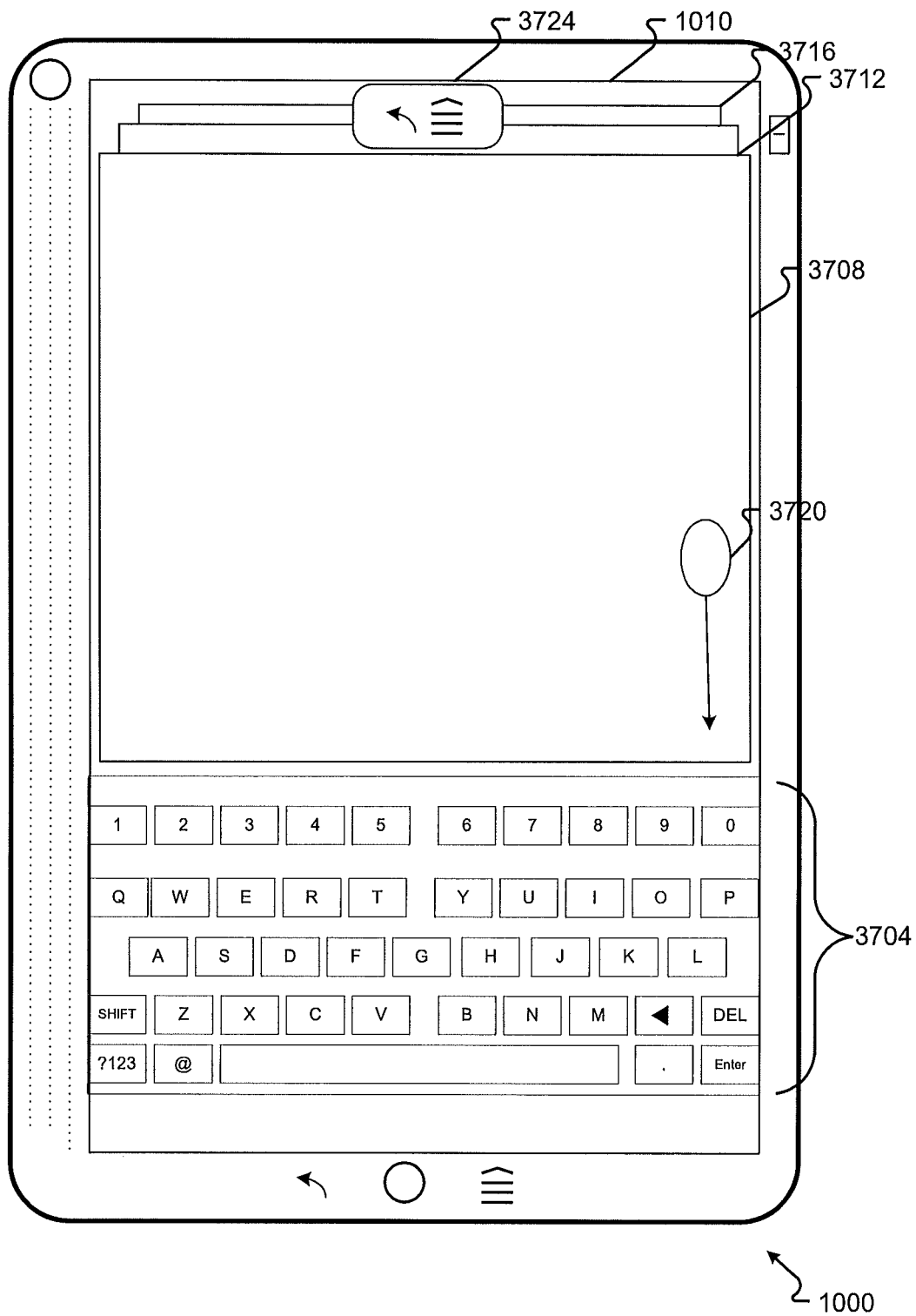
FIG. 37 illustrates an exemplary carousel application window stack with a virtual keyboard.

These concepts can be extended to the situation where the keyboard is also displayed in the multiple application mode. For example, and as illustrated in FIG. 37, the keyboard 3704 is displayed below the application stack 3708. "Behind" the application stack 3708, are additional applications 3712 and 3716 that the user can access via, for example, initiation of gesture 3720. This exemplary embodiment has the applications scroll in a carousel-like fashion into and out of view, with the keyboard 3704 remaining visible, for example, at the bottom of display 1010. As with the embodiment in FIG. 35, the back and menu buttons can be enabled and, for example, virtually displayed on the display 1010 as illustrated by graphical button 3724.

The capabilities of SP 1000 can provide flexibility and versatility in display management by one or more of the display controller 544, framework 520, window management module 532, display configuration module 568, as well as middleware 520 and associated classes.

With reference to FIGS. 57A-E and 58A-C, the various display modes and orientations of the SP 1000 are depicted. SP 1000 has two tablet orientations, namely portrait and landscape) and two application modes, namely single and dual. The differing combinations of orientations and display modes are discussed below.

FIG. 57A (5700) depicts the portrait single application mode in which SP 1000 is in portrait orientation and single application mode. Single-display applications within SP 1000 are in portrait orientation and occupy substantially the entire application area.

FIG. 57B (5704) depicts the portrait dual application mode in which SP 1000 is in portrait orientation and dual application mode. The separate views 5702 and 5706 of single-display applications within SP 1000 are each in landscape orientation while the composite display and SP 1000 are also in landscape orientation.

FIG. 57C (5708) depicts the landscape single application mode in which SP 1000 is in landscape orientation and single application (or max) mode. The view of the single-display application within SP 1000 and the SP 1000 are each in landscape orientation.

FIG. 57D (5712) depicts landscape dual application mode in which SP 1000 is in landscape orientation and dual application mode. The separate views 5702 and 5706 of single-display applications within SP 1000 are each in portrait orientation while the composite display and SP 1000 are in landscape orientation.

FIG. 57E (5716) depicts a portrait multi-display application in which the application display of SP 1000 is presented in its portrait max mode.

FIG. 58A (5800) depicts a multi-display application in which SP 1000 is in portrait orientation and the separate views 5802 and 5806 of multi-display applications within SP 1000 are each in landscape orientation (the view spanning across the entire screen) while the composite display and SP 1000 are in portrait orientation (when the windows or other displayed objects are maximized). When minimized, the windows or other displayed objects of the multi-display applications are presented in landscape orientation (the view not spanning across the entire screen).

FIG. 58B (5804) depicts a landscape multi-display applications in which application display of SP 1000 is presented in its landscape max mode.

Finally, FIG. 58C (5808) depicts a multi-display applications in which SP 1000 is in landscape orientation and the separate views 5802 and 5806 of multi-display applications within SP 1000 are each in portrait orientation (the view spanning across the entire screen) while the composite display and SP 1000 are in landscape orientation (when the windows or other displayed objects are maximized). When minimized, the windows or other displayed objects of the multi-display applications are presented in portrait orientation (the view not spanning across the entire screen).

The rules for seam 5520 use depend on a number of factors. When SP 1000 is in dual-application mode with windows or displayed objects from two separate applications in view, the seam 5520 is displayed in a central portion of the composite display and spans the entire height of the screen and/or composite display. The seam 5520 is also used to as a main indication of focus. The seam 5520 is also displayed when a window or displayed object from only one application is displayed along with a desktop. When the SP 1000 is in single-application mode, and a non-max mode-capable multi-display application is displayed, no seam 5520 is shown. Instead, one view is laid out across the entire display. When the SP 1000 is in single-application mode, and a max mode-capable application is displayed, the seam 5520 separates the views of the composite display. The seam generally can be placed anywhere between 25% and 75% of the composite display's width (relative to its portrait or landscape orientation), extends the entire height of the composite display (relative to its portrait or landscape orientation), and may even be omitted completely. When the desktop is revealed or no applications are executing, the seam 5520 is not displayed.

SP 1000 can allow switching between single and dual application modes. FIG. 59A (5900) depicts SP 1000 in dual-application mode, with two single-display applications visible as views 5902 and 5906. Upon switching to single-application mode, the application in focus remains visible in full screen view (FIG. 59B (5904)). Upon switching back to dual-application mode, the visible application returns to its original view and optionally is placed on the left/bottom part of the SP screen (FIG. 59C (5908)). As shown in FIGS. 59D-F (5912, 5916, and 5920) the separately displayed views 5924 and 5928 of a multi-display application behave in a similar manner except that the selected window 5924 enters the max mode. SP provides the user with a clear indication of the current application mode (dual or single) through an icon in the enunciator bar. Switching SP 1000 between single and dual modes is similar in nature to the opening and closing of the communication device 100; however in contrast to the behavior on the communication device 100, the application in focus remains on screen before and after the mode is switched. For example, when the keyboard is present when switching modes, the keyboard will remain visible when the transition is over.

With reference to FIGS. 55A-F, toggling a first application view 5502 into max mode is depicted. With reference to FIG. 55A (5500), first and second application views 5502 and 5506 in dual application portrait orientation are depicted. The first and second application views 5502 and 5506 in a composite display are divided by seam 5520. As noted, a seam 5520, or application display divider, visually separates the different application views in the composite display, such as when the SP 1000 is in dual-application mode and a multi-display application is maximized across the display.

When an application, such as the first application, supports max mode, it typically has a max mode button on the action bar (discussed below). When the max mode button is selected, the first application view 5502 (e.g., application area) expands to fill both the entire display area of the SP 1000 (FIG. 55B (5504)) regardless of prior first or second application state, and the seam 5520 disappears. When the first application view 5502 is currently minimized, max mode will trigger an auto-maximization. Any non-application area elements are hidden. Hidden elements include menus, tabs, action bar, notification bar, and other normally persistent controls.

When max mode is dismissed, the first and second application views 5502 and 5506 are restored (FIG. 55C (5508)). The application state is remembered when the max mode is toggled on and off, whereby a minimized application will return to its minimized state when the max mode is exited. As shown by FIGS. 55D-F (5512, 5516, and 5520 respectively), the same rules apply when the second application view 5506 is selected and when the second application view is max-mode capable.

Figure 49:
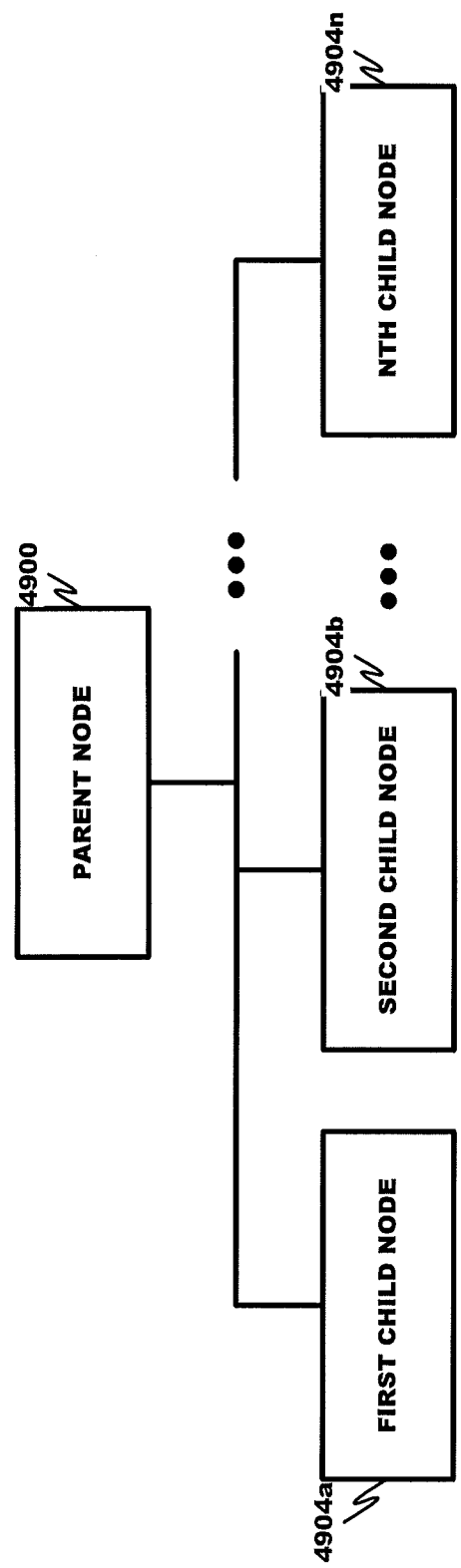
FIG. 49 depicts a hierarchical relationship according to embodiment.

FIGS. 49-52 depict the parent-child node structure used in various configurations of the communication device and SP. With reference to FIG. 49, a parent node 4900 has multiple first, second, . . . nth child nodes 4904a-n. In one application, the nodes correspond to documents or other displayed information. For example, a user selects a first link contained in a web page. The web page is designated as the parent node 4900 and parent web page, and the first web page corresponding to the first link is the first child node 4904a or first child view. This association is associated by a suitable mechanism, such as a link, an embedded identifier of one node in the other node's identification string, and other mechanisms known to one of ordinary skill in the art. The user then selects a second link contained in the parent web page. The second web page corresponding to the second link is the second child node 4904b or the second child view. This association is tracked as noted. If the user then selects a third link in the first web page corresponding to the first child node 4904a, the first web page becomes a parent node and parent view to a third web page (not shown) corresponding to the third link, and the third web page the third child node or child view to the first web page. This association is tracked as noted.

The same principles generally apply to lower tiers. Thus, if the user were to select a fourth link in the first child view, a fourth web page corresponding to the fourth link is a child node or view of the first child view. In other words relative to the fourth child view, the first child view is the parent and the parent view is the grandparent. If the user were to select a fifth link in the fourth child view, a fifth web page corresponding to the fifth link is a child node or view of the fourth child view. In other words relative to the fifth child view, the fourth child view is the parent, the first child view is the grandparent and the parent view is the great grandparent. These association is tracked as noted and used for state tracking to enable user navigation through the various views.

Figure 50:
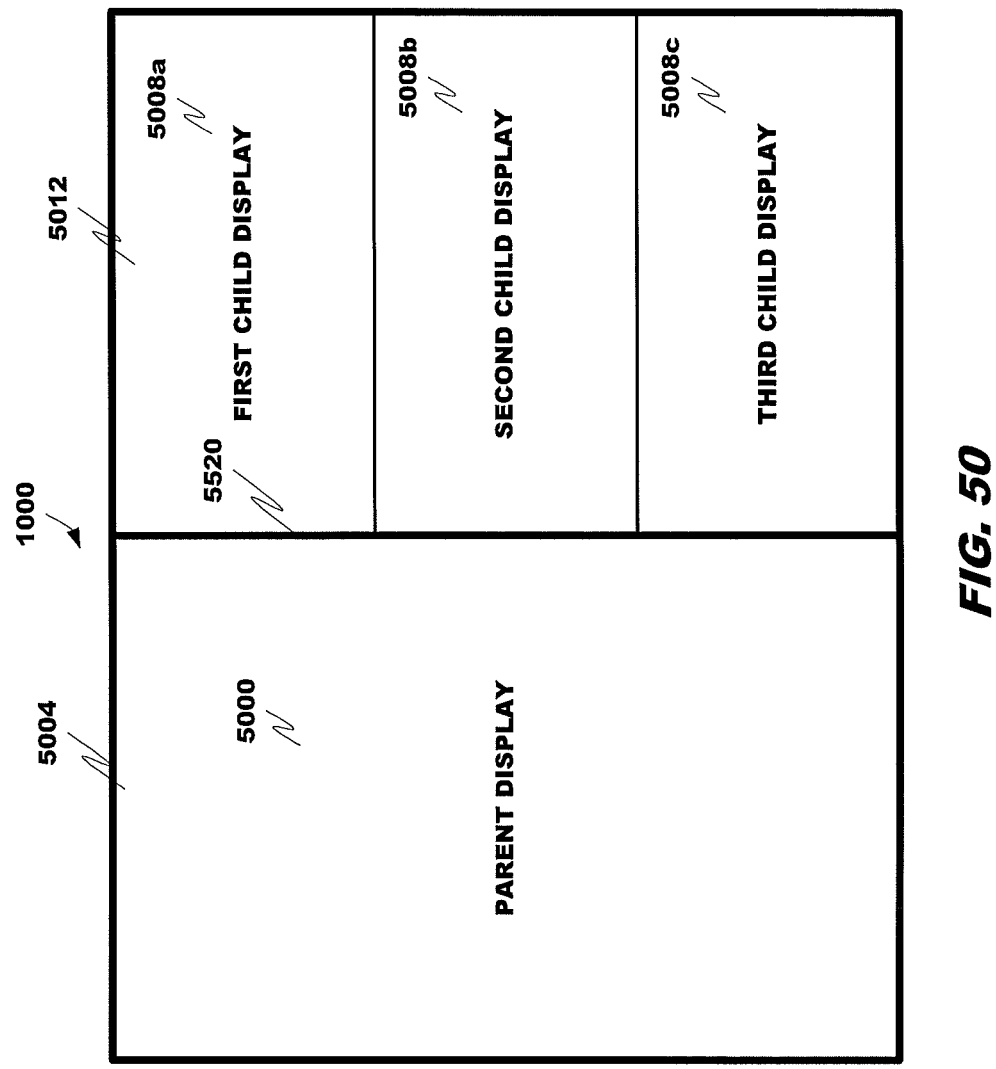
FIG. 50 illustrates a display according to an embodiment.

When the SP 1000 is in dual display orientation (with the seam being displayed to form a composite display), the separate views corresponding to child nodes are displayed in separate windows of the composite display. As shown in FIG. 50, the parent view corresponding to the parent node is displayed in a first view of the composite display, and the first and second child views corresponding to the first and second child nodes are displayed simultaneously in the other view of the composite display. FIG. 50 depicts a parent view 5000 in a first view 5004 of the composite display and first, second, and third child views 5008a-c to the parent view 5000 (meaning that the child views were selected from differing links in the common parent view 5000) are displayed simultaneously in the second view 5012 of the composite display.

Figure 51:
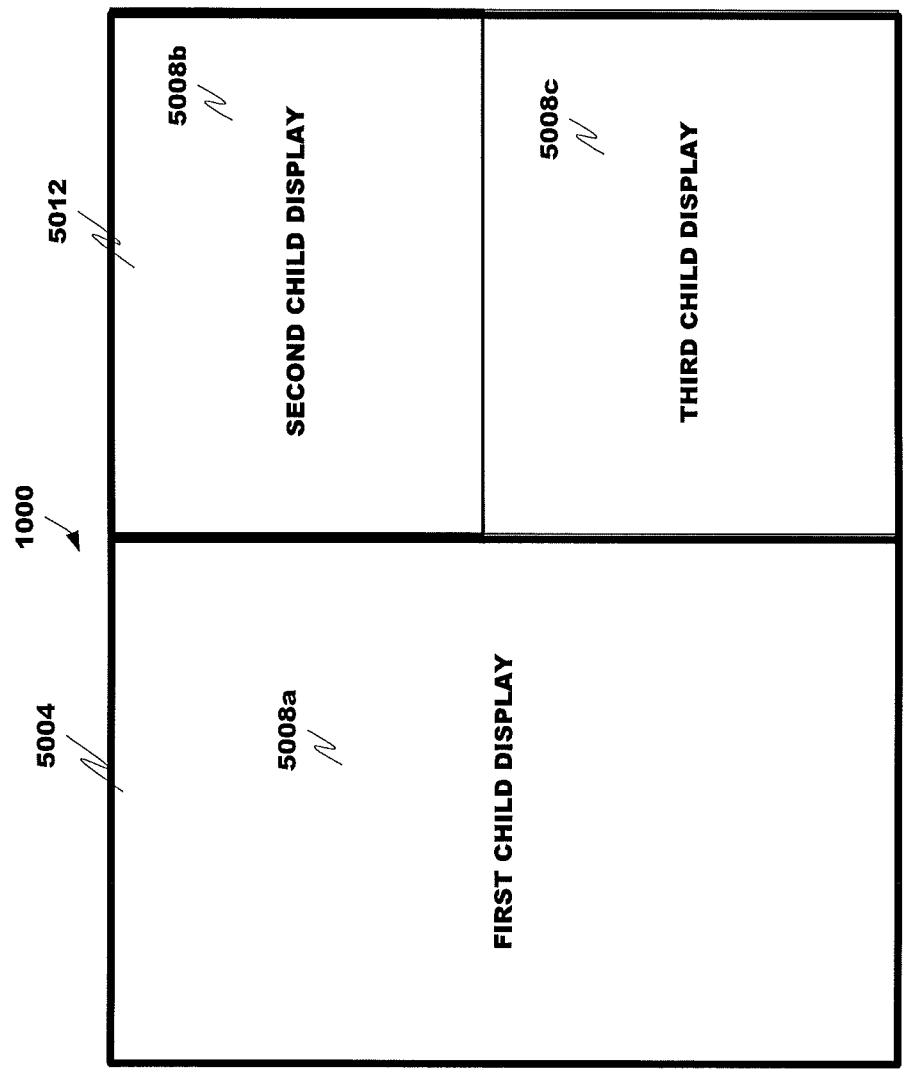
FIG. 51 illustrates a display according to an embodiment.

Now turning to FIG. 51, the user closes or minimizes the parent view 5000, and the first child view 5008a moves to the first view 5004 while the second and third child views 5008b-c are displayed simultaneously in separate windows in the second view 5012 of the composite display.

Figure 52:
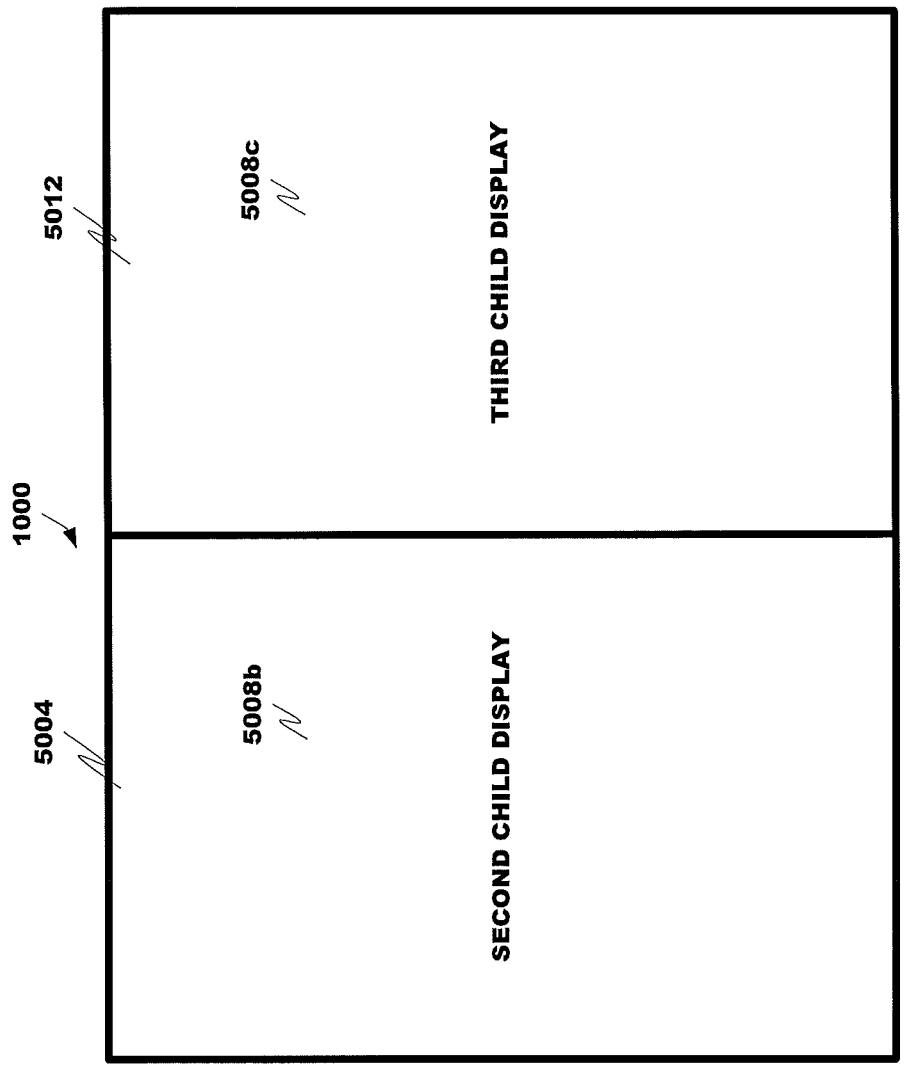
FIG. 52 illustrates a display according to an embodiment.

No turning to FIG. 52, the user closes or minimizes the first child view 5008a, and the second child view 5008b moves to the first view 5004 while the third child view 5008c is displayed in the second view 5012 of the composite display.

A user can use an on-focus feature to move between displays or screens while in dual display mode for a single multi-display application. When the user reaches the split region, or seam, between the views, the on-focus position will move to the first selectable user interface element closest to the top left position of that screen or display. Selectable user interface elements include tabs and sub tabs, buttons and split buttons, header elements and avatars, drop down menus, list items such as contact lists, email lists, and bookmarks, action menus, form elements such as text fields, search fields, radio buttons and check boxes, etc., modals, the triad, and application icons. The on-focus feature will not allow users to switch between applications (i.e., two running apps in single mode), navigate other applications not in view, or switch between an application and a desktop.

With reference to FIGS. 56A-D, a multi-display application has first and second child windows 5602 and 5606. In FIG. 56A (5600), the SP 1000 is in dual-display mode, each view of a composite display having a respective one of the first and second child views 5602 and 5606. The user has selected the first child view 5602 which expands to occupy the entire screen or displayable area (FIG. 56B (5604)). The user again selects the second child view 5606, which is restored to the original display portion, which has been enlarged by movement of the seam 5520 to the left, thereby decreasing the size of the first child view 5602 (FIG. 56C (5608)). The converse is possible. The user can select the second child view 5606, which is restored to the original display portion, which has been decreased by movement of the seam 5520 to the right, thereby increasing the size of the first child view 5602 (FIG. 56D (5612)).

The behavior of multi-display applications will now be discussed with reference to FIGS. 56E-J. Multi-display applications that are not maximized in dual-application mode go to the max mode when SP1000 switches to the single application mode (if supported). When SP 1000 switches to single application mode (if supported), the view associated with the multi-display application expands to max mode across the entire SP screen. When switching back, the multi-display application returns to its non-maximized state (e.g., minimized state). FIG. 56E (5640) depicts SP 1000 as having two views (1.1 and 2.2) for different applications, with view 1.1 being from a multi-display application. SP 1000 then switches to single application mode, and the view 1.1 associated with the multi-display application expands across the SP screen in max mode (FIG. 56F (5644)). When switching back, the multi-display application view 1.1 returns to a non-maximized state (FIG. 56G (5648)).

Multi-display applications that do not support a max mode will have one of their views treated as being in single application mode when the tablet is switched to single application mode. FIG. 56E (5640) depicts SP 1000 as having two views (2.1 and 2.2) for a common multi-display application. SP 1000 then switches to single application mode, and the view 2.1 associated with the multi-display application expands across the SP screen (FIG. 56F (5644)). The view 2.1, however, is not in max mode. When switching back, the multi-display application views return to a non-maximized state (FIG. 56G (5648)).

A multi-display application that is maximized in dual-application mode will go to its max mode when SP switches to single application mode. FIG. 56H (5652) depicts SP 1000 as having two views (2.1 and 2.2) for a common multi-display application. SP 1000 then switches to single application mode, and the view 2.1 associated with the multi-display application expands across the SP screen (FIG. 56I (5656)). The view 2.1, however, is not in max mode. When switching back, the multi-display application views return to a non-maximized state (FIG. 56J (5648)).

A multi-display application that is maximized in dual-application mode will go to its max mode when SP 1000 switches to single application mode. When switching back to dual-application mode, the multi-display application returns to its maximized state, which is typically a full screen state.

Variations of the above can occur when a desktop is visible in dual-application mode. FIG. 56K (5660) depicts a view 1 from a single- or multi-display application and a second view D2 from a desktop. Upon switching to single-application mode, the application in focus, or view 1, remains visible (FIG. 56L (5664)). Upon switching back to multi-application mode, the view 1 is placed on the left/bottom part of SP screen or composite display (FIG. 56M (5668)).

When the desktop view D2 happens to have focus, as in FIG. 56N (5672), switching to single-application mode will make the visible application (view 1) take over the screen or composite display in single mode (FIG. 56O (5676)). Upon switching back to multi-application mode, the view 1 is placed on the left/bottom part of SP screen or composite display (FIG. 56P (5680)) (even if the desktop had focus before).

In dual application mode, the views 1 and 2 (FIG. 56Q (5684) from first and second applications on the primary and secondary displays of the screen or composite display are pushed in the direction of their respective stacks (primary display downwards and secondary display upwards) to reveal underlying desktop views D1 and D2, as shown in FIG. 56R (5688). In single application mode, the single mode application view 1 (FIG. 56S (5692)) slides off screen in a single motion in the direction of the physical buttons to review desktop view D1 (FIG. 56T (5696).

Figure 53:
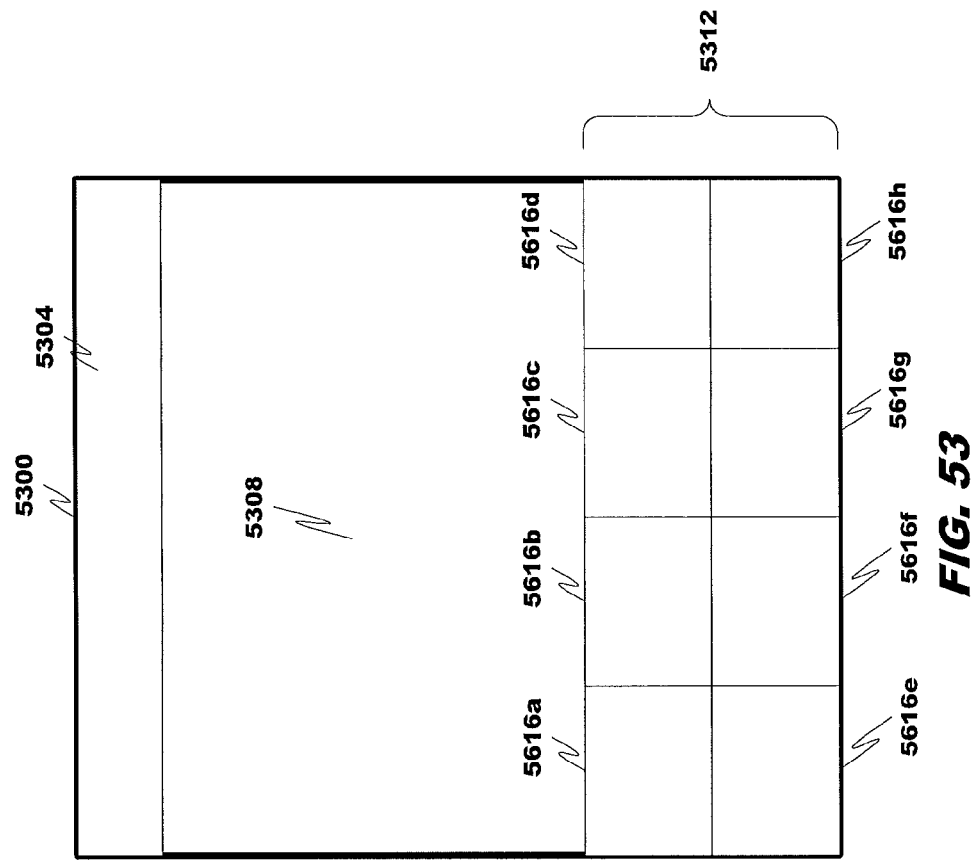
FIG. 53 illustrates a display according to an embodiment.

The configuration of a view of SP 1000 will now be discussed with reference to FIGS. 53 and 54. SP display 5300 typically includes header area 5304, application area 5308, and footer area 5312, which is depicted as including user selectable action bar commands 5616a-h. Header area 5304 and footer area 5312 can include tool bars, enunciator bars, dashboard, notification bar, action region (e.g., tab bar, search bar, etc.), single-/dual-application mode transition button, and full screen and/or max mode action bar and/or overlay button.

In one configuration, header bar command icons are dedicated to in-application navigation. At times, other fundamental actions may be placed into the header bar, for example when an action bar cannot be used. The header bar is not scrolled off the view. For pannable list- or canvas-based views the header bar can be tapped in order to scroll the view back to the top. Headers or action bars can include tabs. Tabs are used for creating subviews or to allow for filtering of content. The interaction for tabs is simple, a tap will select the tab and change the view accordingly.

Action bar commands 5616a-h provide a user with frequently used commands and, of course, are defined by and therefore depend on the selected application. Examples of action bar commands 5616a-h include, for an email application, user account access, move, compose, delete, print, refresh, rename, reply, folder management, toggle text, move, exit, edit, forward, replyall, settings, deselect all, select all, marked as read, marked as unread, and add folder; for a telecommunications application, conference, add pause, wait, add contact, account access, search contacts, contact details, import to contacts, export from contacts, instant message text, call, voice mail, access, edit contact, delete contact, share contact, and display option; for a browser, back in search string, forward in search string, mobile web, full screen, find, print, share, full web, book mark, delete, view list, cancel download, and exit; for gallery, delete, share, slide show, new album, move, settings, rename, edit image, image details, crop image, rotate view left, rotate view right, and exit; for messaging, compose, delete, settings, compose options, and menu search; for electronic calendar, add event, edit event, settings, and today; and for music, search, play all songs, search other, delete, new play list, start play list, other sources, edit play list, play all artists, edit, save as playlist, shuffle, cancel, clear track list, and play all albums. Each action bar command 5616a-h has a corresponding icon and label.

Action bars commands 5616a-h are scalable in width to accommodate SP layouts, such as portrait and landscape views. The action bar 5312 is typically made up of two or more rows of action bar commands 5616a-h, with one row being the primary row and the other rows being the secondary row(s). Within the primary and secondary bars are rows that contain the action icons and the icon labels. Although any number may be used, the number of icons and labels per row generally range from 1 to 5 with 4 being preferred. The horizontal dimension of the button and label equals the width of the view divided by the number of buttons and labels required. Icons and labels are vertically and horizontally centered within their respective regions using the indicated dimensions, sp size and padding. The action bar is consistent across portrait and landscape SP orientations.

When the action bar 5312 contains two or more rows of commands 5616*a-h*, the bar can be expanded and collapsed to reveal and hide the secondary bar(s), respectively. When more than a threshold number of commands are needed, the overflow mode is entered and an overflow modal or "more" action bar command is accessible from the bar. In other words, the overflow modal is linked to the hidden action bar commands, such as in a secondary row. Activating the more command can present a modeless list for accessing the overflow action bar commands. The action bar is hidden in the process When an application that contains an action bar is launched, the bar is revealed as part of the launching animation. The bar may contain only one row of commands. Upon expansion, the labels for the commands are shown. In one configuration, an extended action bar can be collapsed by pressing the menu hardware key again. Initiating an action on the bar collapses the bar afterwards. In addition, any action that is not directly relate to interacting with the bar also collapses the bar. Examples include view changes, or interaction with elements on the current view. Pressing the hardware back-button collapses the bar.

Figure 54:
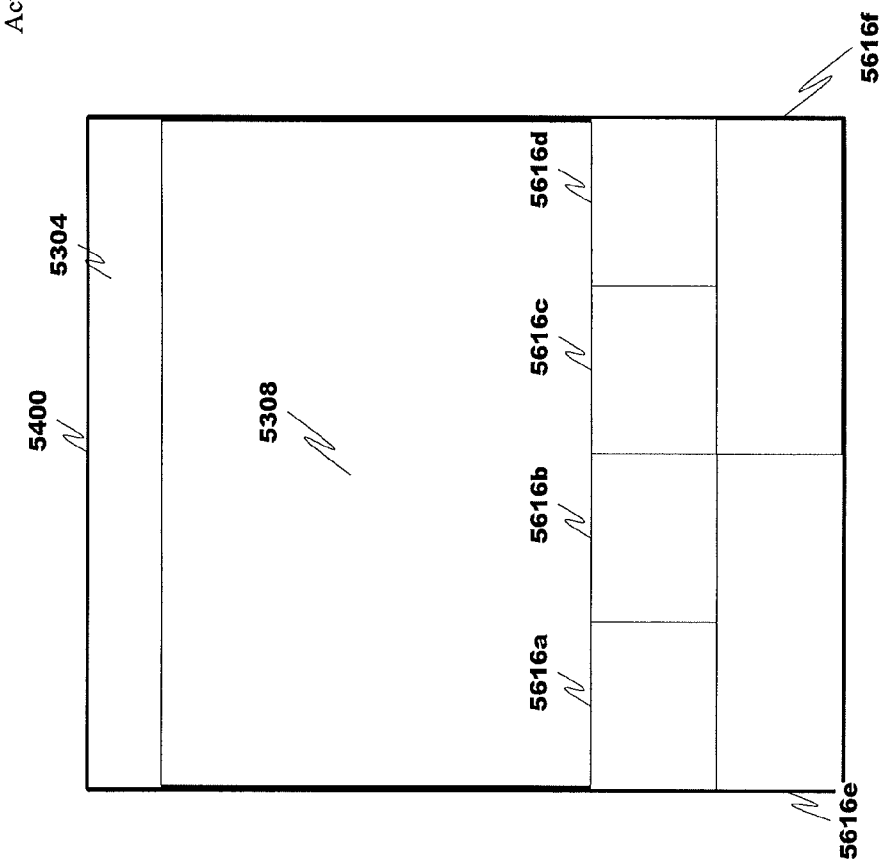
FIG. 54 illustrates a display according to an embodiment.

As shown in FIG. 54, differing numbers of action bar commands and primary and secondary action bar configurations are possible. In the depicted configuration, SP display 5400 includes first, second, third and fourth action bar commands 5616*a-d* in the primary bar and only fifth and sixth action bar commands in the secondary bar. The action bar command icons in the primary bar are formatted differently, or differently sized, than those in the secondary bar. The opposite can also be true.

Once an edit mode has been entered by selection of an "edit" action bar command 5616, the action bar transforms into an edit bar, which can have one or more rows of command icons like the action bar. Despite the difference in naming, the edit bar behaves very similarly to the action bar. Like the action bar, the edit bar expands by default and is not collapsed automatically but only by pressing the hardware menu button. The edit mode is exited via an exit-button, generally placed as the right-most action bar command 5616 in the bar, or by pressing the hardware back-button. When the edit mode is exited, the edit bar is hidden automatically. When a number of edit commands exceeds a selected threshold or an overflow mode is entered, a command in the list of edit commands becomes a "more" command that opens up a modal containing all the extra commands. Activating the more command presents a modeless list for accessing the overflow edit commands. The action bar is hidden in the process.

A number of rules apply to action bar configurations in differing SP display configurations. Two single-display applications in dual screen portrait orientation contain their individual action bars. Upon activating the hardware menu button, the application that has focus expands its action bar. The action bar of the other application is unaffected. An application in max mode (utilizing both screens or displays) can contain action bars for individual views. When the action bar is maximized and minimized using the menu hardware button, both action bars are affected. In some cases, commands are duplicated when an application is maximized (a command that appears on both the parent and child action bars is duplicated when the views are displayed simultaneously). In these cases, the action bar commands need to be revised for the affected dual-screen views. For two single-display action bars from the same application (but from different views within that application), the two commands are repeated across the bars. When maximized into a dual-screen application, the combined action bar omits the duplicate commands; the layout of the combined bar is determined on a view-by-view basis. When primary action bar is in "normal mode", it generally only shows a portion, typically about 70%, of the top part of the primary bar. When the secondary action bar is expanded in "full mode", it generally shows fully both the primary and secondary bars. The action bar command icon width is commonly the number of action bar command icons to be displayed in the row divided by the actual width of the screen.

In another embodiment, setting screens are employed. In the system, there are two ways to call up setting-screens, namely from within an application and via the settings-application provided by the system. Depending on where a setting-screen was launched from, the visual look-and-feel and the interaction model for the view changes. Settings-screens launched from within applications are usually treated as full-screen modals launched on top of the parent application. When the application is maximized, setting-views are generally presented on one side of the application. Setting views can contain several levels of views, similar to multi-node parent-child structured applications. In these cases, a header bar contains a return-arrow for going back up in the view structure and the action bar contains a command to dismiss the modal.

A number of examples will now be discussed to illustrate the various display types, namely portrait single display, landscape single display, portrait dual display, and landscape dual display, for differing types of multi-display applications.

FIGS. 60A-D illustrates a multi-display music or media application. The application stores, organizes, locates, uploads, downloads, manages, and plays media content, particularly music. The various views display commonly displayed content or output of the application. Referring to FIGS. 60A and B 6010 and 6014, respectively, the music application is portrait single ("PS") (FIG. 60A) and portrait dual ("PD") (FIG. 60B) views. The PS view includes, in the header area, a navigation bar 6018 (which includes the navigation commands artists (to select and access artists), albums (to select and access albums), songs (to select and access songs) (which command icon has been currently selected), and playlists (to select and recall playlists)) and displays "music" indicating the media type currently being accessed. An action bar 6022 in the footer area displays the command icons "search" (to locate a specific artist, album, song, or playlist) and "play all songs" (to play all currently stored songs). In the application area between the header and footer areas, the various songs stored on the SP are displayed in alphabetical order. In FIG. 60B, the PD view includes a header area 6024 displaying "songs" (which is currently selected) 6028, such as the song" Across the Universe" as denoted by reference 6026, and the name of the currently selected song "Bonita Applebaum". The footer area includes, in the action bar 6029, the command icons "search", "play all songs", "add to playlist" (to add a song to a selected playlist), and "delete" (to delete a selected song). The application area of the left display displays the songs in alphabetical order while the application area in the right display displays the album cover of the album containing the song, a next song on the album, and the name of the album "People's Instinctive Travels". As will be appreciated, when the output of the music application depicted in FIG. 60B is displayed on the communication device 100, the display to the left of the seam 5520 is displayed by the display 110 on the primary screen 104, and the display to the right of the seam 5520 by the display 114 on the secondary screen 114. FIGS. 60C and D 6030 and 6034, respectively, display the music application in landscape single ("LS") (FIG. 60C) and landscape dual ("LD") (FIG. 60D) views. The LS view displays "music" in the header area, a navigation bar 6032 containing the commands "artists", "albums", "songs" (currently selected), "playlists", and "search". Referring now to FIG. 60D, the music application display is now in landscape dual ("LD").

The various views, though displaying common application content, have differing formats. The navigation bar 6018 in FIG. 60A is moved from the header area to the footer area in FIGS. 60C and D (see navigation bar 6032). Unlike the navigation bar 6018, the search icon is further added to the navigation bar 6032. In the LS and LD display modes (FIGS. 60C and D), the action bar 6018 is replaced with the navigation bar. Unlike in the PS, LS, and LD modes (which display "music"), the header area in the PD mode displays "songs". In the PD mode, the music library navigation commands (see navigation bars 6018 and 6032) are removed. On landing in the PD mode, the first song in the list gets auto-selected and the child view or page updates accordingly. When minimized the selection is dismissed.

FIGS. 61A-D provide further views of the music application. FIG. 61A (6100) corresponds to the PS, 61B (6104) to the PD, 61C (6108) to the LS, and 61D (6112) to the LD modes. The same application content is displayed in each of the modes. In PD mode, the header area 6120 displays "playlists" while in the other modes the header area displays "music". The navigation bar 6032 in the header area if the PS mode is moved to the footer area in the LS and LD modes. The navigation bar is replaced by the action bar 6120 in the PD mode. The action bar 6120 includes the commands "Search", "Edit Playlist", "New Playlist", "Save As Playlist", and "Start Playlist". As shown by the "recently added" icon 6116 in the PD mode, upon landing in the PD mode, the first playlist is auto-selected and the child screen updated accordingly. When minimized, the selection is automatically dismissed. As will be appreciated, when the output of the music application depicted in FIG. 61B is displayed on the communication device 100, the display to the left of the seam 5520 is displayed by the display 110 on the primary screen 104, and the display to the right of the seam 5520 by the display 114 on the secondary screen 114.

These same rules apply for each of the other navigation command selections, namely "artists", "albums", and "playlists." When maximized in PD, "artists" becomes the default selection, and the child screen updates accordingly. In PD mode, the navigation commands behave as tabs. When minimized, the selection is dismissed, and the controls behave as buttons.

FIGS. 62-71 illustrate a multi-display electronic calendar application. The application stores, organizes, communicates to others, provides alerts, manages, and displays calendar and scheduling information. The various views display commonly displayed content of the application. The views include month, week, day, and agenda views in PS, LS, PD, and LD modes.

Figures 62, 63:
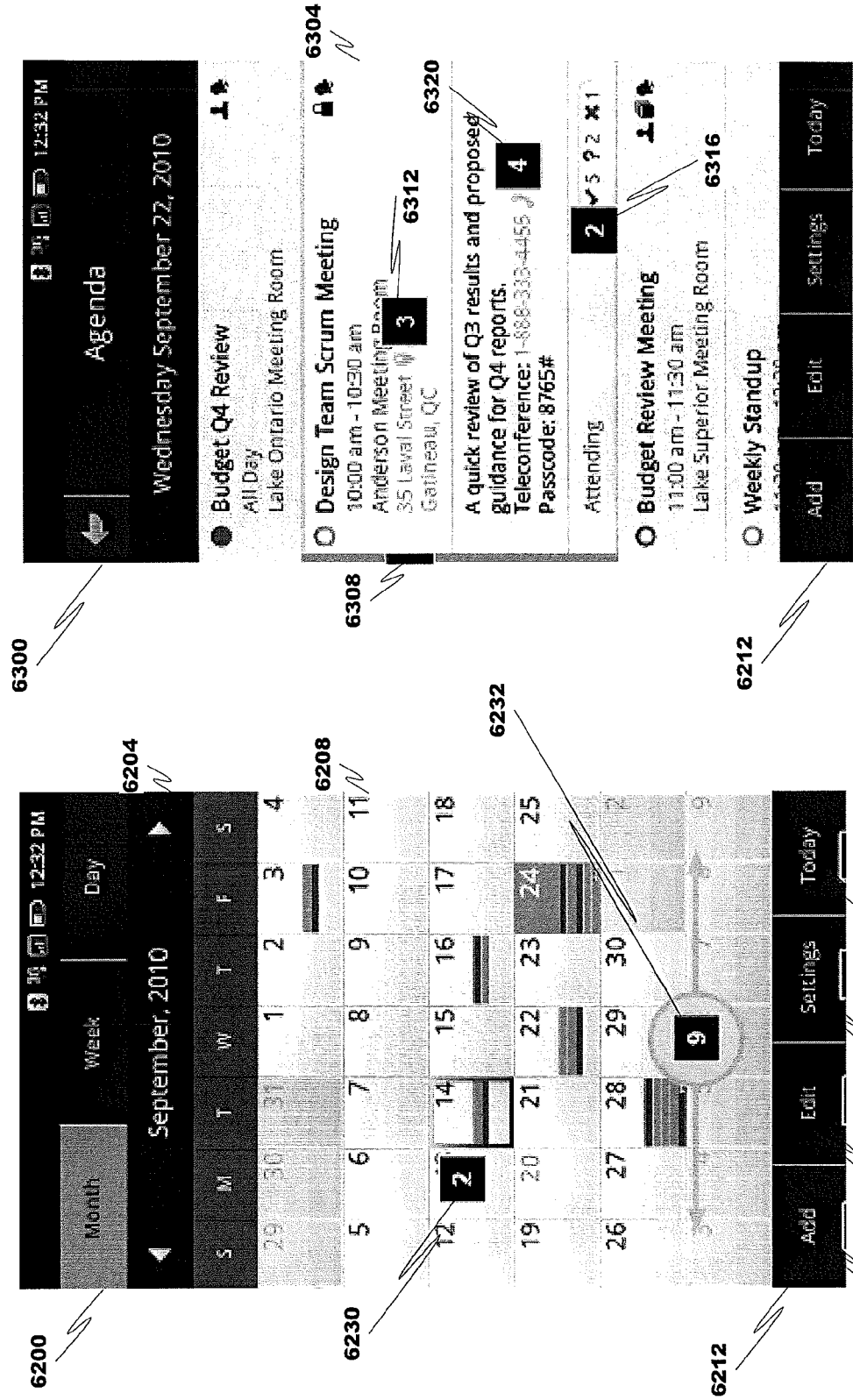
FIG. 62 illustrates a display according to an embodiment.
FIG. 63 illustrates a display according to an embodiment.

FIG. 62 depicts the month view in PS mode. The header area 6200 includes a navigation bar including month (selected), week, and day and the current month 6204 (September, 2010), the application area 6208 includes a calendar for the selected month, and the footer area includes an action bar 6212 including commands or buttons for "Add" 6216, "Edit" 6220, "Settings" 6224, and "Today" 6228. By default, the calendar opens with the month view as the active tab on first launch, and the current day 6230 appears as selected. Tapping on any day in the calendar selects that day and opens the agenda view. When there is only one event on the selected day, that event is selected and expanded in the agenda view. When there are no events, a placeholder empty event will be displayed on the agenda view for that day. When there are multiple events in the day, all of the events are listed but none is selected or expanded. When a day is selected in the month view, the "Add" button 6216 in the action bar 6212 can be used to create a new event on that day. In an "Add Event" full screen modal, the selected day is used to pre-populate the event date. When the selected day is "today", the start time for the meeting is pre-populated to the half hour from the current time. Otherwise, a predetermined time is used as the default meeting start time. The "Edit" button 6220 is disabled in the month view. The "Settings" button 6224 opens the calendar settings. Once any day, other than the current day, is selected the "Today" button 6228 in the action bar enables and can be used to navigate back to the current day. A user can navigate back and forth from month to month using the arrows in the header area. When a user navigates to a different month, day selection will change to the same day of the month in the new month (e.g., if the 14th was selected, the 14th in the new month will be selected). A user can navigate back and forth from month to month using a horizontal swipe gesture 6232 received by the touch screen or an off-screen gesture region.

FIG. 63 depicts the agenda view in PS mode. The header area 6300 displays "Agenda" and the selected date (Wednesday, Sep. 22, 2010), the application area 6304 displays the currently scheduled events for the selected day, and the footer area includes the action bar 6212. The event 6308 expands to display the information that was provided within the event when it was created, typically where the meeting is on 6312, what time the meeting is at, who is attending 6316 and an event description 6320. When the attending icons are tapped, an attendee pop-up modal is triggered. This pop-up provides the user with additional information on the event attendees. Tapping on the location icon launches the default map application. Tapping on the phone icon launches the default Phone application.

Figure 64:
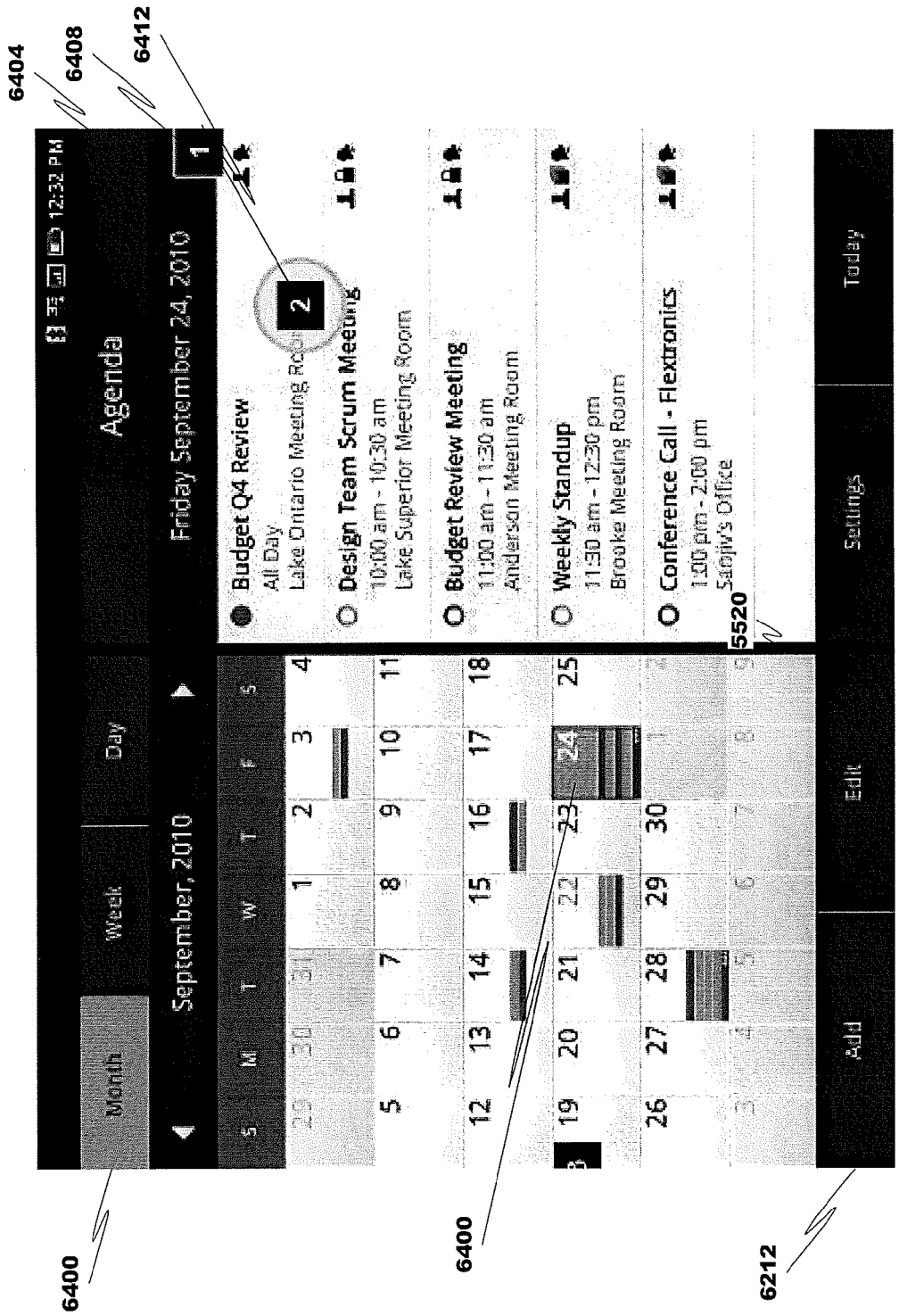
FIG. 64 illustrates a display according to an embodiment.

FIG. 64 depicts the month view in PD mode. The month view is displayed on the left-hand display and the agenda view on the right-hand display. The header area 6404 of the agenda view displays the day (Friday Sep. 24, 2010) 6408 that is selected in the adjacent Month view. Unlike the views of FIGS. 62-63, there are no navigation arrows in the agenda view header area 6404. Selecting a new day in the month view resets the event selection in the adjacent agenda view. When tapping 6412 the currently selected day, the selection in the agenda view will reset. There is one exception to this rule. When the selected day has only one event, tapping the currently selected day will alternate between selecting and unselecting that sole event. An event can be selected by tapping 6412 a selected event. Once an event is selected it expands to show more details. When a selected event is tapped, the Edit Event full-screen modal will open if the event is created by the current user. When the user selects any day which has more than two events from the month view, the user can tap on any event from agenda view to expand it. When the user taps on the already selected day from month view, the expanded event should collapse. When the user taps on the already selected day from month view again, the events should stay collapsed in the agenda view. As will be appreciated, when the output of the calendar application depicted in FIG. 60B is displayed on the communication device 100, the display to the left of the seam 5520 is displayed by the display 110 on the primary screen 104, and the display to the right of the seam 5520 by the display 114 on the secondary screen 108.

Figure 65:
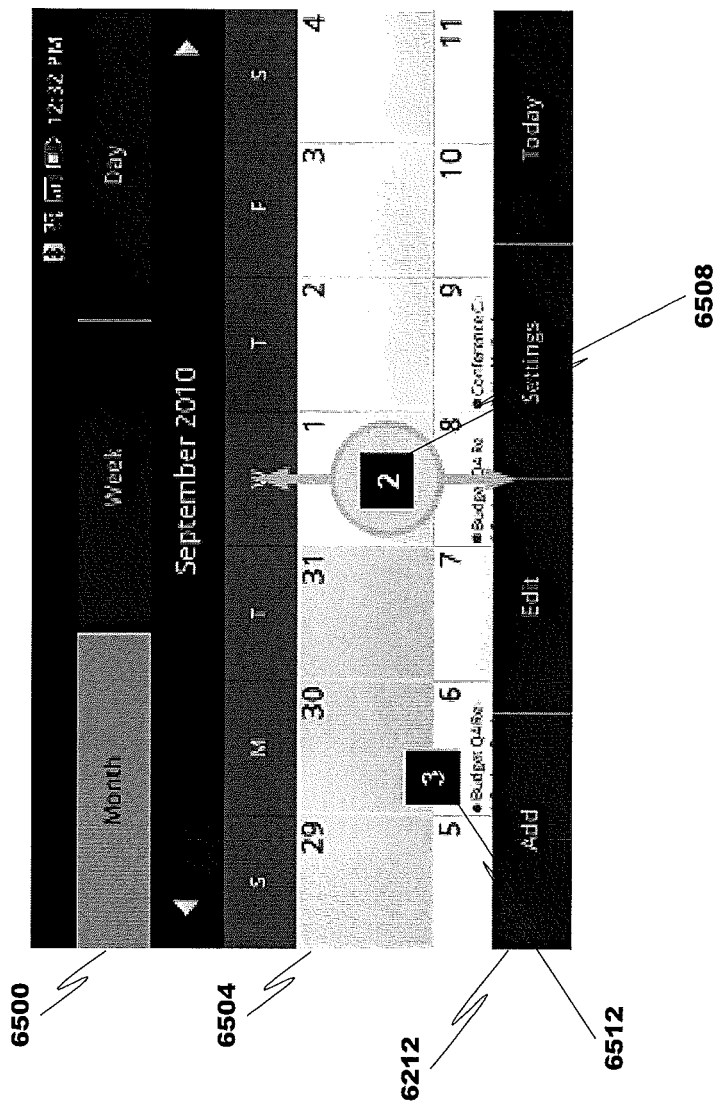
FIG. 65 illustrates a display according to an embodiment.

FIG. 65 depicts the month view in LS mode. The header area 6500 includes a navigation bar including month (selected), week, and day and the current month (September, 2010) and navigation arrows, the application area 6504 includes a calendar for the selected month, and the footer area includes the action bar 6212. The interactions for this view are the same as the month view (discussed above with reference to FIG. 62). This view enables the user to vertically scroll by gesture 6508 to view other weeks in the month. Unlike the PS month view, the LS month view displays events as text 6512 rather than colored bars.

Figure 66:
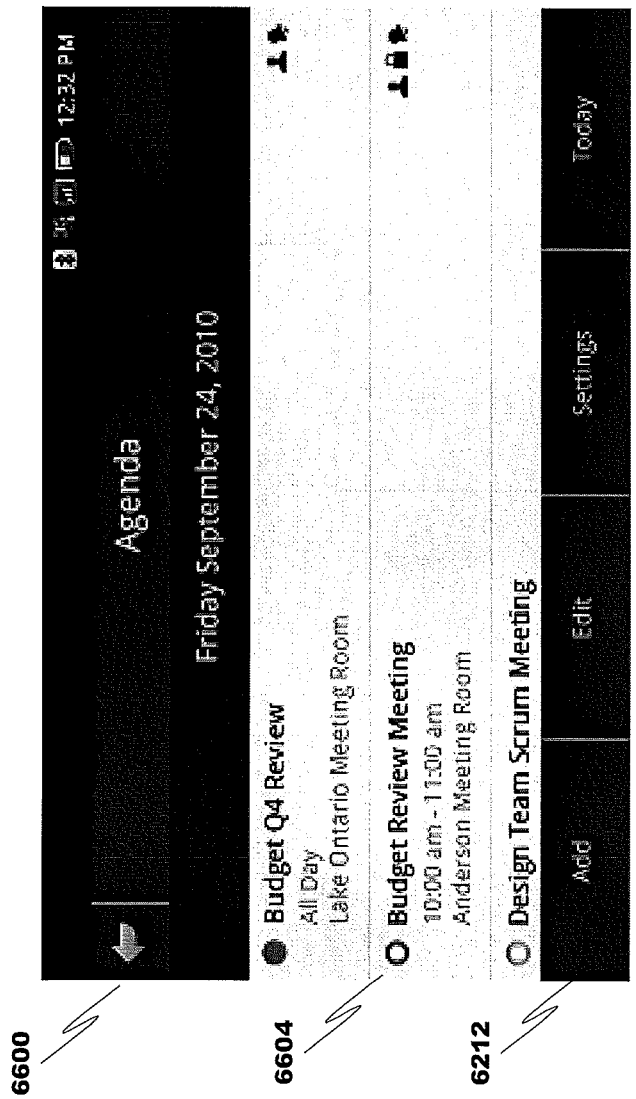
FIG. 66 illustrates a display according to an embodiment.

FIG. 66 depicts the agenda view in LS mode. The header area 6600 displays "Agenda" and the selected date (Friday, Sep. 24, 2010), the application area 6604 displays the currently scheduled events for the selected day, and the footer area includes the action bar 6212. The interactions for this view are the same as the agenda view discussed above with reference to FIG. 63.

Figure 67:
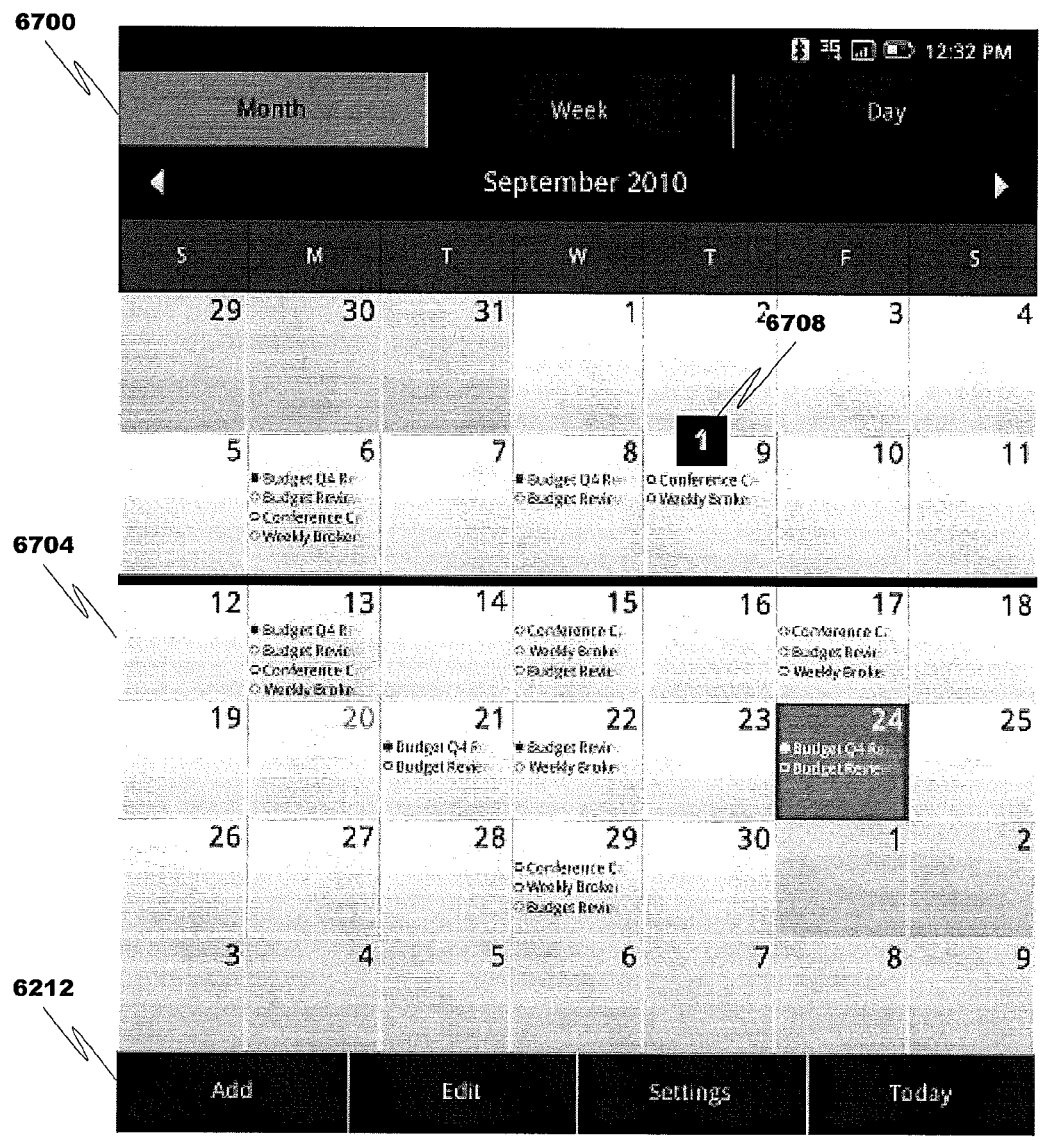
FIG. 67 illustrates a display according to an embodiment.

FIG. 67 displays the month view in LD. The header area 6700 includes a navigation bar including month (selected), week, and day and the current month (September, 2010) and navigation arrows, the application area 6704 includes a calendar for the selected month, and the footer area includes the action bar 6212. The interactions for this view are the same as the month view described above with reference to FIG. 62. The LD month view displays events as text 6708 rather than colored bars.

Figure 68:
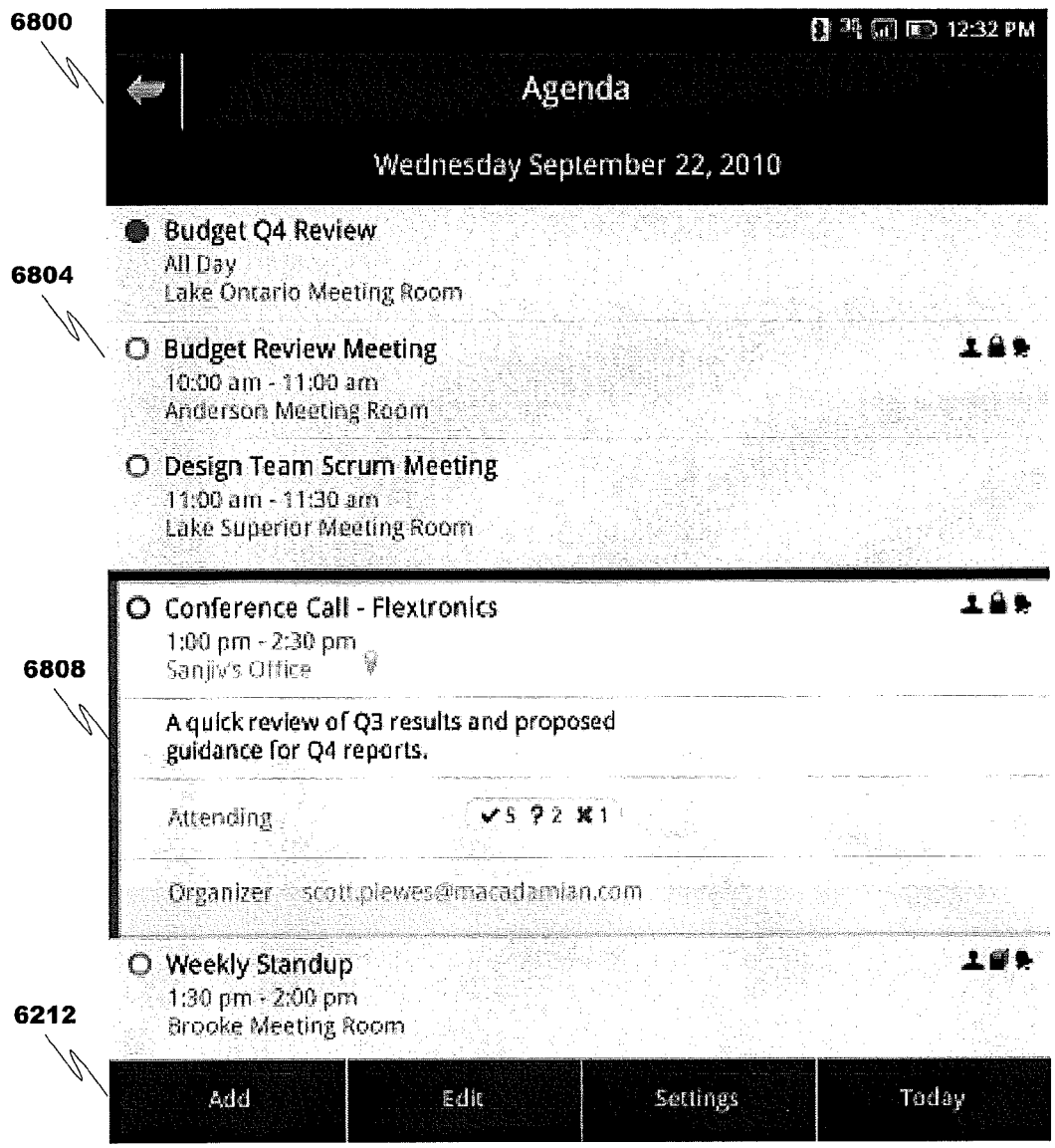
FIG. 68 illustrates a display according to an embodiment.

FIG. 68 displays the agenda view in the LD mode. The header area 6800 displays "Agenda" and the selected date (Wednesday, Sep. 22, 2010), the application area 6804 displays the currently scheduled events for the selected day, and the footer area includes the action bar 6212. The box 6808 depicts the expanded information provided for a typical scheduled event. The box is opened by selecting a listed event. The interactions for this view are the same as the agenda view discussed above with reference to FIG. 63.

Figure 69:
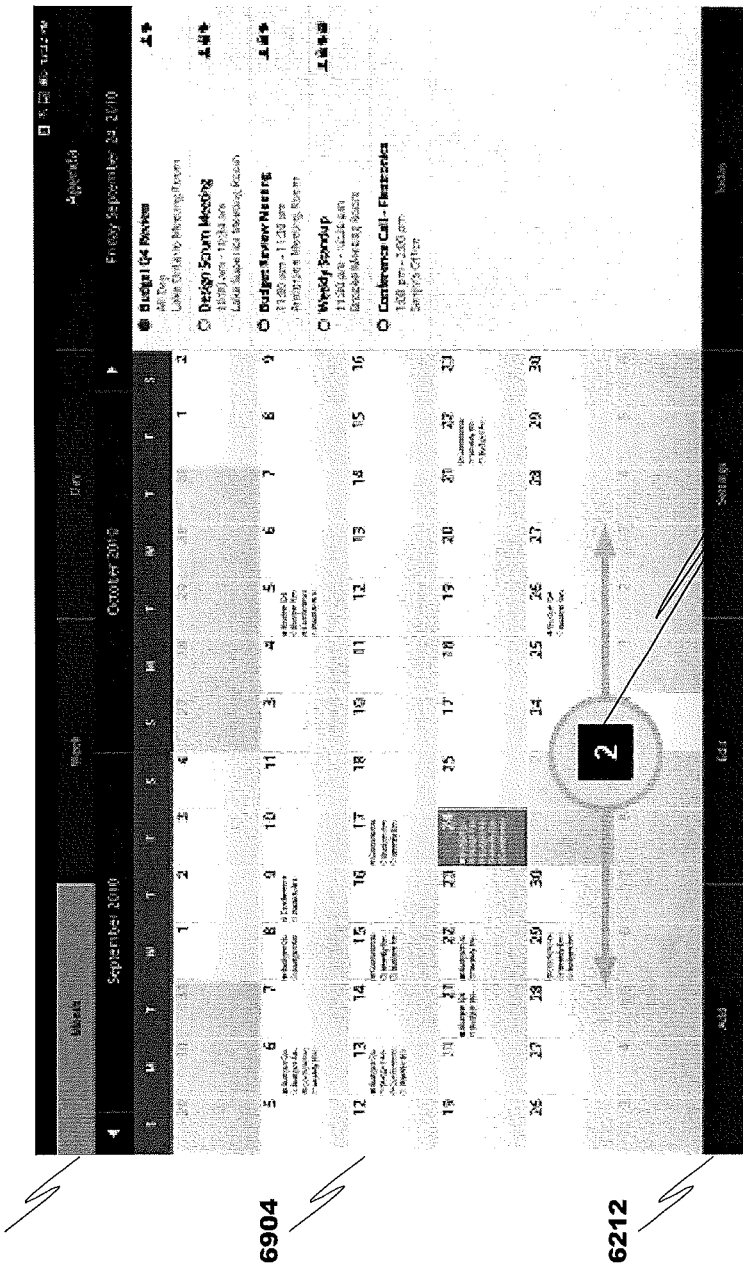
FIG. 69 illustrates a display according to an embodiment.

FIG. 69 displays the dual month agenda view (LTMax) in the landscape mode. The header area 6900 includes a navigation bar including month (selected), week, and day, displays "Agenda", the current month (September, 2010), the next month (October, 2010), and the selected day (Friday Sep. 24, 2010), and includes navigation arrows, the application area 6904 includes a calendar for the selected and next month and the agenda for the selected day, and the footer area includes the action bar 6212. This view combines a special two-month version of the month view and the agenda view. A gesture 6908, such as a horizontal swipe gesture received by the touch screen or off-screen gesture region, enables navigation to prior or future months. A user can also navigate back and forth from month to month using the arrows in the header area. When a user navigates to a different month, day selection will change to the same day of the month in the new month (if the 14th was selected, the 14th in the new month will be selected).

Figure 70:
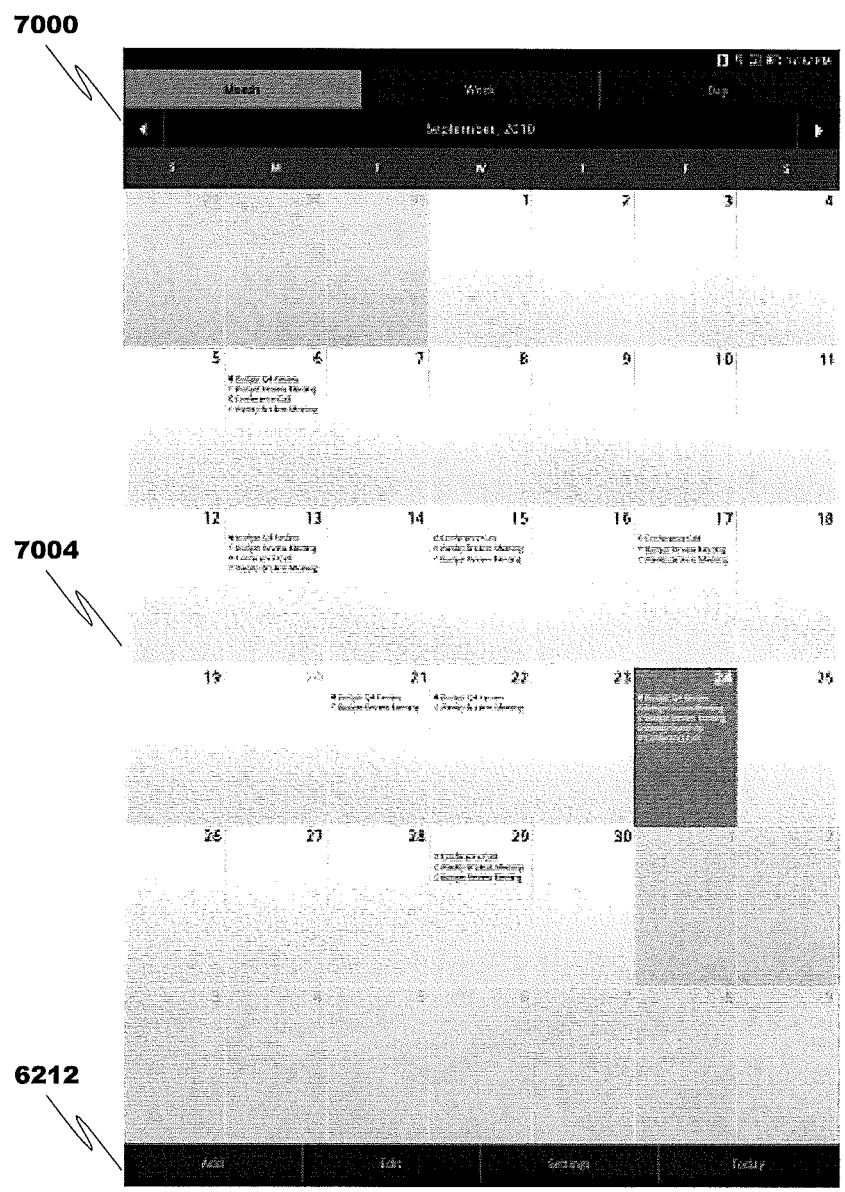
FIG. 70 illustrates a display according to an embodiment.

FIG. 70 displays the single month agenda view (PTMax) in the portrait mode. The header area 7000 includes a navigation bar including month (selected), week, and day displays the current month (September, 2010) and includes navigation arrows, the application area 7004 includes a calendar for the selected month, and the footer area includes the action bar 6212. Unlike the PS month view, the PTMax month view displays events as text rather than colored bars.

Figure 71:
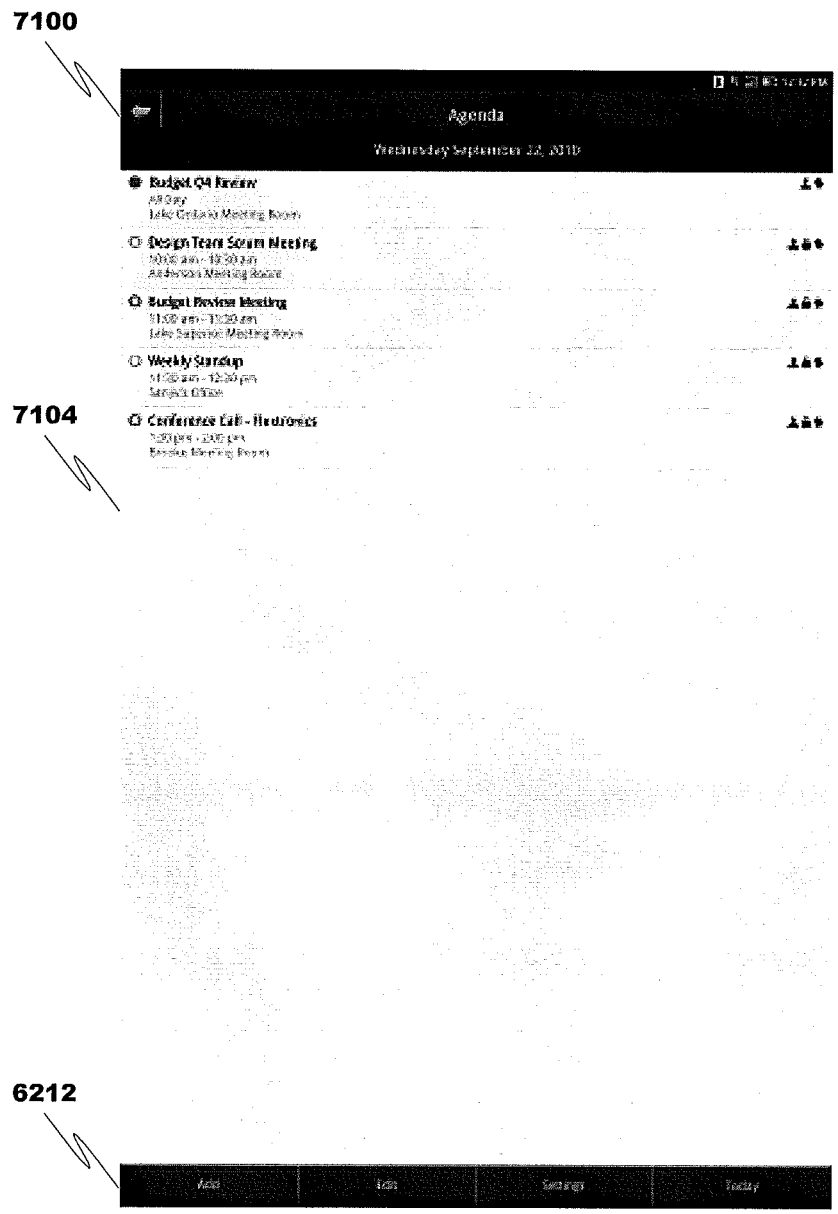
FIG. 71 illustrates a display according to an embodiment.

FIG. 71 displays the agenda view (PTMax) in the portrait mode. The header area 7100 displays "Agenda" and the selected date (Wednesday, Sep. 22, 2010) and includes a navigation arrow, the application area 7104 displays the currently scheduled events for the selected day, and the footer area includes the action bar 6212.

Similar rules apply to other views. As noted, there are week and day views in PS, LS, PD, and LD modes. If an empty time slot is selected in the week view, for example, the day is loaded in the agenda view and a "No Event" entry will be added in the list. Tapping on the selected "No Event" item in the agenda view will open the "Add Event" full screen modal dialog with the date and time pre-populated to match. While an empty timeslot is selected in the week view, the "Edit" button in the action bar is disabled. Selecting any other event (through the agenda view or the week view) will collapse the "No Event" item and remove it from the list. When a timeslot is selected in week view (any day), and the user taps on another day in the days header, the current selection should be lost. The agenda would update to reflect the newly selected day, but no event would be selected (assuming that there is no all-day event). Once any day, other than the current day, is selected the "Today" button in the action bar enables and can be used to navigate back to the time in the current day. If there is an event in that current time, the event would be selected. If there is more than one consecutive event, the first should be selected, and if there are multiple concurrent events the "first", i.e., left-most, displayed event should be selected. If there is an event that is longer than the selected hour slot, this event would not be displayed in the agenda view. Instead, "No Event" would appear in the agenda view. When there are no events in the day, the agenda view will show an empty list that just says "No Events" and will have no interactive behavior. When an existing event is selected in day view, the selected event appears selected and expanded in the agenda view. When the selected event is tapped again, it will remain selected but the event will collapse in the agenda view. When an expanded event is tapped in the agenda view, the "Edit Event" full screen modal will appear. When a collapsed event is tapped in the agenda view, the event will be expanded, and it will also be selected in the day view. When a user taps an event in week view that is not in the currently selected day, the selected day n the agenda view will change and then, the event will be selected. Week and day views (PTMax) are similar to the month view of FIG. 70 displays a current week or day, as appropriate. Dual-week and day agenda views (LTMax) are similar to the dual-month view of FIG. 69 displays a current and a future (next) week or day, as appropriate. In the above examples, it is to be understood that the various views, namely day, week, month, and agenda views can display common content in and transition between any of the PS, LS, PD, LD, PTMax, and LTMax modes. The fact that different selections are used in the above examples is not meant to convey that the content is necessarily different among the various views.

FIGS. 72-77 illustrate a multi-display messaging application. The application stores, organizes, generates, transmits and receives messages with others, provides alerts, manages, and displays messaging information. The various views display commonly displayed content of the application. The views include home or desktop, all threads list, single thread, compose new message, settings, forward existing message, reply to message sender, Multimedia Messaging Service ("MMS"), and slideshow full-screen modal views, among others in PS, LS, PD, and LD modes.

The layout of the messaging views generally includes, in the header area, an annunciator bar, a header bar, and a text tab bar, an application area, and, in the footer area, an action (menu) bar. The annunciator bar provides various informational icons including current wireless communications network type (e.g., 1G, 2G, 3G, and 4G for cellular networks, battery status, network strength bars, and time). The header bar displays the current view type and related information, such as "Email Settings", "Messaging", "Email Accounts", "Add Account", "Account Settings", "Manage Folders", "Inbox" (e.g., by subject or sender), "Combined Inbox" (e.g., by sender, by sender, or both), "New Email", email detail view providing email sender information, "Edit Combined Inbox" (e.g., by subject or sender or both). The text tab bar includes various navigation commands "All" (e.g., both sender and subject), "Sender", and "Subject". The action bar includes commands, including compose new email, search, settings, forward, reply, delete, thread, folder, refresh, select all, print, more, mark as read, deselect, and exit.

Figure 72:
FIG. 72 illustrates a display according to an embodiment.

An exemplary all threads messaging view in PS mode is shown in FIG. 72. The view includes, in the header area, an annunciator bar 7200 and a header bar 7204 displaying "Messaging" and a count of how many new/unread messages have been received (e.g., noting two new messages have been received) with no text tab bar being shown, the application area 7208 displaying a received or sent messaging thread (including messages of various types or communication modalities including email, MMS, and instant messages), and, in the footer area, an action bar 7212 (first tier) displaying the commands "Compose" new message, "Search" messages, and "Settings" (access messaging settings). Delete all threads is available on a hidden second tier of the action bar. New/Unread messages are indicated by an icon 7216 on the right-hand side of each respective message bar. Tapping a selected message 7220 displays a single thread view for the selected message. An alert icon 7224 is displayed alerting the user if a message was not able to be delivered or if sending of the message has been delayed. An attachment icon 7228 is displayed if the message contains an attachment. If a draft is the latest message for a specific thread, a draft icon 6232 is shown within the all threads list.

Figure 73:
FIG. 73 illustrates a display according to an embodiment.
Figure 74:
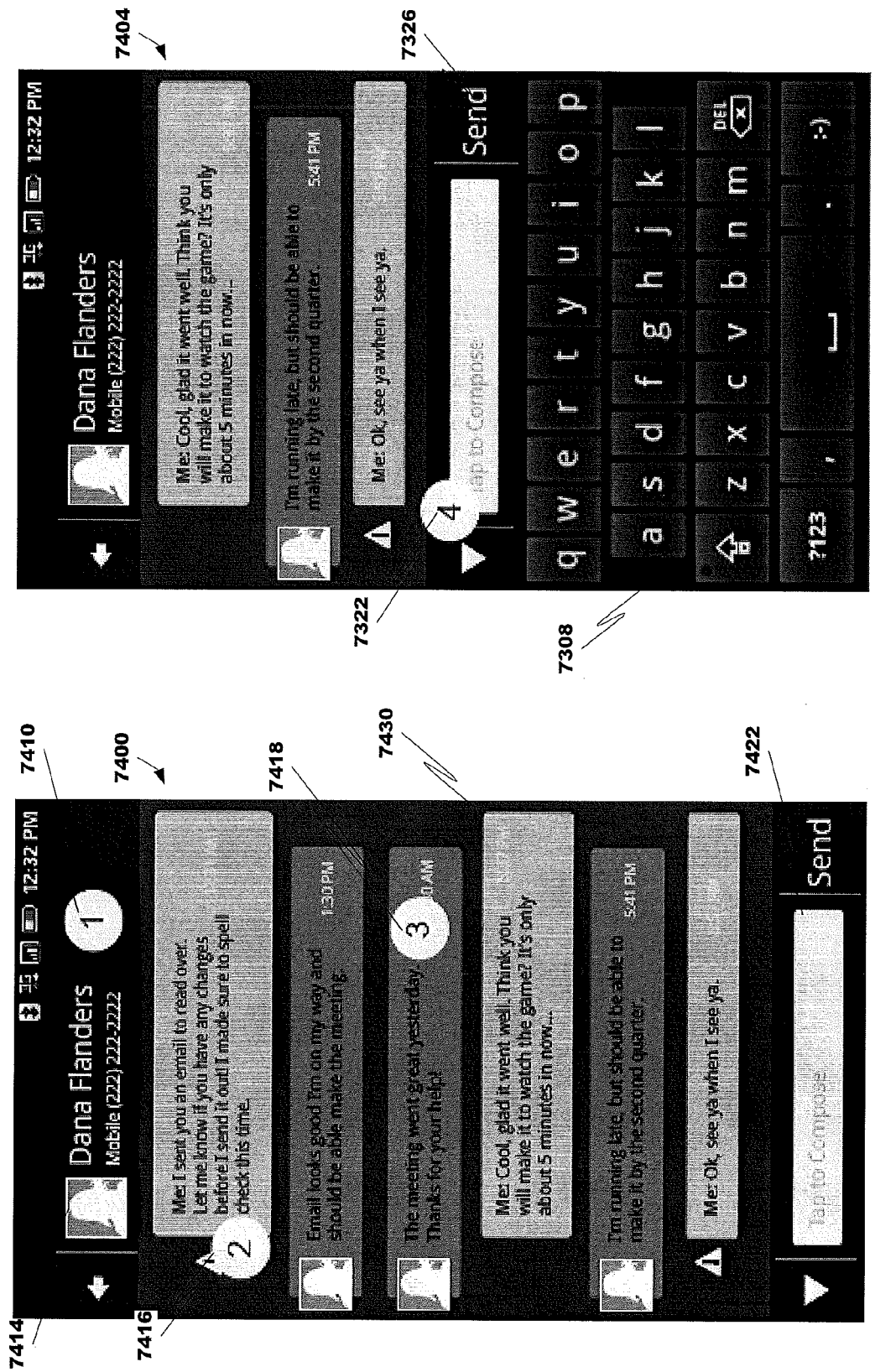
FIG. 74 illustrates a display according to an embodiment.

FIG. 73 depicts a compose message view in PS mode. The "To" field 7300 is in the header bar 7304 along with a directional arrow. Upon choosing in the action bar to compose a "New" message the "To" field is displayed in focus and the keyboard 7308 is visible in the footer area (but no action bar is displayed). The application area 7312 is effectively a thread area that is reserved for displaying messages within a thread. In the case shown, no messages exist yet, but once the user has sent a message to a new recipient the message will be displayed in this area starting at the top. A compose menu button 7316, if selected by tapping, causes the display of a pop-up menu containing the options to add a subject, add an attachment, insert an object, such as a smiley face, and/or discard the message. A compose field 7322, if selected by tapping, applies focus and invokes the keyboard if not already visible, thereby enabling the user to enter content within the field. A "Send" button 7326, if selected by tapping the button, sends the composed message. A user must enter a recipient in the "To" field 7300 to send a message; otherwise, a dialog is shown alerting them to enter a phone number or enter a valid recipient.

FIGS. 74A and 74B 7400 and 7404, respectively, depict single thread and reply views, respectively, in PS mode. With respect to FIG. 74A, the thread view header 7410 includes, for a single thread, a communicant image 7414 (of the other party to the communication thread). When the recipient is a contact, the image displayed is that associated with him or her in the contacts application, such as Microsoft Outlook™. When the recipient has no corresponding contact entry, a different image or avatar selected by the user can be displayed. When there are multiple recipients, an avatar or other recipient-independent image is displayed, and the names of the other communicants (e.g., recipients) are displayed in the space available. The thread view header 7410 further includes contact information, such as communicant name and phone number or other electronic address (e.g., email address, instant message handle, and the like). When the contact has a name associated with him or her in the contacts application, it will be displayed, and the electronic address (e.g., phone number or e-mail address) will be displayed underneath. When there is no name or the person has no corresponding contact entry, the electronic address is displayed at the top of the header bar. Messages within the common thread in the application area 7430 use a similar format for the content and time stamp within the "chat bubble". Content is commonly displayed in one font size, with the timestamp shown adjacent to it in a smaller font. Messages 7416 sent by the user are denoted by a different background color than those messages 7418 received by the user from a communicant and do not contain the user's contact image. By way of illustration, received messages 7418 display the sender's contact image. In the case of a group thread, the user is able to distinguish each contact that has contributed to the thread. When the user taps the compose field 7422, focus is applied and the keyboard transitions up from the bottom of the screen as shown by FIG. 74B. The user can then type in the compose field 7322 a reply or add a new message to the thread, which, when completed, can be sent by tapping the send button 7326.

Figure 75:
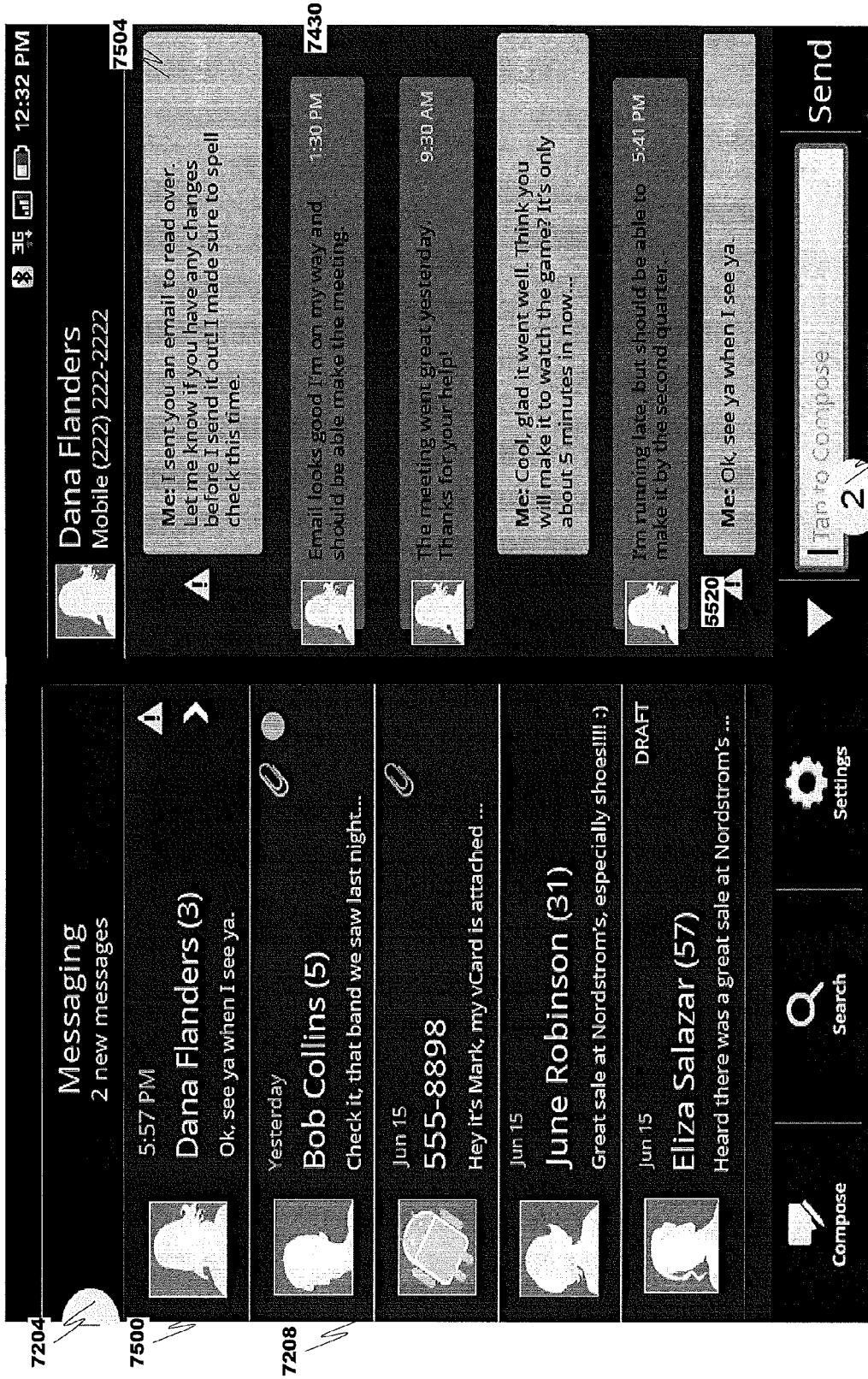
FIG. 75 illustrates a display according to an embodiment.

FIG. 75 depicts the all thread view (left-hand display) and single thread view (right-hand display) in the PD mode. The single thread view is launched by selecting a thread 7500 in the all thread view. This causes each of the communications in the selected thread to be displayed in the single thread view. As will be appreciated, when the output of the messaging application depicted in FIG. 75 is displayed on the communication device 100, the display to the left of the seam 5520 is displayed by the display 110 on the primary screen 104, and the display to the right of the seam 5520 by the display 114 on the secondary screen 108.

Maximizing the messaging application from the all threads view displays the list view in the primary position (the left-hand display), the first list item taking on a focus state, which conveys the relation to the single thread view (which is shown in the secondary or right-hand display). While the single thread view if a child view of the all thread view, they do not follow the standard rules when using a gesture or rotating the SP 1000. Instead of the parent view taking precedence over the child view, the single thread view takes precedence over the all threads view. As soon as the input focus is assigned to the "compose" field, the keyboard is displayed and the single thread view expanded to occupy both screens (FIG. 76).

Figure 76:
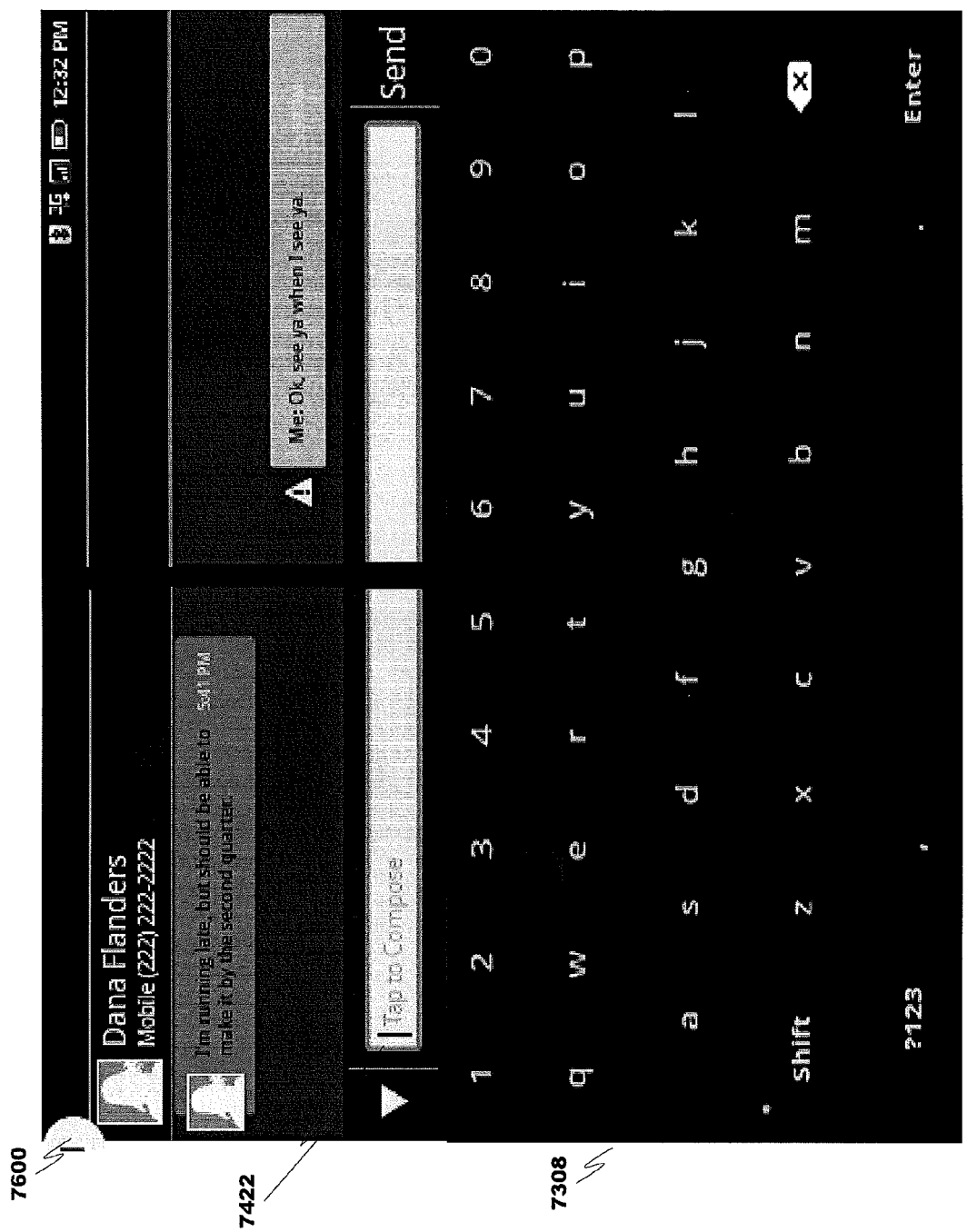
FIG. 76 illustrates a display according to an embodiment.

FIG. 76 depicts a view 7600 that is a child view of FIG. 75. When the user taps on the compose field 7422 in FIG. 75, the keyboard 7308 is displayed and compose field 7422 horizontally expanded across both displays. Upon dismissal of the keyboard, the view collapses back to its child position as shown in FIG. 75. As will be appreciated, when the output of the messaging application depicted in FIG. 76 is displayed on the communication device 100, the display to the left of the seam 5520 is displayed by the display 110 on the primary screen 104, and the display to the right of the seam 5520 by the display 114 on the secondary screen 108.

Figure 77:
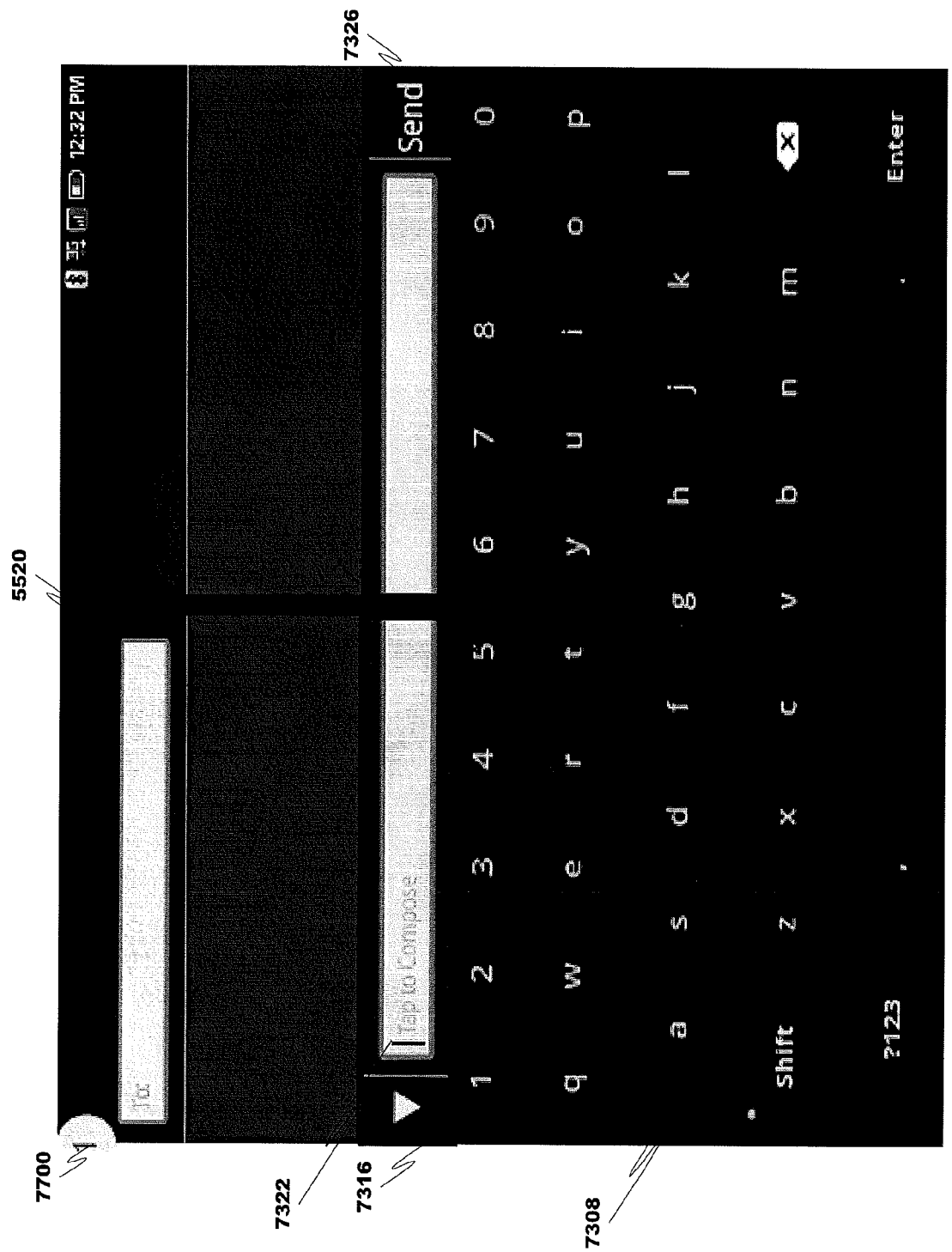
FIG. 77 illustrates a display according to an embodiment.

FIG. 77 depicts the single thread view of FIG. 74A in LD mode. The compose field 7322 and keyboard 7308 span substantially the entire width of the screen. To obtain this display, the user has tapped "Compose" from the action bar 7212 in the all threads view of FIG. 75, which displays the compose screen. The focus (or active cursor location) is immediately given to the "To" field 7700 and the keyboard 7308 is displayed. When the messaging application is maximized to create first and second displays and the keyboard is present, the compose view (same for the single thread view) view will be expanded to be visible on both screens. Once the user composes and sends the new message, the compose view is dismissed and since the sent message 7504 is the most recent it is shown at the top of the all threads view and the single thread view for the new conversation is displayed on the right. As long as the keyboard is visible, this view will remain expanded. As soon as the keyboard is dismissed, the view collapses back into the more standard parent-child relationship. As will be appreciated, when the output of the messaging application depicted in FIG. 77 is displayed on the communication device 100, the display to the left of the seam 5520 is displayed by the display 110 on the primary screen 104, and the display to the right of the seam 5520 by the display 114 on the secondary screen 108.

Figure 38:
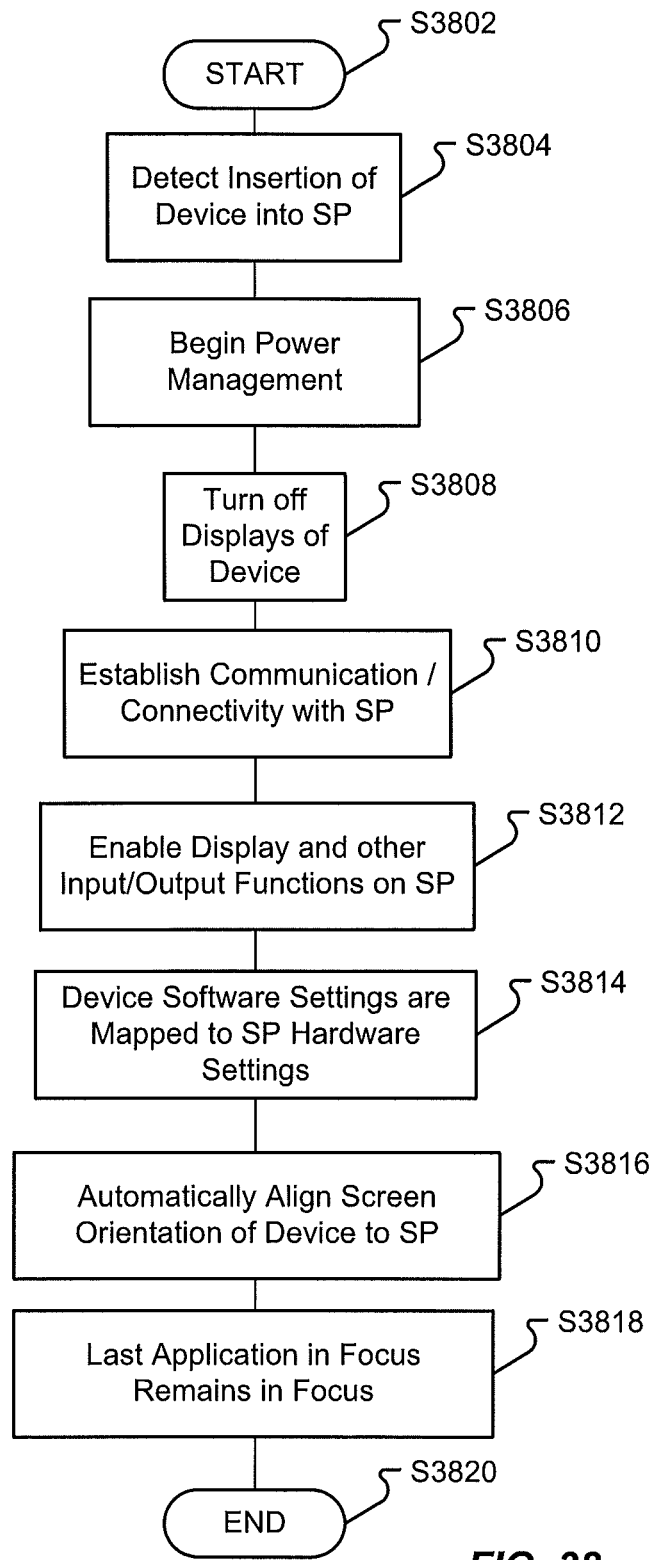
FIG. 38 illustrates an exemplary method for associating the device and the SP.

FIG. 38 outlines an exemplary method for docking the device 100 with the smartpad 1000. In particular, control begins in step S3802 and continues to step S3804. In step S3804 the insertion of the device into the SP is detected. Next, in step S3806, power management can optionally begin. For example, and as discussed, the SP can be used as a power source for the device, the device can be used as a power source for the SP, power can be shared between the two devices and/or the SP can be plugged in, via for example, an AC adaptor, which is capable of charging one or more of the SP and the device 100. Then, in step S3808, the display of the device 100 is optionally turned off to, for example, conserve power. Control then continues to step S3810. In step S3810, communication and/or connectivity are established between the device 100 and the SP. Next, in step S3812, display and other input/output functions on the SP are enabled. Then, in step S3814, the device software settings are mapped to the smartpad hardware settings. Control then continues to step S3816.

In step S3816, the screen orientation of the device is automatically aligned to the orientation of the SP. Next, in step S3818, the last application in focus on the device remains in focus and is displayed on the SP. Normal operation and interaction with the SP then continues utilizing, for example, the same gestures as are usable with the device 100. Control then continues to step S3820 where the control sequence ends.

Figure 39:
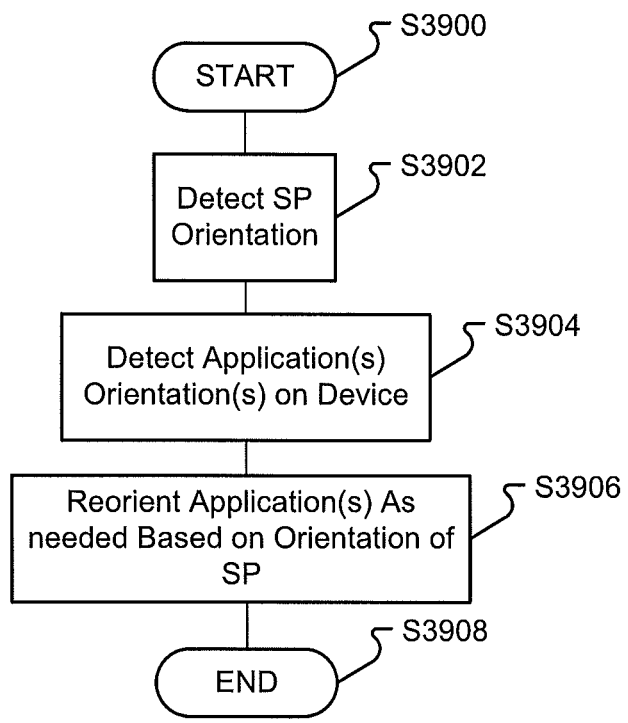
FIG. 39 illustrates an exemplary method for application reorientation based on SP orientation.

FIG. 39 illustrates an exemplary method of application/ display orientation/reorientation. In particular, control begins in step S3900 and continues to step S3902. In step S3902, the orientation of the SP is detected. Next, in step S3904, the application orientation on the device is detected. Then, in step S3906, one or more displayed applications are reoriented to be in the same orientation as the SP. In addition, and based on the need for reorientation, a redrawing or re-sizing of the application can also occur with the application(s) being displayed on the SP. Control then continues to step S3908 where the control sequence ends.

Figure 40:
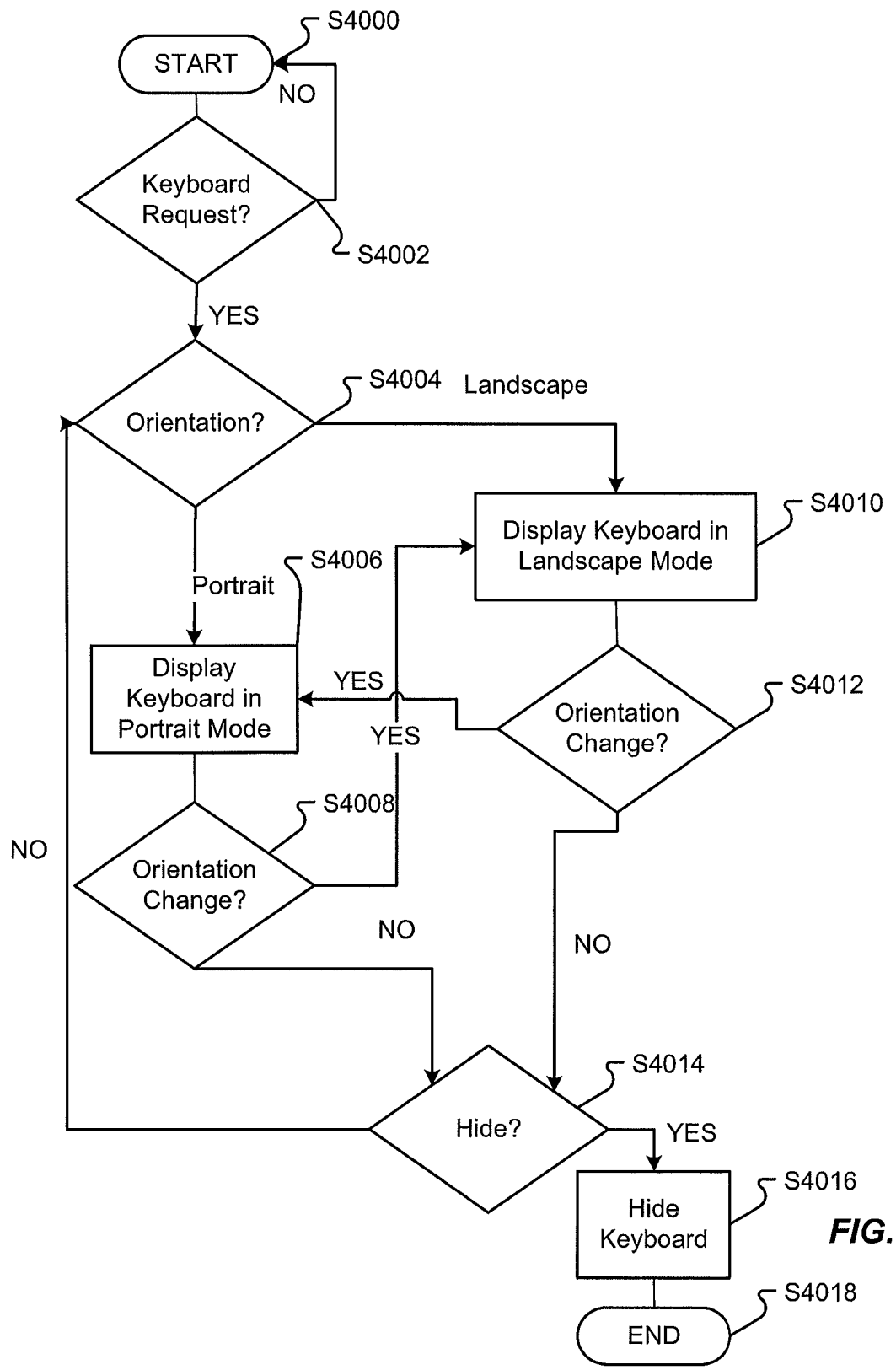
FIG. 40 illustrates an exemplary method for managing the keyboard on the SP.

FIG. 40 outlines an exemplary method for managing the keyboard. In particular, control begins in step S4000 and continues to step S4002. In step S4002, determination is made as to whether a keyboard request has been detected. If a keyboard request has not been detected, control jumps back to step S4000 with control otherwise continuing to step S4004. In step S4004, a determination is made as to the orientation of the SP. If the SP is in the landscape orientation, control jumps to step S4010 with control otherwise continuing to step S4006 with the SP being in the portrait orientation. In step S4006, the keyboard is displayed in the portrait mode.

Next, in step S4008, a determination is made as to whether there has been an orientation change. If there has been an orientation change, control jumps to step S4010 with control otherwise continuing to step S4014.

In step S4010, the keyboard is displayed in the landscape mode. Next, in step S4012, a determination is made as to whether there has been a change in orientation of the SP. If there has been a change in the orientation, control jumps to step S4006 with control otherwise continuing to S4014.

In step S4014, a determination is made as to whether the keyboard should be hidden. If the keyboard should be hidden, control continues to step S4016 with control otherwise continuing back to step S4004.

In step S4016, the keyboard is hidden with control continuing to step S4018 where the control sequence ends.

Figure 41:
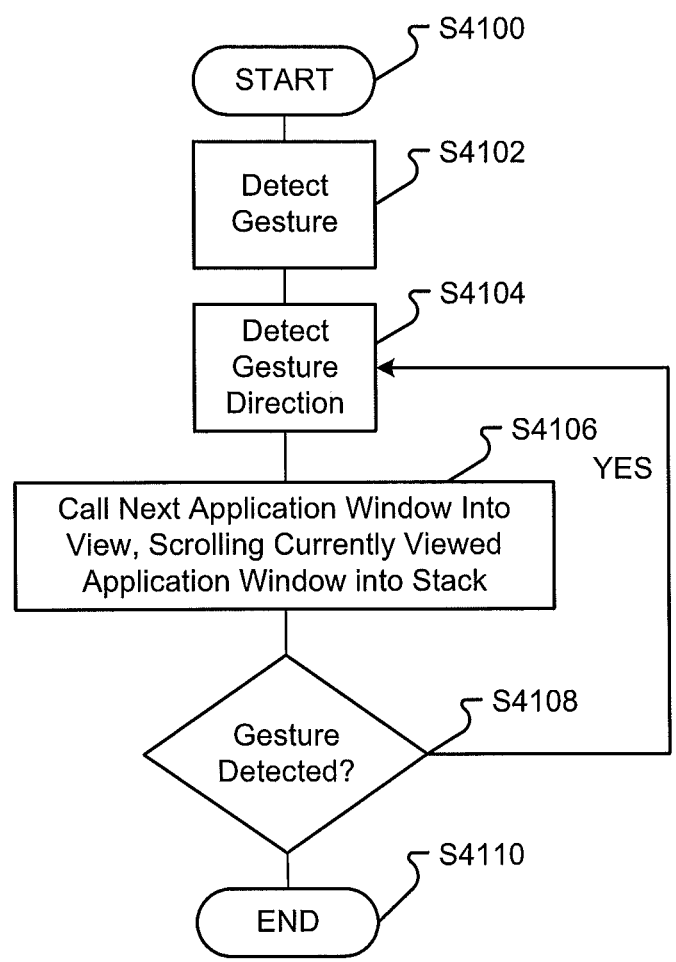
FIG. 41 illustrates an exemplary method for window manipulation based on one or more gestures.

FIG. 41 illustrates an exemplary method for window management. In particular, control begins in step S4100 and continues to step S4102. In step S4102 a gesture is detected. As will be appreciated, and similar to the device 100, this gesture can be on the touch-sensitive display, in a configurable area, and/or in the gesture capture region(s). In step S4104, gesture direction can also optionally be detected. Then, in step S4106, the next application window can be brought into view, enabling, for example, a user to scroll through application window stack. A determination is then made as to whether another gesture has been detected. If another gesture has been detected, control jumps back to step S4104 with control otherwise continuing to step S4110.

Figure 42:
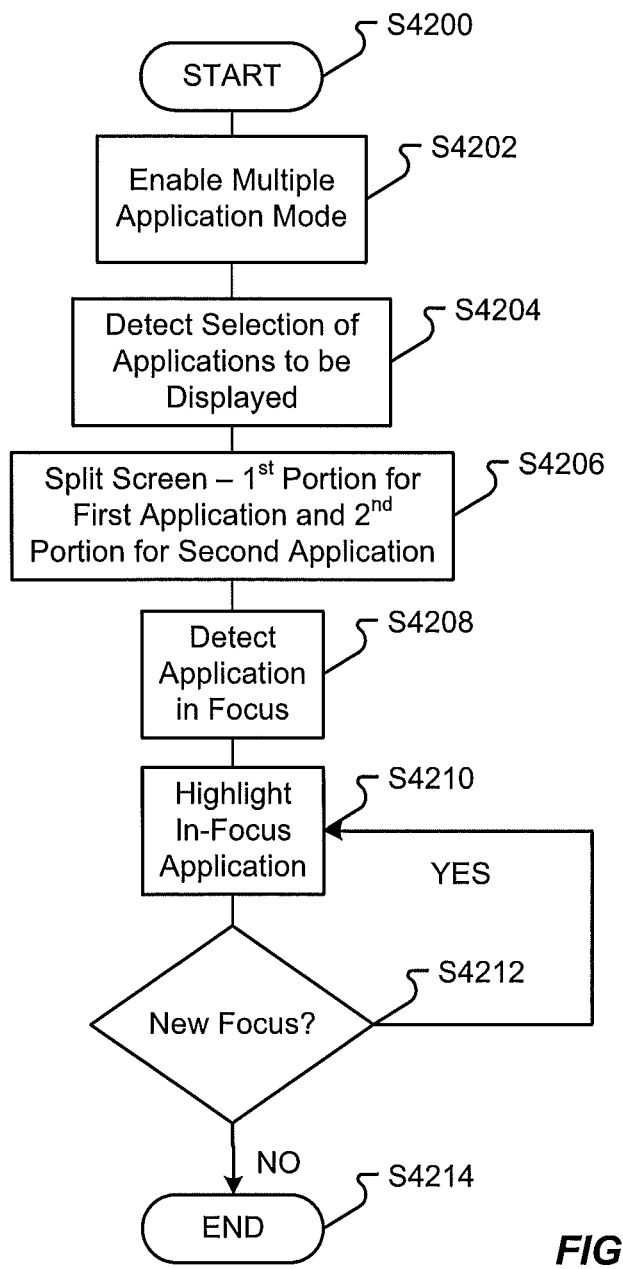
FIG. 42 illustrates an exemplary method for application highlighting when an application is in focus in multi application mode.

FIG. 42 outlines an exemplary method for screen management. In particular, control begins in step S4200 and continues to step S4202. In step S4202, multiple application mode is enabled via, for example, selection of a button or toggle. Next, in step S4204, a user is optionally prompted to select which applications will be displayed. In an alternative embodiment, two adjacent applications in the stack are displayed, with one of the applications being the application that is currently in focus. Then, in step S4206, the screen is split with the first portion of the screen displaying a first application and a second portion of the screen displaying a second application. Next, in S4208, the application that was detected to be in focus is then highlighted on the SP in step S4210. Control then continues to step S4212.

In step S4212, a determination is made as to whether a new application has been brought into focus. If a new application has been brought into focus, control jumps back to step S4210 where that application is highlighted with an "in-focus" indicator. Otherwise, control continues to step S4214 where the control sequence ends.

Figure 43:
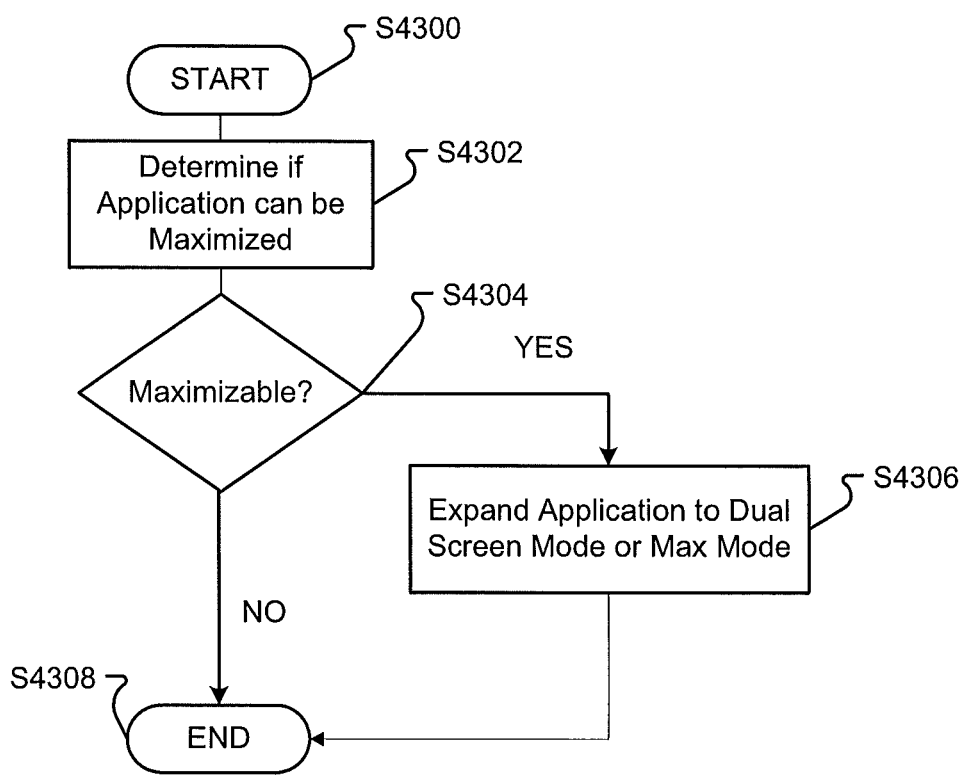
FIG. 43 illustrates an exemplary method for application maximization.

FIG. 43 outlines an exemplary method for windows management. In particular, control begins in step S4300 and continues to step S4302. In step S4302, a determination is made as to whether the application can be maximized. Next, in step S4304, if the application is maximizable, control jumps to step S4306 where the application is expanded to either the dual screen mode or the max mode. Control then continues to step S4308 where the control sequence ends.

Figure 44:
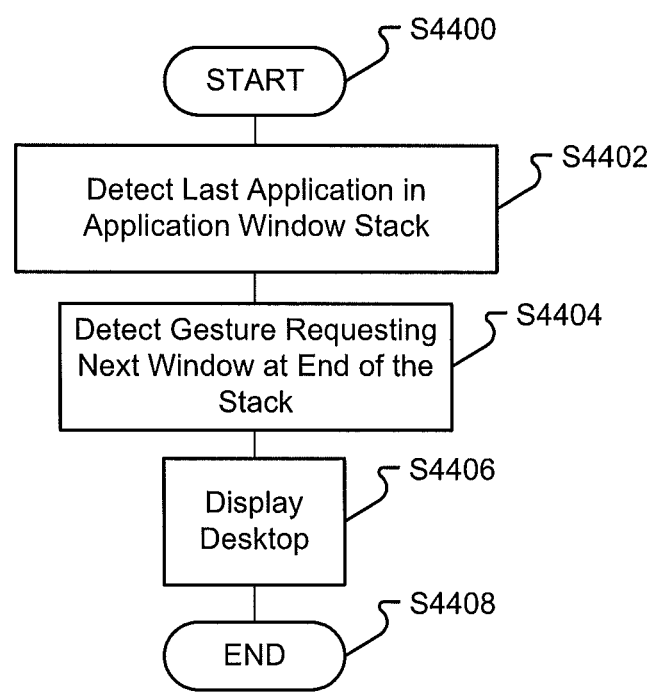
FIG. 44 illustrates an exemplary method for transitioning from an application window to the desktop.

FIG. 44 outlines an exemplary method for transitioning from an application window to the desktop. In particular, control begins in step S4400 and continues to step S4402. In step S4402, the last application in the application window stack is detected. Next, in step S4404, a gesture is detected, the gesture requesting a "next" window, however the current window is the last application in the window stack. In this scenario, in step S4406, the desktop is displayed in that there are no further windows to display in the application window stack. Control then continues to step S4408 where the control sequence ends.

Figure 45:
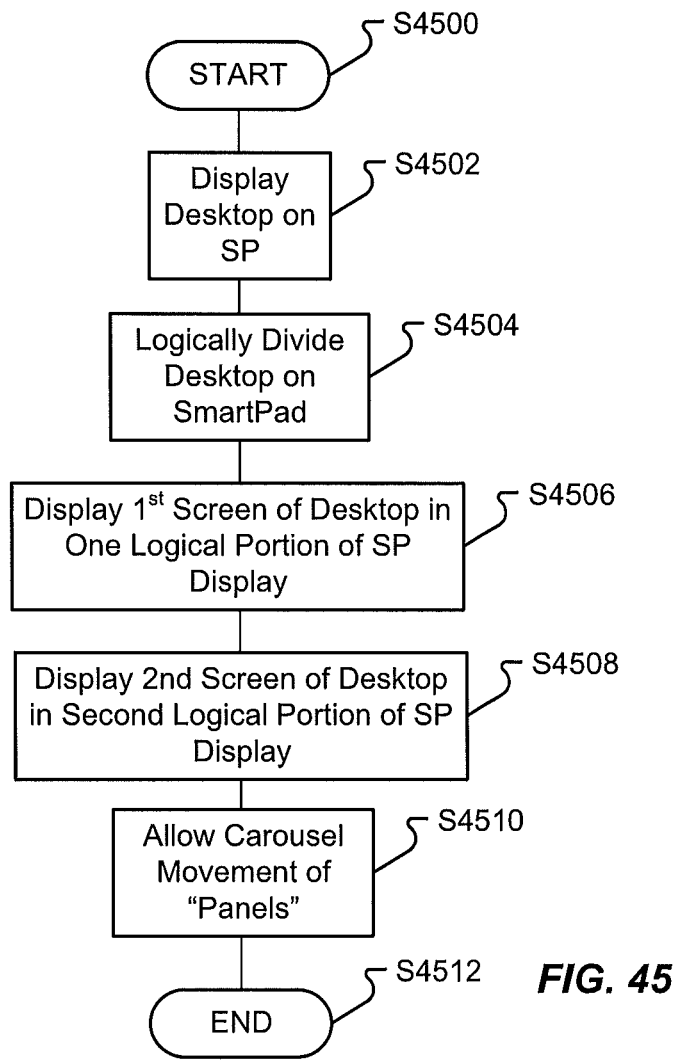
FIG. 45 illustrates an exemplary method for managing the display of the desktop and/or one or more panels on the SP.

FIG. 45 illustrates an exemplary method of emulating the multi-screen display of the device 100 on the SP1000. As will be appreciated, a multi-screen application on the device 100 transforms to a multi-display application on the SP 1000; that is, output of a multi-screen application that occupies the primary and secondary screens of the device 100 is converted or transformed to output that occupies the virtual and/or logical primary and secondary displays of the SP 1000 separated by a virtual and/or logical seam 5520.

Control beings in step S4500 and continues to step S4502. In step S4502, the desktop is displayed on the SP. Next, in step S4504, the desktop is logically divided on the SP into, for example, two sections. Then in step S4506, a first screen of the desktop is displayed in a first logical portion of the SP display. Then, in step S4508, a second screen of the desktop is displayed in a second logical portion of the SP display. Control then continues to step S4510.

In step S4510, carousel movement of the "panels" shown in the display can be initiated through user input, such as a gesture. Control then continues to step S4512 where the control sequence ends.

Figure 46:
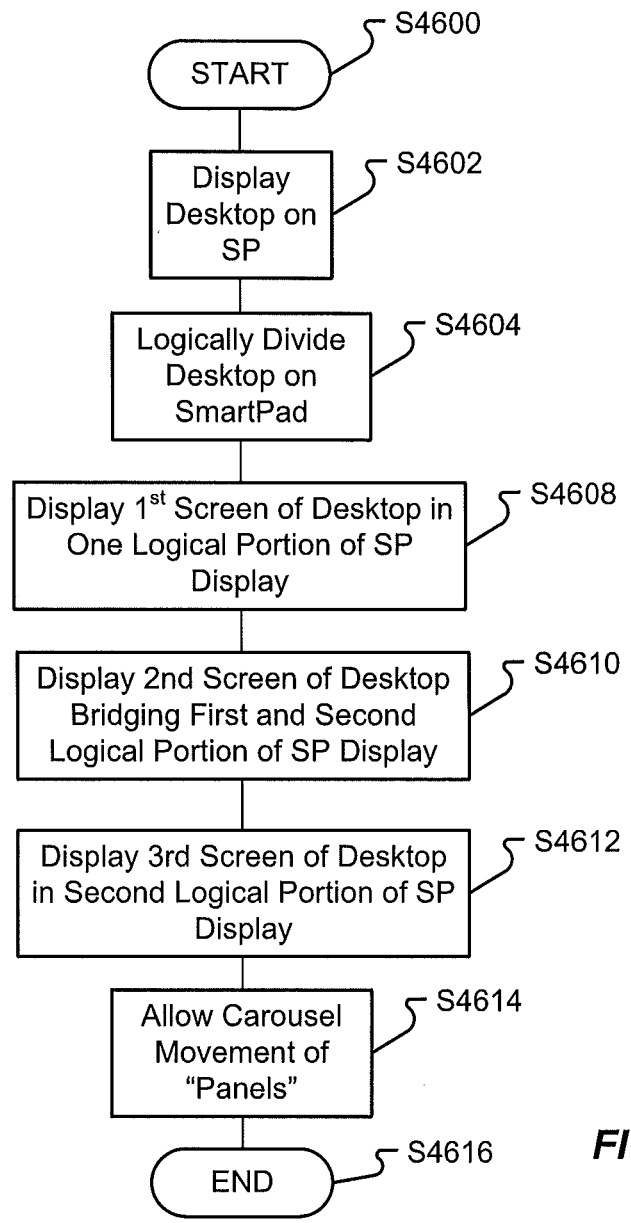
FIG. 46 illustrates an exemplary method for merging panels for display on the SP.

FIG. 46 outlines an exemplary method of displaying multiple "panels" of the desktop on the SP. In particular, control begins in step S4600 and continues to step S4602. In step S4602, a portion of the desktop is displayed on the SP. Next, in step S4604, the desktop is logically divided on the smartpad to accommodate multiple desktop "panels." Then, in step S4608, the first screen or panel of the desktop is displayed in one logical portion of the SP display. Then, in step S4610, a second screen or panel of the desktop is displayed bridging a first and a second logical portion of the SP display. Then, a third screen or panel of the desktop is displayed in the second logical portion of the SP display. Control then continues to step S4614.

In step S4614 carousel movement of the panels can be affected by, for example, an input of a gesture by the user. Control then continues to step S4616 where the control sequence ends.

Figure 47:
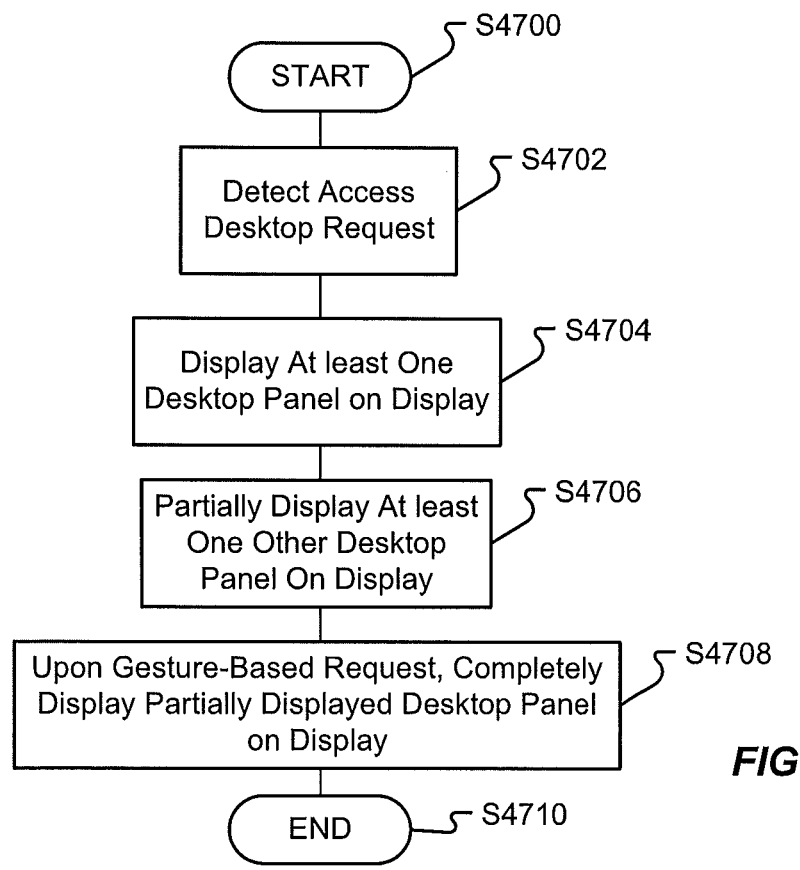
FIG. 47 illustrates an exemplary method for previewing one or more panels on the SP.

FIG. 47 outlines an exemplary method of displaying one or more portions of the desktop. In particular, control begins in step S4700 and continues to step S4702. In step S4702, an access request to the desktop is detected. Next, in step S4704, at least one desktop panel is displayed. Then, in step S4706, at least one additional desktop panel is partially displayed on the desktop. Control then continues to step S4708.

In step S4708, and upon detection of a gesture, the partially displayed panel can be completely displayed on the display of the SP. Control then continues to step S4710 where the control sequence ends.

Figure 48:
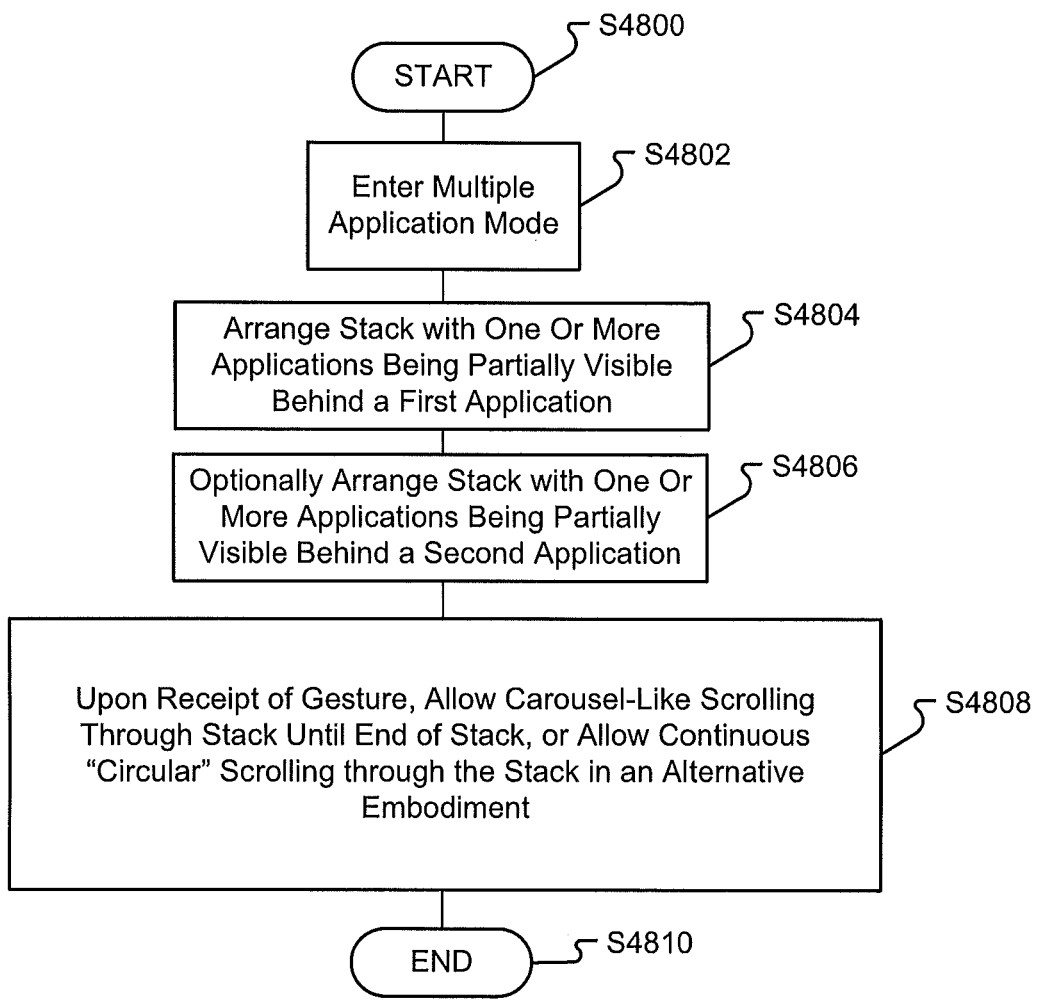
FIG. 48 illustrates an exemplary method for stack management in multi application mode.

FIG. 48 outlines an exemplary method of windows management in multiple application mode. In particular, control begins in step S4800 and continues to step S4802. In step S4802, multiple application mode is entered. Next, in step S4804, the windows stack is arranged with one or more applications being partially visible behind a first application. Next, in step S4806, the stack can be arranged with one or more applications also partially being visible behind a second application. Then, in step S4808, and upon receiving an input gesture from a user, carousel-like scrolling can be enabled through the stack until the end of the stack is reached, or in a second embodiment, the stack can have a "circular" arrangement where continuous scrolling through the stack is possible. Control then continues to step S4810 where the control sequence ends.

Figure 78:
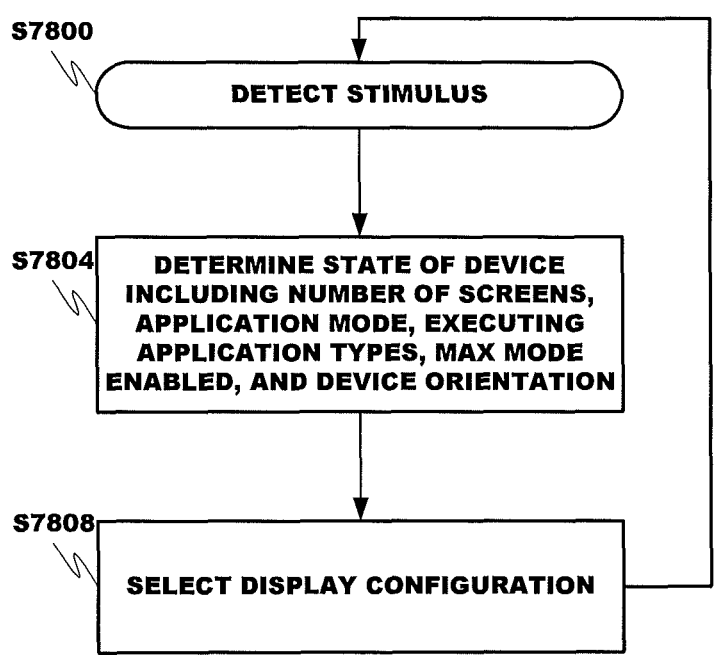
FIG. 78 illustrates an exemplary method for selecting a display configuration.

FIG. 78 depicts an exemplary method of selecting a particular display configuration. In particular, control begins in step S7800 and, when a stimulus is detected, continues to step S7804. Stimuli include user command, change in currently executing application requirements and capabilities, change in currently executing number of applications, change in device orientation, and max mode enabled or disabled. In step S7804, the microprocessor determines a current (or post-stimulus) state of the device, including a number of screens (e.g., whether one or multiple screens), an application mode (e.g., single- or multi-screen application, and single- or multi-display application), currently executing application types, requirements, and capabilities, max mode currently enabled or disabled, and current device orientation (e.g., portrait or landscape). Using the device state, the microprocessor, in step S6008, selects a display configuration. The display configurations and rules used for display configuration selection are set forth above. Display configurations, for example, include minimized or maximized view, max mode view, multi- or single-screen composite display, and the like.

The exemplary systems and methods of this disclosure have been described in relation to a smartpad and interaction with the device. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

For example, the smartpad could have multiple physical and/or logical screens/displays. Additionally, the smartpad could be used with one or more input devices such as a stylus, mouse, or the like. Moreover, the smartpad could be populated with a processor, memory, communications means and the like that would allow for stand-alone operation. Even further, the smartpad could be associated or docked with other types of communications devices such as a smartphone such that the smartpad could be used as a display and/or I/O interface therefore.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method, comprising:
   displaying, by a microprocessor on first and second displays of a multi-display wireless communication device, a multi-thread view of a messaging application comprising a plurality of messages of different types and from different sources received by the communication device over a selected time period, wherein the different types of messages comprise a plurality of e-mail, voice mail, instant messaging, multimedia messaging service, and text chat;
   receiving, by the microprocessor and from a user, a selection of a displayed message from among the plurality of messages, wherein the user selection is by at least one of: (i) user rotation of the communication device from portrait mode to landscape mode, thereby causing selection of the displayed message and (ii) a user gesture received by an off screen gesture capture region located on the communication device; and
   in response, displaying, by the first and/or second displays in a single thread view and as output of the messaging application, a plurality of messages sent by the user to the source and from the source to the user.

2. The method of claim 1, wherein the user selection is received by user rotation of the communication device from portrait mode to landscape mode, thereby causing selection of the displayed message, wherein the messages sent by the user are displayed differently than messages received by the user to distinguish sent messages from received messages and wherein the multi-thread view is displayed by the one of the first and second displays having a primary position and the single-thread view is displayed by the other of the first and second displays having a secondary position.

3. The method of claim 1, wherein the displayed sent and received messages differ in at least one of the following respects: color, type of information displayed, font, and displayed message horizontal screen position, wherein each of the first and second displays have a corresponding off-display gesture capture region to capture user input for the respective one of the first and second display, and wherein the user selection is received by user input to one of the off-display gesture capture regions.

4. The method of claim 1, wherein the wireless communication device is a cellular phone, and wherein the displayed message is selected based on an orientation of the screen relative to a selected point of reference.

5. The method of claim 1, wherein maximizing the messaging application from the multi-thread view causes display of the multi-thread view on the first display and of the single thread view on the second display, the single thread view being based on an in user focus message in the multi-thread view.

6. The method of claim 1, wherein, in the multi-thread view, each of the displayed messages comprise an identification of the source, contact information for the source, an image of the source, at least part of the content of the respective message, and a timestamp associated with each message and wherein, in the single thread view, the view, in a header area, displays an identification of the source, contact information for the source, and an image of the source and wherein the view, in an application area, displays, for each message sent by the user and received by the user, at least part of the content of the respective message and a timestamp associated with each message.

7. The method of claim 5, wherein the first message in the maximized multi-thread view is selected automatically as the in focus message upon which the single thread view is based.

8. A communication device, comprising:
   a microprocessor;
   a screen to display information to a user, the screen comprising first and second displays;
   a cellular telephony module;
   a wireless communication module; and
   a tangible and non-transient computer readable medium comprising microprocessor executable instructions that cause the microprocessor to:
      display, on the screen, a multi-thread view of a messaging application comprising a plurality of messages of different types and from different sources received by the communication device over a selected time period;
      receive, from a user, a selection of a displayed message from among the plurality of messages, wherein the user selection is by at least one of: (i) user rotation of the communication device from portrait mode to landscape mode, thereby causing selection of the displayed message and (ii) a user gesture received by an off screen gesture capture region located on the communication device; and
      in response, display, by the first and/or second displays in a single thread view and as output of the messaging application, a plurality of messages sent by the user to the source and from the source to the user.

9. The device of claim 8, wherein the user selection is received by user rotation of the communication device from portrait mode to landscape mode, thereby causing selection of the displayed message, wherein the messages sent by the user are displayed differently than messages received by the user to distinguish sent messages from received messages and wherein the multi-thread view is displayed by the one of the first and second displays having a primary position and the single-thread view is displayed by the other of the first and second displays having a secondary position.

10. The device of claim 8, wherein the displayed sent and received messages differ in at least one of the following respects: color, type of information displayed, font, and displayed message horizontal screen position, wherein each of the first and second displays have a corresponding off-display gesture capture region to capture user input for the respective one of the first and second display, and wherein the user selection is received by user input to one of the off-display gesture capture regions.

11. The device of claim 8, wherein the different types of messages comprise a plurality of e-mail, voice mail, instant messaging, multimedia messaging service, and text chat, wherein the wireless communication device is a cellular phone, and wherein the displayed message is selected based on an orientation of the screen relative to a selected point of reference.

12. The device of claim 8, wherein maximizing the messaging application from the multi-thread view causes display of the multi-thread view on the first display and of the single thread view on the second display, the single thread view being based on an in user focus message in the multi-thread view.

13. The device of claim 8, wherein, in the multi-thread view, each of the displayed messages comprise an identification of the source, contact information for the source, an image of the source, at least part of the content of the respective message, and a timestamp associated with each message and wherein, in the single thread view, the view, in a header area, displays an identification of the source, contact information for the source, and an image of the source and wherein the view, in an application area, displays, for each message sent by the user and received by the user, at least part of the content of the respective message and a timestamp associated with each message.

14. The device of claim 12, wherein the first message in the maximized multi-thread view is selected automatically as the in focus message upon which the single thread view is based.

15. A tangible and non-transient computer readable medium comprising microprocessor executable instructions that, when executed by the microprocessor, cause the microprocessor to perform the following steps:
  display on first and second displays of a multi-display wireless communication device, a multi-thread view of a messaging application comprising a plurality of messages of different types and from different sources received by the communication device over a selected time period;
  from a user, a selection of a displayed Message from among the plurality of messages, wherein the user selection is by at least one of: (i) user rotation of the communication device from portrait mode to landscape mode, thereby causing selection of the displayed message and (ii) a user gesture received by an off screen gesture capture region located on the communication device; and
  in response, display, by the first and/or second displays in a single thread view and as output of the messaging application, a plurality of messages sent by the user to the source and from the source to the user.

16. The computer readable medium of claim 15, wherein (i) is true, wherein the messages sent by the user are displayed differently than messages received by the user to distinguish sent messages from received messages and wherein the multi-thread view is displayed by the one of the first and second displays having a primary position and the single-thread view is displayed by the other of the first and second displays having a secondary pos.

17. The computer readable medium of claim 15, wherein the displayed sent and received messages differ in at least one of the following respects: color, type of information displayed, font, and displayed message horizontal screen position, wherein each of the first and second displays have a corresponding off-display gesture capture region to capture user input for the respective one of the first and second display, and wherein the user selection is received by user input to one of the off-display gesture capture regions.

18. The computer readable medium of claim 15, wherein the different types of messages comprise a plurality of e-mail, voice mail, instant messaging, multimedia messaging service, and text chat, wherein the wireless communication device is a cellular phone, and wherein the displayed message is selected based on an orientation of the screen relative to a selected point of reference.

19. The computer readable medium of claim 15, wherein maximizing the messaging application from the multi-thread view causes display of the multi-thread view on the first display and of the single thread view on the second display, the single thread view being based on an in user focus message in the multi-thread view.

20. The computer readable medium of claim 15, wherein, in the multi-thread view, each of the displayed messages comprise an identification of the source, contact information for the source, an image of the source, at least part of the content of the respective message, and a timestamp associated with each message and wherein, in the single thread view, the view, in a header area, displays an identification of the source, contact information for the source, and an image of the source and wherein the view, in an application area, displays, for each message sent by the user and received by the user, at least part of the content of the respective message and a timestamp associated with each message.

21. The computer readable medium of claim 19, wherein the first message in the maximized multi-thread view is selected automatically as the in focus message upon which the single thread view is based.

22. A method, comprising:
  providing a wireless communication device having first and second displays, the wireless communication device comprising in memory a messaging application, the messaging application outputting a multi-thread view of messages to and from a user of the wireless communication device; wherein in a first state of the wireless communication device, the messaging application is not maximized and outputs only the multi-thread view; and
  receiving, by the wireless communication device, user input to maximize the messaging application, wherein maximizing the messaging application from the multi-thread view causes display of the multi-thread view on the first display and of the single thread view on the second display, the single thread view comprising a plurality of messages sent by the user to the source and from the source to the user and being generated automatically from a user in focus message in the multi-thread view.

23. The method of claim 22, wherein the first message in the maximized multi-thread view is selected automatically as the in focus message upon which the single thread view is based.

24. The method of claim 22, further comprising:
  displaying, by the first and second displays, the multi-thread view of the messaging application, the multi-thread view comprising a plurality of messages of different types and from different sources received by the communication device over a selected time period;
  receiving, from the user, a selection of a displayed message, wherein the user selection is by at least one of: (i) user rotation of the communication device from portrait mode to landscape mode, thereby causing selection of the displayed message and (ii) a user gesture received by an off screen gesture capture region located on the communication device; and
  in response, displaying, by the first and/or second displays in the single thread view and as output of the messaging application, the plurality of messages sent by the user to the source and from the source to the user.

25. A communication device comprising a microprocessor, a screen to display information to a user and comprising the first and second displays, a cellular telephony module, a wireless communication module, and a computer readable medium comprising microprocessor executable instructions that, when executed, perform the steps of claim 22.

26. A tangible and non-transient computer readable medium comprising microprocessor executable instructions that, when executed by the microprocessor, are configured to perform the steps of claim 22.

* * * * *